(12) United States Patent
Iwashita et al.

(10) Patent No.: US 9,057,948 B2
(45) Date of Patent: *Jun. 16, 2015

(54) RESIST COMPOSITION FOR EUV OR EB, AND METHOD OF FORMING RESIST PATTERN

(71) Applicant: Tokyo Ohka Kogyo Co., Ltd., Kawasaki-shi (JP)

(72) Inventors: Jun Iwashita, Kawasaki (JP); Kenri Konno, Kawasaki (JP); Daisuke Kawana, Kawasaki (JP); Tatsuya Fujii, Kawasaki (JP); Kenta Suzuki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/653,930

(22) Filed: Oct. 17, 2012

(65) Prior Publication Data

US 2013/0143159 A1    Jun. 6, 2013

(30) Foreign Application Priority Data

Oct. 17, 2011  (JP) .................................. 2011-228066
Nov. 11, 2011  (JP) .................................. 2011-248090

(51) Int. Cl.
G03F 7/004    (2006.01)
G03F 7/00     (2006.01)
G03F 7/039    (2006.01)
G03F 7/20     (2006.01)

(52) U.S. Cl.
CPC .............. G03F 7/004 (2013.01); G03F 7/0045 (2013.01); G03F 7/0046 (2013.01); G03F 7/0397 (2013.01); G03F 7/2059 (2013.01)

(58) Field of Classification Search
None
See application file for complete search history.

(56) References Cited

U.S. PATENT DOCUMENTS

| | | | |
|---|---|---|---|
| 5,945,517 | A | 8/1999 | Nitta et al. |
| 6,153,733 | A | 11/2000 | Yukawa et al. |
| 6,949,325 | B2 | 9/2005 | Li et al. |
| 7,482,108 | B2 | 1/2009 | Matsumaru et al. |
| 7,932,334 | B2 | 4/2011 | Ando et al. |
| 8,039,198 | B2 | 10/2011 | Tachibana et al. |
| 8,048,610 | B2 | 11/2011 | Ohsawa et al. |
| 8,062,828 | B2 | 11/2011 | Ohsawa et al. |
| 8,105,748 | B2 | 1/2012 | Ohashi et al. |
| 2001/0049073 | A1 | 12/2001 | Hada et al. |
| 2004/0110085 | A1 | 6/2004 | Iwai et al. |
| 2006/0121390 | A1* | 6/2006 | Gonsalves ................. 430/270.1 |
| 2007/0149702 | A1 | 6/2007 | Ando et al. |
| 2007/0231708 | A1 | 10/2007 | Matsumaru et al. |
| 2008/0187860 | A1 | 8/2008 | Tsubaki et al. |
| 2009/0023095 | A1 | 1/2009 | Hada et al. |
| 2009/0233223 | A1 | 9/2009 | Tachibana et al. |
| 2009/0269694 | A1 | 10/2009 | Shimizu et al. |
| 2010/0055606 | A1 | 3/2010 | Mimura et al. |

(Continued)

FOREIGN PATENT DOCUMENTS

EP    2 112 554 A2    10/2009
JP    A-09-208554     8/1997

(Continued)

OTHER PUBLICATIONS

Office Action issued on Aug. 22, 2013 in U.S. Appl. No. 13/678,955.

(Continued)

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A resist composition including a base component containing a polymer (A1) having a structural unit (a5) containing a group represented by general formula (a5-0-1) or (a5-0-2), wherein the amount of the monomer that derives the structural unit (a5) is not more than 100 ppm relative to (A1). In the formulas, each of $Q^1$ and $Q^2$ represents single bond or divalent linking group, $R^3$, $R^4$ and $R^5$ represent organic groups, and $R^4$ and $R^5$ may be bonded to each other to form a ring in combination with the sulfur atom, provided that $—R^3—S^+(R^4)(R^5)$ has a total of only one aromatic ring or has no aromatic rings, $V^-$ represents a counter anion, $A^-$ represents an organic group containing anion, and $M^{m+}$ represents an organic cation having a valency of m, wherein m represents an integer of 1 to 3, provided that $M^{m+}$ has only one aromatic ring or has no aromatic rings.

[Chemical Formula 1]

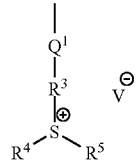

(a5-0-1)

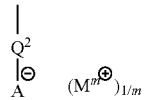

(a5-0-2)

5 Claims, No Drawings

(56) References Cited

U.S. PATENT DOCUMENTS

| | | | |
|---|---|---|---|
| 2010/0063232 A1 | 3/2010 | Nagai et al. | |
| 2010/0075256 A1 | 3/2010 | Joo et al. | |
| 2010/0143845 A1 | 6/2010 | Iwashita et al. | |
| 2010/0233624 A1 | 9/2010 | Kakinoya et al. | |
| 2010/0255420 A1 | 10/2010 | Sakakibara et al. | |
| 2010/0304303 A1 | 12/2010 | Maeda et al. | |
| 2011/0177453 A1 | 7/2011 | Masubuchi et al. | |
| 2011/0200940 A1 | 8/2011 | Ichikawa et al. | |
| 2011/0244392 A1 | 10/2011 | Hirano et al. | |
| 2012/0003583 A1 | 1/2012 | Tsuchimura et al. | |
| 2012/0003590 A1* | 1/2012 | Hirano et al. | 430/325 |
| 2012/0082939 A1* | 4/2012 | Kawabata et al. | 430/319 |
| 2012/0100487 A1 | 4/2012 | Hirano et al. | |
| 2012/0135350 A1 | 5/2012 | Kobayashi et al. | |
| 2012/0156618 A1 | 6/2012 | Takahashi et al. | |
| 2012/0282551 A1* | 11/2012 | Matsuzawa et al. | 430/296 |
| 2012/0328993 A1* | 12/2012 | Utsumi et al. | 430/325 |
| 2013/0095427 A1 | 4/2013 | Yahagi et al. | |
| 2013/0137048 A1* | 5/2013 | Yahagi et al. | 430/325 |
| 2013/0157201 A1* | 6/2013 | Takaki et al. | 430/325 |

FOREIGN PATENT DOCUMENTS

| | | |
|---|---|---|
| JP | A-10-221852 | 8/1998 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2003-241385 | 8/2003 |
| JP | A-2005-037888 | 2/2005 |
| JP | A-2005-336452 | 12/2005 |
| JP | A-2006-045311 | 2/2006 |
| JP | A-2006-063318 | 3/2006 |
| JP | A-2006-169319 | 6/2006 |
| JP | A-2006-234938 | 9/2006 |
| JP | A-2006-259582 | 9/2006 |
| JP | A-2006-317803 | 11/2006 |
| JP | A-2008-292975 | 12/2008 |
| JP | A-2009-025723 | 2/2009 |
| JP | A-2009-040761 | 2/2009 |
| JP | A-2009-192618 | 8/2009 |
| JP | A-2009-265332 | 11/2009 |
| JP | A-2010-077377 | 4/2010 |
| JP | A-2010-095643 | 4/2010 |
| JP | A-2010-128369 | 6/2010 |
| JP | A-2010-217856 | 9/2010 |
| JP | A-2011-026300 | 2/2011 |
| JP | A-2011-043783 | 3/2011 |
| JP | A-2011-053364 | 3/2011 |
| JP | A-2011-118310 | 6/2011 |
| JP | A-2011-158879 | 8/2011 |
| JP | A-2011-168698 | 9/2011 |
| JP | A-2011-190246 | 9/2011 |
| JP | A-2012-013811 | 1/2012 |
| WO | WO 2004/074242 A2 | 9/2004 |
| WO | WO 2006/011420 | 2/2006 |
| WO | WO 2008/056795 | 5/2008 |
| WO | WO 2009/057769 | 5/2009 |
| WO | WO 2011/115190 | 9/2011 |

OTHER PUBLICATIONS

Office Action issued on Oct. 24, 2013 in U.S. Appl. No. 13/402,820.
Office Action issued on Dec. 5, 2013 in U.S. Appl. No. 13/664,651.
Office Action in Japanese Patent Application No. 2011-037534, mailed Aug. 26, 2014.
Office Action in U.S. Appl. No. 13/402,820, mailed Sep. 17, 2014.
Office Action in Japanese Patent Application No. 2011-228066., mailed Mar. 24, 2015.

* cited by examiner

RESIST COMPOSITION FOR EUV OR EB, AND METHOD OF FORMING RESIST PATTERN

TECHNICAL FIELD

The present invention relates to a resist composition that generates acid upon exposure, and exhibits changed solubility in a developing solution under the action of that acid, and also relates to a method of forming a resist pattern that uses the resist composition.

Priority is claimed on Japanese Patent Application No. 2011-228066, filed Oct. 17, 2011, and Japanese Patent Application No. 2011-248090, filed Nov. 11, 2011, the contents of which are incorporated herein by reference.

BACKGROUND ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified resist composition is used, which includes a base component that exhibits changed solubility in a developing solution under the action of acid, and an acid generator component that generates acid upon exposure. For example, in the case where the developing solution is an alkali developing solution (alkali developing process), a positive-type chemically amplified resist composition containing a resin component (base resin) that exhibits increased solubility in an alkali developing solution under the action of acid, and an acid generator component is generally used. If a resist film formed using this resist composition is selectively exposed during formation of a resist pattern, then acid is generated from the acid generator component within the exposed portions, and the action of this acid causes an increase in the solubility of the base resin in an alkali developing solution, making the exposed portions soluble in the alkali developing solution. Accordingly, by performing alkali developing, the unexposed portions remain as a pattern, resulting in the formation of a positive-type pattern.

The base resin used exhibits increased polarity under the action of acid, thereby exhibiting increased solubility in an alkali developing solution, whereas the solubility in an organic solvent is decreased. Accordingly, if a solvent developing process that uses a developing solution containing an organic solvent (an organic developing solution) is employed instead of an alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is also referred to as a negative-type development process (for example, see Patent Document 1).

Currently, resins that contain structural units derived from (meth)acrylate esters within the main chain (acrylic resins) are generally used as base resins for chemically amplified resist compositions that use ArF excimer laser lithography or the like, as they exhibit excellent transparency in the vicinity of 193 nm (for example, see Patent Document 2).

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

Further, as acid generators usable in a chemically amplified resist composition, various types have been proposed including, for example, onium salt acid generators, oxime sulfonate acid generators, diazomethane acid generators, nitrobenzyl-sulfonate acid generators, iminosulfonate acid generators, and disulfone acid generators.

Resins having an acid-generating group that generates acid upon exposure have also been proposed as base resins for chemically amplified resist compositions. For example, in order to achieve high resolution and the like, resin components that have, within the resin structure, an acid-generating group that generates acid upon exposure, and an acid-decomposable group that exhibits changed polarity under the action of acid have been proposed (for example, see Patent Documents 3 and 4). These resin components combine the function of an acid generator and the function of a base resin, and enable a chemically amplified resist composition to be formed from a single component. In other words, when this type of resin component is subjected to exposure, acid is generated from the acid-generating group within the structure, and the action of that acid causes decomposition of the acid-decomposable group, thereby forming a polar group such as a carboxyl group that causes an increase in the polarity. As a result, when a resin film (resist film) formed using this resin component is subjected to selective exposure, the polarity of the exposed portions increases, and by performing developing using an alkali developing solution, the exposed portions can be dissolved and removed, forming a positive-type resist pattern.

In recent years, investigations have been conducted into the use of extreme ultraviolet rays (EUV) electron beams (EB) and X-rays, which have a shorter wavelength (and higher energy) than an ArF excimer laser.

Resist materials for use in EUV lithography and EB lithography require specific lithography properties, including sensitivity to EUV or EB, and a high resolution capable of forming the targeted very fine resist patterns, and also require a favorable resist pattern shape.

Currently, chemically amplified resists that have been proposed for use with KrF excimer lasers or ArF excimer lasers or the like are generally used as the resist materials for EUV lithography and EB lithography due to their superior lithography properties.

Chemically amplified resists containing an acrylic resin as the base resin are considered to have particularly superior lithography properties.

DOCUMENTS OF RELATED ART

Patent Documents

[Patent Document 1]
Japanese Unexamined Patent Application, First Publication No. 2009-025723
[Patent Document 2]
Japanese Unexamined Patent Application, First Publication No. 2003-241385
[Patent Document 3]
Japanese Unexamined Patent Application, First Publication No. 2011-118310
[Patent Document 4]
Japanese Unexamined Patent Application, First Publication No. 2011-158879

SUMMARY OF THE INVENTION

However, a problem exists in that when a chemically amplified resist that has been proposed for use with a KrF excimer laser or an ArF excimer laser is used for EUV lithography or EB lithography, the shape of the formed resist pattern is often unsatisfactory.

For example, in the case of EUV lithography, so-called "Out of Band" (OoB) light, which is incorporated within the light generated by the light source of the EUV exposure apparatus but is of a wavelength outside the EUV region, can cause problems. OoB light enters the unexposed portions of the resist film together with a flare that is generated at the same time (thus impairing the selectivity of the exposure region during the EUV light irradiation), and therefore the acid generator component decomposes and generates acid even within the unexposed portions, which can cause problems such as a decrease in the resist pattern contrast, thickness loss, and roughness (surface roughness in the upper surface and the side walls of the pattern). Roughness can cause resist pattern shape faults. For example, roughness in the side wall surfaces of a pattern can cause shape defects typified by non-uniformity in the line width of a line and space pattern or distortion around the hole periphery in a hole pattern.

These shape defect problems caused by OoB light tend to be particularly marked when the chemically amplified resist compositions used have been designed for lithography processes in which exposure is performed using light having a wavelength in the DUV region, such as an ArF excimer laser or the like. In other words, in these types of chemically amplified resist compositions, generally, irradiation of light having a wavelength in the DUV region results in the generation of acid and a change in solubility within the developing solution.

OoB light contains EUV of approximately 13.5 nm, DUV of 150 to 300 nm, and light having a wavelength in the infrared region, and onium salt acid generators, which are widely used conventionally, readily absorb light having a wavelength in the DUV region to generate acid. Accordingly, when EUV exposure is performed, those portions that are intended as unexposed portions also exhibit photosensitivity, causing a decrease in the resolution, worsening of the roughness, and deterioration in the shape, which can have an adverse effect on the performance of the device.

In EB lithography, electrons may be diffused (scattered) at the surface of the resist film depending on the electron beam irradiation conditions such as the accelerating voltage, and therefore the same types of problem as those observed with the OoB light in EUV lithography (such as forward scattering and back scattering) can occur.

Resist pattern shape defects can adversely effect the formation of very fine semiconductor elements. Accordingly, resist materials for use in EUV lithography and EB lithography require improved lithography properties and an improved pattern shape.

Further, when a chemically amplified resist containing the resin disclosed in Patent Document 4 (a resin having an acid-generating group that generates acid upon exposure) is used in an EUV lithography or EB lithography process for the purpose of achieving higher resolution and the like, there is a possibility that the sensitivity may deteriorate.

The present invention takes the above circumstances into consideration, and has an object of providing a resist composition and a method of forming a resist pattern that are useful for EUV or EB.

In order to achieve this object, the present invention employs the following aspects.

In other words, a first aspect of the present invention is a resist composition for EUV or EB, the composition including a base component (A) which generates acid upon exposure and exhibits changed solubility in a developing solution under the action of acid, wherein the base component (A) contains a polymer (A1) having a structural unit (a5) containing a group represented by general formula (a5-0-1) or general formula (a5-0-2) shown below, and the amount of the monomer that derives the structural unit (a5) is not more than 100 ppm (by weight) relative to the polymer (A1).

[Chemical Formula 1]

(a5-0-1)

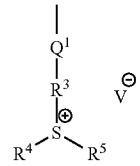

(a5-0-2)

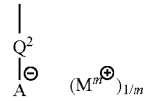

In the formulas, each of $Q^1$ and $Q^2$ independently represents a single bond or a divalent linking group, each of $R^3$, $R^4$ and $R^5$ independently represents an organic group, and $R^4$ and $R^5$ may be bonded to each other to form a ring in combination with the sulfur atom in the formula, provided that the group —$R^3$—$S^+(R^4)(R^5)$ has a total of only one aromatic ring or has no aromatic rings, $V^-$ represents a counter anion, $A^-$ represents an organic group containing an anion, and $M^{m+}$ represents an organic cation having a valency of m, wherein m represents an integer of 1 to 3, provided that $M^{m+}$ has only one aromatic ring or has no aromatic rings.

The polymer (A1) may also have a structural unit (a6) represented by general formula (a6-1) shown below.

The polymer is also referred to as a resin component.

[Chemical Formula 2]

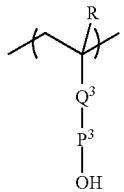

(a6-1)

In the formula, $Q^3$ represents a single bond or a divalent linking group, R represents a hydrogen atom, an alkyl group of 1 to 5 carbon atoms or a halogenated alkyl group of 1 to 5 carbon atoms, and $P^3$ represents an aromatic hydrocarbon group which may have a substituent.

A second aspect of the present invention is a method of forming a resist pattern, the method including: using the resist composition for EUV or EB according to the first aspect to form a resist film on a substrate, conducting exposure of the resist film with EUV or EB, and developing the resist film to form a resist pattern.

In the present description and claims, the expression "for EUV or EB" indicates that formation of a resist pattern using the resist composition is performed using extreme ultraviolet rays (EUV) or an electron beam (EB) as the exposure light source (radiation source).

The term "exposure" is used as a general concept that includes irradiation with any form of radiation.

The term "aliphatic" is a relative concept used in relation to the term "aromatic", and defines a group or compound or the like that has no aromaticity.

The term "alkyl group" includes linear, branched and cyclic monovalent saturated hydrocarbon groups, unless specified otherwise. This definition also applies for the alkyl group within an alkoxy group.

The term "alkylene group" includes linear, branched and cyclic divalent saturated hydrocarbon groups, unless specified otherwise.

A "halogenated alkyl group" is a group in which part or all of the hydrogen atoms of an alkyl group have each been substituted with a halogen atom, and a "halogenated alkylene group" is a group in which part or all of the hydrogen atoms of an alkylene group have each been substituted with a halogen atom. Examples of the halogen atom include a fluorine atom, a chlorine atom, a bromine atom and an iodine atom.

A "fluorinated alkyl group" is a group in which part or all of the hydrogen atoms of an alkyl group have each been substituted with a fluorine atom, and a "fluorinated alkylene group" is a group in which part or all of the hydrogen atoms of an alkylene group have each been substituted with a fluorine atom.

A "hydroxyalkyl group" is a group in which part or all of the hydrogen atoms of an alkyl group have each been substituted with a hydroxyl group.

The term "structural unit" refers to a monomer unit that contributes to the formation of a polymeric compound (a resin, polymer or copolymer).

The present invention is able to provide a resist composition that is useful for EUV or EB, and a method of forming a resist pattern that uses the resist composition.

MODE FOR CARRYING OUT THE INVENTION

<<Resist Composition for EUV or EB>>

The resist composition according to the first aspect of the present invention is a resist composition for EUV or EB, including a base component (A) (hereafter referred to as "component (A)") which generates acid upon exposure and exhibits changed solubility in a developing solution under the action of acid.

Because the resist composition of the present invention includes the component (A), it has a property wherein the solubility of the resist composition in a developing solution changes upon exposure. When a resist film is formed using the resist composition, and that resist film is then subjected to selective exposure, acid is generated from the component (A) in the exposed portions, and the generated acid causes a change in the solubility of the component (A) in a developing solution. As a result, the solubility of the exposed portions in the developing solution changes, whereas the solubility of the unexposed portions in the developing solution does not change, meaning that when the resist film is subjected to developing, either a positive-type resist pattern is formed by dissolving and removing the exposed portions in the case where the resist composition is a positive-type, or a negative-type resist pattern is formed by dissolving and removing the unexposed portions in the case where the resist composition is a negative-type.

In the present description, a resist composition in which the exposed portions are dissolved and removed to form a positive-type resist pattern is referred to as a "positive-type resist composition", and a resist composition in which the unexposed portions are dissolved and removed to form a negative-type resist pattern is referred to as a "negative-type resist composition".

The resist composition of the present aspect may be either a positive-type resist composition or a negative-type resist composition. Further, the resist composition of the present aspect may be used for either an alkali developing process in which an alkali developing solution is used for the developing treatment during formation of the resist pattern, or a solvent developing process in which a developing solution containing an organic solvent (an organic developing solution) is used for the developing treatment. The resist composition is preferably used for forming a positive-type resist pattern in an alkali developing process, and in this case, a base component that exhibits increased solubility in an alkali developing solution under the action of acid is used as the component (A).

<Component (A)>

The component (A) used in the resist composition of the present aspect is a base component that generates acid upon exposure and exhibits changed solubility in a developing solution under the action of acid, and this component (A) contains a polymer (A1) (hereafter referred to as "component (A1)") having a structural unit (a5) described below.

The polymer (A1) may also have a structural unit (a6) described below.

Here, the term "base component" describes an organic compound capable of forming a film, and is preferably an organic compound having a molecular weight of 500 or more. Ensuring that the organic compound has a molecular weight of 500 or more improves the film-forming ability, and facilitates the formation of nano level resist patterns. The "organic compounds having a molecular weight of 500 or more" that can be used as the base component can be broadly classified into non-polymers and polymers.

In general, compounds which have a molecular weight of at least 500 but less than 4,000 may be used as non-polymers.

Hereafter, the term "low molecular weight compound" is used to describe a non-polymer having a molecular weight of at least 500 but less than 4,000.

In terms of the polymers, typically, compounds which have a molecular weight of 1,000 or more may be used. Hereafter, a polymer having a molecular weight of 1,000 or more is referred to as a polymeric compound. For these polymeric compounds, the "molecular weight" is the weight-average molecular weight in terms of the polystyrene-equivalent value determined by gel permeation chromatography (GPC). Hereafter, a polymeric compound is frequently referred to simply as a "resin".

[Component (A1)]

The component (A1) is a resin component having the structural unit (a5). The component (A1) may also have the structural unit (a6).

When the component (A1) also has the structural unit (a6), examples of the component (A1) include a component containing both a polymer having the structural unit (a5) and a polymer having the structural unit (a6), a component containing a copolymer having both the structural unit (a5) and the structural unit (a6), a component containing the above copolymer and a polymer having the structural unit (a5), a component containing the above copolymer and a polymer having the structural unit (a6), and a component containing the above copolymer as well as a polymer having the structural unit (a5) and a polymer having the structural unit (a6).

In the present invention, when the component (A1) also has the structural unit (a6), the component (A1) is preferably either a component containing both a polymer having the structural unit (a5) and a polymer having the structural unit (a6), or a component containing a copolymer having both the structural unit (a5) and the structural unit (a6).

The component (A1) may be either a component that exhibits increased solubility in a developing solution under the action of acid, or a component that exhibits reduced solubility in a developing solution under the action of acid.

The component (A1) has a region that generates acid upon exposure (an acid-generating region), at least within the structural unit (a5).

In those cases where the resist composition of the present aspect is a resist composition which forms a negative-type resist pattern in an alkali developing process (or forms a positive-type resist pattern in a solvent developing process), a resin component which generates acid upon exposure and is soluble in an alkali developing solution (hereafter, this resin component is also referred to as "component (A1-2)") is used as the component (A1), and a crosslinking agent component is also added to the composition. In this resist composition, when acid is generated from the acid-generating region (at least the structural unit (a5)) within the component (A1-2) upon exposure, the action of the acid causes crosslinking to occur between the component (A1-2) and the crosslinking agent component, and as a result, the solubility in an alkali developing solution decreases (whereas the solubility in an organic developing solution increases). Accordingly, during resist pattern formation, by conducting selective exposure of a resist film obtained by applying the resist composition to a substrate, the exposed portions change to a state that is substantially insoluble in an alkali developing solution (but soluble in an organic developing solution), while the unexposed portions remain soluble in an alkali developing solution (but substantially insoluble in an organic developing solution), meaning developing with an alkali developing solution can be used to form a negative-type resist pattern.

Further, if an organic developing solution is used as the developing solution, then a positive-type resist pattern can be formed.

Examples of the component (A1-2) include resins which may have the structural unit (a6), and are known as resins that are soluble in alkali developing solutions (hereafter referred to as "alkali-soluble resins"), into which an acid-generating region that generates acid upon exposure (and at least a group represented by general formula (a5-0-1) or general formula (a5-0-2) described below) has been introduced.

As the alkali-soluble resin (prior to introduction of the acid-generating region), a resin having a structural unit derived from at least one of an α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin or polycycloolefin resin having a sulfonamide group, and in which an atom other than a hydrogen atom or a substituent may be bonded to the carbon atom on the α-position, as disclosed in U.S. Pat. No. 6,949,325; an acrylic resin containing a fluorinated alcohol, and in which an atom other than a hydrogen atom or a substituent may be bonded to the carbon atom on the α-position, as disclosed in U.S. Pat. No. 6,949,325, Japanese Unexamined Patent Application, First Publication No. 2005-336452 or Japanese Unexamined Patent Application, First Publication No. 2006-317803; or a polycycloolefin resin having a fluorinated alcohol, as disclosed in Japanese Unexamined Patent Application, First Publication No. 2006-259582 is preferable, as these resins are capable of forming a resist pattern with minimal swelling.

Among acrylic acids in which an atom other than a hydrogen atom or a substituent may be bonded to the carbon atom on the α-position, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (and preferably a hydroxyalkyl group of 1 to 5 carbon atoms) is bonded to the carbon atom on the α-position.

The acid-generating region includes at least the group represented by general formula (a5-0-1) or general formula (a5-0-2) described below, and may also include structures that are the same as the acid-generating regions of conventional compounds used as acid generators for resist compositions.

The position at which the acid-generating region is introduced into the alkali-soluble resin may be a side chain portion, or a main chain terminal in addition to a side chain portion. Introduction of the acid-generating region at a main chain terminal can be performed by using a polymerization initiator having an acid-generating region as the polymerization initiator used during production of the alkali-soluble resin. Introduction of the acid-generating region into a side chain portion can be achieved by conducting a polymerization, during the production of the alkali-soluble resin, of a monomer having an acid-generating region (a monomer that yields the structural unit (a5) described below) together with a monomer having an alkali-soluble group (for example, a monomer that yields a structural unit (a3) described below which has an alkali-soluble group such as a hydroxyl group or a carboxyl group as the polar group) or a derivative thereof (for example, in which the alkali-soluble group is protected with a protective group), or together with a monomer having an alkali-soluble group (for example, a monomer that yields a structural unit (a6) described below) or a derivative thereof (for example, in which the alkali-soluble group (—OH) is protected with a protective group).

An amino-based crosslinking agent such as a glycoluril having a methylol group or alkoxymethyl group, or a melamine-based crosslinking agent is usually preferred as the crosslinking agent component, as it enables the formation of a favorable resist pattern with minimal swelling. The amount added of the crosslinking agent component is preferably within a range from 1 to 50 parts by weight, relative to 100 parts by weight of the alkali-soluble resin.

In those cases where the resist composition of the present aspect is a resist composition which forms a positive-type resist pattern in an alkali developing process (or forms a negative-type resist pattern in a solvent developing process), a resin component which generates acid upon exposure and exhibits increased polarity under the action of acid (hereafter this resin component is also referred to as "component (A1-1)") is preferably used as the component (A1). The polarity of the component (A1-1) changes upon exposure, and therefore by using the component (A1-1), excellent developing contrast can be achieved, not only in an alkali developing process, but also in a solvent developing process.

In other words, in those cases where an alkali developing process is used, the component (A1-1) is substantially insoluble in an alkali developing solution prior to exposure, but when acid is generated from the acid-generating region within the component (A1-1) (at least the structural unit (a5)) upon exposure, the action of the acid causes an increase in polarity that increases the solubility in the alkali developing solution. Accordingly, during resist pattern formation, by conducting selective exposure of a resist film formed by applying the resist composition to a substrate, the exposed portions change from being substantially insoluble in the alkali developing solution to being soluble, while the unexposed portions remain substantially insoluble in the alkali developing solution, meaning alkali developing can be used to form a positive-type resist pattern. On the other hand, in those cases where a solvent developing process is used, the component (A1-1) exhibits good solubility in an organic developing solution prior to exposure, but when acid is generated from the acid-generating region within the component (A1-1) (at least the structural unit (a5)) upon exposure, the action of the acid causes an increase in polarity that reduces the solubility in the organic developing solution. Accordingly, during resist pattern formation, by conducting selective exposure of a resist film formed by applying the resist composition to a substrate, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, thereby enabling the formation of a negative-type resist pattern.

(Structural Unit (a5))

The structural unit (a5) is a structural unit containing a group represented by general formula (a5-0-1) or general formula (a5-0-2) shown below.

[Chemical Formula 3]

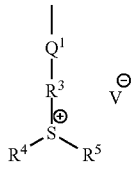

(a5-0-1)

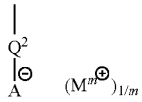

(a5-0-2)

In the formulas, each of $Q^1$ and $Q^2$ independently represents a single bond or a divalent linking group, each of $R^3$, $R^4$ and $R^5$ independently represents an organic group, and $R^4$ and $R^5$ may be bonded to each other to form a ring in combination with the sulfur atom in the formula, provided that the group —$R^3$—$S^+(R^4)(R^5)$ has a total of only one aromatic ring or has no aromatic rings, $V^-$ represents a counter anion, $A^-$ represents an organic group containing an anion, and $M^{m+}$ represents an organic cation having a valency of m, wherein m represents an integer of 1 to 3, provided that $M^{m+}$ has only one aromatic ring or has no aromatic rings.

Structural Unit Having a Group Represented by Formula (a5-0-1)

In formula (a5-0-1), $Q^1$ represents a single bond or a divalent linking group.

There are no particular limitations on the divalent linking group for $Q^1$, but examples of preferred groups include divalent hydrocarbon groups which may have a substituent, and divalent linking groups containing a hetero atom.

Divalent Hydrocarbon Group which May have a Substituent

The hydrocarbon group as the divalent linking group for $Q^1$ may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

More specific examples of the aliphatic hydrocarbon group include linear or branched aliphatic hydrocarbon groups, and aliphatic hydrocarbon groups that include a ring within the structure.

The linear or branched aliphatic hydrocarbon group preferably has 1 to 10 carbon atoms, more preferably 1 to 8 carbon atoms, and still more preferably 1 to 5 carbon atoms.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—, alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—, alkyltrimethylene groups such as —$CH(CH_3)CH_2CH_2$— and —$CH_2CH(CH_3)CH_2$—, and alkyltetramethylene groups such as —$CH(CH_3)CH_2CH_2CH_2$— and —$CH_2CH(CH_3)$ CH$_2$CH$_2$—. As the alkyl group within the alkylalkylene group, a linear alkyl group of 1 to 5 carbon atoms is preferable.

The linear or branched aliphatic hydrocarbon group may or may not have a substituent (a group or atom other than a hydrogen atom) that substitutes a hydrogen atom. Examples of the substituent include a fluorine atom, a fluorinated alkyl group of 1 to 5 carbon atoms, and an oxo group (=O).

Examples of the aliphatic hydrocarbon group that includes a ring within the structure include cyclic aliphatic hydrocarbon groups (groups in which two hydrogen atoms have been removed from an aliphatic hydrocarbon ring: alicyclic hydrocarbon groups) which may contain a hetero atom-containing substituent within the cyclic structure, groups in which an aforementioned cyclic aliphatic hydrocarbon group is bonded to the terminal of a linear or branched aliphatic hydrocarbon group, and groups in which an aforementioned cyclic aliphatic hydrocarbon group is interposed within the chain of a linear or branched aliphatic hydrocarbon group. Examples of the linear or branched aliphatic hydrocarbon group include the same groups as those mentioned above.

The cyclic aliphatic hydrocarbon group (alicyclic hydrocarbon group) preferably has 3 to 20 carbon atoms, and more preferably 3 to 12 carbon atoms.

The cyclic aliphatic hydrocarbon group (alicyclic hydrocarbon group) may be either a polycyclic group or a monocyclic group. As the monocyclic aliphatic hydrocarbon group, a group in which two hydrogen atoms have been removed from a monocycloalkane is preferred. The monocycloalkane preferably contains 3 to 6 carbon atoms, and specific examples include cyclopentane and cyclohexane. As the polycyclic aliphatic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The cyclic aliphatic hydrocarbon group (alicyclic hydrocarbon group) may or may not have a substituent (a group or atom other than a hydrogen atom) that substitutes a hydrogen atom. Examples of the substituent include an alkyl group, alkoxy group, halogen atom, halogenated alkyl group, hydroxyl group and oxo group (=O).

The alkyl group as the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferred.

Examples of the halogenated alkyl group for the substituent include groups in which part or all of the hydrogen atoms of an aforementioned alkyl group have each been substituted with an aforementioned halogen atom.

In the cyclic aliphatic hydrocarbon group, a portion of the carbon atoms that constitute the cyclic structure may be substituted with a hetero atom-containing substituent. This hetero atom-containing substituent is preferably —O—, —C(=O)—O—, —S—, —S(=O)$_2$—, or —S(=O)$_2$—O—.

The aromatic hydrocarbon group as the divalent hydrocarbon group is a divalent hydrocarbon group having at least one aromatic ring, and may also have a substituent. There are no particular limitations on the aromatic ring, provided it is a cyclic conjugated system having 4n+2 (wherein n represents 0 or a natural number) π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the divalent hydrocarbon group include groups in which two hydrogen atoms have been removed from an aromatic hydrocarbon ring or aromatic heterocyclic ring (namely, arylene groups or heteroarylene groups), groups in which two hydrogen atoms have been removed from an aromatic compound having two or more aromatic rings (such as biphenyl or fluorene), and groups in which one of the hydrogen atoms of a group having one hydrogen atom removed from an aforementioned aromatic hydrocarbon ring or aromatic heterocyclic ring (namely, an aryl group or heteroaryl group) has been substituted with an alkylene group (for example, groups in which one further hydrogen atom has been removed from the aryl group within an arylalkyl group such as a benzyl group, phenethyl group, 1-naphthylmethyl group, 2-naphthylmethyl group, 1-naphthylethyl group or 2-naphthylethyl group). The alkylene group bonded to the aryl group or heteroaryl group preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic ring of an aforementioned aromatic hydrocarbon group may be substituted with a substituent. Examples of the substituent include an alkyl group, alkoxy group, halogen atom, halogenated alkyl group, hydroxyl group and oxo group (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group have each been substituted with an aforementioned halogen atom.

Divalent Linking Group Containing a Hetero Atom

Examples of the hetero atom in the "divalent linking group containing a hetero atom" for $Q^1$ include atoms other than a carbon atom or hydrogen atom, and specific examples include an oxygen atom, nitrogen atom, sulfur atom, halogen atom, and silicon atom.

Examples of the divalent linking group containing a hetero atom include non-hydrocarbon linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, =N— and —SiH$_2$—O—, and combinations of at least one of these non-hydrocarbon linking groups with a divalent hydrocarbon group. Examples of the divalent hydrocarbon group include the same groups as those described above for the divalent hydrocarbon group which may have a substituent, although a linear or branched aliphatic hydrocarbon group is preferable.

In the above groups, an H within —NH— in —C(=O)—NH—, —NH—, —NH—C(=NH)— or —SiH$_2$—O— may be substituted with a substituent such as an alkyl group or an acyl group. The substituent preferably contains 1 to 10 carbon atoms, more preferably 1 to 8 carbon atoms, and most preferably 1 to 5 carbon atoms.

Further, examples of divalent linking groups that are a combination of a non-hydrocarbon linking group and a divalent hydrocarbon group include groups represented by —Y$^{21}$—O—Y$^{22}$—, —[Y$^{21}$—C(=O)—O]$_{m'}$—Y$^{22}$—, —Y$^{21}$—O—C(=O)—Y$^{22}$— (wherein each of Y$^{21}$ and Y$^{22}$ independently represents a divalent hydrocarbon group which may have a substituent, O represents an oxygen atom, and m' represents an integer of 0 to 3), and —[Y$^{23}$—O]$_{n'}$— (wherein Y$^{23}$ represents an alkylene group, O represents an oxygen atom, and n' is an integer of 1 or greater).

In the above formulas —Y$^{21}$—O—Y$^{22}$—, —[Y$^{21}$—C(=O)—O]$_{m'}$—Y$^{22}$— and —Y$^{21}$—O—C(=O)—Y$^{22}$—, each of Y$^{21}$ and Y$^{22}$ independently represents a divalent hydrocarbon group which may have a substituent. Examples of this divalent hydrocarbon group include the same groups as those described above for the "divalent hydrocarbon group which may have a substituent".

Y$^{21}$ is preferably a linear aliphatic hydrocarbon group, more preferably a linear alkylene group, still more preferably a linear alkylene group of 1 to 5 carbon atoms, and most preferably a methylene group or an ethylene group.

Y$^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[Y$^{21}$—C(=O)—O]$_{m'}$—Y$^{22}$—, m' represents an integer of 0 to 3, and is preferably an integer of 0 to 2, more preferably 0 or 1, and most preferably 1. In other words, the group represented by formula —[Y$^{21}$—C(=O)—O]$_{m'}$—Y$^{22}$— is most preferably a group represented by a formula —Y$^{21}$—C(=O)—O—Y$^{22}$—. Among such groups, groups represented by a formula —(CH$_2$)$_{a'}$—C(=O)—O—(CH$_2$)$_{b'}$— are particularly preferred. In this formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

The alkylene group for Y$^{23}$ in —[Y$^{23}$—O]$_{n'}$— is preferably an alkylene group of 1 to 4 carbon atoms.

Among the various possibilities, the divalent linking group for Q$^1$ is preferably a single bond, an ester linkage [—C(=O)—O-], an ether linkage (—O—), an alkylene group, or a combination thereof.

In formula (a5-0-1), each of R$^3$, R$^4$ and R$^5$ independently represents an organic group, wherein R$^4$ and R$^5$ may be bonded to each other to form a ring in combination with the sulfur atom in the formula.

The organic group for each of R$^3$ to R$^5$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

Examples of the organic group include hydrocarbon groups in which part or all of the hydrogen atoms may each be substituted with a substituent, and in which a linking group may be inserted between carbon atoms of the group. Examples of this linking group include the same groups as those mentioned above for the divalent linking group containing a hetero atom. The organic group may or may not have an aromatic group.

However, the group —R$^3$—S$^+$(R$^4$)(R$^5$) in the formula must have a total of only one aromatic ring or have no aromatic rings. In other words, in those cases where R$^4$ and R$^5$ are not bonded to each other to form a ring in combination with the sulfur atom in the formula, either one of R$^3$, R$^4$ and R$^5$ is an organic group having one aromatic ring, and the other two are organic groups that do not have an aromatic ring, or all of R$^3$, R$^4$ and R$^5$ are organic groups that do not have an aromatic ring. In those cases where R$^4$ and R$^5$ are bonded to each other to form an aromatic ring in combination with the sulfur atom in the formula, R$^3$ represents an organic group that does not have an aromatic ring. In those cases where R$^4$ and R$^5$ are bonded to each other to form a ring in combination with the sulfur atom in the formula, and the formed ring is an aliphatic ring (a ring having no aromaticity), R$^3$ may be either an organic group having one aromatic ring, or an organic group that does not have an aromatic ring. In those cases where the ring that is formed when R$^4$ and R$^5$ are bonded to each other to form a ring in combination with the sulfur atom in the formula is a cyclic structure that contains two or more aromatic rings, the resulting structural unit does not correspond with the structural unit (a5).

Aromatic rings absorb OoB light having a DUV wavelength. By ensuring that the entire structure of the group —R$^3$—S$^+$(R$^4$)(R), formed from S$^+$ and the groups R$^3$, R$^4$ and R$^5$ bonded directly thereto, contains not more than one aromatic ring, the effects of OoB light can be suppressed. In order to enhance this effect, it is particularly desirable that the entire group —R$^3$—S$^+$(R$^4$)(R$^5$) contains no aromatic rings.

There are no particular limitations on the aromatic ring, provided it is a cyclic conjugated system having 4n+2 (wherein n represents 0 or a natural number) π electrons, and examples include the same aromatic rings as those mentioned above within the description of the divalent hydrocarbon group. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic ring include an oxygen atom, a sulfur atom and a nitrogen atom. Specific examples of the aromatic heterocyclic rings include a pyridine ring and a thiophene ring.

A substituent may be bonded to the aromatic ring. Examples of this substituent include the same substituents as those mentioned above, within the description of the divalent hydrocarbon group, as substituents which the aromatic hydrocarbon group may have.

In formula (a5-0-1), the organic group for $R^3$ is preferably an alkylene group which may have a substituent, or an arylene group which may have a substituent.

Examples of the alkylene group which may have a substituent for $R^3$ include unsubstituted alkylene groups, and substituted alkylene groups in which part or all of the hydrogen atoms of an unsubstituted alkylene group have each been substituted with a substituent.

The unsubstituted alkylene group may be linear, branched or cyclic. From the viewpoint of achieving superior resolution, an alkylene group of 1 to 10 carbon atoms is preferred, and an alkylene group of 1 to 5 carbon atoms is more preferred. Specific examples include a methylene group, ethylene group, n-propylene group, isopropylene group, n-butylene group, isobutylene group, n-pentylene group, cyclopentylene group, hexylene group, cyclohexylene group, nonylene group and decylene group.

Examples of the substituent within the substituted alkylene group include a halogen atom, oxo group (=O), cyano group, alkyl group, alkoxyalkyloxy group, alkoxycarbonylalkyloxy group, —C(=O)—O—$R^{7\prime\prime}$, —O—C(=O)—$R^{8\prime\prime}$, —O—$R^{9\prime\prime}$, and aryl group. Each of $R^{7\prime\prime}$, $R^{8\prime\prime}$ and $R^{9\prime\prime}$ independently represents a hydrogen atom or a hydrocarbon group.

Among these, examples of the halogen atom as the substituent include a fluorine atom, chlorine atom, iodine atom and bromine atom, and a fluorine atom is preferred.

The alkyl group for the substituent within the substituted alkylene group may be linear, branched or cyclic. The alkyl group preferably contains 1 to 30 carbon atoms.

Of such alkyl groups, the linear alkyl group preferably has 1 to 20 carbon atoms, more preferably 1 to 15 carbon atoms, and still more preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched alkyl group preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The cyclic alkyl group may be either monocyclic or polycyclic. The cyclic alkyl group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The cyclic alkyl group is preferably a polycyclic group, is more preferably a group in which one or more hydrogen atoms have been removed from a polycycloalkane, and is most preferably a group in which one or more hydrogen atoms have been removed from adamantane.

The alkyl group for the substituent is preferably an alkyl group of 1 to 5 carbon atoms, and is most preferably a methyl group, ethyl group, propyl group, n-butyl group or tert-butyl group.

Examples of the alkoxyalkyloxy group for the substituent within the substituted alkylene group include groups represented by a general formula shown below.

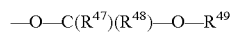

—O—C($R^{47}$)($R^{48}$)—O—$R^{49}$

In this formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ is a hydrogen atom. It is particularly desirable that one of $R^{47}$ and $R^{48}$ is a hydrogen atom, and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and specific examples include a methyl group, ethyl group, propyl group, n-butyl group and tert-butyl group.

The cyclic alkyl group for $R^{49}$ preferably has 4 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Examples of the alkoxycarbonylalkyloxy group for the substituent within the aforementioned substituted alkylene group include groups represented by a general formula shown below.

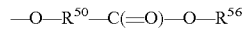

—O—$R^{50}$—C(=O)—O—$R^{56}$

In this formula, $R^{50}$ represents a linear or branched alkylene group, and $R^{56}$ represents a tertiary alkyl group.

The linear or branched alkylene group for $R^{50}$ preferably has 1 to 5 carbon atoms, and specific examples include a methylene group, ethylene group, trimethylene group, tetramethylene group and 1,1-dimethylethylene group.

Examples of the tertiary alkyl group for $R^{56}$ include a 2-methyl-2-adamantyl group, 2-(2-propyl)-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

Moreover, groups in which $R^{56}$ in the above general formula —O—$R^{50}$—C(=O)—O—$R^{56}$ has been substituted with $R^{56'}$ may also be used. $R^{56'}$ represents a hydrogen atom, an alkyl group, a fluorinated alkyl group, or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which part or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which one or more hydrogen atoms within an aliphatic cyclic group have been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

Specific examples of the aliphatic cyclic group for $R^{56'}$ containing a hetero atom in the ring structure include groups represented by formulas (L1) to (L5) and (S1) to (S4) described below.

For $R^{56'}$, specific examples of the groups in which a hydrogen atom within an aliphatic cyclic group has been substituted with a hetero atom include groups in which two hydrogen atoms within an aliphatic cyclic group have been substituted with an oxo group (=O).

$R^{7''}$ in —C(=O)—O—$R^{7''}$ represents a hydrogen atom or a hydrocarbon group.

The hydrocarbon group for $R^{7''}$ may be an aliphatic hydrocarbon group or an aromatic hydrocarbon group. The aliphatic hydrocarbon group may be either a saturated hydrocarbon group or an unsaturated hydrocarbon group.

The saturated hydrocarbon group for $R^{7''}$ may be linear, branched or cyclic, or a combination thereof.

The linear or branched saturated hydrocarbon group preferably has 1 to 25 carbon atoms, more preferably 1 to 15 carbon atoms, and still more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group include the tertiary alkyl groups described above for $R^{56}$. Further, examples of branched saturated hydrocarbon groups other than tertiary alkyl groups include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxo group (=O), cyano group and carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group for $R^{7''}$ preferably contains 3 to 20 carbon atoms. The cyclic saturated hydrocarbon group may be either a polycyclic group or a monocyclic group, and examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, part of the carbon atoms that constitute a ring within the cyclic saturated hydrocarbon group may be substituted with a hetero atom, or a hydrogen atom bonded to a ring within the cyclic saturated hydrocarbon may be substituted with a substituent.

Examples of the former case include groups in which one or more hydrogen atoms have been removed from a heterocycloalkane in which part of the carbon atoms that constitute the ring(s) of an aforementioned monocycloalkane or polycycloalkane have been substituted with a hetero atom such as an oxygen atom, sulfur atom or nitrogen atom. Further, the ring structure may contain an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a lactone ring-containing bicycloalkane, tricycloalkane or tetracycloalkane.

In the latter case, examples of the substituent include the same substituents as those described above for the linear or branched saturated hydrocarbon group, and alkyl groups of 1 to 5 carbon atoms.

Further, the saturated hydrocarbon group for $R^{7''}$ may be a combination of a linear or branched saturated hydrocarbon group and a cyclic saturated hydrocarbon group.

Examples of combinations of a linear or branched saturated hydrocarbon group and a cyclic saturated hydrocarbon group include groups in which a cyclic saturated hydrocarbon group is bonded as a substituent to a linear or branched saturated hydrocarbon group (such as a 1-(1-adamantyl)methyl group), and groups in which a linear or branched saturated hydrocarbon group is bonded as a substituent to a cyclic saturated hydrocarbon group.

The aliphatic unsaturated hydrocarbon group for $R^{7''}$ is preferably a linear or branched group. Examples of the linear aliphatic unsaturated hydrocarbon group include a vinyl group, propenyl group (allyl group), and butynyl group. Examples of the branched aliphatic unsaturated hydrocarbon group include a 1-methylpropenyl group and 2-methylpropenyl group. These linear or branched aliphatic unsaturated hydrocarbon groups may have a substituent. Examples of the substituent include the same substituents as those described above for the linear or branched saturated hydrocarbon group.

The aromatic hydrocarbon group for $R^{7\prime\prime}$ is a monovalent hydrocarbon group having at least one aromatic ring, and may also have a substituent.

There are no particular limitations on the aromatic ring, provided it is a cyclic conjugated system having 4n+2 (wherein n represents 0 or a natural number) π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. However, this preferred number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic ring include an oxygen atom, a sulfur atom and a nitrogen atom. Specific examples of the aromatic heterocyclic ring include a pyridine ring and a thiophene ring.

Specific examples of the aromatic hydrocarbon group include groups in which one hydrogen atom has been removed from an aromatic hydrocarbon ring or aromatic heterocyclic ring (namely, aryl groups or heteroaryl groups), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group, and heteroarylalkyl groups). The alkylene group that substitutes the hydrogen atom of an aforementioned aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group may or may not have a substituent. However, in the present invention, in order to ensure that the total number of aromatic rings in the group $-R^3-S^+(R^4)(R^5)$ is not more than one, in those cases where the substituent within the substituted alkylene group is $-C(=O)-O-R^{7\prime\prime}$, and $R^{7\prime\prime}$ represents an aromatic hydrocarbon group, any substituents on the aromatic hydrocarbon group must be non-aromatic substituents. The term "non-aromatic" means having no aromaticity. The non-aromatic substituent may be any group not having an aromatic group (such as an aromatic hydrocarbon group) within the structure, and examples include an alkyl group, alkoxy group, halogen atom, halogenated alkyl group, hydroxyl group and oxo group (=O).

The alkyl group for this substituent is preferably an alkyl group of 1 to 5 carbon atoms, and is most preferably a methyl group, ethyl group, propyl group, n-butyl group or tert-butyl group.

The alkoxy group for this substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferred.

Examples of the halogenated alkyl group for the substituent include groups in which part or all of the hydrogen atoms of an aforementioned alkyl group have each been substituted with an aforementioned halogen atom.

Of the various possibilities described above, from the viewpoints of achieving superior lithography properties and a favorable resist pattern shape, $R^{7\prime\prime}$ is preferably a hydrogen atom, a saturated hydrocarbon group or an aliphatic unsaturated hydrocarbon group, and is more preferably a hydrogen atom, a linear or branched saturated hydrocarbon group of 1 to 15 carbon atoms, or a cyclic saturated hydrocarbon group of 3 to 20 carbon atoms.

$R^{8\prime\prime}$ in $-O(C=O)-R^{8\prime\prime}$ represents a hydrogen atom or a hydrocarbon group.

Specific examples for $R^{8\prime\prime}$ include the same groups as those mentioned above for $R^{7\prime\prime}$. Among the various possibilities, from the viewpoints of achieving superior lithography properties and a favorable resist pattern shape, $R^{8\prime\prime}$ is preferably a hydrogen atom, a saturated hydrocarbon group or an aliphatic unsaturated hydrocarbon group, and is more preferably a hydrogen atom, a linear or branched saturated hydrocarbon group of 1 to 15 carbon atoms, or a cyclic saturated hydrocarbon group of 3 to 20 carbon atoms.

$R^{9\prime\prime}$ in $-O-R^{9\prime\prime}$ represents a hydrogen atom or a hydrocarbon group.

Specific examples for $R^{9\prime\prime}$ include the same groups as those mentioned above for $R^{7\prime\prime}$. Among the various possibilities, from the viewpoints of achieving superior lithography properties and a favorable resist pattern shape, $R^{9\prime\prime}$ is preferably a hydrogen atom, a saturated hydrocarbon group or an aliphatic unsaturated hydrocarbon group, and is more preferably a hydrogen atom, a linear or branched saturated hydrocarbon group of 1 to 15 carbon atoms, or a cyclic saturated hydrocarbon group of 3 to 20 carbon atoms.

The group $-O-R^{9\prime\prime}$ that functions as an aforementioned non-aromatic substituent is preferably a hydroxyl group or an alkoxy group of 1 to 5 carbon atoms, and is most preferably a methoxy group, ethoxy group, n-propoxy group, iso-propoxy group, n-butoxy group or tert-butoxy group.

The aryl group for the substituent within the aforementioned substituted alkylene group is preferably an aryl group of 6 to 10 carbon atoms, because such groups enable lower cost synthesis. Specific examples include a phenyl group and a naphthyl group. However, in the present invention, in order to ensure that the total number of aromatic rings in the group $-R^3-S^+(R^4)(R^5)$ is not more than one, in those cases where $R^3$ is a substituted alkylene group, and the substituted alkylene group has an aryl group as a substituent, the number of aryl groups that may exist in the substituent is one.

This aryl group for the substituent may itself have a substituent. However, in the present invention, in order to ensure that the total number of aromatic rings in the group $-R^3-S^+(R^4)(R^5)$ is not more than one, the substituent of this aryl group substituent must be a non-aromatic substituent. Examples of this non-aromatic substituent may be any substituent that does not have an aromatic group (such as an aromatic hydrocarbon) within the structure, and examples include the same non-aromatic substituents as those mentioned above for the aromatic hydrocarbon group for $R^{7\prime\prime}$.

In formula (a5-0-1), examples of the arylene group which may have a substituent for $R^3$ include unsubstituted arylene groups of 6 to 20 carbon atoms, and substituted arylene groups in which part or all of the hydrogen atoms within such an unsubstituted arylene group have each been substituted with a substituent.

The unsubstituted arylene group is preferably an arylene group of 6 to 10 carbon atoms, because such groups enable lower cost synthesis. Specific examples include a phenylene group and a naphthylene group.

Examples of the substituent in the "substituted arylene group" include the same substituents as those mentioned above for the substituent in the aforementioned substituted alkylene group. However, in the present invention, in order to ensure that the total number of aromatic rings among $R^3$, $R^4$ and $R^5$ is not more than one, in those cases where $R^3$ is a substituted arylene group, the substituent of this arylene group must be a non-aromatic substituent. The non-aromatic substituent may be any substituent that does not contain an aromatic group (such as an aromatic hydrocarbon group) within the structure. Specific examples of suitable substituents among those mentioned above as the substituent for the substituted alkylene group include a halogen atom, oxo group (=O), cyano group, alkyl group, alkoxyalkyloxy group, alkoxycarbonylalkyloxy group, —C(=O)—O—$R^{7'''}$, —O—C(=O)—$R^{8'''}$, and —O—$R^{9'''}$ (wherein each of $R^{7'''}$, $R^{8'''}$ and $R^{9'''}$ independently represents a hydrogen atom, a saturated hydrocarbon group, or an aliphatic unsaturated hydrocarbon group).

In formula (a5-0-1), there are no particular limitations on the organic groups for $R^4$ and $R^5$, and examples include aryl groups which may have a substituent, alkyl groups which may have a substituent, and alkenyl groups which may have a substituent. Among these, an aryl group which may have a substituent or an alkyl group which may have a substituent is preferred, and an alkyl group which may have a substituent is particularly desirable.

Examples of the aryl group which may have a substituent include unsubstituted aryl groups of 6 to 20 carbon atoms, and substituted aryl groups in which part or all of the hydrogen atoms of such an unsubstituted aryl group have each been substituted with a substituent.

The unsubstituted aryl group is preferably an aryl group of 6 to 10 carbon atoms, because such groups enable lower cost synthesis. Specific examples include a phenyl group and a naphthyl group.

Examples of the substituent in the substituted aryl group include non-aromatic substituents. Specific examples of these non-aromatic substituents include the same non-aromatic substituents as those mentioned above for the substituent for the aforementioned substituted arylene group.

Examples of the alkyl group for $R^4$ and $R^5$ include unsubstituted alkyl groups, and substituted alkyl groups in which part or all of the hydrogen atoms of such an unsubstituted alkyl group have each been substituted with a substituent.

In terms of achieving superior resolution, the unsubstituted alkyl group is preferably an alkyl group of 1 to 5 carbon atoms.

The unsubstituted alkyl group may be a linear, branched or cyclic group. From the viewpoint of achieving superior resolution, an alkyl group of 1 to 10 carbon atoms is preferred, and an alkyl group of 1 to 5 carbon atoms is more preferable. Specific examples include a methyl group, ethyl group, n-propyl group, isopropyl group, n-butyl group, isobutyl group, n-pentyl group, cyclopentyl group, hexyl group, cyclohexyl group, nonyl group and decyl group.

Examples of the substituent in the substituted alkyl group include the same substituents as those mentioned above for the substituent in the substituted alkylene group for $R^3$.

Examples of the alkenyl group for $R^4$ and $R^5$ include unsubstituted alkenyl groups, and substituted alkenyl groups in which part or all of the hydrogen atoms of such an unsubstituted alkenyl group have each been substituted with a substituent.

The unsubstituted alkenyl group is preferably a linear or branched group, and preferably contains 2 to 10 carbon atoms, more preferably 2 to 5 carbon atoms, and still more preferably 2 to 4 carbon atoms. Specific examples include a vinyl group, propenyl group (allyl group), butenyl group, 1-methylpropenyl group, and 2-methylpropenyl group.

Examples of the substituent in the substituted alkenyl group include the same substituents as those mentioned above for the substituent in the substituted alkylene group for $R^3$.

In formula (a5-0-1), $R^4$ and $R^5$ may be bonded to each other to form a ring in combination with the sulfur atom in the formula. The resulting ring may be saturated or unsaturated. Further, the ring may be monocyclic or polycyclic. For example, in those cases where one or both of $R^4$ and $R^5$ is a cyclic group (a cyclic alkyl group or aryl group), bonding $R^4$ and $R^5$ together forms a polycyclic ring structure (condensed ring structure).

The ring that is formed, which includes the sulfur atom in the formula within the ring structure, is preferably a 3- to 10-membered ring, and more preferably a 5- to 7-membered ring, including the sulfur atom.

The ring may include, among the atoms that constitute the ring structure, a hetero atom other than the sulfur atom that is bonded to $R^4$ and $R^5$. Examples of this hetero atom include a sulfur atom, an oxygen atom, and a nitrogen atom.

Specific examples of the ring that is formed include a thiophene ring, thiazole ring, benzothiophene ring, tetrahydrothiophenium ring and tetrahydrothiopyranium ring.

In formula (a5-0-1), V$^-$ represents a counter anion.

There are no particular limitations on the counter anion for V$^-$, and for example, any of the conventional anions known as anions for onium salt acid generators may be used.

Examples of V$^-$ include anions represented by general formula $R^{4'''}SO_3^-$ (wherein $R^{4'''}$ represents a linear, branched or cyclic alkyl group, a halogenated alkyl group, an aryl group or an alkenyl group, and any of these groups may have a substituent).

In the aforementioned general formula $R^{4'''}SO_3^-$, $R^{4'''}$ represents a linear, branched or cyclic alkyl group, a halogenated alkyl group, an aryl group or an alkenyl group, wherein the group may have a substituent.

The linear or branched alkyl group for the aforementioned $R^{4'''}$ preferably has 1 to 10 carbon atoms, more preferably 1 to 8 carbon atoms, and most preferably 1 to 4 carbon atoms.

The cyclic alkyl group for the aforementioned $R^{4'''}$ preferably has 4 to 15 carbon atoms, more preferably 4 to 10 carbon atoms, and most preferably 6 to 10 carbon atoms.

When $R^{4'''}$ represents an alkyl group, examples of "$R^{4'''}SO_3^-$" include alkylsulfonates such as methanesulfonate, n-propanesulfonate, n-butanesulfonate, n-octanesulfonate, 1-adamantanesulfonate, 2-norbornanesulfonate and d-camphor-10-sulfonate.

The halogenated alkyl group for $R^{4'''}$ is an alkyl group in which part or all of the hydrogen atoms within the group have each been substituted with a halogen atom. The alkyl group is preferably an alkyl group of 1 to 5 carbon atoms, is more preferably a linear or branched alkyl group, and is most preferably a methyl group, ethyl group, propyl group, isopropyl group, n-butyl group, tert-butyl group, tert-pentyl group, or isopentyl group. Examples of the halogen atom which substitutes the hydrogen atoms include a fluorine atom, chlorine atom, iodine atom and bromine atom.

In the halogenated alkyl group, it is preferable that 50 to 100% of all the hydrogen atoms within the alkyl group (prior to halogenation) are substituted with halogen atoms, and groups in which all of the hydrogen atoms have been substituted with halogen atoms are particularly desirable.

As the halogenated alkyl group, a fluorinated alkyl group is preferable. The fluorinated alkyl group preferably contains 1 to 10 carbon atoms, more preferably 1 to 8 carbon atoms, and most preferably 1 to 4 carbon atoms.

Furthermore, the fluorination ratio of the fluorinated alkyl group is preferably within a range from 10 to 100%, and more preferably from 50 to 100%. Groups in which all of the hydrogen atoms have been substituted with fluorine atoms are particularly desirable because the acid strength increases.

Specific examples of such fluorinated alkyl groups include a trifluoromethyl group, heptafluoro-n-propyl group and nonafluoro-n-butyl group.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part or all of the hydrogen atoms within the aforementioned linear, branched or cyclic alkyl group, halogenated alkyl group, aryl group or alkenyl group may each be substituted with a substituent (an atom other than a hydrogen atom, or a group).

$R^{4'''}$ may have one substituent, or two or more substituents.

Examples of the substituent include a halogen atom, a hetero atom, an alkyl group, and a group represented by the formula $X^3$-Q'- (wherein Q' represents a divalent linking group containing an oxygen atom, and $X^3$ represents a hydrocarbon group of 3 to 30 carbon atoms which may have a substituent).

Examples of the halogen atom and the alkyl group include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X^3$-Q'-, Q' represents a divalent linking group containing an oxygen atom.

Q' may contain an atom other than the oxygen atom. Examples of these atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (ether linkage: —O—), an ester linkage (—C(=O)—O—), an amide linkage (—C(=O)—NH—), a carbonyl linkage (—C(=O)—) and a carbonate linkage (—O—C(=O)—O—); and combinations of these non-hydrocarbon, oxygen atom-containing linking groups with an alkylene group. Furthermore, the combinations may have a sulfonyl group (—SO$_2$—) bonded thereto.

Specific examples of these combinations include —R$^{91}$—O—, —R$^{92}$—O—C(=O)—, —C(=O)—O—R$^{93}$—O—C(=O)—, —SO$_2$—O—R$^{94}$—O—C(=O)— and —R$^{95}$—SO$_2$—O—R$^{94}$—O—C(=O)— (wherein each of R$^{91}$ to R$^{95}$ independently represents an alkylene group).

The alkylene group for R$^{91}$ to R$^{95}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

Q' is preferably a divalent linking group containing an ester linkage or an ether linkage, and is more preferably a group represented by —R$^{91}$—O—, —R$^{92}$—O—C(=O)— or —C(=O)—O—R$^{93}$—O—C(=O)—.

In the group represented by the formula $X^3$-Q'-, the hydrocarbon group for $X^3$ may be either an aromatic hydrocarbon group or an aliphatic hydrocarbon group.

The aromatic hydrocarbon group for $X^3$ is a hydrocarbon group having at least one aromatic ring.

There are no particular limitations on the aromatic ring, provided it is a cyclic conjugated system having 4n+2 (wherein n represents 0 or a natural number) it electrons, and the aromatic ring may be either monocyclic or polycyclic. The aromatic ring preferably has 5 to 30 carbon atoms, more preferably 5 to 20 carbon atoms, still more preferably 6 to 15 carbon atoms, and most preferably 6 to 12 carbon atoms. Here, this number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for $X^3$ include groups in which one hydrogen atom has been removed from an aromatic hydrocarbon ring or aromatic heterocyclic ring (namely, aryl groups or heteroaryl groups), groups in which one hydrogen atom has been removed from an aromatic compound having two or more aromatic rings (such as biphenyl or fluorene), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group, and heteroarylalkyl groups). The alkylene group that substitutes the hydrogen atom of an aforementioned aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group for $X^3$ may have a substituent. For example, a hydrogen atom bonded to the aromatic ring within the aromatic hydrocarbon group may be substituted with a substituent. Examples of this substituent include an alkyl group, alkoxy group, halogen atom, halogenated alkyl group, hydroxyl group and oxygen atom (=O).

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

When $X^3$ includes an aromatic ring, there is preferably only one aromatic ring within the entire $X^3$ group. When $X^3$ includes an aromatic ring, it is preferable that $R^3$, $R^4$ and $R^5$ do not have an aromatic ring.

The aliphatic hydrocarbon group for $X^3$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $X^3$, part of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on this "hetero atom" in $X^3$, as long as it is an atom other than a carbon atom or a hydrogen atom, and examples include a halogen atom, an oxygen atom, a sulfur atom and a nitrogen atom.

Examples of the halogen atom include a fluorine atom, chlorine atom, iodine atom and bromine atom.

The substituent containing a hetero atom may consist solely of the hetero atom, or may be a group that also contains an atom or group of atoms in addition to the hetero atom.

Specific examples of the substituent for substituting part of the carbon atoms include —O—, —C(=O)—O—, —C(=O)—, —O—C(=O)—O—, —C(=O)—NH—, —NH— (wherein H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent for substituting part or all of the hydrogen atoms include an alkoxy group, halogen atom, halogenated alkyl group, hydroxyl group, oxygen atom (=O) and cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, chlorine atom, bromine atom and iodine atom, and a fluorine atom is preferable.

Examples of the aforementioned halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, propenyl group (allyl group) and butynyl group. Examples of branched monovalent unsaturated hydrocarbon groups include a 1-methylpropenyl group and a 2-methylpropenyl group.

Among the above examples, the unsaturated hydrocarbon group is most preferably a propenyl group.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 4]

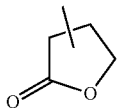 (L1)

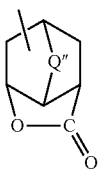 (L2)

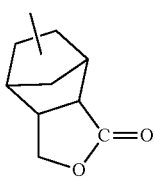 (L3)

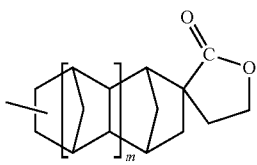 (L4)

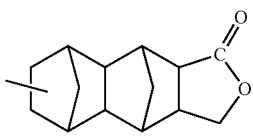 (L5)

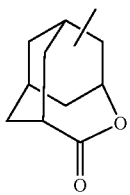 (L6)

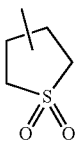 (S1)

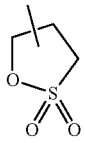 (S2)

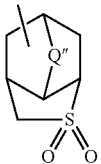 (S3)

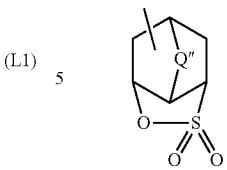 (S4)

In the formulas, Q″ represents an alkylene group of 1 to 5 carbon atoms, —O—, —S—, —O—$R^{94'}$— or —S—$R^{95'}$—, wherein each of $R^{94'}$ and $R^{95'}$ independently represents an alkylene group of 1 to 5 carbon atoms, and m represents an integer of 0 or 1.

Examples of the alkylene groups for Q″, $R^{94'}$ and $R^{95'}$ include the same alkylene groups as those described above for $R^{91}$ to $R^{95}$.

In these aliphatic cyclic groups, part of the hydrogen atoms bonded to the carbon atoms that constitute the ring structure may be substituted with a substituent. Examples of the substituent include an alkyl group, alkoxy group, halogen atom, halogenated alkyl group, hydroxyl group and oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting part or all of the hydrogen atoms that constitute the aliphatic hydrocarbon group for $X^3$.

In the present invention, $X^3$ is preferably a cyclic group which may have a substituent. The cyclic group may be either an aromatic hydrocarbon group which may have a substituent, or an aliphatic cyclic group which may have a substituent, and an aliphatic cyclic group which may have a substituent is preferable.

The aromatic hydrocarbon group is preferably a naphthyl group which may have a substituent, or a phenyl group which may have a substituent.

The aliphatic cyclic group which may have a substituent is preferably a polycyclic aliphatic cyclic group which may have a substituent. As this polycyclic aliphatic cyclic group, groups in which one or more hydrogen atoms have been removed from an aforementioned polycycloalkane, and groups represented by the above formulas (L2) to (L6), and (S3) and (S4) are preferable.

Among these examples, $R^{4'''}$ is preferably a halogenated alkyl group or a group having $X^3$-Q′— as a substituent.

When the $R^{4'''}$ group has $X^3$-Q′— as a substituent, $R^{4'''}$ is preferably a group represented by the formula $X^3$-Q′-$Y^3$— (wherein Q′ and $X^3$ are the same as defined above, and $Y^3$ represents an alkylene group of 1 to 4 carbon atoms which may have a substituent, or a fluorinated alkylene group of 1 to 4 carbon atoms which may have a substituent).

In the group represented by the formula $X^3$-Q′-$Y^3$—, examples of the alkylene group represented by $Y^3$ include those alkylene groups described above for Q′ in which the number of carbon atoms is within a range from 1 to 4.

Examples of the fluorinated alkylene group for $Y^3$ include groups in which part or all of the hydrogen atoms of an aforementioned alkylene group have each been substituted with a fluorine atom.

Specific examples of $Y^3$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2$ —CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^3$ is preferably a fluorinated alkylene group, and most preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of groups represented by formula R$^{4\prime\prime}$SO$_3^-$ in which R$^{4\prime\prime}$ represents X$^3$-Q'-Y$^3$— include anions represented by the following formulas (b1) to (b9).

[Chemical Formula 5]

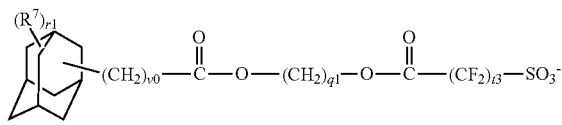
(b1)

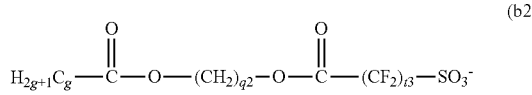
(b2)

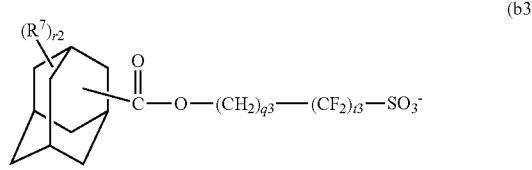
(b3)

-continued

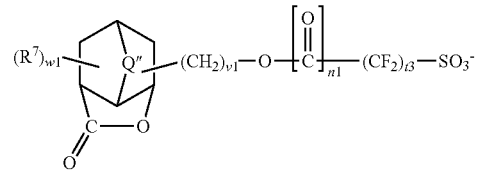
(b4)

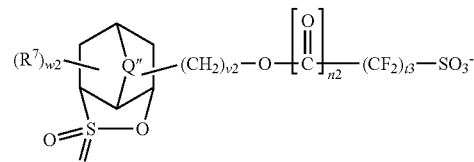
(b5)

[Chemical Formula 6]

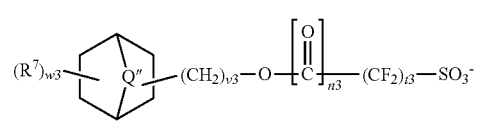
(b6)

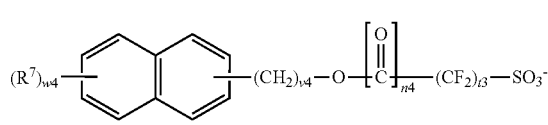
(b7)

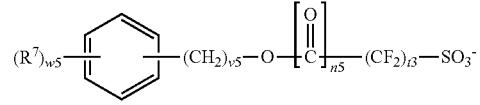
(b8)

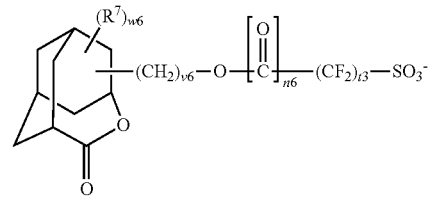
(b9)

In the above formulas, each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, R$^7$ represents a substituent, each of n1 to n6 independently represents 0 or 1, each of v0 to v6 independently represents an integer of 0 to 3, each of w1 to w6 independently represents an integer of 0 to 3, and Q" is the same as defined above.

Examples of the substituent for R$^7$ include the same groups as those mentioned above, within the description relating to X$^3$, as substituents that may substitute part of the hydrogen atoms bonded to the carbon atoms that constitute the ring structure of an aliphatic cyclic group, or as substituents that may substitute the hydrogen atoms bonded to an aromatic ring within an aromatic hydrocarbon group.

If there are two or more of the R$^7$ group, as indicated by the value of the subscript (r1, r2, or w1 to w6) appended to R$^7$, then the plurality of R$^7$ groups within the compound may be the same or different.

Examples of V$^-$ in the aforementioned formula (a5-0-1) include anions represented by general formula (b-3) shown below, and anions represented by general formula (b-4) shown below.

[Chemical Formula 7]

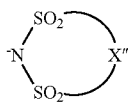
(b-3)

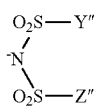
(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

In formula (b-3), X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In formula (b-4), each of Y" and Z" independently represents a linear or branched alkyl group in which at least one hydrogen atom has been substituted with a fluorine atom, wherein the alkyl group preferably has 1 to 10 carbon atoms, more preferably 1 to 7 carbon atoms, and most preferably 1 to 3 carbon atoms.

The smaller the number of carbon atoms in the alkylene group for X" or the alkyl group for Y" and Z" within the aforementioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or an electron beam is improved.

The amount of fluorine atoms within the alkylene group or alkyl group, namely, the fluorination ratio, is preferably within a range from 70 to 100%, and more preferably from 90 to 100%. A perfluoroalkylene or perfluoroalkyl group in which all the hydrogen atoms have been substituted with fluorine atoms is the most desirable.

V⁻ in formula (a5-0-1) is preferably an anion represented by general formula $R^{4''}SO_3^-$ (and in particular, an anion of one of the above formulas (b1) to (b9), which represent anions in which $R^{4''}$ is a group represented by $X^3\text{-}Q'\text{-}Y^3$—).

Specific examples of the group represented by formula (a5-0-1) are shown below. In the chemical formulas shown below, V⁻ is the same as defined above.

[Chemical Formula 8]

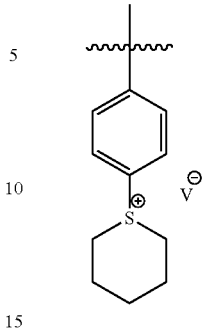 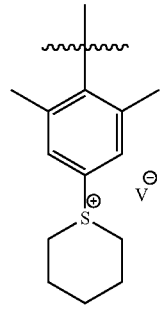

Although there are no particular limitations on the structural unit having a group represented by the aforementioned general formula (a5-0-1) (hereafter referred to as "structural unit (a5-1)"), provided that the structural unit includes a group represented by general formula (a5-0-1) within the structure, a structural unit derived from a compound having an ethylenic double bond is preferable.

Here, "a structural unit derived from a compound having an ethylenic double bond" describes a structural unit having a structure formed by cleavage of the ethylenic double bond in the compound having the ethylenic double bond, resulting in the formation of a single bond.

Examples of compounds having an ethylenic double bond include acrylic acid or an ester thereof in which the hydrogen atom bonded to the carbon atom on the α-position may be substituted with a substituent, acrylamide or a derivative thereof in which the hydrogen atom bonded to the carbon atom on the α-position may be substituted with a substituent, vinyl aromatic compounds in which the hydrogen atom bonded to the carbon atom on the α-position may be substituted with a substituent, cycloolefins and derivatives thereof, and vinyl sulfonates.

Among these compounds, acrylic acid or an ester thereof in which the hydrogen atom bonded to the carbon atom on the α-position may be substituted with a substituent, acrylamide or a derivative thereof in which the hydrogen atom bonded to the carbon atom on the α-position may be substituted with a substituent, and vinyl aromatic compounds in which the hydrogen atom bonded to the carbon atom on the α-position may be substituted with a substituent are preferred.

The term "acrylate ester" describes a compound in which the terminal hydrogen atom of the carboxyl group of acrylic acid ($CH_2$=CH—COOH) has been substituted with an organic group.

In the present description, an acrylic acid or acrylate ester in which the hydrogen atom bonded to the carbon atom on the α-position is substituted with a substituent may also be referred to as an "α-substituted acrylic acid" or "α-substituted acrylate ester" respectively. Further, the generic term "(α-substituted) acrylic acid" may be used to describe either or both acrylic acid and the α-substituted acrylic acid, and the generic term "(α-substituted) acrylate ester" may be used to describe either or both of the acrylate ester and the α-substituted acrylate ester.

Examples of the substituent bonded to the carbon atom on the α-position in an α-substituted acrylic acid or ester thereof include a halogen atom, an alkyl group of 1 to 5 carbon atoms, a halogenated alkyl group of 1 to 5 carbon atoms and a hydroxyalkyl group. Unless specified otherwise, the α-position (the carbon atom on the α-position) of a structural unit derived from an acrylate ester refers to the carbon atom having the carbonyl group bonded thereto.

Examples of the halogen atom for the α-position substituent include a fluorine atom, chlorine atom, bromine atom and iodine atom.

Specific examples of the alkyl group of 1 to 5 carbon atoms for the α-position substituent include linear and branched alkyl groups such as a methyl group, ethyl group, propyl group, isopropyl group, n-butyl group, isobutyl group, tert-butyl group, pentyl group, isopentyl group and neopentyl group.

Further, specific examples of the halogenated alkyl group of 1 to 5 carbon atoms for the α-position substituent include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

The hydroxyalkyl group for the α-position substituent is preferably a hydroxyalkyl group of 1 to 5 carbon atoms, and specific examples include groups in which part or all of the hydrogen atoms of an aforementioned alkyl group of 1 to 5 carbon atoms have each been substituted with a hydroxyl group.

In the present invention, a hydrogen atom, an alkyl group of 1 to 5 carbon atoms or a halogenated alkyl group of 1 to 5 carbon atoms is preferably bonded to the carbon atom on the α-position of the (α-substituted) acrylic acid or ester thereof, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

The term "organic group" describes a group which contains a carbon atom, and may also contain atoms other than the carbon atom (such as a hydrogen atom, oxygen atom, nitrogen atom, sulfur atom or halogen atom (such as a fluorine atom or chlorine atom) or the like).

There are no particular limitations on the organic group of the (α-substituted) acrylate ester, and examples include characteristic groups such as the aromatic groups and polarity altering groups described above and the acid-decomposable groups described below, and characteristic group-containing groups containing one of these characteristic groups within the structure. Examples of the characteristic group-containing groups include groups in which a characteristic group mentioned above is bonded to a divalent linking group. Examples of the divalent linking group include the same groups as those described above for the divalent linking group for $Q^1$ in formula (a5-0-1).

Examples of the "acrylamide or derivative thereof" include acrylamides in which the hydrogen atom bonded to the carbon atom on the α-position may be substituted with a substituent (hereafter also referred to as (α-substituted) acrylamides), and compounds in which one or both of the terminal hydrogen atoms of the amino group of an α-substituted) acrylamide have each been substituted with a substituent.

Examples of the substituent which may be bonded to the carbon atom on the α-position in an acrylamide or derivative thereof include the same groups as those mentioned above as the substituent bonded to the carbon atom on the α-position in an aforementioned α-substituted acrylate ester.

The substituents that substitute one or both of the terminal hydrogen atoms of the amino group of an (α-substituted) acrylamide are preferably organic groups. There are no particular limitations on these organic groups, and examples include the same organic groups as those in an (α-substituted) acrylate ester.

Examples of compounds in which one or both of the terminal hydrogen atoms of the amino group of an (α-substituted) acrylamide have been substituted with a substituent include, for example, compounds in which the —C(=O)—O— group bonded to the α-position carbon atom in an (α-substituted) acrylate ester has been substituted with —C(=O)—N($R^b$)— (wherein $R^b$ represents a hydrogen atom or an alkyl group of 1 to 5 carbon atoms).

In the above formula, the alkyl group for $R^b$ is preferably a linear or branched group.

A "vinyl aromatic compound" describes a compound having an aromatic ring and one vinyl group bonded to that aromatic ring, and examples include styrene or a derivative thereof, and vinylnaphthalene or a derivative thereof.

Examples of the substituent which may be bonded to the carbon atom on the α-position of the vinyl aromatic compound (namely, the carbon atom, among the carbon atoms of the vinyl group, that is bonded to the aromatic ring) include the same groups as those mentioned above as the substituent bonded to the carbon atom on the α-position in an aforementioned α-substituted acrylate ester.

Hereafter, the term "(α-substituted) vinyl aromatic compound" may be used to describe a vinyl aromatic compound in which the hydrogen atom bonded to the carbon atom on the α-position may be substituted with a substituent.

Examples of "styrene or a derivative thereof" include styrenes in which the hydrogen atom bonded to the carbon atom on the α-position may be substituted with a substituent, and in which the hydrogen atoms bonded to the benzene ring may each be substituted with a substituent other than a hydroxyl group (hereafter also referred to as "(α-substituted) styrene"), hydroxystyrenes in which the hydrogen atom bonded to the carbon atom on the α-position may be substituted with a substituent, and in which the hydrogen atoms bonded to the benzene ring may each be substituted with a substituent other than a hydroxyl group (hereafter also referred to as "(α-substituted) hydroxystyrene"), compounds in which the hydrogen atom of the hydroxyl group of an (α-substituted) hydroxystyrene has been substituted with an organic group, vinylbenzoic acids in which the hydrogen atom bonded to the carbon atom on the α-position may be substituted with a substituent, and in which the hydrogen atoms bonded to the benzene ring may each be substituted with a substituent other than a hydroxyl group or a carboxyl group (hereafter also referred to as "(α-substituted) vinylbenzoic acid"), and compounds in which the hydrogen atom of the carboxyl group of an (α-substituted) vinylbenzoic acid has been substituted with an organic group.

Hydroxystyrene is a compound in which a single vinyl group and at least one hydroxyl group are bonded to a benzene ring. The number of hydroxyl groups bonded to the benzene ring is preferably from 1 to 3, and most preferably 1. There are no particular limitations on the bonding position(s) of the hydroxyl group(s) on the benzene ring. When there is only one hydroxyl group, the bonding position of the vinyl group is preferably the para-position (4th position). When the number of hydroxyl groups is an integer of two or more, any arbitrary combination of bonding positions may be used.

Vinylbenzoic acid is a compound in which a single vinyl group is bonded to the benzene ring of benzoic acid.

There are no particular limitations on the bonding position of the vinyl group on the benzene ring.

There are no particular limitations on the substituent other than a hydroxyl group or carboxyl group which may be bonded to the benzene ring of styrene or a derivative thereof, and examples include a halogen atom, an alkyl group of 1 to 5 carbon atoms, and a halogenated alkyl group of 1 to 5 carbon atoms. Examples of the halogen atom include a fluorine atom, chlorine atom, bromine atom and iodine atom, and a fluorine atom is particularly desirable.

There are no particular limitations on the organic group in a compound in which the hydrogen atom of the hydroxyl group of an (α-substituted) hydroxystyrene has been substituted with an organic group, and examples include the same groups as the organic group of the aforementioned (α-substituted) acrylate ester.

There are no particular limitations on the organic group in a compound in which the hydrogen atom of the carboxyl group of an (α-substituted) vinylbenzoic acid has been substituted with an organic group, and examples include the same groups as the organic group of the aforementioned (α-substituted) acrylate ester.

Examples of "vinylnaphthalene or a derivative thereof" include vinylnaphthalenes in which the hydrogen atom bonded to the carbon atom on the α-position may be substituted with a substituent, and in which the hydrogen atoms bonded to the naphthalene ring may each be substituted with a substituent other than a hydroxyl group (hereafter also referred to as "(α-substituted) vinylnaphthalene"), vinyl(hydroxynaphthalenes) in which the hydrogen atom bonded to the carbon atom on the α-position may be substituted with a substituent, and in which the hydrogen atoms bonded to the naphthalene ring may each be substituted with a substituent other than a hydroxyl group (hereafter also referred to as "(α-substituted) vinyl(hydroxynaphthalene)"), and compounds in which the hydrogen atom of the hydroxyl group of an (α-substituted) vinyl(hydroxynaphthalene) has been substituted with a substituent.

Vinyl(hydroxynaphthalene) is a compound in which a single vinyl group and at least one hydroxyl group are bonded to a naphthalene ring. The vinyl group may be bonded to the 1st position or 2nd position of the naphthalene ring. The number of hydroxyl groups bonded to the naphthalene ring is preferably from 1 to 3, and most preferably 1. There are no particular limitations on the bonding position(s) of the hydroxyl group(s) on the naphthalene ring. When the vinyl group is bonded to the 1st position or 2nd position of the naphthalene ring, the hydroxyl group(s) are preferably bonded to any of the 5th to 8th positions. In particular, when there is only one hydroxyl group, the hydroxyl group is preferably bonded to any one of the 5th to 7th positions of the naphthalene ring, and is more preferably bonded to the 5th or 6th position. When the number of hydroxyl groups is an integer of two or more, any arbitrary combination of bonding positions may be used.

Examples of the substituent which may be bonded to the naphthalene ring of the vinylnaphthalene or derivative therefore include the same substituents as those mentioned above for the substituent which may be bonded to the benzene ring of the α-substituted) styrene.

There are no particular limitations on the organic group in a compound in which the hydrogen atom of the hydroxyl group of an (α-substituted) vinyl(hydroxynaphthalene) has been substituted with an organic group, and examples include the same groups as the organic group of the aforementioned (α-substituted) acrylate ester.

Specific examples of structural units derived from an (α-substituted) acrylic acid or an ester thereof include structural units represented by general formula (U-1) shown below.

Specific examples of structural units derived from an (α-substituted) acrylamide or a derivative thereof include structural units represented by general formula (U-2) shown below.

Among the various (α-substituted) vinyl aromatic compounds, specific examples of structural units derived from an (α-substituted) styrene or a derivative thereof include structural units represented by general formula (U-3) shown below. Further, specific examples of structural units derived from an (α-substituted) vinylnaphthalene or a derivative thereof include structural units represented by general formula (U-4) shown below.

[Chemical Formula 9]

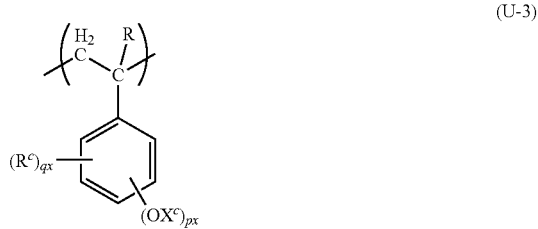

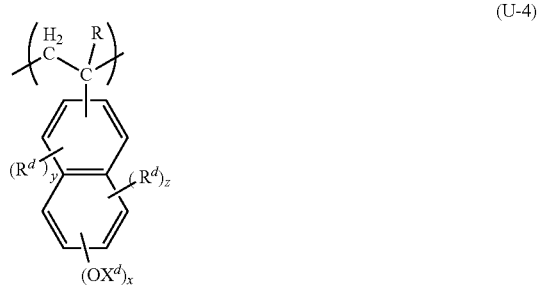

In the formulas, R represents a hydrogen atom, an alkyl group of 1 to 5 carbon atoms, or a halogenated alkyl group of 1 to 5 carbon atoms, each of $X^a$ to $X^d$ independently represents a hydrogen atom or an organic group, $R^b$ represents a hydrogen atom or an alkyl group of 1 to 5 carbon atoms, each of $R^c$ and $R^d$ independently represents a halogen atom, —$COOX^e$ (wherein $X^e$ represents a hydrogen atom or an organic group), an alkyl group of 1 to 5 carbon atoms or a halogenated alkyl group of 1 to 5 carbon atoms, px represents an integer of 0 to 3 and qx represents an integer of 0 to 5, provided that px+qx is from 0 to 5, when qx is an integer of 2 or greater, the plurality of $R^c$ groups may be the same or different, x represents an integer of 0 to 3, y represents an integer of 0 to 3, and z represents an integer of 0 to 4, provided that x+y+z is from 0 to 7, and when y+z is an integer of 2 or greater, the plurality of $R^d$ groups may be the same or different.

As the structural unit (a5-1), a structural unit which is derived from an acrylate ester in which the hydrogen atom bonded to the carbon atom on the α-position may be substituted with a substituent, and which also contains a group represented by the aforementioned general formula (a5-0-1) is particularly preferred. Examples of this type of structural unit include structural units represented by formula (a5-11) shown below.

[Chemical Formula 10]

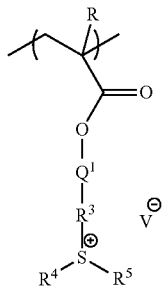

(a5-11)

In the formula, R represents a hydrogen atom, an alkyl group of 1 to 5 carbon atoms or a halogenated alkyl group of 1 to 5 carbon atoms, and $Q^1$, $R^3$ to $R^5$ and $V^-$ are the same as defined above.

In formula (a5-11), the alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which part or all of the hydrogen atoms of an aforementioned alkyl group for R have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a5-11), $Q^1$, $R^3$ to $R^5$ and $V^-$ are the same as defined above.

Structural Unit Having a Group Represented by Formula (a5-0-2)

In formula (a5-0-2), $Q^2$ represents a single bond or a divalent linking group. Examples of the divalent linking group for $Q^2$ include the same groups as those described above for the divalent linking group for $Q^1$ in formula (a5-0-1).

$Q^2$ may or may not have an aromatic ring. However, in formula (a5-0-2), $M^{m+}$ has only one aromatic ring or has no aromatic rings, and it is preferable that $Q^2$ also has only one aromatic ring or has no aromatic rings. When $Q^2$ has an aromatic ring, $M^{m+}$ preferably does not have an aromatic ring.

In the present invention, of the various divalent linking groups described above, $Q^2$ is preferably a single bond, a linear or branched alkylene group, a linear or branched fluorinated alkylene group, an arylene group which may have a substituent (preferably a fluorine atom), an ester linkage [—C(=O)—O—], or a combination thereof.

In formula (a5-0-2), $A^-$ represents an organic group containing an anion.

There are no particular limitations on $A^-$, provided it includes a region that generates an acid anion upon exposure, and groups that can generate a sulfonate anion, carbo anion, carboxylate anion, sulfonylimide anion, bis(alkylsulfonyl)imide anion or tris(alkylsulfonyl)methide anion are preferred.

Among such groups, $A^-$ is preferably a group represented by one of formulas (a5-2-an1) to (a5-2-an4) shown below.

[Chemical Formula 11]

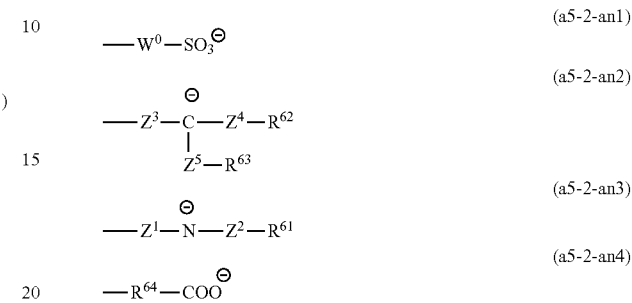

In the above formulas, $W^0$ represents a hydrocarbon group of 1 to 30 carbon atoms which may have a substituent, $Z^3$ represents —C(=O)—O—, —SO$_2$— or a hydrocarbon group which may have a substituent, each of $Z^4$ and $Z^5$ independently represents —C(=O)—, or —SO$_2$—, each of $R^{62}$ and $R^{63}$ independently represents a hydrocarbon group which may have a fluorine atom, $Z^1$ represents —C(=O)—, —SO$_2$—, —C(=O)—O— or a single bond, $Z^2$ represents —C(=O)— or —SO$_2$—, $R^{61}$ represents a hydrocarbon group which may have a fluorine atom, and $R^{64}$ represents a hydrocarbon group which may have a fluorine atom.

In formula (a5-2-an1), $W^0$ represents a hydrocarbon group of 1 to 30 carbon atoms which may have a substituent.

The hydrocarbon group of 1 to 30 carbon atoms which may have a substituent represented by $W^0$ may be either an aliphatic hydrocarbon group or an aromatic hydrocarbon group, and examples include the same aliphatic hydrocarbon groups and aromatic hydrocarbon groups as those described above as the divalent linking group for $Q^1$ in formula (a5-0-1).

Examples of preferred forms of $W^0$ include groups represented by —[C($R^{f1}$)($R^{f2}$)]$_{p0}$—. In this formula, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, and p0 represents an integer of 1 to 8.

In those cases where $W^0$ is a group represented by —[C($R^{f1}$)($R^{f2}$)]$_{p0}$—, formula (a5-2-an1) can be represented by formula (a5-2-an1-1) shown below.

[Chemical Formula 12]

(a5-2-an1-1)

In the formula, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, and p0 represents an integer of 1 to 8.

In the formula —[C($R^{f1}$)($R^{f2}$)]$_{p0}$— and formula (a5-2-an1-1), each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The fluorinated alkyl group for $R^{f1}$ and $R^{f2}$ is preferably a group in which part or all of the hydrogen atoms within an aforementioned alkyl group for $R^{f1}$ and $R^{f2}$ have each been substituted with a fluorine atom.

Each of $R^{f1}$ and $R^{f2}$ is preferably a fluorine atom or a fluorinated alkyl group.

In the formula $—[C(R^{f1})(R^{f2})]_{p0}—$ and formula (a5-2-an1-1), p0 represents an integer of 1 to 8, and is preferably an integer of 1 to 4, and more preferably 1 or 2.

Other examples of preferred forms of $W^0$ include aliphatic cyclic groups and aromatic hydrocarbon groups which may have a substituent. Among such groups, groups in which two or more hydrogen atoms have been removed from adamantane, norbornane, isobornane, tricyclodecane, tetracyclododecane, camphor or benzene (and which may have a substituent) are preferred.

In formula (a5-2-an2), $Z^3$ represents —C(=O)—O—, —SO$_2$— or a hydrocarbon group which may have a substituent. Examples of the hydrocarbon group which may have a substituent for $Z^3$ include the same groups as the "divalent hydrocarbon group which may have a substituent" mentioned above within the description for the divalent linking group for $Q^1$ in formula (a5-0-1). Among these possibilities, $Z^3$ is preferably —SO$_2$—.

In formula (a5-2-an2), each of $Z^4$ and $Z^5$ independently represents —C(=O)— or —SO$_2$—, and it is preferable that at least one of $Z^4$ and $Z^5$ represents —SO$_2$—, and more preferable that both of $Z^4$ and $Z^5$ represent —SO$_2$—.

Each of $R^{62}$ and $R^{63}$ independently represents a hydrocarbon group which may have a fluorine atom, and examples include the same groups as those described below for the hydrocarbon group which may have a fluorine atom for $R^{61}$.

In formula (a5-2-an3), $Z^1$ represents —C(=O)—, —SO$_2$—, —C(=O)—O— or a single bond. When $Z^1$ represents a single bond, the $N^−$ in the formula is preferably not bonded directly to —C(=O)— on the side in the formula (namely, the left end in the formula) that is opposite the side where $Z^2$ is bonded.

In formula (a5-2-an3), $Z^2$ represents —C(=O)— or —SO$_2$—, and is preferably —SO$_2$—.

$R^{61}$ represents a hydrocarbon group which may have a fluorine atom. Examples of the hydrocarbon group for $R^{61}$ include alkyl groups, monovalent alicyclic hydrocarbon groups, aryl groups and aralkyl groups.

The alkyl group for $R^{61}$ preferably contains 1 to 8 carbon atoms, more preferably 1 to 6 carbon atoms, and still more preferably 1 to 4 carbon atoms, and may be either a linear group or a branched group. Specific examples of preferred alkyl groups include a methyl group, ethyl group, propyl group, butyl group, hexyl group and octyl group.

The monovalent alicyclic hydrocarbon group for $R^{61}$ preferably contains 3 to 20 carbon atoms and more preferably 3 to 12 carbon atoms, and may be either a polycyclic group or a monocyclic group. The monocyclic alicyclic hydrocarbon group is preferably a group in which one or more hydrogen atoms have been removed from a monocycloalkane. The monocycloalkane preferably contains 3 to 6 carbon atoms, and specific examples include cyclobutane, cyclopentane and cyclohexane. The polycyclic alicyclic hydrocarbon group is preferably a group in which one or more hydrogen atoms have been removed from a polycycloalkane, wherein the polycycloalkane preferably contains 7 to 12 carbon atoms, and specific examples include adamantane, norbornane, isobornane, tricyclodecane and tetracyclododecane.

The aryl group for $R^{61}$ preferably contains 6 to 18 carbon atoms and more preferably 6 to 10 carbon atoms, and a phenyl group is particularly desirable.

The aralkyl group for $R^{61}$ is preferably a group in which an alkylene group of 1 to 8 carbon atoms is bonded to an aforementioned "aryl group for $R^{61}$". An aralkyl group in which an alkylene group of 1 to 6 carbon atoms is bonded to an aforementioned "aryl group for $R^{61}$" is more preferred, and an aralkyl group in which an alkylene group of 1 to 4 carbon atoms is bonded to an aforementioned "aryl group for $R^{61}$" is particularly desirable.

In the hydrocarbon group for $R^{61}$, it is preferable that part or all of the hydrogen atoms within the hydrocarbon group are each substituted with a fluorine atom, and hydrocarbon groups in which 30 to 100% of the hydrocarbon group hydrogen atoms are substituted with fluorine atoms are more preferred. Among such groups, perfluoroalkyl groups in which all of the hydrogen atoms within an aforementioned alkyl group have been substituted with fluorine atoms are particularly desirable.

In the formula (a5-2-an4), $R^{64}$ represents a hydrocarbon group which may have a fluorine atom. Examples of the hydrocarbon group for $R^{64}$ include alkylene groups, divalent alicyclic hydrocarbon groups, groups in which one or more hydrogen atoms have been removed from an aryl group, and groups in which one or more hydrogen atoms have been removed from an aralkyl group.

Specific examples of the hydrocarbon group for $R^{64}$ include groups in which one or more hydrogen atoms have been removed from the hydrocarbon group described above for $R^{61}$ (such as an alkyl group, monovalent alicyclic hydrocarbon group, aryl group or aralkyl group).

In the hydrocarbon group for $R^{64}$, it is preferable that part or all of the hydrogen atoms within the hydrocarbon group are each substituted with a fluorine atom, and groups in which 30 to 100% of the hydrocarbon group hydrogen atoms are substituted with fluorine atoms are more preferred.

Of the above possibilities, in those cases where $A^−$ has a group represented by formula (a5-2-an1) which has a fluorine atom (and particularly a group represented by formula (a5-2-an1-1)), a group represented by formula (a5-2-an2), or a group represented by formula (a5-2-an3) in which $Z^1$ and $Z^2$ both represent —SO$_2$—, performing exposure can generate a comparatively strong acid from the structural unit (a5), such as a fluorinated alkylsulfonate anion, carbo anion or sulfonylimide anion.

On the other hand, in those cases where $A^−$ has a group represented by formula (a5-2-an1) which does not contain a fluorine atom, a group represented by formula (a5-2-an4), or a group represented by formula (a5-2-an3) in which $Z^1$ and $Z^2$ both represent —C(=O)—, performing exposure can generate a comparatively weak acid from the structural unit (a5), such as an alkylsulfonate anion, arylsulfonate anion, carboxylate anion or imide anion.

As described above, because an acid having the desired acid strength can be generated from the structural unit (a5), the function of the acid generated from the structural unit (a5) within the resist composition can be selected as appropriate, and the anion $A^−$ can be selected in accordance with the function required.

For example, in those cases where the structural unit (a5) is to perform a similar function to an acid generator used in a conventional resist composition, an anion A⁻ that generates a strong acid is preferably selected.

Further, in those cases where the structural unit (a5) is to perform a similar function to a quencher used in a conventional resist composition (namely, a quencher that undergoes salt exchange with a strong acid generated from an acid generator, thereby trapping the strong acid), an anion A⁻ that generates a weak acid is preferably selected.

Here, whether an acid is deemed a strong acid or a weak acid is determined on the basis of the relationship relative to the activation energy of the type of acid-decomposable group contained within the structural unit (a1) described below which decomposes under the action of acid, and the relationship relative to the acid strength of any acid generators that are also used in the composition. Accordingly, an aforementioned "comparatively weak acid" may not necessarily be able to be used as a quencher.

In formula (a5-0-2), $M^{m+}$ represents an organic cation having a valency of m, wherein m represents an integer of 1 to 3. However, $M^{m+}$ either has only one aromatic ring, or has no aromatic rings.

By ensuring that the number of aromatic rings that exist within the organic cation is not more than one, a resist pattern having superior lithography properties and a favorable pattern shape can be formed by EUV lithography or EB lithography. In order to enhance this effect, it is particularly desirable that $M^{m+}$ is an organic cation having no aromatic rings.

There are no particular limitations on the organic cation for $M^{m+}$, provided it has only one aromatic ring or has no aromatic rings, and for example, any of the photodegradable bases used in conventional resist composition quenchers, or the organic cations known as the cations for onium salt acid generators or the like within conventional resist compositions can be used.

Examples of these types of organic cations include cations represented by general formula (m1-1-1) or general formula (m2-1) shown below.

[Chemical Formula 13]

(m1-1)

(m2-1)

In the formulas, each of $R^{11''}$ to $R^{13''}$, and $R^{15''}$ and $R^{16''}$ independently represents an aryl group, alkyl group or alkenyl group which may have a substituent. In formula (m1-1), two of $R^{11''}$ to $R^{13''}$ may be bonded to each other to form a ring in combination with the sulfur atom in the formula. However, the group $S^+(R^{11''})(R^{12''})(R^{13''})$ in the formula must have a total of only one aromatic ring, or have no aromatic rings. Similarly, the group $I^+(R^{15''})(R^{16''})$ in formula (m2-1) must have a total of only one aromatic ring, or have no aromatic rings.

In formula (m1-1), examples of the aryl group which may have a substituent, alkyl group which may have a substituent, or alkenyl group which may have a substituent for $R^{11''}$ to $R^{13''}$ include the same groups as the aryl groups, alkyl groups and alkenyl groups described above for $R^4$ and $R^5$ in general formula (a5-0-1).

Examples of the ring that is formed in those cases where two of $R^{11''}$ to $R^{13''}$ in formula (m1-1-1) are bonded to each other to form a ring in combination with the sulfur atom in the formula include the same rings as those formed when $R^4$ and $R^5$ in formula (a5-0-1) are bonded to each other to form a ring in combination with the sulfur atom in the formula.

However, the group $S^+(R^{11''})(R^{12''})(R^{13''})$ in formula (m1-1) either has a total of only one aromatic ring, or has no aromatic rings. In other words, in those cases where $R^{12''}$ and $R^{13''}$ are not bonded to each other to form a ring in combination with the sulfur atom in the formula, either only one of $R^{11''}$, $R^{12''}$ and $R^{13''}$ is an organic group having one aromatic ring, and the other two groups are organic groups that do not have an aromatic ring, or all of $R^{11''}$, $R^{12''}$ and $R^{13''}$ are organic groups that do not have an aromatic ring. In those cases where $R^{12''}$ and $R^{13''}$ are bonded to each other to form an aromatic ring in combination with the sulfur atom in the formula, $R^{11''}$ represents an aromatic group that does not have an organic group. In those cases where $R^{12''}$ and $R^{13''}$ are bonded to each other to form a ring in combination with the sulfur atom in the formula, and the formed ring is an aliphatic ring (a ring having no aromaticity), $R^{11''}$ may be either an organic group having one aromatic ring, or an organic group that does not have an aromatic ring. In those cases where the ring that is formed when $R^{12''}$ and $R^{13''}$ are bonded to each other to form a ring in combination with the sulfur atom in the formula is a cyclic structure that contains two or more aromatic rings, the resulting structural unit does not correspond with the structural unit (a5).

In formula (m2-1), examples of the aryl group which may have a substituent, alkyl group which may have a substituent, or alkenyl group which may have a substituent for $R^{15''}$ and $R^{16''}$ include the same groups as those described above for $R^{11''}$ to $R^{13''}$.

However, the group $I^+(R^{15''})(R^{16''})$ in formula (m2-1) either has a total of only one aromatic ring, or has no aromatic rings. In other words, either only one of $R^{15''}$ and $R^{16''}$ has an aromatic ring, or neither of $R^{15''}$ and $R^{16''}$ has an aromatic ring.

By ensuring that the total number of aromatic rings in the group $S^+(R^{11''})(R^{12''})(R^{13''})$ or the group $I^+(R^{15''})(R^{16''})$ is not more than one, a resist pattern having superior lithography properties and a favorable pattern shape can be formed by EUV lithography or EB lithography. In order to further enhance this effect, it is particularly desirable that the group $S^+(R^{11''})(R^{12''})(R^{13''})$ or the group $I^+(R^{15''})(R^{16''})$ contains a total of no aromatic rings.

Among the compound cations represented by formula (m1-1), specific examples of preferred cations include cations represented by formulas (m1-1-1) to (m1-1-3) shown below.

[Chemical Formula 14]

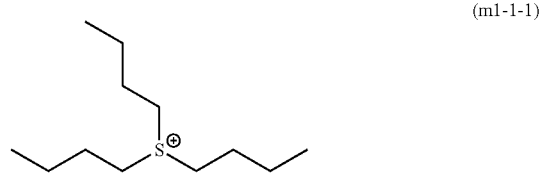

(m1-1-1)

(m1-1-2)

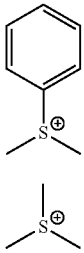

(m1-1-3)

Further, in the cation represented by formula (m1-1-1), specific examples of preferred cations in the case where two of $R^{11\prime\prime}$ to $R^{13\prime\prime}$ are bonded to each other to form a ring in combination with the sulfur atom in the formula include cations represented by formulas (m1-1-2), (m1-3) and (m1-4) shown below.

[Chemical Formula 15]

(m1-2)

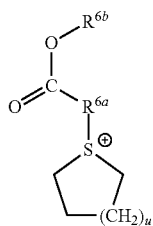

(m1-3)

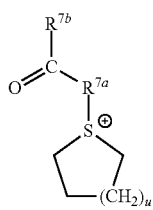

(m1-4)

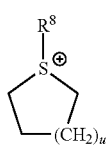

In the formulas, u represents an integer of 1 to 3, $R^{6a}$ represents an alkylene group which may have a substituent, and $R^{6b}$ represents a hydrogen atom, an alkyl group which may have a substituent, or a phenyl group or naphthyl group which may have a non-aromatic substituent, provided that $R^{6a}$—C (=O)—O—$R^{6b}$ either has a total of only one aromatic ring, or has no aromatic rings. $R^{7a}$ represents an alkylene group which may have a substituent, $R^{7b}$ represents an alkyl group which may have a substituent, or a phenyl group or naphthyl group which may have a substituent, provided that $R^{7a}$—C (=O)—$R^{7b}$ either has a total of only one aromatic ring, or has no aromatic rings. $R^8$ represents an alkyl group which may have a substituent, or a phenyl group or naphthyl group which may have a non-aromatic substituent, provided that $R^8$ either has only one aromatic ring, or has no aromatic rings.

In the formulas, u represents an integer of 1 to 3, and is most preferably 1 or 2.

In the formulas, the alkylene group for each of $R^{6a}$ and $R^{7a}$ is preferably a linear or branched alkylene group. The alkylene group preferably contains 1 to 12 carbon atoms, more preferably 1 to 5 carbon atoms, still more preferably 1 to 3 carbon atoms, and most preferably 1 or 2 carbon atoms.

Examples of the substituent which the alkylene group may have include the same substituents as those mentioned above, within the description relating to $R^3$ in general formula (a5-0-1), for the substituent in a substituted alkylene group (namely, a halogen atom, oxo group (=O), cyano group, alkyl group, alkoxyalkyloxy group, alkoxycarbonylalkyloxy group, —C(=O)—O—$R^{7\prime\prime}$, —O—C(=O)—$R^{8\prime\prime}$, —O—$R^{9\prime\prime}$, and aryl group).

Examples of the alkyl group which may have a substituent for $R^{6b}$, $R^{7b}$ and $R^8$ include the same groups as those mentioned above for the substituted alkyl group within the description relating to $R^4$ and $R^5$ in general formula (a5-0-1).

Examples of the non-aromatic substituent which the phenyl group or naphthyl group may have in $R^{6b}$, $R^{7b}$ and $R^8$ include the same substituents as those mentioned above, within the description relating to $R^4$ and $R^5$ in formula (a5-0-1), for the non-aromatic substituent which the substituted aryl group may have.

Examples of preferred cations represented by one of the above formulas (m1-2), (m1-3) or (m1-4) include the cations shown below.

[Chemical Formula 16]

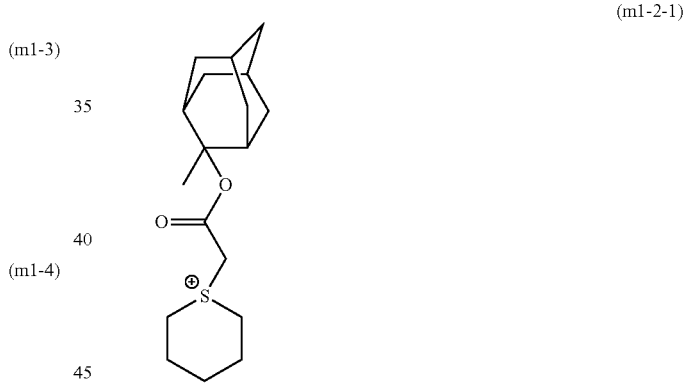

(m1-2-1)

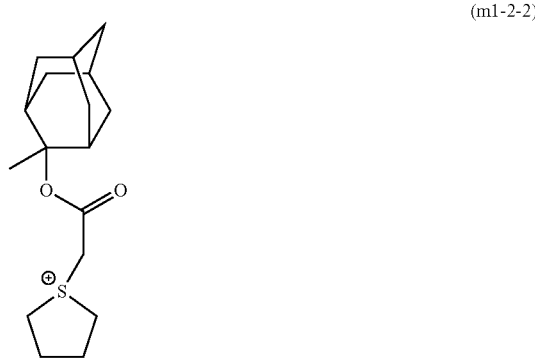

(m1-2-2)

-continued
(m1-2-3)
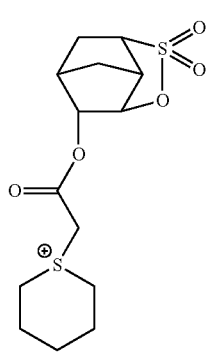
(m1-3-1)
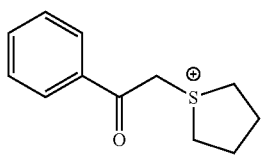
(m1-3-2)
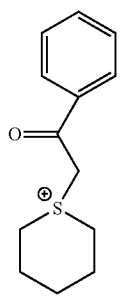
[Chemical Formula 17]
(m1-4-1)
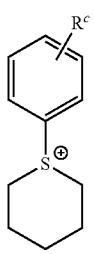
(m1-4-2)
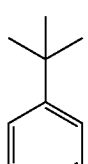
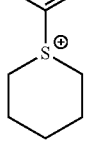
-continued
(m1-4-3)
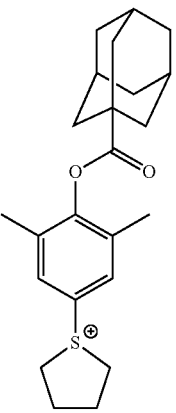
(m1-4-4)
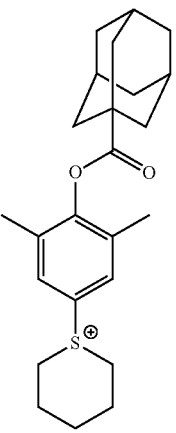
(m1-4-5)
(m1-4-6)
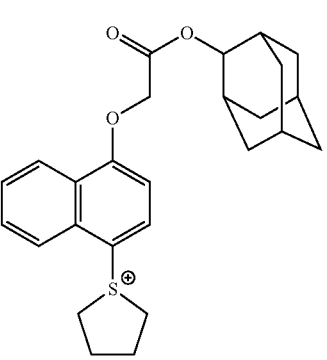
In formula (m1-4-1), $R^C$ represents a substituent. Examples of this substituent include the substituents mentioned above in the description relating to the substituted aryl group (namely, an alkyl group, alkoxy group, alkoxyalkyloxy group, alkoxycarbonylalkyloxy group, halogen atom, hydroxyl group, oxo group (=O), aryl group, —C(=O)—O—R⁷″, —O—C(=O)—R⁸″ and —O—R⁹″).

Although there are no particular limitations on the structural unit having a group represented by the aforementioned general formula (a5-0-2) (hereafter referred to as "structural unit (a5-2)"), provided that the structural unit includes a group represented by general formula (a5-0-2) within the structure, a structural unit which is derived from a compound having an ethylenic double bond and also contains a group represented by general formula (a5-0-2) is preferable, and a structural unit represented by general formula (a5-21) shown below is particularly desirable.

[Chemical Formula 18]

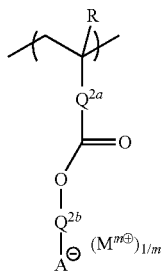

(a5-21)

In the formula, R represents a hydrogen atom, an alkyl group of 1 to 5 carbon atoms or a halogenated alkyl group of 1 to 5 carbon atoms, $Q^{2a}$ represents a single bond or a divalent linking group, $Q^{2b}$ represents a single bond or a divalent linking group, $A^-$ represents an organic group containing an anion, and $M^{m+}$ represents an organic cation having a valency of m, wherein m represents an integer of 1 to 3. However, $M^{m+}$ either has only one aromatic ring, or has no aromatic rings.

In formula (a5-21), R is the same as defined above for R in formula (a5-11).

$A^-$ and $(M^{m+})_{1/m}$ are the same as defined above for $A^-$ and $(M^{m+})_{1/m}$ in formula (a5-0-2).

Examples of the divalent linking group for $Q^{2a}$ include the same groups as those mentioned above for the divalent linking group for $Q^1$ in formula (a5-0-1).

Among such groups, $Q^{2a}$ is preferably a single bond, or a group represented by —C(=O)-$Q^{22}$-N(R″)— or -$Q^{23}$-CF($R^{q1}$)—.

In formula —C(=O)-$Q^{22}$-N(R″)—, $Q^{22}$ represents a divalent linking group, and R″ represents a hydrogen atom or an alkyl group of 1 to 5 carbon atoms.

In formula -$Q^{23}$-CF($R^{q1}$)—, $Q^{23}$ represents a group containing —O—, —CH₂—O— or —C(=O)—O—, and $R^{q1}$ represents a fluorine atom or a fluorinated alkyl group.

In formula —C(=O)-$Q^{22}$-N(R″)—, examples of the divalent linking group for $Q^{22}$ include the same groups as those mentioned above for the divalent linking group for $Q^1$ in formula (a5-0-1), and among these groups, a linear or branched alkylene group, a cyclic aliphatic hydrocarbon group, or a divalent aromatic hydrocarbon group is preferred, a linear alkylene group is more preferred, and a methylene group or an ethylene group is the most desirable.

Examples of the alkyl group of 1 to 5 carbon atoms for R″ include the same groups as those mentioned above for the alkyl group of 1 to 5 carbon atoms for R. Among the various possibilities, is most preferably a hydrogen atom or a methyl group.

In formula -$Q^{23}$-CF($R^{q1}$)—, specific examples of $Q^{23}$ include groups consisting solely of —O—, —CH₂—O— or —C(=O)—O—, and groups composed of a combination of —O—, —CH₂—O— or —C(=O)—O— and a divalent hydrocarbon group which may have a substituent.

Examples of this divalent hydrocarbon group which may have a substituent include the same groups as those mentioned above for the divalent hydrocarbon group which may have a substituent, mentioned within the description of the divalent linking group for $Q^1$ in formula (a5-0-1). Of these groups, the "divalent hydrocarbon group" in $Q^{23}$ is preferably an aliphatic hydrocarbon group, and more preferably a linear or branched alkylene group.

$Q^{23}$ is preferably a group composed of a combination of —C(=O)—O— and a divalent hydrocarbon group which may have a substituent, is more preferably a group composed of a combination of —C(=O)—O— and an aliphatic hydrocarbon group, and is still more preferably a group composed of a combination of —C(=O)—O— and a linear or branched alkylene group.

In formula -$Q^{23}$-CF($R^{q1}$)—, in the fluorinated alkyl group for $R^{q1}$, the alkyl group in a state prior to the fluorine atom substitution may be linear, branched or cyclic.

In the case of a linear or branched alkyl group, the alkyl group preferably contains 1 to 5 carbon atoms, more preferably 1 to 3 carbon atoms, and still more preferably 1 or 2 carbon atoms.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane.

In the fluorinated alkyl group, the ratio of the number of fluorine atoms relative to the combined total of all the fluorine atoms and hydrogen atoms within the fluorinated alkyl group (namely, the fluorination ratio (%)) is preferably within a range from 30 to 100%, and more preferably from 50 to 100%. A higher fluorination ratio enhances the hydrophobicity of the resist film.

Among the above possibilities, $R^{q1}$ is most preferably a fluorine atom.

In formula (a5-21), examples of the divalent linking group for $Q^{2b}$ include the same groups as those mentioned above for the divalent linking group for $Q^1$ in formula (a5-0-1). Among such groups, $Q^{2b}$ is preferably a linear or branched alkylene group, a cyclic aliphatic hydrocarbon group, an aromatic hydrocarbon group, or a divalent linking group containing a hetero atom, is more preferably a linear or branched alkylene group, a combination of a linear or branched alkylene group and a divalent linking group containing a hetero atom, a combination of a cyclic aliphatic hydrocarbon group and a divalent linking group containing a hetero atom, or a combination of an aromatic hydrocarbon group and a divalent linking group containing a hetero atom, is still more preferably a linear or branched alkylene group, a combination of a linear or branched alkylene group and an ester linkage [—C(=O)—O—], or a combination of a divalent alicyclic hydrocarbon group and an ester linkage [—C(=O)—O—], and is most preferably a linear or branched alkylene group, or a combination of a linear or branched alkylene group and an ester linkage [—C(=O)—O—].

The structural unit (a5-2) is preferably at least one structural unit selected from the group consisting of structural units represented by formulas (a5-2-11) to (a5-2-13), formulas (a5-2-21) to (a5-2-25), formulas (a5-2-31) to (a5-2-32), and formulas (a5-2-41) to (a5-2-44) shown below.

Of these structural units, the structural units represented by formulas (a5-2-11) to (a5-2-13) are preferably structural units represented by formulas (a5-2-11-1), (a5-2-12-1) and (a5-2-13-1) respectively shown below.

[Chemical Formula 19]

(a5-2-11)

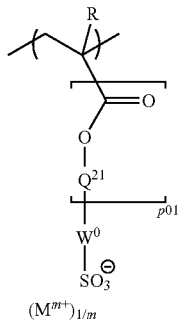

(a5-2-12)

(a5-2-13)

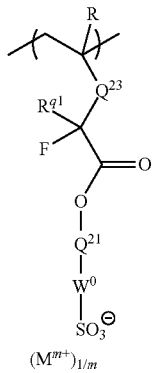

[Chemical Formula 20]

(a5-2-11-1)

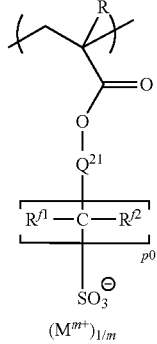

(a5-2-12-1)

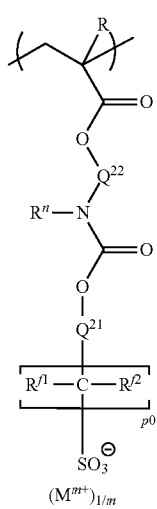

(a5-2-13-1)

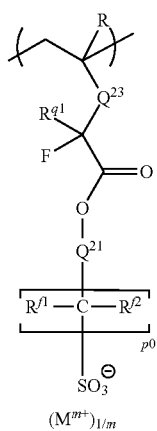

In the formulas, R, $W^0$ and $(M^{m+})_{1/m}$ are the same as defined above, each $Q^{21}$ independently represents a single bond or a divalent linking group, $Q^{22}$ represents a divalent linking group, $Q^{23}$ represents a group containing —O—, —$CH_2$—O— or —C(=O)—O—, $R^{q1}$ represents a fluorine atom or a fluorinated alkyl group, $R^n$ represents a hydrogen atom or an alkyl group of 1 to 5 carbon atoms, and p01 represents 0 or 1.

In the above formulas, R, $R^{f1}$, $R^{f2}$, $R^{q1}$, $R^n$, $Q^{21}$ to $Q^{23}$, p0 and $(M^{m+})_{1/m}$ are the same as defined above.

[Chemical Formula 21]
(a5-2-21) 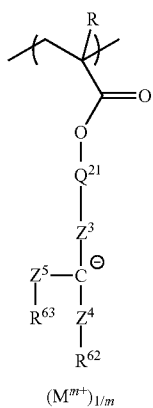
(a5-2-22) 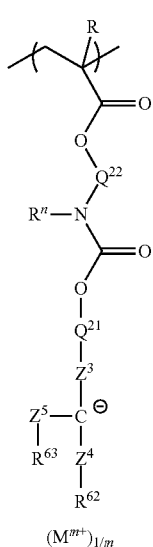
(a5-2-23) 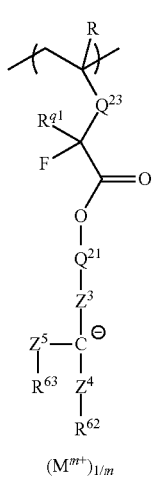
(a5-2-24) 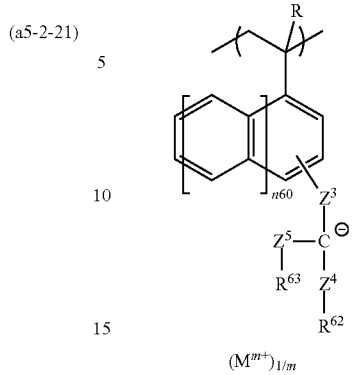
(a5-2-25) 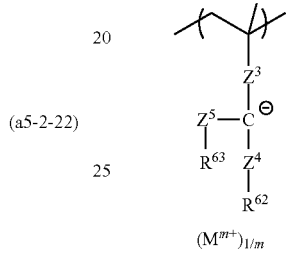
In the above formulas, R, $Q^{21}$ to $Q^{23}$, $Z^3$ to $Z^5$, $R^{62}$ to $R^{63}$, $R^n$, $R^{q1}$ and $(M^{m+})_{1/m}$ are the same as defined above, and n60 represents an integer of 0 to 3.
[Chemical Formula 22]
(a5-2-31) 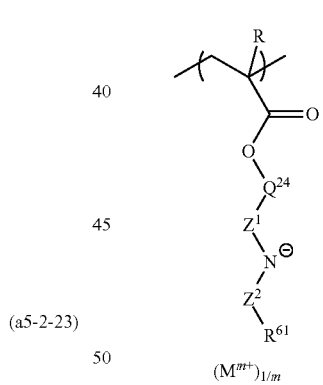
(a5-2-32) 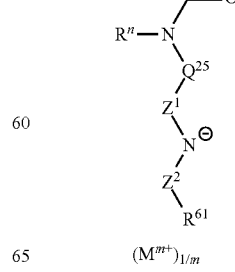

In the above formulas, R, $Z^1$ to $Z^2$, $R^{61}$, $R''$ and $(M^{m+})_{1/m}$ are the same as defined above, and each of $Q^{24}$ and $Q^{25}$ independently represents a single bond or a divalent linking group.

[Chemical Formula 23]

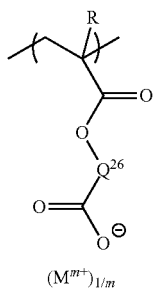

(a5-2-41)

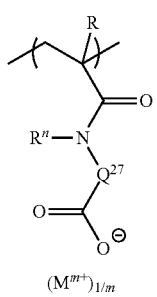

(a5-2-42)

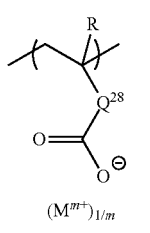

(a5-2-43)

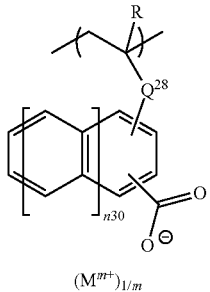

(a5-2-44)

In the above formulas, R, $R''$ and $(M^{m+})_{1/m}$ are the same as defined above, each of $Q^{26}$ to $Q^{28}$ independently represents a single bond or a divalent linking group, and n30 represents an integer of 0 to 3.

In formulas (a5-2-11) to (a5-2-13), R and $(M^{m+})_{1/m}$ are the same as defined for R and $(M^{m+})_{1/m}$ in formula (a5-21).

$W^0$ is the same as $W^0$ in formula (a5-2-an1).

$Q^{21}$ represents a single bond or a divalent linking group. Examples of the divalent linking group for $Q^{21}$ include the same groups as those mentioned above for the divalent linking group for $Q^1$ in formula (a5-0-1). Among such groups, $Q^{21}$ is preferably a linear or branched alkylene group, a cyclic aliphatic hydrocarbon group, an aromatic hydrocarbon group, or a divalent linking group containing a hetero atom, is more preferably a linear or branched alkylene group, a combination of a linear or branched alkylene group and a divalent linking group containing a hetero atom, a combination of a cyclic aliphatic hydrocarbon group and a divalent linking group containing a hetero atom, or a combination of an aromatic hydrocarbon group and a divalent linking group containing a hetero atom, is still more preferably a linear or branched alkylene group, a combination of a linear or branched alkylene group and an ester linkage [—C(═O)—O—] or a combination of a divalent alicyclic hydrocarbon group and an ester linkage [—C(═O)—O—], and is most preferably a linear or branched alkylene group, or a combination of a linear or branched alkylene group and an ester linkage [—C(═O)—O—].

p01 represents 0 or 1, and is preferably 1.

In formula (a5-2-12), $Q^{22}$ represents a divalent linking group, and examples include the same groups as those mentioned above for the divalent linking group for $Q^1$ in formula (a5-0-1). Among such groups, $Q^{22}$ is preferably a linear or branched alkylene group, a cyclic aliphatic hydrocarbon group, or a divalent aromatic hydrocarbon group, is more preferably a linear alkylene group, and is most preferably a methylene group or an ethylene group.

In formula (a5-2-12), $R''$ represents a hydrogen atom or an alkyl group of 1 to 5 carbon atoms. Examples of the alkyl group of 1 to 5 carbon atoms include the same groups as those described above for the alkyl group of 1 to 5 carbon atoms for R. Of the various possibilities, $R''$ is preferably a hydrogen atom or a methyl group.

In formula (a5-2-13), $Q^{23}$ is a group containing —O—, —$CH_2$—O— or —C(═O)—O—.

Specific examples of $Q^{23}$ include groups consisting solely of —O—, —$CH_2$—O— or —C(═O)—O—, and groups composed of a combination of —O—, —$CH_2$—O— or —C(═O)—O—, and a divalent hydrocarbon group which may have a substituent.

Examples of this divalent hydrocarbon group which may have a substituent include the same groups as those mentioned above for the divalent hydrocarbon group which may have a substituent, mentioned within the description of the divalent linking group for $Q^1$ in formula (a5-0-1). Of these groups, the "divalent hydrocarbon group" is preferably an aliphatic hydrocarbon group, and more preferably a linear or branched alkylene group.

$Q^{23}$ is preferably a group composed of a combination of —C(═O)—O— and a divalent hydrocarbon group which may have a substituent, is more preferably a group composed of a combination of —C(═O)—O— and an aliphatic hydrocarbon group, and is still more preferably a group composed of a combination of —C(═O)—O— and a linear or branched alkylene group.

Specific examples of preferred groups for $Q^{23}$ include the groups represented by general formula ($Q^{23}$-1) shown below.

[Chemical Formula 24]

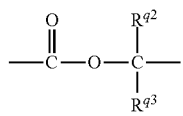

($Q^{23}$-1)

In formula ($Q^{23}$-1), each of $R^{q2}$ and $R^{q3}$ independently represents a hydrogen atom, an alkyl group or a fluorinated alkyl group, or $R^{q2}$ and $R^{q3}$ may be bonded to each other to form a ring.

In formula ($Q^{23}$-1), the alkyl group for $R^{q2}$ and $R^{q3}$ may be linear, branched or cyclic, but is preferably a linear or branched group.

In the case of a linear or branched alkyl group, a group of 1 to 5 carbon atoms is preferred, a methyl group or ethyl group is more preferred, and an ethyl group is particularly desirable.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane. Among these, a group in which one or more hydrogen atoms have been removed from adamantane is preferred.

The fluorinated alkyl group for $R^{q2}$ and $R^{q3}$ is a group in which part or all of the hydrogen atoms within an alkyl group have each been substituted with a fluorine atom.

In the fluorinated alkyl group, the alkyl group in a state prior to the fluorine atom substitution may be linear, branched or cyclic, and specific examples include the same groups as those described above for the "alkyl group for $R^{q2}$ and $R^{q3}$".

$R^{q2}$ and $R^{q3}$ may be bonded to each other to form a ring, and examples of the ring composed of $R^{q2}$, $R^{q3}$ and the carbon atom to which $R^{q2}$ and $R^{q3}$ are bonded include rings in which two hydrogen atoms have been removed from one of the monocycloalkanes or polycycloalkanes described above in relation to the cyclic alkyl group. The ring is preferably a 4- to 10-membered ring, and more preferably a 5- to 7-membered ring.

Of the various possibilities described above, each of $R^{q2}$ and $R^{q3}$ is preferably a hydrogen atom or an alkyl group.

In formula (a5-2-13), $R^{q1}$ represents a fluorine atom or a fluorinated alkyl group.

In the fluorinated alkyl group for $R^{q1}$, the alkyl group in a state prior to the fluorine atom substitution may be linear, branched or cyclic.

In the case of a linear or branched alkyl group, the alkyl group preferably contains 1 to 5 carbon atoms, more preferably 1 to 3 carbon atoms, and still more preferably 1 or 2 carbon atoms.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane.

In the fluorinated alkyl group, the ratio of the number of fluorine atoms relative to the combined total of all the fluorine atoms and hydrogen atoms within the fluorinated alkyl group (namely, the fluorination ratio (%)) is preferably within a range from 30 to 100%, and more preferably from 50 to 100%. A higher fluorination ratio enhances the hydrophobicity of the resist film.

Among the above possibilities, $R^{q1}$ is most preferably a fluorine atom.

In formulas (a5-2-11-1), (a5-2-12-1) and (a5-2-13-1), R, $Q^{21}$ to $Q^{23}$, $R''$, $R^{q1}$ and $(M^{m+})_{1/m}$ are the same as defined above for R, $Q^{21}$ to $Q^{23}$, $R''$, $R^{q1}$ and $(M^{m+})_{1/m}$ in formulas (a5-2-11) to (a5-2-13).

$R'^{1}$, $R'^{2}$ and p0 are the same as defined above for $R'^{1}$, $R'^{2}$ and p0 in formula (a5-2-an1-1).

In formulas (a5-2-21) to (a5-2-25), R, $Q^{21}$ to $Q^{23}$, $R''$, $R^{q1}$ and $(M^{m+})_{1/m}$ are the same as defined above for R, $Q^{21}$ to $Q^{23}$, $R''$, $R^{q1}$ and $(M^{m+})_{1/m}$ in formulas (a5-2-11) to (a5-2-13).

$Z^3$ to $Z^5$ and $R^{62}$ to $R^{63}$ are the same as defined above for $Z^3$ to $Z^5$ and $R^{62}$ to $R^{63}$ in formula (a5-2-an2).

In formula (a5-2-24), n60 represents an integer of 0 to 3, and is preferably 0 or 1.

In formulas (a5-2-31) to (a5-2-32), R, $R''$ and $(M^{m+})_{1/m}$ are the same as defined above for R, $R''$ and $(M^{m+})_{1/m}$ in formulas (a5-2-11) to (a5-2-13).

$Z^1$, $Z^2$ and $R^{61}$ are the same as defined above for $Z^1$, $Z^2$ and $R^{61}$ in formula (a5-2-an3).

Each of $Q^{24}$ and $Q^{25}$ independently represents a single bond or a divalent linking group.

Examples of the divalent linking group for $Q^{24}$ and $Q^{25}$ include the same groups as those described above for the divalent linking group for $Q^1$ in formula (a5-0-1). As mentioned above, when $Z^1$ is a single bond, the terminal of $Q^{24}$ or $Q^{25}$ that is bonded to $Z^1$ is preferably not —C(=O)—. The divalent linking group for $Q^{24}$ and $Q^{25}$ is preferably a linear or branched alkylene group, a cyclic aliphatic hydrocarbon group, or a divalent linking group containing a hetero atom. Among these groups, a linear or branched alkylene group or a cyclic aliphatic hydrocarbon group is preferred, and a linear alkylene group or a cyclic aliphatic hydrocarbon group is particularly desirable.

In formulas (a5-2-41) to (a5-2-44), R, $R''$ and $(M^{m+})_{1/m}$ are the same as defined above for R, $R''$ and $(M^{m+})_{1/m}$ in formulas (a5-2-11) to (a5-2-13).

Each of $Q^{26}$ to $Q^{28}$ independently represents a single bond or a divalent linking group. $Q^{26}$ to $Q^{28}$ are the same as defined above for $Q^{24}$ and $Q^{25}$.

In formula (a5-2-44), n30 represents an integer of 0 to 3, and is preferably 0 or 1.

Specific examples of the structural unit (a5-2) are shown below. In each of the following formulas, $R^\alpha$ represents a hydrogen atom, a methyl group, or a trifluoromethyl group, and $(M^{m+})_{1/m}$ is the same as defined above.

[Chemical Formula 25]

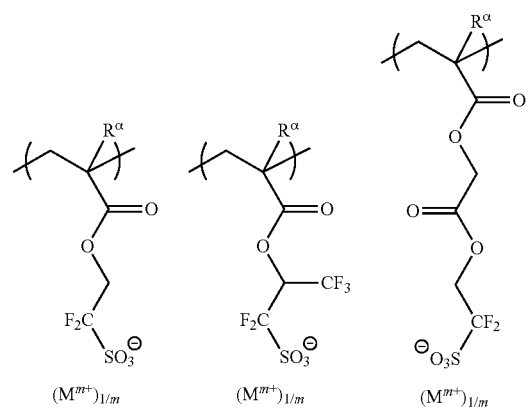

57
-continued
58
-continued
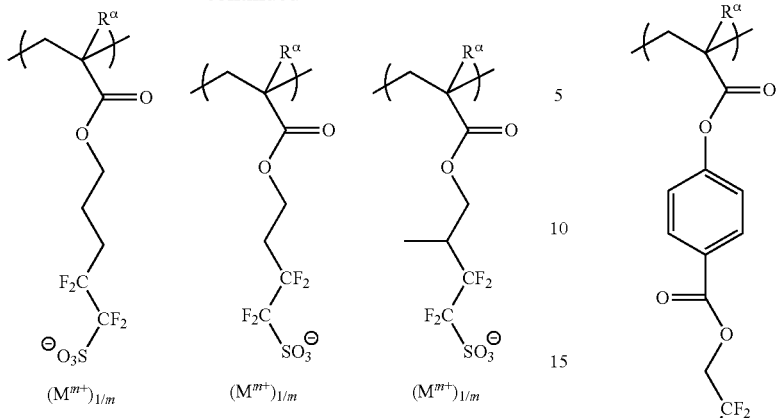
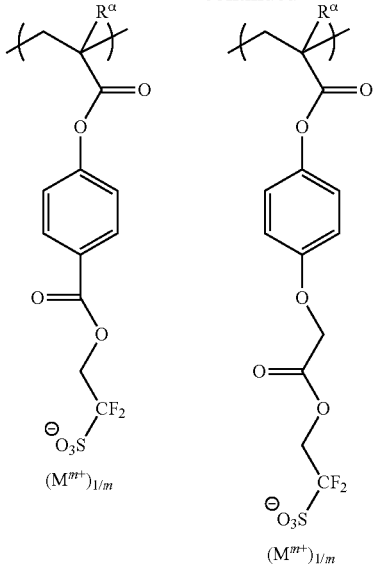
[Chemical Formula 26]
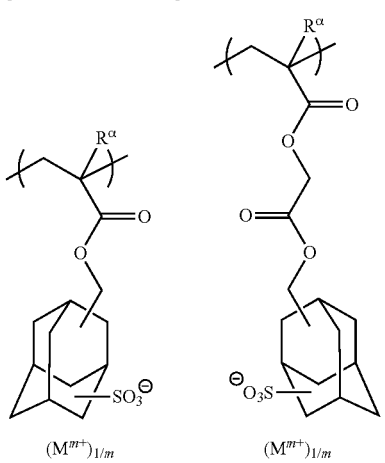
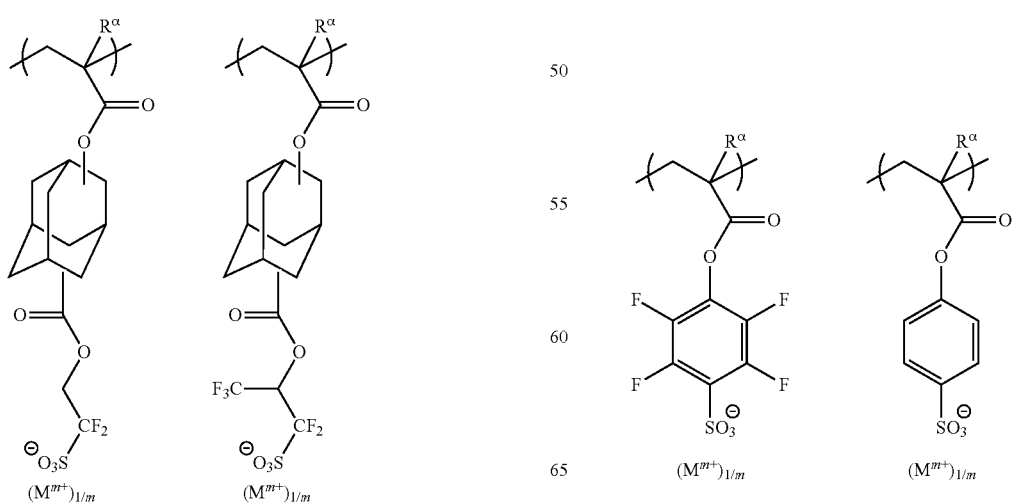

[Chemical Formula 27]
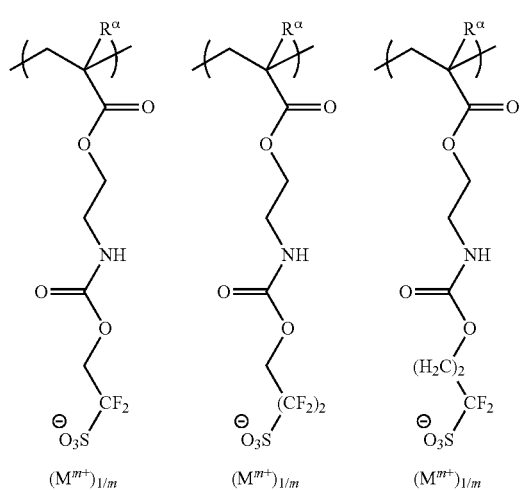
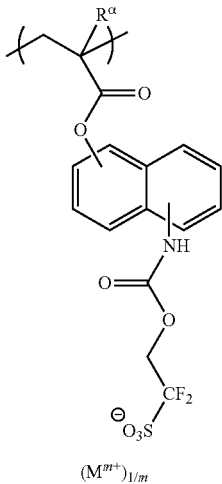
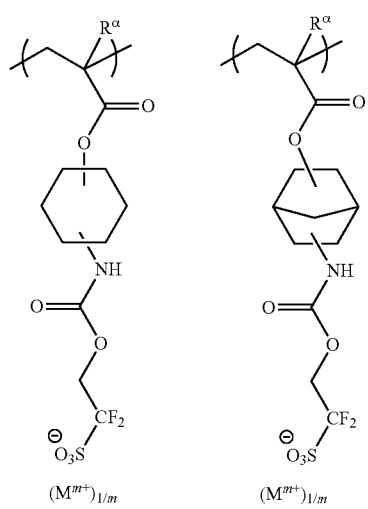
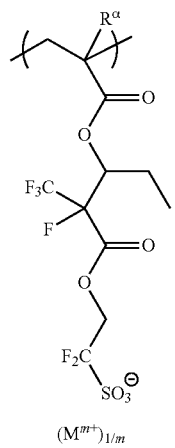
[Chemical Formula 28]
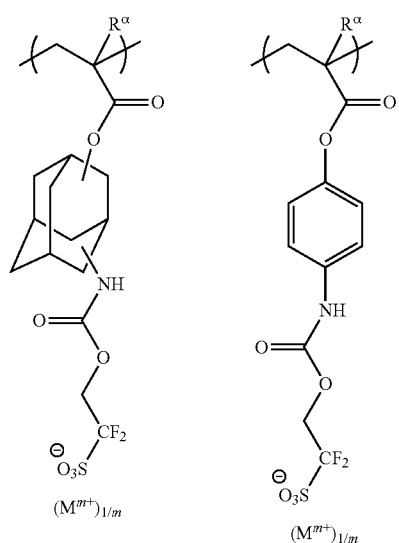
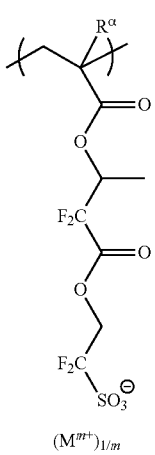

-continued
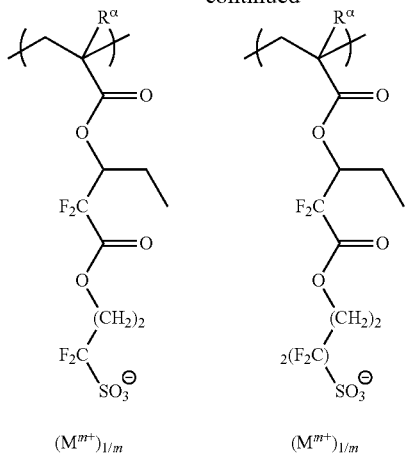
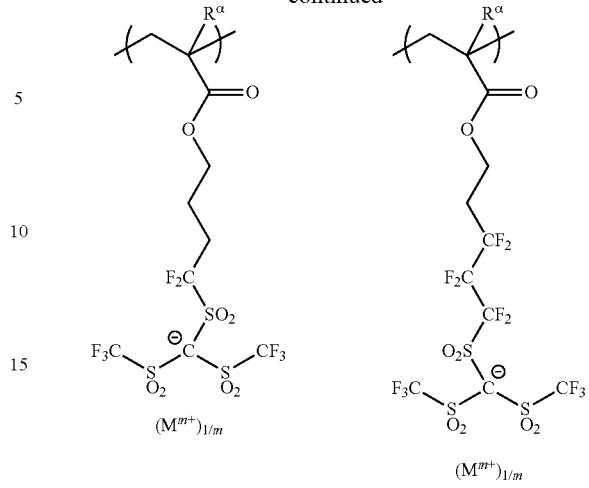
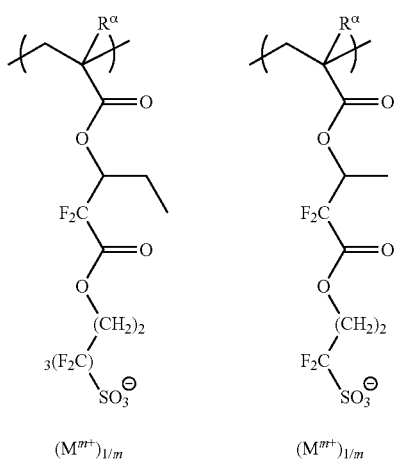
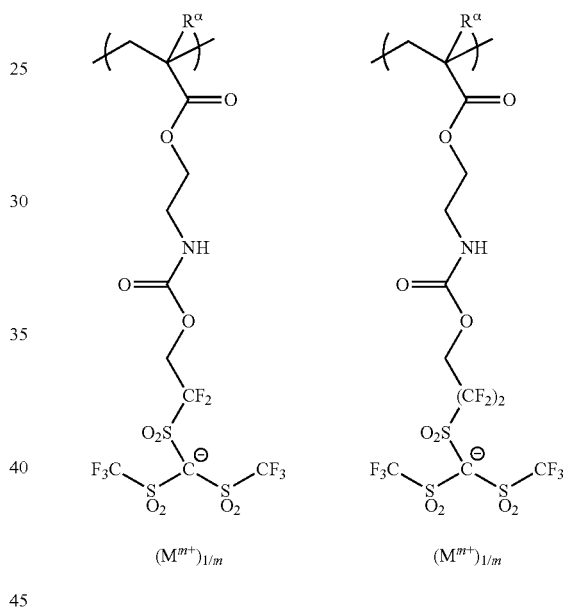
[Chemical Formula 29]
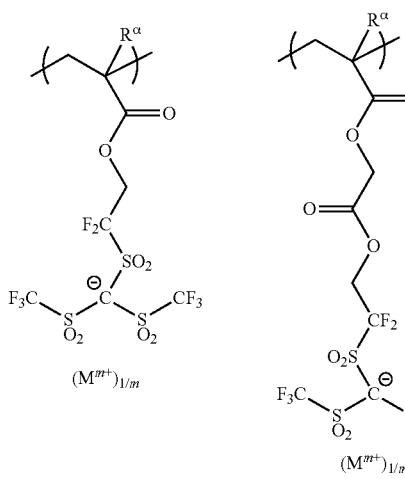
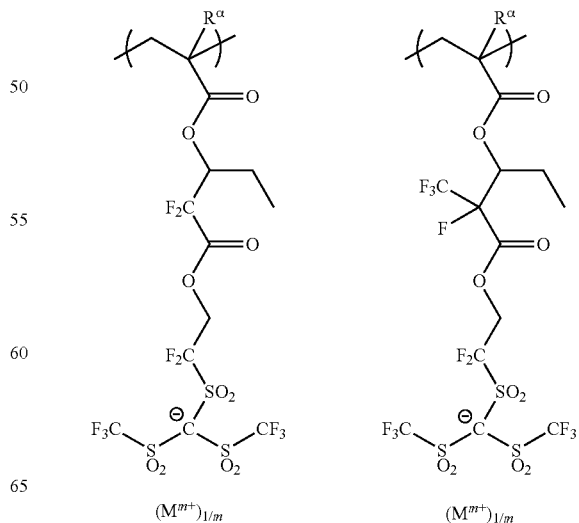

63
-continued
[Chemical Formula 30]
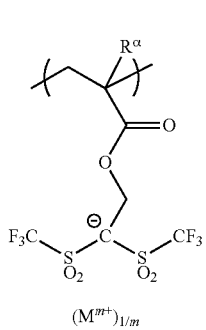 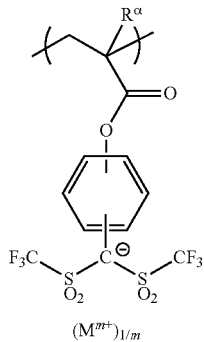
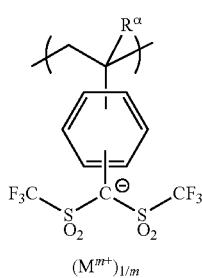 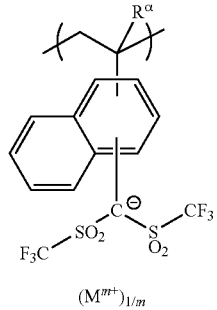
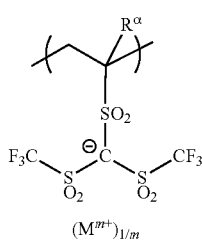 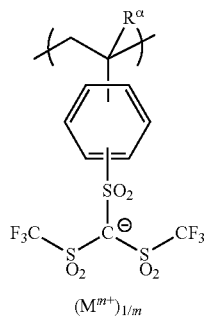
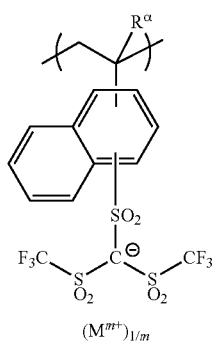
64
-continued
[Chemical Formula 31]
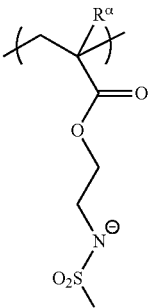 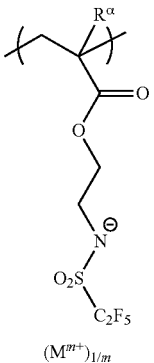 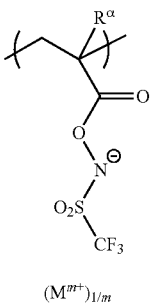
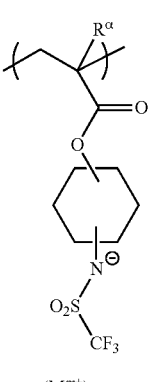 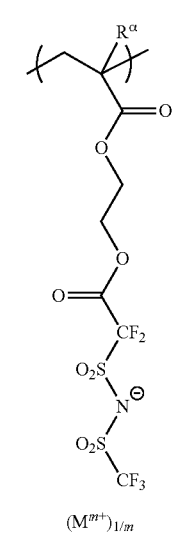
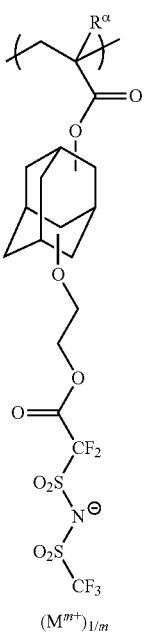 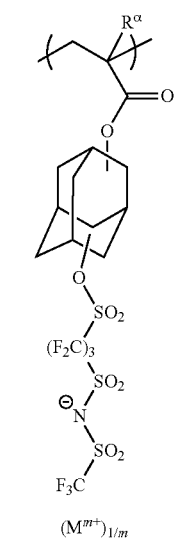

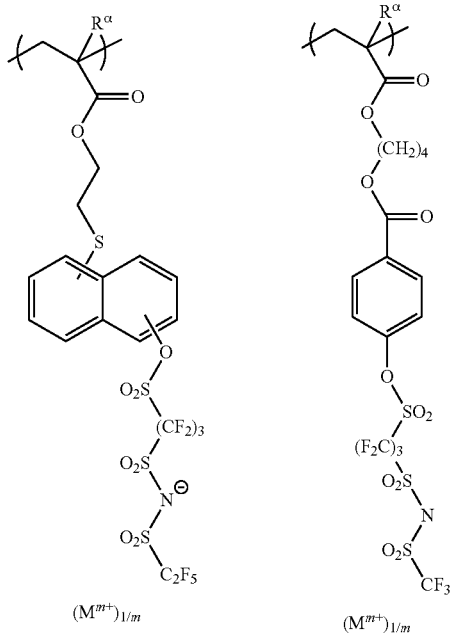

[Chemical Formula 32]

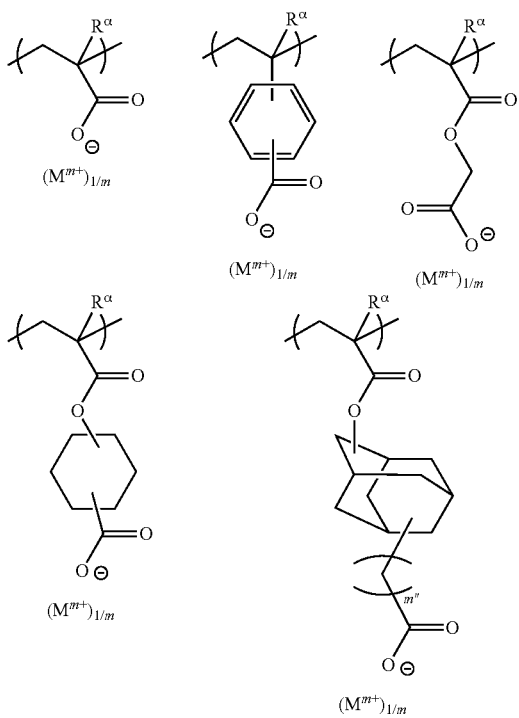

The component (A1) may have a single type of the structural unit (a5), or a combination of two or more types.

The amount of the structural unit (a5) within the component (A1), based on the combined total of all the structural units that constitute the component (A1), is preferably within a range from 1 to 50 mol %, more preferably from 1 to 45 mol %, still more preferably from 3 to 40 mol %, and most preferably from 5 to 35 mol %. When the amount of the structural unit (a5) is at least 1 mol %, the effects of the invention in improving the lithography properties such as the sensitivity and the resolution, and improving the resist pattern shape can be achieved satisfactorily, whereas when the amount of the structural unit (a5) is not more than the upper limit of the above range, a good balance can be achieved with the other structural units.

Further, satisfactory solubility in the resist solvent (a component (S) described below) can be ensured.

The component (A1) may have a structural unit other than the structural unit (a5).

The component (A1) preferably contains the structural unit (a6).

In those cases where the component (A1) contains the structural unit (a6), the component (A1) may also have, in addition to the structural unit (a5) and the structural unit (a6), a structural unit in which the group —$R^3$—$S^+(R^4)(R^5)$ in formula (a5-0-1) has a total of two or more aromatic rings, or a structural unit in which $M^{m+}$ in formula (a5-0-2) has two or more aromatic rings, or alternatively, a resin having these structural units containing two or more aromatic rings may be used together with the component (A1).

In such cases, the proportion of these types of structural units having two or more aromatic rings is preferably not more than 50 mol % of the combined total of all the structural units that constitute the resin component of the base component (A) in the resist composition. By ensuring that the proportion of structural units having two or more aromatic rings is not more than 50 mol %, the effect of the invention in improving the lithography properties and the resist pattern shape can be satisfactorily achieved.

Further, examples of structural units that can be used other than the structural unit (a5) include any of the multitude of conventional structural units used within resist resins for ArF excimer lasers or KrF excimer lasers (and particularly for ArF excimer lasers). Examples of these other structural units include a structural unit (a1) containing an acid-decomposable group that exhibits increased polarity under the action of acid, a structural unit (a2) containing an —$SO_2$-containing cyclic group or a lactone-containing cyclic group, a structural unit (a3) containing a polar group, and a structural unit (a4) containing a non-acid-dissociable cyclic group.

In those cases where the component (A1) is the component (A1-2), the component (A1-2) preferably contains a polar group.

Examples of the polar group include the same groups as those mentioned for the polar group of the structural unit (a3) described below, and an alkali-soluble group such as a hydroxyl group or a carboxyl group is preferable.

When the structural unit (a5) contains a polar group, the component (A1-2) may be composed solely of the structural unit (a5), or may also include the structural unit (a3) in addition to the structural unit (a5).

When a structural unit that does not have a polar group is used as the structural unit (a5), the component (A1-2) must include the structural unit (a3) in addition to the structural unit (a5).

In those cases where the component (A1) is the component (A1-1), the component (A1-1) preferably contains an acid-decomposable group that exhibits increased polarity under the action of acid.

An "acid-decomposable group" is a group exhibiting acid decomposability in which at least part of the bonding within the structure of the acid-decomposable group can be cleaved by the action of acid (such as the acid generated from the structural unit (a5) upon exposure, or acid generated from an optional acid generator component (B) described below).

When the structural unit (a5) contains an acid-decomposable group, the component (A1-1) may be composed solely of the structural unit (a5), or may also include the structural unit (a1)) in addition to the structural unit (a5).

When a structural unit that does not have an acid-decomposable group is used as the structural unit (a5), the component (A1-1) must include the structural unit (a1) in addition to the structural unit (a5).

In the resist composition of the present aspect, the component (A1) is preferably the component (A1-1). In other words, the component (A1) is preferably a resin component which generates acid upon exposure and exhibits increased polarity under the action of acid, and the resist composition of the present aspect is preferably a chemically amplified resist composition that functions as a positive-type composition in an alkali developing process, and functions as a negative-type composition in a solvent developing process.

(Structural Unit (a6))

The structural unit (a6) is a structural unit represented by general formula (a6-1) shown below.

[Chemical Formula 33]

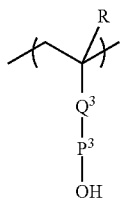

(a6-1)

In the formula, R represents a hydrogen atom, an alkyl group of 1 to 5 carbon atoms or a halogenated alkyl group of 1 to 5 carbon atoms, $Q^3$ represents a single bond or a divalent linking group, and $P^3$ represents an aromatic hydrocarbon group which may have a substituent.

In formula (a6-1), R represents a hydrogen atom, an alkyl group of 1 to 5 carbon atoms or a halogenated alkyl group of 1 to 5 carbon atoms.

In formula (a6-1), the alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which part or all of the hydrogen atoms of an aforementioned alkyl group for R have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a6-1), $Q^3$ represents a single bond or a divalent linking group. Examples of the divalent linking group for $Q^3$ include the same groups as the divalent linking group for $Q^1$ in the aforementioned formula (a5-0-1), and a divalent linking group containing a hetero atom is preferable.

$Q^3$ is preferably a single bond or a divalent linking group containing a hetero atom, and is more preferably a single bond or an ester linkage (—C(=O)—O—).

In formula (a6-1), $P^3$ represents an aromatic hydrocarbon group which may have a substituent.

The aromatic hydrocarbon group for $P^3$ is a divalent hydrocarbon group having at least one aromatic ring, and may also have a substituent.

There are no particular limitations on the aromatic ring, provided it is a cyclic conjugated system having 4n+2 (wherein n represents 0 or a natural number) π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the divalent hydrocarbon group include groups in which two hydrogen atoms have been removed from an aromatic hydrocarbon ring or aromatic heterocyclic ring (namely, arylene groups or heteroarylene groups), groups in which two hydrogen atoms have been removed from an aromatic compound having two or more aromatic rings (such as biphenyl or fluorene), and groups in which one of the hydrogen atoms of a group having one hydrogen atom removed from an aforementioned aromatic hydrocarbon ring or aromatic heterocyclic ring (namely, an aryl group or heteroaryl group) has been substituted with an alkylene group (for example, groups in which one further hydrogen atom has been removed from the aryl group within an arylalkyl group such as a benzyl group, phenethyl group, 1-naphthylmethyl group, 2-naphthylmethyl group, 1-naphthylethyl group or 2-naphthylethyl group). The alkylene group bonded to the aryl group or heteroaryl group preferably contains 1 to 4 carbon atoms, more preferably 1 or 2 carbon atoms, and most preferably 1 carbon atom.

Of the various possibilities, $P^3$ is preferably a group in which two hydrogen atoms have been removed from an aforementioned aromatic hydrocarbon ring (namely, an arylene group), and is more preferably a group in which two hydrogen atoms have been removed from benzene or naphthalene.

The bonding position for the hydroxyl group (—OH) on the aromatic hydrocarbon ring of $P^3$ may be the o-position, the m-position or the p-position of the aromatic hydrocarbon ring, but in terms of ready availability and low cost, the p-position is preferred.

The aromatic hydrocarbon group for $P^3$ may or may not have a substituent. For example, a hydrogen atom bonded to the aromatic ring within the aromatic hydrocarbon group may be substituted with a substituent. Examples of this substituent include an alkyl group, alkoxy group, halogen atom, halogenated alkyl group, hydroxyl group and oxo group (=O).

The alkyl group as the substituent is preferably an alkyl group of 1 to 5 carbon atoms, and a methyl group, ethyl group, propyl group, n-butyl group or tert-butyl group is the most desirable.

The alkoxy group as the substituent for is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent include a fluorine atom, chlorine atom, bromine atom and iodine atom, and a fluorine atom is preferable.

Examples of the halogenated alkyl group as the substituent include groups in which part or all of the hydrogen atoms in an aforementioned alkyl group have each been substituted with an aforementioned halogen atom.

Examples of preferred forms of the structural unit (a6) include structural units represented by formula (a6-1-1) shown below.

[Chemical Formula 34]

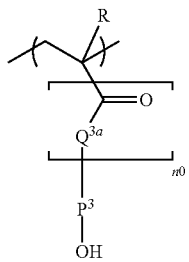

(a6-1-1)

In the formula, R represents a hydrogen atom, an alkyl group of 1 to 5 carbon atoms or a halogenated alkyl group of 1 to 5 carbon atoms, $Q^{3a}$ represents NH or O, n0 represents 0 or 1, and $P^3$ represents an aromatic hydrocarbon group which may have a substituent.

In formula (a6-1-1), R and $P^3$ are the same as defined above for R and $P^3$ in formula (a6-1).

Specific examples of the structural unit (a6) are shown below. In each of the following formulas, $R^\alpha$ represents a hydrogen atom, a methyl group, or a trifluoromethyl group.

[Chemical Formula 35]

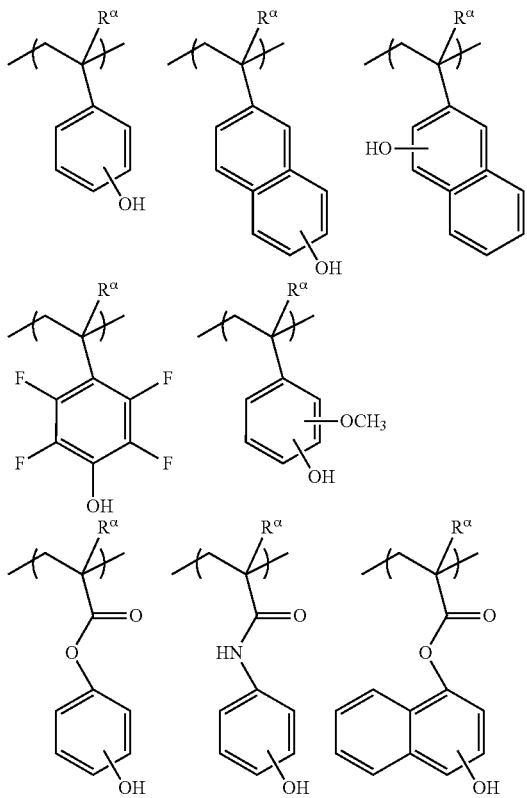

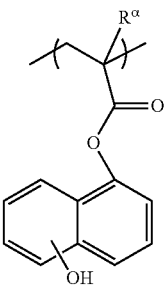

The component (A1) may have a single type of the structural unit (a6), or a combination of two or more types.

The amount of the structural unit (a6) within the component (A1), based on the combined total of all the structural units that constitute the component (A1), is preferably within a range from 10 to 50 mol %, more preferably from 20 to 40 mol %, still more preferably from 22.5 to 37.5 mol %, and most preferably from 25 to 35 mol %.

When the amount of the structural unit (a6) is at least as great as the lower limit of the above range, the sensitivity in EUV lithography and EB lithography processes can be further enhanced. On the other hand, when the amount of the structural unit (a6) is not more than the upper limit of the above range, good balance can readily be achieved with the other structural units. Further, the resolution also improves.

(Structural Unit (a1))

The structural unit (a1) is a structural unit containing an acid-decomposable group that exhibits increased polarity under the action of acid.

The "acid-decomposable group" is a group exhibiting acid decomposability in which at least part of the bonding within the structure of the acid-decomposable group can be cleaved by the action of acid.

Examples of acid-decomposable groups that exhibit increased polarity under the action of an acid include groups which are decomposed by the action of an acid to form a polar group.

Examples of the polar group include a carboxyl group, a hydroxyl group, an amino group and a sulfo group (—SO₃H). Among these, a polar group containing —OH within the structure (hereafter also referred to as an "OH-containing polar group") is preferred, a carboxyl group or a hydroxyl group is more preferred, and a carboxyl group is particularly desirable.

More specific examples of the acid-decomposable groups include groups in which the aforementioned polar group is protected with an acid-dissociable group (such as groups in which the hydrogen atom of an OH-containing polar group is protected with an acid-dissociable group).

An "acid-dissociable group" is a group exhibiting acid dissociability in which at least the bond between the acid-dissociable group and the atom adjacent to this acid-dissociable group can be cleaved by the action of acid. It is necessary that the acid-dissociable group that constitutes the acid-decomposable group is a group which exhibits a lower polarity than the polar group generated by the dissociation of the acid-dissociable group. Thus, when the acid-dissociable group is dissociated by the action of acid, a polar group exhibiting a higher polarity than that of the acid-dissociable group is generated, thereby increasing the polarity. As a result, the polarity of the entire component (A1-1) is increased. Increasing the polarity causes a relative change in the solubility within a developing solution, and the solubility increases when the developing solution is an alkali developing solution.

There are no particular limitations on the acid-dissociable group, and any of the groups that have been conventionally proposed as acid-dissociable groups for the base resins of chemically amplified resists can be used. Generally, groups that form either a cyclic or chain-like tertiary alkyl ester with the carboxyl group of (meth)acrylic acid or the like, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched, acid-dissociable groups, acid-dissociable groups containing an aliphatic cyclic group, and acid-dissociable groups containing an aromatic hydrocarbon group.

Here, the term "aliphatic branched" refers to a branched structure having no aromaticity. The "aliphatic branched, acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, acid-dissociable group include groups represented by the formula —C($R^{71}$)($R^{72}$)($R^{73}$). In this formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, 2-methyl-2-butyl group, 2-methyl-2-pentyl group and 3-methyl-3-pentyl group.

Among these, a tert-butyl group is particularly desirable.

The term "aliphatic cyclic group" refers to a monocyclic group or polycyclic group that has no aromaticity.

In the "acid-dissociable group containing an aliphatic cyclic group", the aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the "aliphatic cyclic group" exclusive of substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either a monocyclic group or a polycyclic group.

Examples of the aliphatic cyclic group include groups in which one or more hydrogen atoms have been removed from either a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, in these alicyclic hydrocarbon groups, part of the carbon atoms that constitute the ring structure may be replaced with an ether group (—O—).

Examples of acid-dissociable groups containing an aliphatic cyclic group include:

(i) a group in which a substituent (a group or an atom other than hydrogen) is bonded to the carbon atom within the ring structure of a monovalent aliphatic cyclic group that is bonded to the atom adjacent to the acid-dissociable group (for example, the —O— within a —C(=O)—O— group), thereby forming a tertiary carbon atom on the ring structure of the monovalent aliphatic cyclic group, and (ii) a group which has a monovalent aliphatic cyclic group, and a branched alkylene group containing a tertiary carbon atom that is bonded to the monovalent aliphatic cyclic group.

In the group (i), an example of the substituent bonded to the carbon atom within the ring structure of a monovalent aliphatic cyclic group that is bonded to the atom adjacent to the acid-dissociable group is an alkyl group. Examples of such alkyl groups include the same groups as those described below for $R^{14}$ in formulas (1-1) to (1-9).

Specific examples of the group (i) include groups represented by general formulas (1-1) to (1-9) shown below.

Specific examples of the group (ii) include groups represented by general formulas (2-1) to (2-6) shown below.

[Chemical Formula 36]

(1-1)

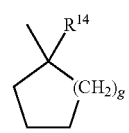

(1-2)

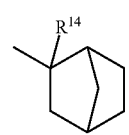

(1-3)

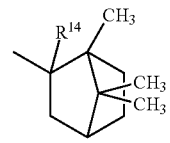

(1-4)

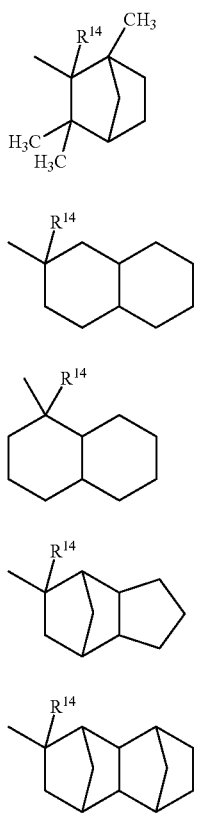

In the formulas above, $R^{14}$ represents an alkyl group, and g represents an integer of 0 to 8.

[Chemical Formula 37]

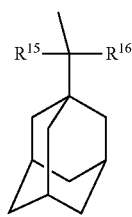

(2-1)

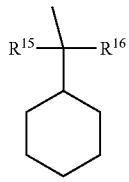

(2-2)

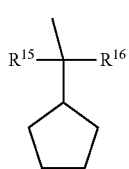

(2-3)

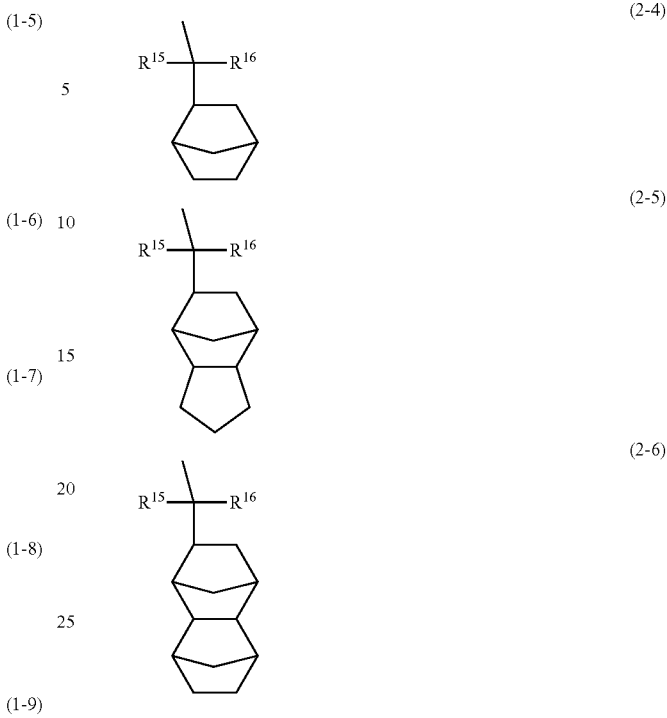

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

g is preferably an integer of 0 to 3, more preferably 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and (2-1) to (2-6), part of the carbon atoms that constitute the ring(s) may be replaced with an ethereal oxygen atom (—O—).

Further, in formulas (1-1) to (1-9) and (2-1) to (2-6), one or more of the hydrogen atoms bonded to the carbon atoms that constitute the ring(s) may each be substituted with a substituent. Examples of the substituent include an alkyl group of 1 to 5 carbon atoms, a fluorine atom and a fluorinated alkyl group.

The "aromatic hydrocarbon group" in the acid-dissociable group containing an aromatic hydrocarbon group is a hydrocarbon group having at least one aromatic ring.

There are no particular limitations on the aromatic ring, provided it is a cyclic conjugated system having 4n+2 (wherein n represents 0 or a natural number) π electrons, and the aromatic ring may be either monocyclic or polycyclic.

The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents.

Specific examples of the aromatic ring include aromatic hydrocarbon rings such as benzene, naphthalene, anthracene and phenanthrene.

The aromatic ring may have a substituent. For example, a hydrogen atom bonded to the aromatic ring of the aromatic hydrocarbon group may be substituted with a substituent. Examples of the substituent include an alkyl group, alkoxy group, halogen atom, halogenated alkyl group, hydroxyl group and oxo group (=O). The alkyl group as the substituent for the aromatic hydrocarbon group is preferably an alkyl group of 1 to 5 carbon atoms, and is most preferably a methyl group, ethyl group, propyl group, n-butyl group or tert-butyl group. The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group. Examples of the halogen atom as the substituent for the aromatic hydrocarbon group include a fluorine atom, chlorine atom, bromine atom and iodine atom, and a fluorine atom is preferable. Examples of the halogenated alkyl group as the substituent for the aromatic hydrocarbon group include groups in which part or all of the hydrogen atoms of an aforementioned alkyl group have each been substituted with an aforementioned halogen atom.

Examples of the acid-dissociable group containing an aromatic hydrocarbon group include groups having an aromatic ring and a branched alkylene group having a tertiary carbon atom bonded to the aromatic ring. Specific examples include groups represented by the general formulas shown below.

[Chemical Formula 38]

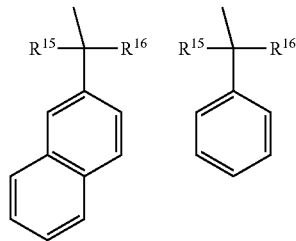

In the formulas, $R^{15}$ and $R^{16}$ are the same as defined above.

An "acetal-type acid-dissociable group" generally substitutes a hydrogen atom at the terminal of an OH-containing polar group such as a carboxyl group or hydroxyl group, so as to be bonded with an oxygen atom. Under the action of acid, the bond between the acetal-type acid-dissociable group and the oxygen atom to which the acetal-type acid-dissociable group is bonded is broken, thereby forming an OH-containing polar group such as a carboxyl group or hydroxyl group.

Examples of acetal-type acid-dissociable groups include groups represented by general formula (p1) shown below.

[Chemical Formula 39]

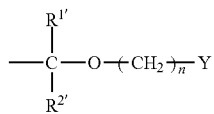

(p1)

In the formula, each of $R^{1'}$ and $R^{2'}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p1), n is preferably an integer of 0 to 2, more preferably 0 or 1, and most preferably 0.

Examples of the alkyl group for $R^{1'}$ and $R^{2'}$ include the same alkyl groups as those described above for the substituent which may be bonded to the carbon atom on the α-position of an aforementioned α-substituted acrylate ester, but a methyl group or ethyl group is preferable, and a methyl group is particularly desirable.

In the present invention, it is preferable that at least one of $R^{1'}$ and $R^{2'}$ is a hydrogen atom. In other words, it is preferable that the acid-dissociable group (p1) is a group represented by general formula (p1-1) shown below.

[Chemical Formula 40]

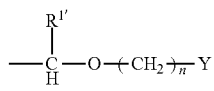

(p1-1)

In the formula, $R^{1'}$, n and Y are the same as defined above.

Examples of the alkyl group for Y include the same alkyl groups as those described above for the substituent which may be bonded to the carbon atom on the α-position of an aforementioned α-substituted acrylate ester.

As the aliphatic cyclic group for Y, any of the monocyclic or polycyclic aliphatic cyclic groups that have been proposed for conventional ArF resists or the like can be selected and used as appropriate. For example, the same aliphatic cyclic groups as those described above in connection with the "acid-dissociable group containing an aliphatic cyclic group" can be used.

Further, as the acetal-type, acid-dissociable group, groups represented by general formula (p2) shown below can also be used.

[Chemical Formula 41]

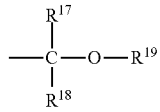

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein the terminal of $R^{17}$ and the terminal of $R^{19}$ are bonded to each other to form a ring.

The alkyl group for $R^{17}$ and $R^{18}$ preferably has 1 to 15 carbon atoms, and may be either linear or branched. The alkyl group is preferably an ethyl group or methyl group, and most preferably a methyl group.

It is particularly desirable that either one of $R^{17}$ and $R^{18}$ is a hydrogen atom, and the other is a methyl group.

$R^{19}$ represents a linear, branched or cyclic alkyl group, which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (preferably an alkylene group of 1 to 5 carbon atoms), wherein the terminal of $R^{19}$ and the terminal of $R^{17}$ may be bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. This cyclic group is preferably a 4- to 7-membered ring, and more preferably a 4- to 6-membered ring. Specific examples of the cyclic group include a tetrahydropyranyl group and a tetrahydrofuranyl group.

Provided the structural unit (a1) contains an acid-decomposable group, there are no particular limitations on the remaining structure of the structural unit, and examples include a structural unit (a11) derived from an acrylate ester in which the hydrogen atom bonded to the carbon atom on the α-position may be substituted with a substituent, and containing an acid-decomposable group, a structural unit (a12) derived from a hydroxystyrene in which the hydrogen atom bonded to the carbon atom on the α-position may be substituted with a substituent, in which the hydrogen atoms bonded to the benzene ring may be substituted with a substituent other than a hydroxyl group, and in which the hydrogen atom of the hydroxyl group is substituted with an acid-dissociable group or a substituent containing an acid-dissociable group, and a structural unit (a13) derived from a vinyl(hydroxynaphthalene) in which the hydrogen atom bonded to the carbon atom on the α-position may be substituted with a substituent, in which the hydrogen atoms bonded to the naphthalene ring may be substituted with a substituent other than a hydroxyl group, and in which the hydrogen atom of the hydroxyl group is substituted with an acid-dissociable group or a substituent containing an acid-dissociable group. The structural unit (a11) is preferred in terms of improving roughness (namely, reducing line width roughness and line edge roughness), and the structural unit (a12) or the structural unit (a13) is preferred in terms of facilitating absorption of the EUV wavelength, and further reducing the effects of OoB light on the acid generator component.

{Structural Unit (a11)}

The structural unit (a11) is a structural unit derived from an acrylate ester in which the hydrogen atom bonded to the carbon atom on the α-position may be substituted with a substituent and containing an acid-decomposable group.

Specific examples of the structural unit (a11) include structural units represented by general formula (a1-0-1) shown below and structural units represented by general formula (a1-0-2) shown below.

[Chemical Formula 42]

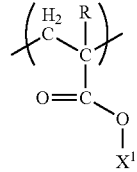
(a1-0-1)

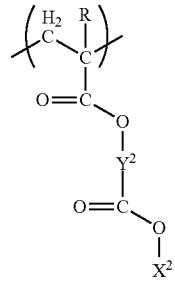
(a1-0-2)

In the formulas, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In general formula (a1-0-1), examples of the alkyl group and halogenated alkyl group for R include the same groups alkyl groups and halogenated alkyl groups as those mentioned above for the substituent on the α-position within the description relating to the aforementioned α-substituted acrylate ester. R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, a tertiary alkyl ester-type acid-dissociable group is preferable.

In general formula (a1-0-2), R is the same as defined above.

$X^2$ is the same as defined for $X^1$ in general formula (a1-0-1).

Although there are no particular limitations on the divalent linking group for $Y^2$, preferred examples include divalent hydrocarbon groups which may have a substituent, and divalent linking groups containing a hetero atom. Examples of these divalent hydrocarbon groups which may have a substituent and divalent linking groups containing a hetero atom include the same groups as those mentioned above for the divalent linking group for $Q^1$ in formula (a5-0-1).

$Y^2$ is preferably a linear or branched alkylene group, a divalent alicyclic hydrocarbon group, or a divalent linking group containing a hetero atom.

When $Y^2$ represents a linear or branched alkylene group, the alkylene group preferably contains 1 to 10 carbon atoms, more preferably 1 to 6 carbon atoms, still more preferably 1 to 4 carbon atoms, and most preferably 1 to 3 carbon atoms. Specific examples include the same linear alkylene groups and branched alkylene groups as those mentioned above, within the description of the divalent linking group for $Q^1$ in formula (a5-0-1), as the linear or branched aliphatic hydrocarbon group.

When $Y^2$ represents a divalent alicyclic hydrocarbon group, examples of the alicyclic hydrocarbon group include the same cyclic aliphatic hydrocarbon groups (alicyclic hydrocarbon groups) as those mentioned above, within the description for the divalent linking group for $Q^1$ in formula (a5-0-1), as the "aliphatic hydrocarbon group that includes a ring within the structure".

As the alicyclic hydrocarbon group, a group in which two or more hydrogen atoms have been removed from cyclopentane, cyclohexane, norbornane, isobornane, adamantane, tricyclodecane or tetracyclododecane or the like is particularly preferred.

When $Y^2$ represents a divalent linking group containing a hetero atom, preferred examples of the linking group include —O—, —C(=O)—O—, —C(=O)—, —O—C(=O)—O—, —C(=O)—NH—, —NH— (wherein H may be substituted with a substituent such as an alkyl group or an acyl group or the like), —S—, —S(=O)$_2$—, —S(=O)$_2$—O—, and groups represented by a general formula —$Y^{21}$—O—$Y^{22}$—, —[$Y^{21}$—C(=O)—O]$_{m'}$—$Y^{22}$— or —$Y^{21}$—O—C(=O)—$Y^{22}$— [wherein each of $Y^{21}$ and $Y^{22}$ independently represents a divalent hydrocarbon group which may have a substituent, O represents an oxygen atom, and m' represents an integer of 0 to 3].

When $Y^2$ represents —NH—, the H may be substituted with a substituent such as an alkyl group or an acyl group or the like. The substituent (the alkyl group or acyl group or the like) preferably has 1 to 10 carbon atoms, more preferably 1 to 8 carbon atoms, and most preferably 1 to 5 carbon atoms.

In the group represented by the formula —$Y^{21}$—O—$Y^{22}$—, —[$Y^{21}$—C(=O)—O]$_{m'}$—$Y^{22}$— or —$Y^{21}$—O—C(=O)—$Y^{22}$—, each of $Y^{21}$ and $Y^{22}$ independently represents a divalent hydrocarbon group which may have a substituent. Examples of this divalent hydrocarbon group include the same groups as those described above for the "divalent hydrocarbon group which may have a substituent" for $Y^2$.

$Y^{21}$ is preferably a linear aliphatic hydrocarbon group, more preferably a linear alkylene group, still more preferably a linear alkylene group of 1 to 5 carbon atoms, and most preferably a methylene group or an ethylene group.

$Y^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by formula —[$Y^{21}$—C(=O)—O]$_{m'}$—$Y^{22}$— is a group represented by a formula —$Y^{21}$—C(=O)—O—$Y^{22}$—. Among such groups, groups represented by a formula —(CH$_2$)$_{a'}$—C(=O)—O—(CH$_2$)$_{b'}$— are particularly preferred. In this formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

The divalent linking group containing a hetero atom for $Y^2$ is preferably an organic group composed of a combination of at least one non-hydrocarbon group and a divalent hydrocarbon group. Among such groups, linear groups containing an oxygen atom as the hetero atom, for example, groups containing an ether linkage or ester linkage are preferable, groups represented by one of the above formulas —$Y^{21}$—O—$Y^{22}$—, —[$Y^{21}$—C(=O)—O]$_{m'}$—$Y^{22}$— or —$Y^{21}$—O—C(=O)—$Y^{22}$— are more preferable, and groups represented by either of the formulas —[$Y^{21}$—C(=O)—O]$_{m'}$—$Y^{22}$— or —$Y^{21}$—O—C(=O)—$Y^{22}$— are particularly preferable.

Of the various possibilities described above, $Y^2$ is preferably a linear or branched alkylene group, or a divalent linking group containing a hetero atom, and is more preferably a linear or branched alkylene group, a group represented by the above formula —$Y^{21}$—O—$Y^{22}$—, a group represented by the above formula —[$Y^{21}$—C(=O)—O]$_{m'}$—$Y^{22}$—, or a group represented by the above formula —$Y^{21}$—O—C(=O)—$Y^{22}$—.

Specific examples of the structural unit (a11) include structural units represented by general formulas (a1-1) to (a1-4) shown below.

[Chemical Formula 43]

(a1-1)

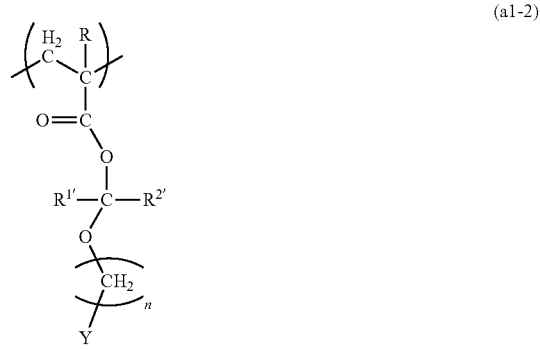

(a1-2)

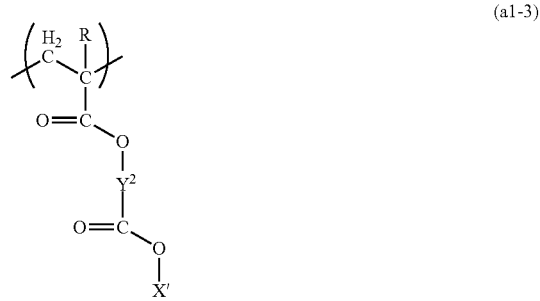

(a1-3)

-continued (a1-4)

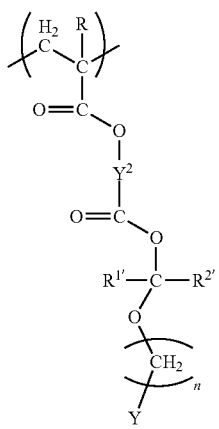

In the formulas, R, $R^{1'}$, $R^{2'}$, n, Y and $Y^2$ are each the same as defined above, and X' represents a tertiary alkyl ester-type acid-dissociable group.

In the above formulas, examples of X' include the same tertiary alkyl ester-type acid-dissociable groups as those described above.

$R^{1'}$, $R^{2'}$, n and Y are the same as defined above for $R^{1'}$, $R^{2'}$, n and Y respectively in general formula (p1) described above in connection with the "acetal-type acid-dissociable group".

Examples of $Y^2$ include the same groups as those described above for $Y^2$ in general formula (a1-0-2).

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 44]

(a1-1-1)

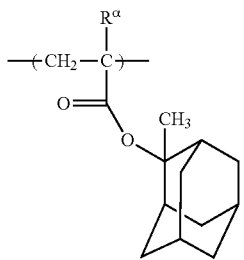

(a1-1-2)

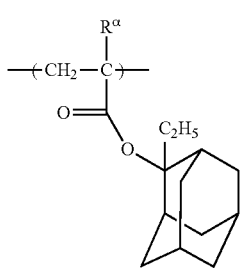

(a1-1-3)

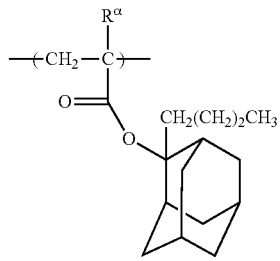

(a1-1-4)

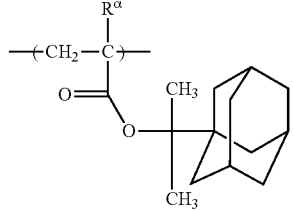

(a1-1-5)

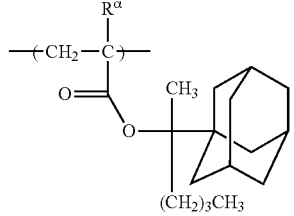

(a1-1-6)

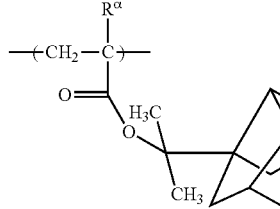

(a1-1-7)

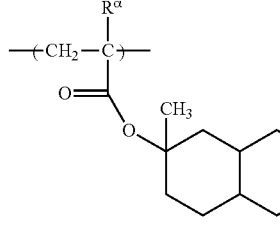

(a1-1-8)

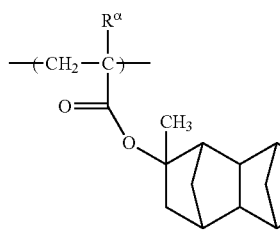

(a1-1-9)

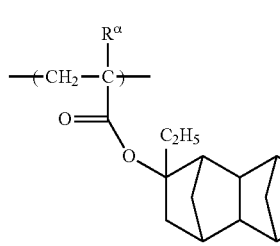

[Chemical Formula 45]
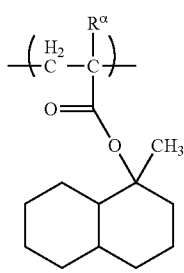 (a1-1-9)
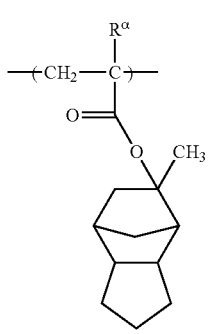 (a1-1-11)
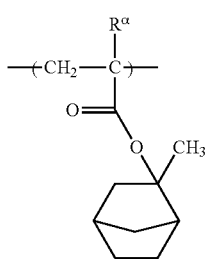 (a1-1-12)
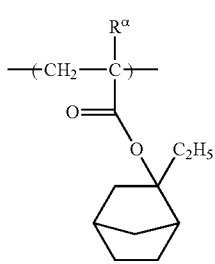 (a1-1-13)
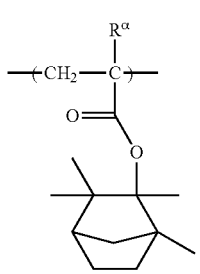 (a1-1-14)
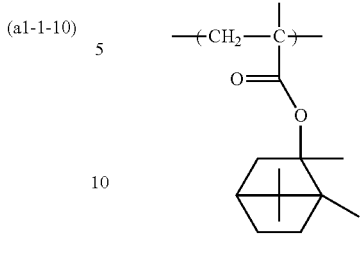 (a1-1-10)
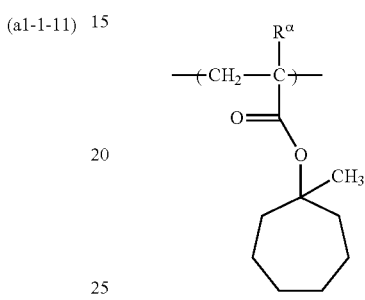 (a1-1-15)
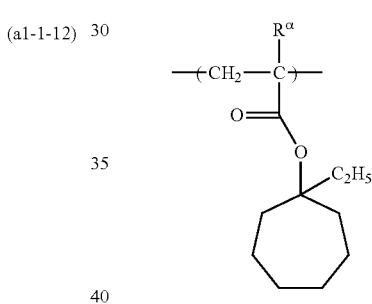 (a1-1-16)
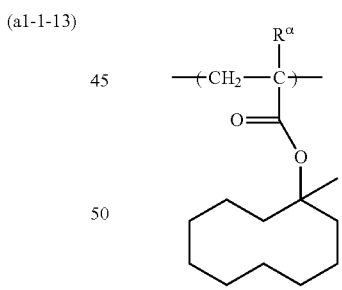 (a1-1-17)
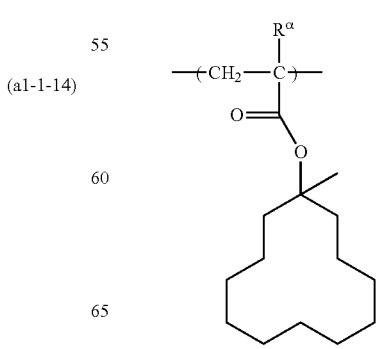 (a1-1-18)
(a1-1-19)

(a1-1-20) 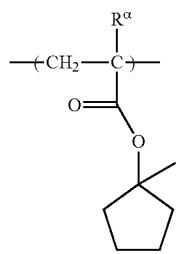
(a1-1-21) 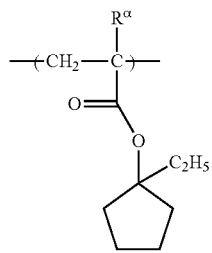
[Chemical Formula 46]
(a1-1-22) 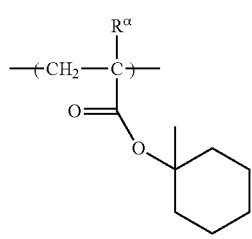
(a1-1-23) 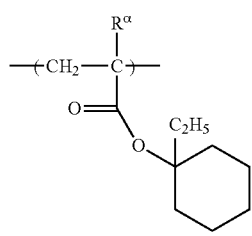
(a1-1-24) 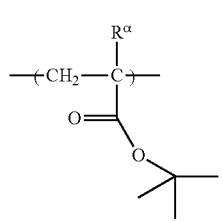
(a1-1-25) 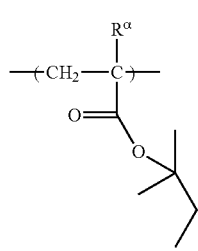
(a1-1-26) 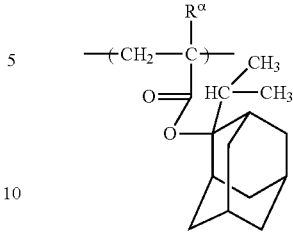
(a1-1-27) 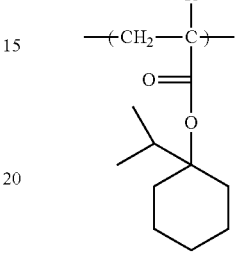
(a1-1-28) 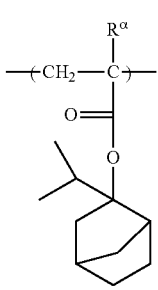
(a1-1-29) 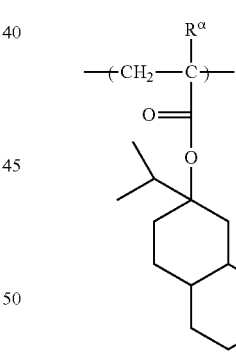
(a1-1-30) 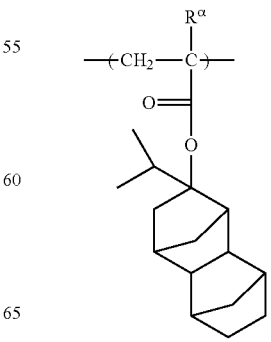

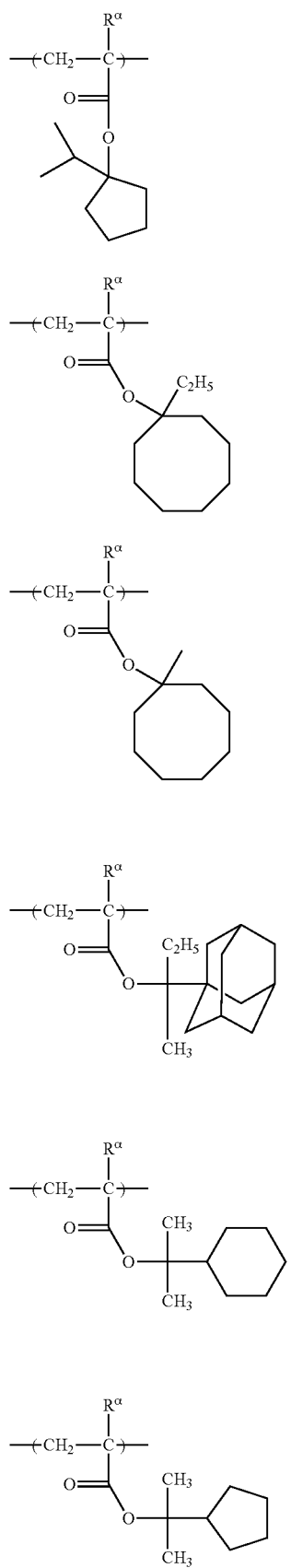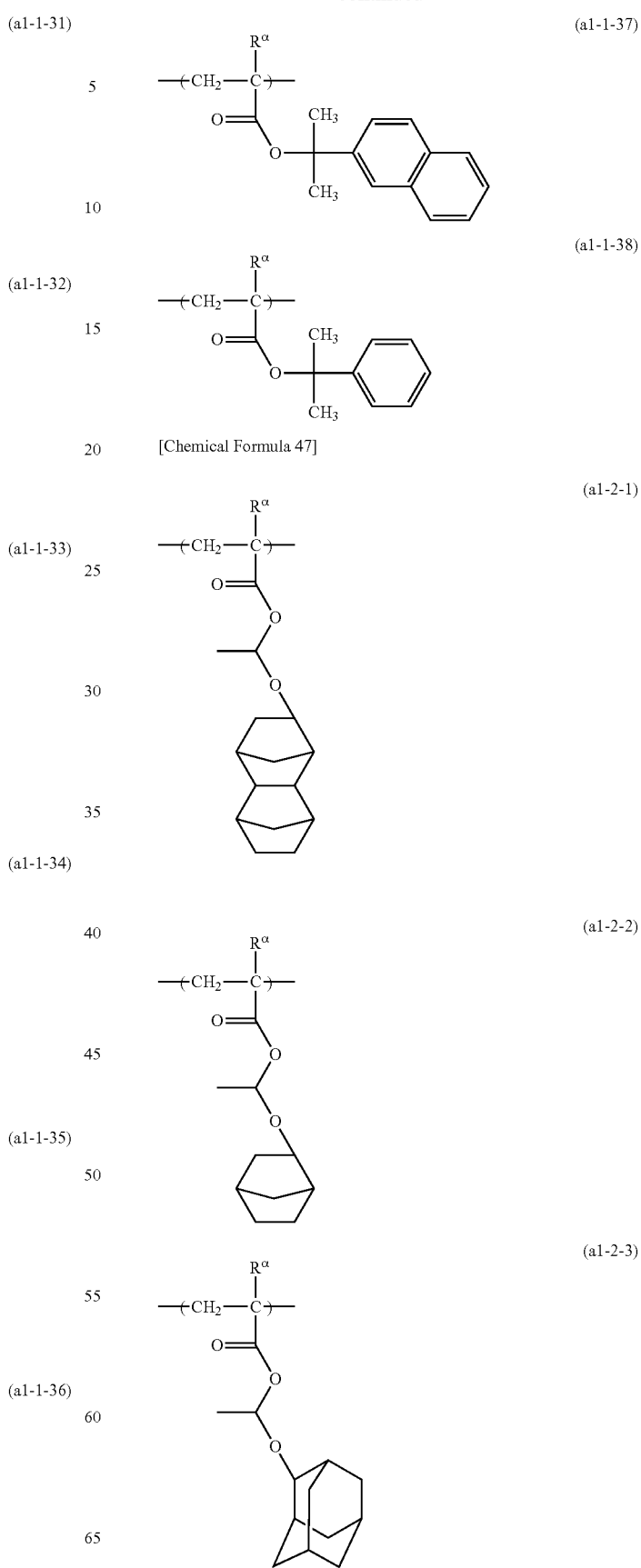

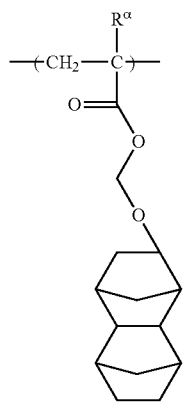 (a1-2-4)
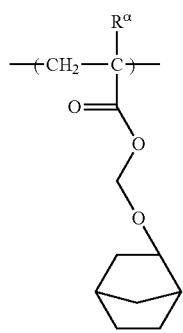 (a1-2-5)
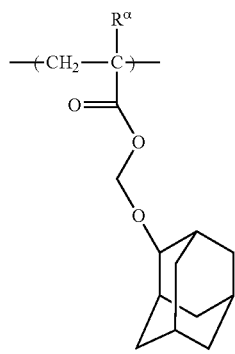 (a1-2-6)
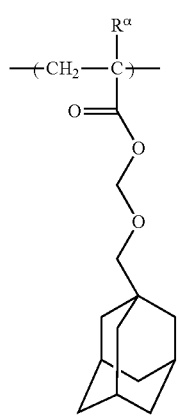 (a1-2-7)
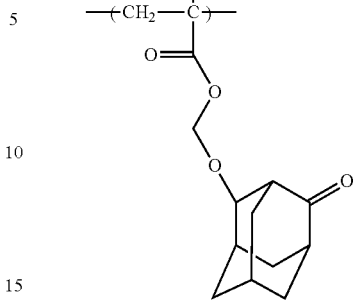 (a1-2-8)
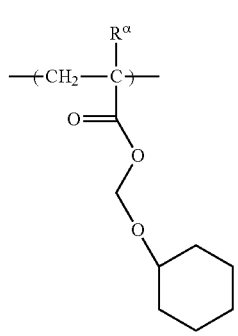 (a1-2-9)
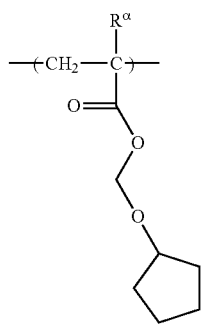 (a1-2-10)
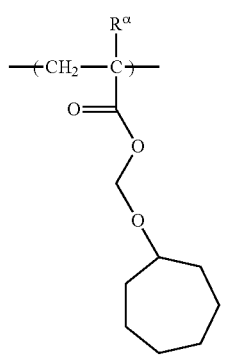 (a1-2-11)

(a1-2-12)
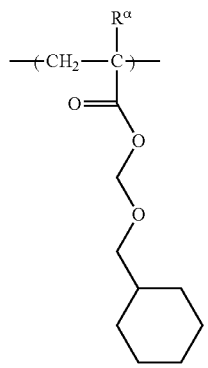
(a1-2-13)
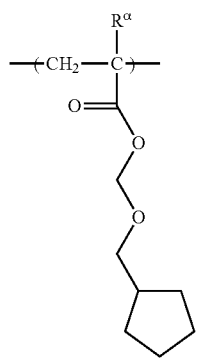
(a1-2-14)
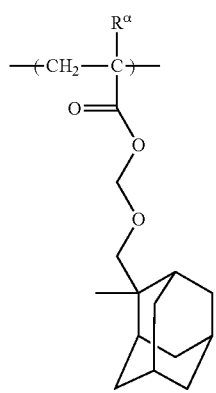
(a1-2-15)
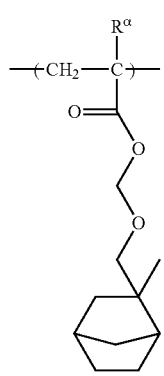
(a1-2-16)
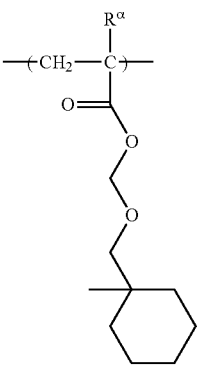
(a1-2-17)
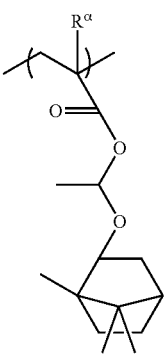
(a1-2-18)
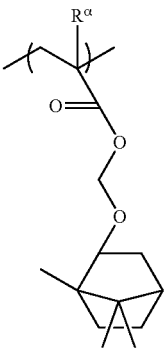
(a1-2-19)
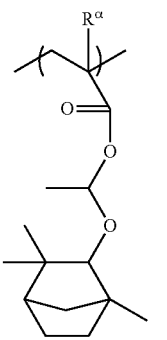

(a1-2-20)
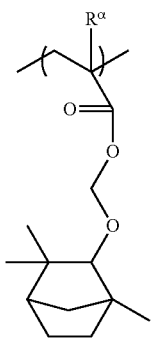
(a1-2-21)
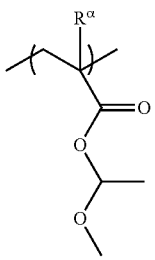
(a1-2-22)
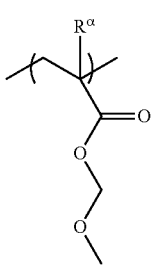
(a1-2-23)
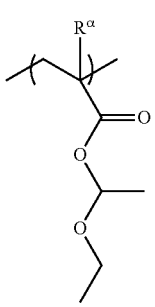
(a1-2-24)
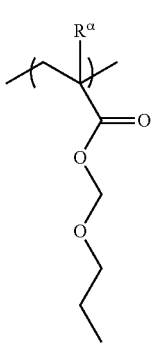
[Chemical Formula 48]
(a1-3-1)
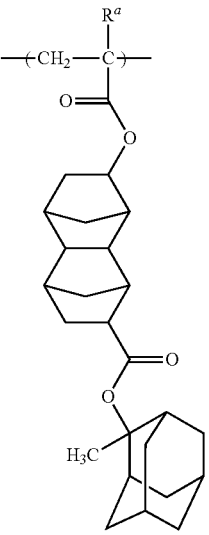
(a1-3-2)
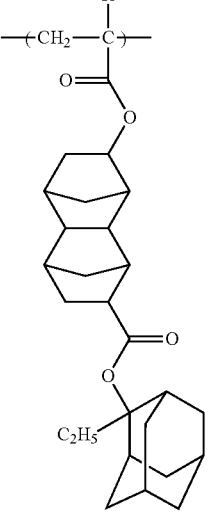
(a1-3-3)
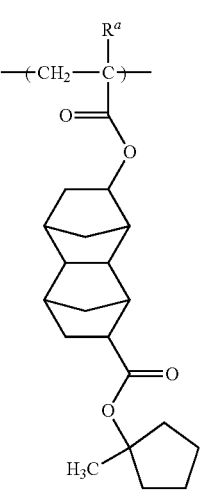

(a1-3-4)
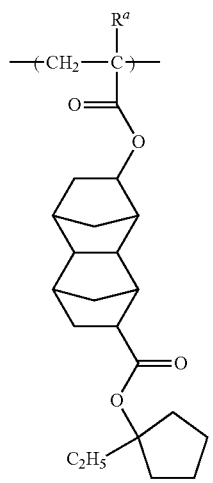
(a1-3-5)
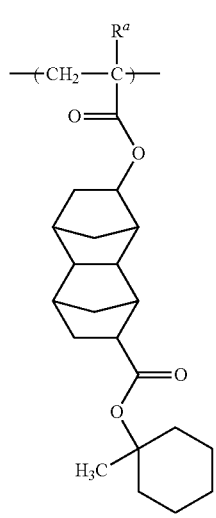
(a1-3-6)
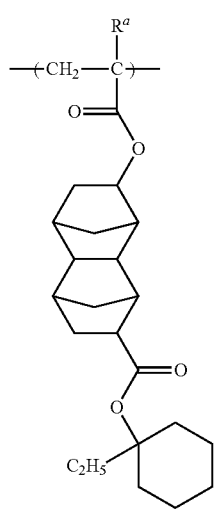
(a1-3-7)
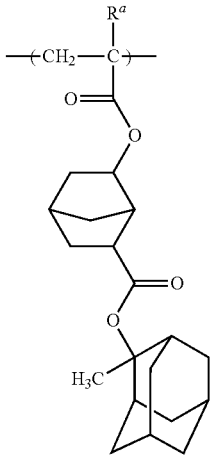
(a1-3-8)
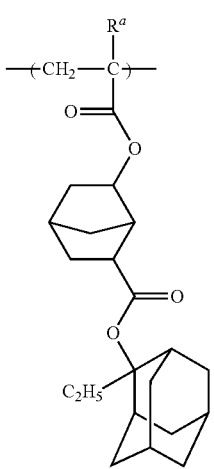
(a1-3-9)
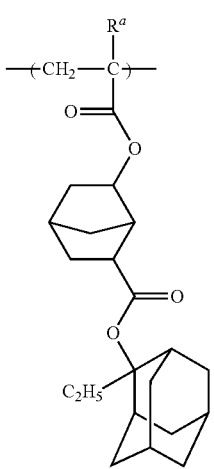

(a1-3-10) 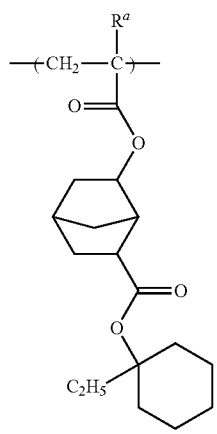
(a1-3-11) 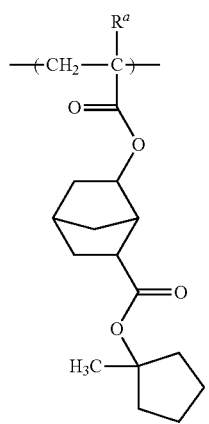
(a1-3-12) 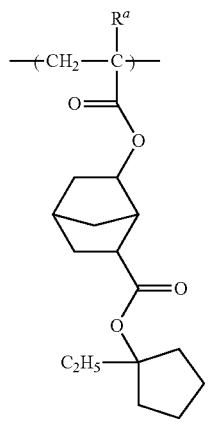
(a1-3-13) 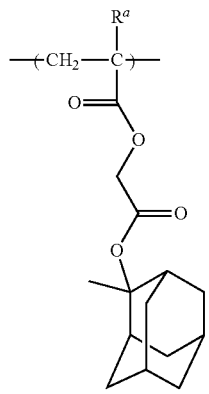
(a1-3-14) 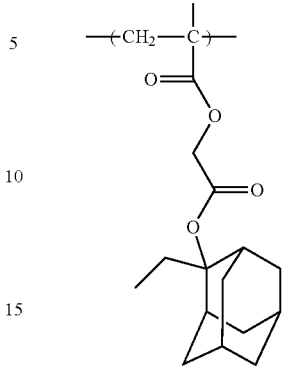
(a1-3-15) 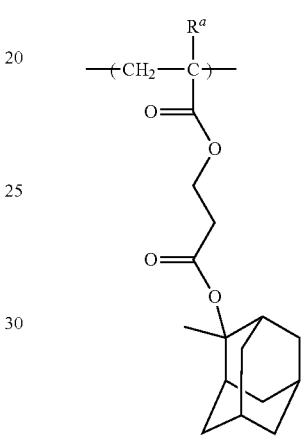
(a1-3-16) 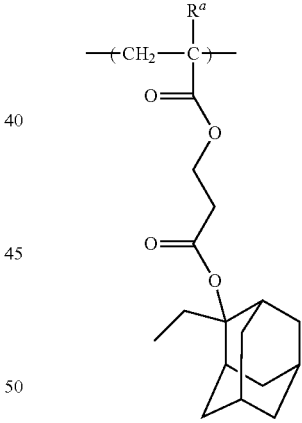
(a1-3-17) 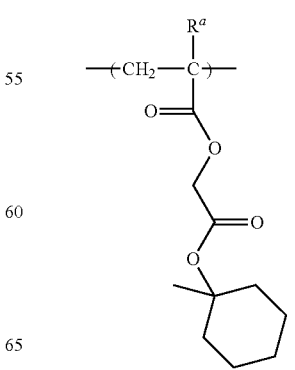

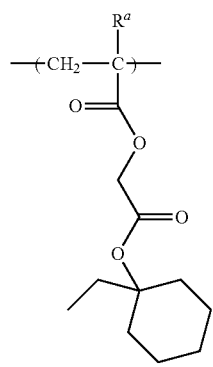
(a1-3-18)
[Chemical Formula 49]
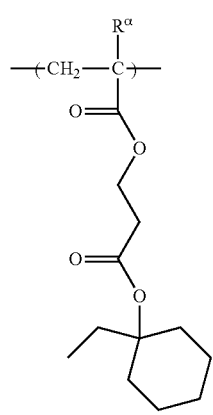
(a1-3-19)
(a1-3-20)
(a1-3-21)
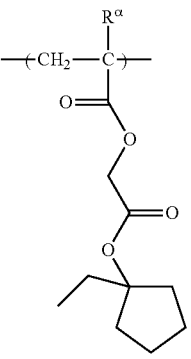
(a1-3-22)
(a1-3-23)
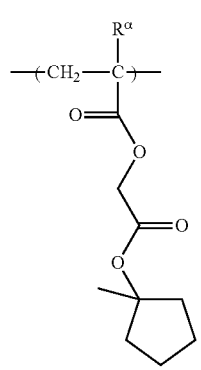
(a1-3-24)

[Chemical Formula 50]
(a1-3-25) 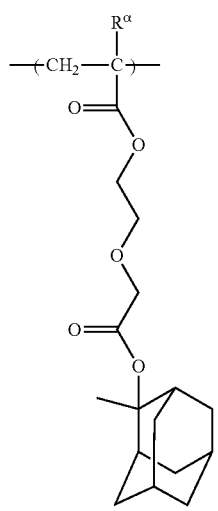
(a1-3-26) 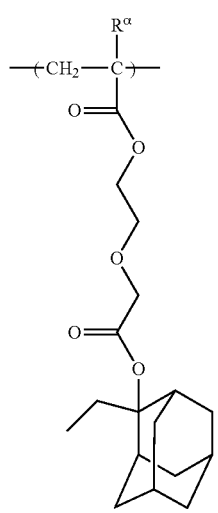
(a1-3-27) 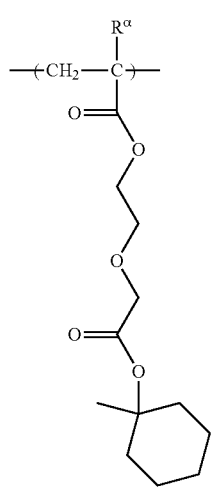
(a1-3-28) 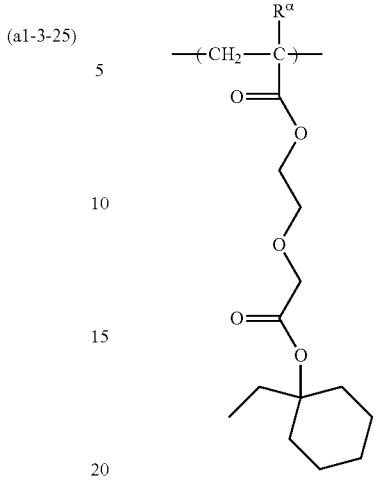
(a1-3-29) 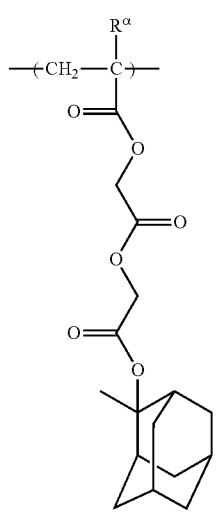
(a1-3-30) 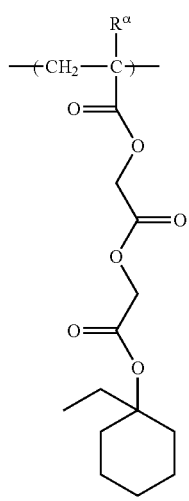

(a1-3-31)
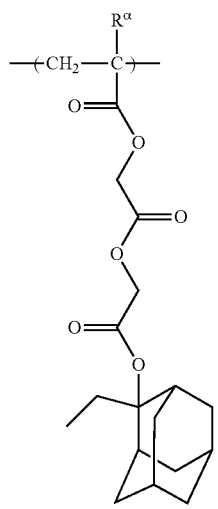
(a1-3-32)
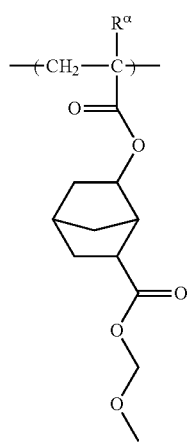
[Chemical Formula 51]
(a1-4-1)
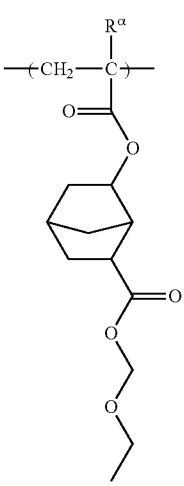
(a1-4-2)
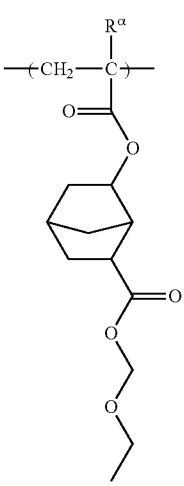
(a1-4-3)
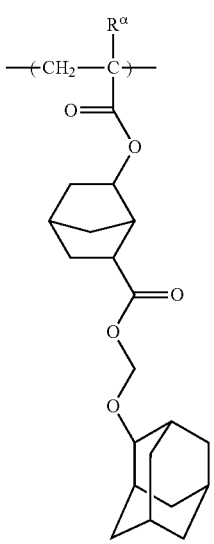
(a1-4-4)
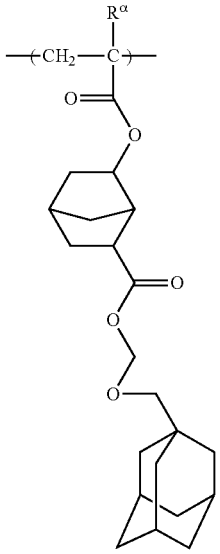

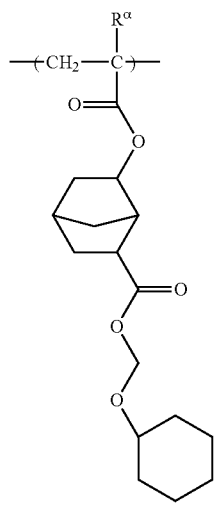
(a1-4-5)
(a1-4-6)
(a1-4-7)
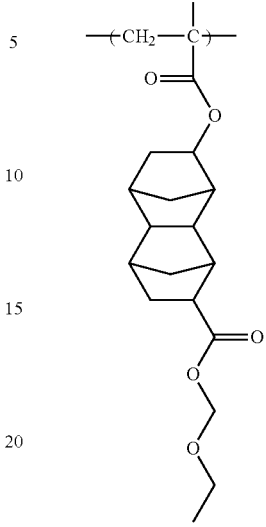
(a1-4-8)
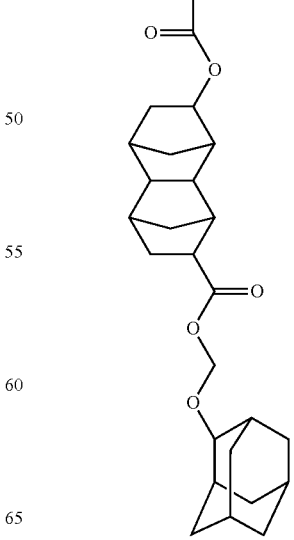
(a1-4-9)

(a1-4-10)
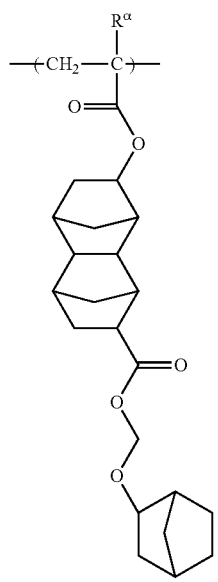
(a1-4-11)
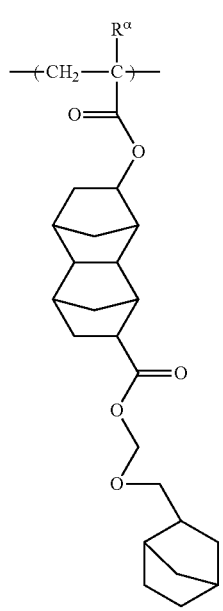
(a1-4-12)
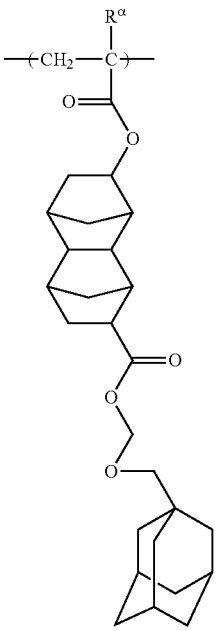
(a1-4-13)
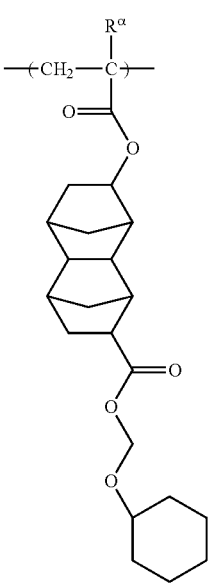

(a1-4-14)

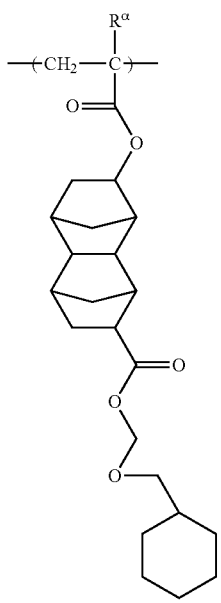

(a1-4-15)

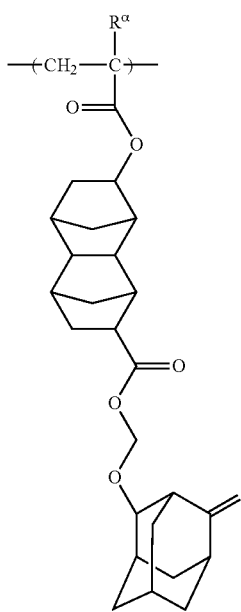

In the present invention, the structural unit (a11) preferably includes at least one structural unit selected from the group consisting of structural units represented by general formula (a1-0-11) shown below, structural units represented by general formula (a1-0-12) shown below, structural units represented by general formula (a1-0-13) shown below, structural units represented by general formula (a1-0-16) shown below, and structural units represented by general formula (a1-0-2) shown below, or preferably includes at least one structural unit selected from the group consisting of structural units represented by general formula (a1-0-11) shown below, structural units represented by general formula (a1-0-12) shown below, structural units represented by general formula (a1-0-13) shown below and structural units represented by general formula (a1-0-2) shown below.

Of these, the structural unit (a11) more preferably includes at least one structural unit selected from the group consisting of structural units represented by general formula (a1-0-12) shown below, structural units represented by general formula (a1-0-16) shown below, and structural units represented by general formula (a1-0-2) shown below, or includes at least one structural unit selected from the group consisting of structural units represented by general formula (a1-0-11) shown below, structural units represented by general formula (a1-0-12) shown below, and structural units represented by general formula (a1-0-2) shown below. It is particularly desirable that the structural unit (a11) includes at least one structural unit selected from the group consisting of structural units represented by general formula (a1-0-12) shown below and structural units represented by general formula (a1-0-2) shown below.

[Chemical Formula 52]

(a1-0-11)

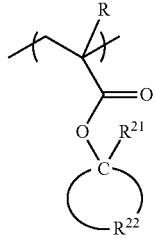

(a1-0-12)

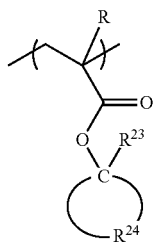

(a1-0-13)

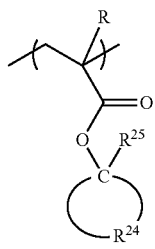

(a1-0-14)

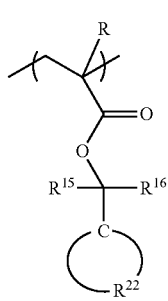

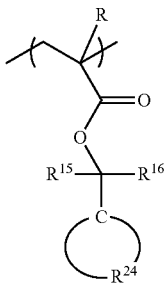

(a1-0-15)

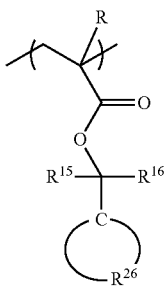

(a1-0-16)

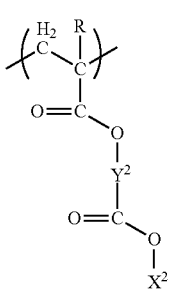

(a1-0-2)

In the formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group which forms an aliphatic monocyclic group in combination with the carbon atom to which this $R^{22}$ group is bonded, $R^{23}$ represents a branched alkyl group, $R^{24}$ represents a group which forms an aliphatic polycyclic group in combination with the carbon atom to which this $R^{24}$ group is bonded, $R^{25}$ represents a linear alkyl group of 1 to 5 carbon atoms, each of $R^{15}$ and $R^{16}$ independently represents an alkyl group, $R^{26}$ represents a group which forms an aromatic ring in combination with the carbon atom to which this $R^{26}$ group is bonded, $Y^2$ represents a divalent linking group, and $X^2$ represents an acid-dissociable group.

In each of the above formulas, R, $Y^2$ and $X^2$ are the same as defined above.

In formula (a1-0-11), examples of the alkyl group for $R^{21}$ include the same alkyl groups as those described above for $R^{14}$ in formulas (1-1) to (1-9), and of these, a methyl group, ethyl group or isopropyl group is preferred.

In terms of $R^{22}$, examples of the aliphatic monocyclic group that is formed by $R^{22}$ in combination with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

A portion of the carbon atoms that constitute the ring of the monocycloalkane may or may not be substituted with an ether group (—O—).

Further, the monocycloalkane may have a substituent such as an alkyl group of 1 to 5 carbon atoms, a fluorine atom or a fluorinated alkyl group of 1 to 5 carbon atoms.

Examples of the $R^{22}$ group that constitutes the aliphatic monocyclic group include linear alkylene groups which may have an ether group (—O—) interposed between the carbon atoms.

Specific examples of the structural units represented by formula (a1-0-11) include structural units represented by the above formulas (a1-1-16) to (a1-1-23), (a1-1-27), and (a1-1-31) to (a1-1-33). Among these, structural units represented by general formula (a1-1-02) shown below, which includes the structural units represented by formulas (a1-1-16) and (a1-1-17), formulas (a1-1-20) to (a1-1-23), formula (a1-1-27), and formulas (a1-1-31) to (a1-1-33) are preferred. Furthermore, structural units represented by general formula (a1-1-02') shown below are also preferred.

In each of the formulas below, h is preferably 1 or 2.

[Chemical Formula 53]

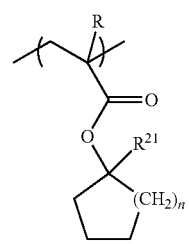

(a1-1-02)

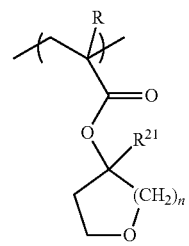

(a1-1-02')

In the formulas, R and $R^{21}$ are each the same as defined above, and h represents an integer of 1 to 4.

In formula (a1-0-12), examples of the branched alkyl group for $R^{23}$ include the same branched alkyl groups as those described above for the alkyl group for $R^{14}$ in formulas (1-1) to (1-9), and an isopropyl group is particularly desirable.

Examples of the aliphatic polycyclic group formed by $R^{24}$ in combination with the carbon atom to which $R^{24}$ is bonded include the same groups as the polycyclic groups among the aliphatic cyclic groups described above in connection with the tertiary alkyl ester-type acid-dissociable group.

Specific examples of structural units represented by general formula (a1-0-12) include the structural units represented by the above formula (a1-1-26) and formulas (a1-1-28) to (a1-1-30).

The structural unit represented by formula (a1-0-12) is preferably a structural unit in which the aliphatic polycyclic group formed by $R^{24}$ in combination with the carbon atom to which $R^{24}$ is bonded is a 2-adamantyl group, and a structural unit represented by the above formula (a1-1-26) is particularly desirable.

In formula (a1-0-13), R and $R^{24}$ are each the same as defined above.

Examples of the linear alkyl group for $R^{25}$ include the same linear alkyl groups as those described above for the alkyl group for $R^{14}$ in formulas (1-1) to (1-9), and a methyl group or an ethyl group is the most desirable.

Specific examples of the structural units represented by formula (a1-0-13) include the structural units represented by formulas (a1-1-1) to (a1-1-3) and (a1-1-7) to (a1-1-15), which were described above as specific examples of the aforementioned general formula (a1-1).

The structural unit represented by formula (a1-0-13) is preferably a structural unit in which the aliphatic polycyclic group formed by $R^{24}$ in combination with the carbon atom to which $R^{24}$ is bonded is a 2-adamantyl group, and a structural unit represented by one of the above formulas (a1-1-1), (a1-1-2) or (a1-1-9) is particularly desirable.

In formula (a1-0-14), R and $R^{22}$ are each the same as defined above. $R^{15}$ and $R^{16}$ are the same as defined above for $R^{15}$ and $R^{16}$ in the aforementioned general formulas (2-1) to (2-6).

Specific examples of the structural units represented by formula (a1-0-14) include the structural units represented by formulas (a1-1-35) and (a1-1-36), which were described above as specific examples of general formula (a1-1).

In formula (a1-0-15), R and $R^{24}$ are each the same as defined above. $R^{15}$ and $R^{16}$ are the same as defined above for $R^{15}$ and $R^{16}$ in the aforementioned general formulas (2-1) to (2-6).

Specific examples of the structural units represented by formula (a1-0-15) include the structural units represented by formulas (a1-1-4) to (a1-1-6) and (a1-1-34), which were described above as specific examples of the aforementioned general formula (a1-1).

In formula (a1-0-16), R is the same as defined above. $R^{15}$ and $R^{16}$ are the same as defined above for $R^{15}$ and $R^{16}$ in the above general formulas (2-1) to (2-6).

Examples of the aromatic ring formed by $R^{26}$ in combination with the carbon atom to which $R^{26}$ is bonded include the same aromatic rings as those mentioned above in connection with the tertiary alkyl ester-type acid-dissociable group.

Specific examples of the structural unit represented by formula (a1-0-16) include structural units represented by formulas (a1-1-37) and (a1-1-38), which were described above as specific examples of the aforementioned general formula (a1-1).

Examples of the structural unit represented by formula (a1-0-2) include structural units represented by the above formulas (a1-3) and (a1-4), and of these, a structural unit represented by formula (a1-3) is particularly desirable.

Among structural units represented by general formula (a1-0-2), those in which $Y^2$ in the formula is a group represented by one of the aforementioned formulas $-Y^{21}-O-Y^{22}-$, $-[Y^{21}-C(=O)-O]_{m'}-Y^{22}-$ or $-Y^{21}-C(=O)-O-Y^{22}-$ is particularly desirable.

Preferred examples of such structural units include structural units represented by general formula (a1-3-01) shown below, structural units represented by general formula (a1-3-02) shown below, and structural units represented by general formula (a1-3-03) shown below.

[Chemical Formula 54]

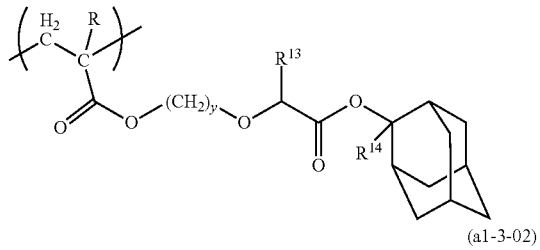

(a1-3-01)

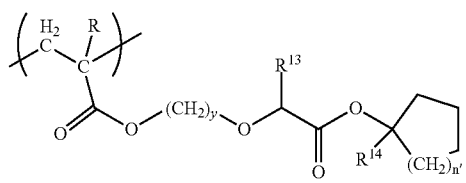

(a1-3-02)

In the formulas, R is the same as defined above, $R^{13}$ represents a hydrogen atom or a methyl group, $R^{14}$ represents an alkyl group, y represents an integer of 1 to 10, and n' represents an integer of 0 to 3.

[Chemical Formula 55]

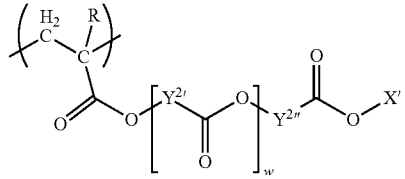

(a1-3-03)

In the formula, R is the same as defined above, each of $Y^{2'}$ and $Y^{2''}$ independently represents a divalent linking group, X' represents an acid-dissociable group, and w represents an integer of 0 to 3.

In formulas (a1-3-01) to (a1-3-02), $R^{13}$ is preferably a hydrogen atom.

$R^{14}$ is the same as defined for $R^{14}$ in the aforementioned formulas (1-1) to (1-9).

y is preferably an integer of 1 to 8, more preferably an integer of 1 to 5, and most preferably 1 or 2.

n' is preferably 1 or 2, and most preferably 2.

Specific examples of structural units represented by formula (a1-3-01) include structural units represented by the above formulas (a1-3-25) and (a1-3-26).

Specific examples of structural units represented by general formula (a1-3-02) include structural units represented by the above formulas (a1-3-27) and (a1-3-28).

Examples of the divalent linking groups for $Y^{2'}$ and $Y^{2''}$ in formula (a1-3-03) include the same groups as those described above for $Y^2$ in general formula (a1-3).

$Y^{2'}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

$Y^{2''}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

Examples of the acid-dissociable group for X' include the same groups as those described above. X' is preferably a tertiary alkyl ester-type acid-dissociable group, is more preferably an aforementioned group (i), in which a substituent is bonded to the carbon atom within the ring structure of a monovalent aliphatic cyclic group that is bonded to the atom adjacent to the acid-dissociable group, thereby forming a tertiary carbon atom on the ring structure of the monovalent aliphatic cyclic group. Among the aforementioned groups (i), a group represented by general formula (1-1) above is preferable.

w represents an integer of 0 to 3, and is preferably an integer of 0 to 2, more preferably 0 or 1, and most preferably 1.

The structural unit represented by general formula (a1-3-03) is preferably a structural unit represented by general formula (a1-3-03-1) or (a1-3-03-2) shown below, and among these, is most preferably a structural unit represented by formula (a1-3-03-1).

[Chemical Formula 56]

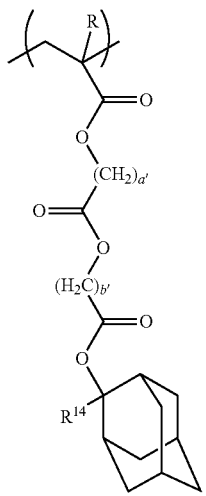

(a1-3-03-1)

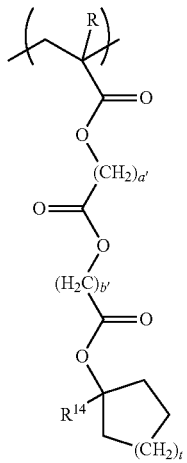

(a1-3-03-2)

In the formulas, R and $R^{14}$ are the same as defined above, a' represents an integer of 1 to 10, b' represents an integer of 1 to 10, and t represents an integer of 0 to 3.

In formulas (a1-3-03-1) and (a1-3-03-2), a' is preferably an integer of 1 to 8, more preferably an integer of 1 to 5, and most preferably 1 or 2.

b' is preferably an integer of 1 to 8, more preferably an integer of 1 to 5, and most preferably 1 or 2.

t is preferably an integer of 1 to 3, and most preferably 1 or 2.

Specific examples of structural units represented by formulas (a1-3-03-1) and (a1-3-03-2) include structural units represented by the aforementioned formulas (a1-3-29) to (a1-3-32).

Further, a structural unit represented by general formula (a1-5) shown below is also preferred as the structural unit (a11). By including this structural unit, the residual film ratio within the exposed portions and the etching resistance can be improved.

[Chemical Formula 57]

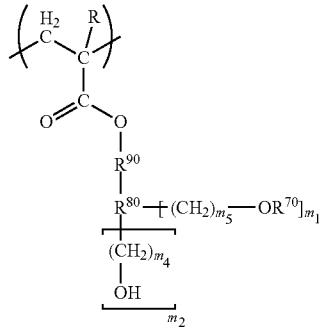

(a1-5)

In the formula, R represents a hydrogen atom, an alkyl group of 1 to 5 carbon atoms or a halogenated alkyl group of 1 to 5 carbon atoms, $OR^{70}$ represents an acid-decomposable group, $R^{80}$ represents an aliphatic hydrocarbon group which may have a substituent, $R^{90}$ represents a single bond or a divalent linking group, $m_1$ represents an integer of 1 to 3 and $m_2$ represents an integer of 0 to 2, provided that $m_1+m_2=1$ to 3, and each of $m_4$ and $m_5$ independently represents an integer of 0 to 3.

In formula (a1-5), examples of the alkyl group and halogenated alkyl group for R include the same groups alkyl groups and halogenated alkyl groups as those mentioned above for the substituent that may be bonded to the carbon atom on the α-position within the description relating to the aforementioned α-substituted acrylate ester.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a1-5), examples of the acid-decomposable group represented by $OR^{70}$ include groups in which the hydrogen atom of an alcoholic hydroxyl group has been substituted with an acid-dissociable group.

An "acid-dissociable group" is a group in which at least the bond between the acid-dissociable group and the atom adjacent to this acid-dissociable group can be cleaved by the action of acid. It is necessary that the acid-dissociable group that constitutes the acid-decomposable group is a group which exhibits a lower polarity than the alcoholic hydroxyl group generated by the dissociation of the acid-dissociable group. Thus, in this group having the hydrogen atom of an alcoholic hydroxyl group substituted with the acid-dissociable group, when the acid-dissociable group dissociates, an alcoholic hydroxyl group is generated (exposed), causing an increase in hydrophilicity. As a result, the hydrophilicity of the entire polymer is increased, causing a relative change in the solubility within a developing solution. When the developing solution is an alkali developing solution, the solubility increases, whereas when the developing solution is a developing solution containing an organic solvent (organic developing solution), the solubility decreases.

There are no particular limitations on the acid-dissociable group, and any of the groups that have been proposed as acid-dissociable groups for the base resins of chemically amplified resists can be used. Examples include the same acid-dissociable groups as those mentioned above.

In terms of improving the solubility within the organic solvent used when preparing a resist composition (resist solvent) and the solubility within the developing solution, the acid-dissociable group is preferably a tertiary alkyl group-containing acid-dissociable group or an acetal-type acid-dissociable group.

(Tertiary Alkyl Group-Containing Acid-Dissociable Group)

The term "tertiary alkyl group" describes an alkyl group containing a tertiary carbon atom. The term "alkyl group" describes a monovalent saturated hydrocarbon group, and includes chain-like (linear or branched) alkyl groups as well as alkyl groups having a cyclic structure.

The "tertiary alkyl group-containing acid-dissociable group" describes an acid-dissociable group containing a tertiary alkyl group within its structure. The tertiary alkyl group-containing acid-dissociable group may be composed solely of the tertiary alkyl group, or may be composed of the tertiary alkyl group and other atom(s) or group(s) besides the tertiary alkyl group.

Examples of these "other atom(s) or group(s) besides the tertiary alkyl group" that may, together with the tertiary alkyl group, constitute the tertiary alkyl group-containing acid-dissociable group include a carbonyloxy group, carbonyl group, alkylene group or oxygen atom (—O—).

Examples of the tertiary alkyl group-containing acid-dissociable group include tertiary alkyl group-containing acid-dissociable groups which do not contain a cyclic structure, and tertiary alkyl group-containing acid-dissociable groups which contain a cyclic structure.

A "tertiary alkyl group-containing acid-dissociable group which does not contain a cyclic structure" is an acid-dissociable group that includes a branched tertiary alkyl group as the tertiary alkyl group, and includes no cyclic structure within the group structure.

Examples of these branched tertiary alkyl groups include the groups represented by general formula (I) shown below.

[Chemical Formula 58]

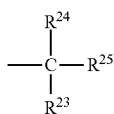

(I)

In formula (I), each of $R^{23}$ to $R^{25}$ independently represents a linear or branched alkyl group. These alkyl groups preferably contain 1 to 5 carbon atoms, and more preferably 1 to 3 carbon atoms.

Further, the total number of carbon atoms within the group represented by general formula (I) is preferably from 4 to 7 carbon atoms, more preferably from 4 to 6 carbon atoms, and most preferably 4 or 5 carbon atoms.

Specific examples of the group represented by general formula (I) include a tert-butyl group and tert-pentyl group, and a tert-butyl group is particularly desirable.

Examples of the tertiary alkyl group-containing acid-dissociable group which does not contain a cyclic structure include the branched tertiary alkyl groups described above, tertiary alkyl group-containing chain-like alkyl groups in which an aforementioned branched tertiary alkyl group is bonded to a linear or branched alkylene group, tertiary alkyloxycarbonyl groups containing an aforementioned branched tertiary alkyl group as the tertiary alkyl group, and tertiary alkyloxycarbonylalkyl groups containing an aforementioned branched tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

Examples of the chain-like tertiary alkyloxycarbonyl groups include groups represented by general formula (II) shown below.

In formula (II), $R^{23}$ to $R^{25}$ are the same as defined above for $R^{23}$ to $R^{25}$ in formula (I).

As this chain-like tertiary alkyloxycarbonyl group, a tert-butyloxycarbonyl group (t-boc) or tert-pentyloxycarbonyl group is preferred.

[Chemical Formula 59]

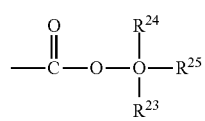

(II)

Examples of the chain-like tertiary alkyloxycarbonylalkyl groups include groups represented by general formula (III-1) or general formula (III-2) shown below.

In formula (III-1) or (III-2), $R^{23}$ to $R^{25}$ are the same as defined above for $R^{23}$ to $R^{25}$ in formula (I).

$m_6$ is an integer of 1 to 3, and is preferably 1 or 2.

$R^{3'}$ represents an alkyl group of 1 to 5 carbon atoms, and is preferably a methyl group or an ethyl group, and most preferably a methyl group.

As this chain-like tertiary alkyloxycarbonylalkyl group, a tert-butyloxycarbonylmethyl group or tert-butyloxycarbonylethyl group is preferred.

[Chemical Formula 60]

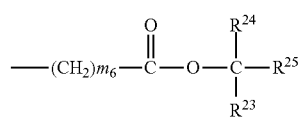

(III-1)

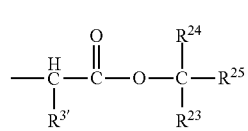

(III-2)

Among the above groups, from the viewpoint of the solubility contrast within an organic developing solution before and after exposure, the tertiary alkyl group-containing acid-dissociable group which does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

A "tertiary alkyl group-containing acid-dissociable group which contains a cyclic structure" describes an acid-dissociable group that includes a tertiary carbon atom and a cyclic structure within the group structure.

In the tertiary alkyl group-containing acid-dissociable group which contains a cyclic structure, the number of carbon atoms that constitutes the ring within the cyclic structure is preferably from 4 to 12 carbon atoms, more preferably from 5 to 10 carbon atoms, and most preferably from 6 to 10 carbon atoms.

The cyclic structure is preferably an aliphatic cyclic group. The term "aliphatic cyclic group" refers to a monocyclic group or polycyclic group that has no aromaticity.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms and an oxygen atom (=O).

The basic ring structure of the "aliphatic cyclic group" exclusive of substituents is not limited to be structures constituted from only carbon and hydrogen (not limited to hydrocarbon groups), but is preferably a hydrocarbon group. Further, the hydrocarbon group may be either saturated or unsaturated, but is preferably saturated.

The aliphatic cyclic group may be either monocyclic group or polycyclic.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, part of the carbon atoms that constitute the ring structure of these alicyclic hydrocarbon groups may be substituted with an ether group (—O—).

Examples of the tertiary alkyl group within the tertiary alkyl group-containing acid-dissociable group which contains a cyclic structure include groups of type [1] or [2] listed below.

[1] A tertiary alkyl group in which an alkyl group is bonded to the carbon atom within the ring structure of a monovalent aliphatic cyclic group that is bonded to the atom adjacent to the tertiary alkyl group, thereby forming a tertiary carbon atom on the ring structure of the monovalent aliphatic cyclic group

[2] A tertiary alkyl group having a monovalent aliphatic cyclic group, and an alkylene group having a tertiary carbon atom (namely, a branched alkylene group), wherein the tertiary carbon atom is bonded to an atom adjacent to the tertiary alkyl group.

In these groups [1] and [2], examples of the monovalent aliphatic cyclic group include the same aliphatic cyclic groups as those described above within the description of the aforementioned cyclic structure.

In the group [1], the alkyl group bonded to the aliphatic cyclic group may be a linear, branched or cyclic group, but is preferably a linear or branched group.

The linear alkyl group preferably contains 1 to 5 carbon atoms, more preferably 1 to 4 carbon atoms, and most preferably 1 or 2 carbon atoms. Specific examples include a methyl group, ethyl group, n-propyl group, n-butyl group or n-pentyl group. Among these groups, a methyl group, ethyl group or n-butyl group is preferred, and a methyl group or an ethyl group is particularly desirable.

The branched alkyl group preferably contains 3 to 10 carbon atoms, and more preferably 3 to 5 carbon atoms. Specific examples include an isopropyl group, isobutyl group, tert-butyl group, isopentyl group or neopentyl group, and an isopropyl group is particularly desirable.

Specific examples of the group [1] include groups represented by the above general formulas (1-1) to (1-9).

Specific examples of the group [2] include groups represented by the above general formulas (2-1) to (2-6).

Examples of the tertiary alkyl group-containing acid-dissociable group which contains a cyclic structure include tertiary alkyl groups having a cyclic structure, tertiary alkyloxycarbonyl groups having a tertiary alkyl group with a cyclic structure as the tertiary alkyl group, and tertiary alkyloxycarbonylalkyl groups having a tertiary alkyl group with a cyclic structure as the tertiary alkyl group.

Examples of the above tertiary alkyl groups having a cyclic structure include the groups [1] and [2] described above.

Specific examples of the tertiary alkyloxycarbonyl groups include groups in which the —C($R^{23}$)($R^{24}$)($R^{25}$) portion in the above general formula (II) is substituted with a tertiary alkyl group having a cyclic structure.

Specific examples of the tertiary alkyloxycarbonylalkyl groups include groups in which the —C($R^{23}$)($R^{24}$)($R^{25}$) portion in the above general formula (III-1) or (III-2) is substituted with a tertiary alkyl group having a cyclic structure.

Among the various possibilities described above, the tertiary alkyl group-containing acid-dissociable group is preferably a group represented by the above general formula (II) (and preferably a tert-butyloxycarbonyl group (t-boc)), or a group of the above general formula (III-2) in which the —C($R^{23}$)($R^{24}$)($R^{25}$) portion is substituted with a tertiary alkyl group having a cyclic structure.

(Acetal-Type Acid-Dissociable Group)

In an acetal-type acid-dissociable group, when acid is generated upon exposure, the action of the acid causes cleavage of the bond between the acetal-type acid-dissociable group and the oxygen atom to which the acetal-type acid-dissociable group is bonded.

Examples of the acetal-type acid-dissociable group include the same groups as those mentioned in the description of the "acetal-type acid-dissociable group".

In the structural unit represented by formula (a1-5), specific examples of preferred groups for —$OR^{70}$ (in cases where $R^{70}$ represents an acetal-type acid-dissociable group) include a methoxymethoxy group, ethoxymethoxy group, n-butoxymethoxy group, cyclohexyloxymethoxy group, adamantyloxymethoxy group, 1-ethoxyethoxy group, 1-n-butoxyethoxy group, 1-cyclohexyloxyethoxy group and 1-adamantyloxyethoxy group.

In the above formula (a1-5), $R^{80}$ represents an aliphatic hydrocarbon group which may have a substituent.

An "aliphatic hydrocarbon group" refers to a hydrocarbon group that has no aromaticity.

The aliphatic hydrocarbon group for $R^{80}$ may be a saturated aliphatic hydrocarbon group or an unsaturated aliphatic hydrocarbon group. Further, the aliphatic hydrocarbon group may be a linear, branched or cyclic group.

The expression that the aliphatic hydrocarbon group "may have a substituent" means that part of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on the "hetero atom" within $R^{80}$, provided it is an atom other than a carbon atom or a hydrogen atom, and examples include a halogen atom, oxygen atom, sulfur atom and nitrogen atom. Examples of the halogen atom include a fluorine atom, chlorine atom, iodine atom and bromine atom.

The substituent containing a hetero atom may consist solely of the hetero atom, or may be a group that contains the hetero atom and a group or atom other than the hetero atom. Specific examples of the substituent containing a hetero atom include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is a cyclic group, any of these substituents may be included within the ring structure of the aliphatic hydrocarbon group.

Examples of the substituent for substituting part or all of the hydrogen atoms that constitute the aliphatic hydrocarbon group include an alkoxy group, halogen atom, halogenated alkyl group, hydroxyl group, oxygen atom (=O), cyano group and alkyl group.

The alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Example of the halogenated alkyl group includes a group in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

Examples of the alkyl group include alkyl groups of 1 to 5 carbon atoms (lower alkyl groups) such as a methyl group, ethyl group, propyl group, n-butyl group and tent-butyl group.

When $R^{80}$ is a linear or branched aliphatic hydrocarbon group, the group preferably contains 1 to 10 carbon atoms, more preferably 1 to 5 carbon atoms, and most preferably 1 to 3 carbon atoms. Specifically, a chain-like alkylene group is preferable.

When $R^{80}$ is a cyclic aliphatic hydrocarbon group (aliphatic cyclic group), the basic ring structure of the aliphatic cyclic group excluding substituents (the aliphatic ring) is not limited to structures constituted of only carbon and hydrogen (not limited to hydrocarbon rings), and a hetero atom such as an oxygen atom may be included within the structure of the ring (the aliphatic ring). Further, the "hydrocarbon ring" may be either saturated or unsaturated, but in most cases, is preferably saturated.

The aliphatic cyclic group may be either polycyclic or monocyclic. Examples of the aliphatic cyclic group include groups in which two or more hydrogen atoms have been removed from a monocycloalkane or a polycycloalkane such as a bicycloalkane, tricycloalkane or tetracycloalkane, which may or may not be substituted with a lower alkyl group, a fluorine atom or a fluorinated alkyl group. Specific examples include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane.

Further, other examples of the aliphatic cyclic group include groups in which two or more hydrogen atoms have been removed from tetrahydrofuran or tetrahydropyran, which may or may not be substituted with a lower alkyl group, a fluorine atom or a fluorinated alkyl group.

In the structural unit represented by formula (a1-5), the aliphatic cyclic group is preferably a polycyclic group, and among such groups, a group in which two or more hydrogen atoms have been removed from adamantane is particularly desirable.

In formula (a1-5), there are no particular limitations on the divalent linking group for $R^{90}$, and examples include divalent hydrocarbon groups which may have a substituent, and divalent linking groups containing a hetero atom.

Examples of the divalent hydrocarbon group which may have a substituent, and the divalent linking group containing a hetero atom for $R^{90}$ include the divalent hydrocarbon groups which may have a substituent and the divalent linking groups containing a hetero atom mentioned above within the description of the divalent linking group for $Q^1$ in formula (a5-0-1).

Among these groups, the divalent linking group for $R^{90}$ is preferably a linear or branched alkylene group, a divalent alicyclic hydrocarbon group, or a divalent linking group containing a hetero atom. Among these, a linear or branched alkylene group, or a divalent linking group containing a hetero atom is more preferable.

The divalent linking group containing a hetero atom is preferably a linear group containing an oxygen atom as the hetero atom, such as a group containing an ether linkage or an ester linkage, and is more preferably a group represented by —Y$^{21}$—O—Y$^{22}$—, —[Y$^{21}$—C(=O)—O]$_{m'}$—Y$^{22}$— or —Y$^{21}$—O—C(=O)—Y$^{22}$—. Each of Y$^{21}$ and Y$^{22}$ independently represents a divalent hydrocarbon group which may have a substituent, and is the same as Y$^{21}$ and Y$^{22}$ described above. m' represents an integer of 0 to 3.

In formula (a1-5), $m_1$ represents an integer of 1 to 3, and $m_2$ represents an integer of 0 to 2, provided that $m_1+m_2=1$ to 3.

$m_1$ is preferably 1 or 2.

$m_2$ is preferably 0.

$m_1+m_2$ is preferably 1 or 2.

$m_4$ represents an integer of 0 to 3, is preferably 0 or 1, and is more preferably 0.

$m_5$ represents an integer of 0 to 3, is preferably 0 or 1, and is more preferably 0.

Among the various possibilities described above, $R^{90}$ in formula (a1-5) is preferably a single bond or a linear alkylene group of 1 to 3 carbon atoms. In other words, a structural unit represented by general formula (a1-51) shown below is preferable.

Of such structural units, structural units represented by one of the general formulas (a1-511), (a1-512) or (a1-513) shown below is particularly preferable.

[Chemical Formula 61]

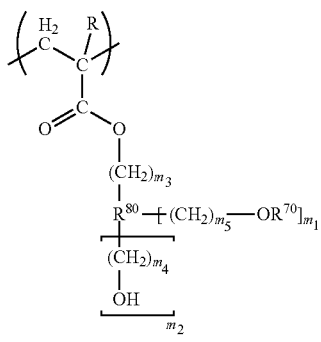

(a1-51)

In formula (a1-51), R, OR$^{70}$, R$^{80}$, m$_1$, m$_2$, m$_4$ and m$_5$ are the same as defined above, and m$_3$ represents an integer of 0 to 3.

[Chemical Formula 62]

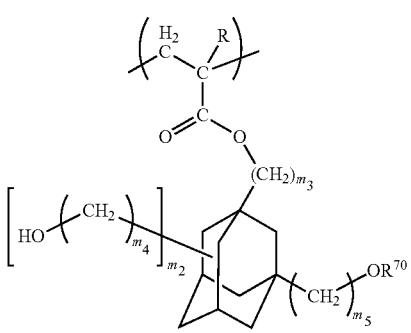

(a1-511)

In the formula, R, OR$^{70}$, m$_2$, m$_3$, m$_4$ and m$_5$ are the same as defined above.

[Chemical Formula 63]

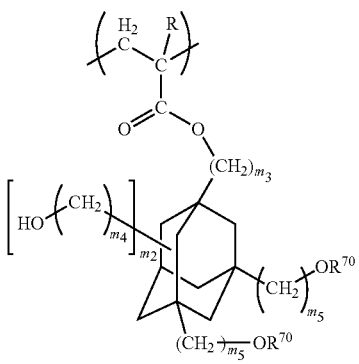

(a1-512)

In the formula, R, OR$^{70}$, m$_2$, m$_3$, m$_4$ and m$_5$ are the same as defined above.

[Chemical Formula 64]

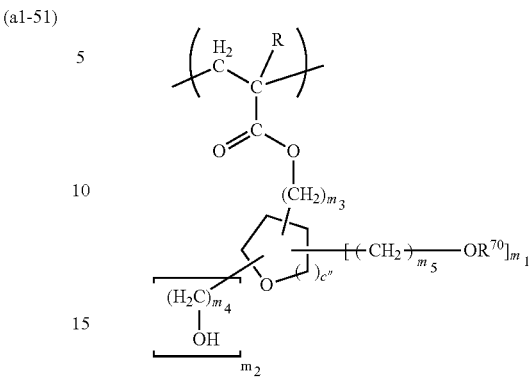

(a1-513)

In the formula, R, OR$^{70}$, m$_1$, m$_2$, m$_3$, m$_4$ and m$_5$ are the same as defined above, and c″ represents an integer of 1 to 3.

In formula (a1-51), m$_3$ represents an integer of 0 to 3, and is preferably 0 or 1, and more preferably 0.

In formula (a1-513), c″ represents an integer of 1 to 3, and is preferably 1 or 2, and more preferably 1.

In those cases where m$_3$ in formula (a1-513) is 0, it is preferable that the oxygen atom at the terminal of the carbonyloxy group (—C(=O)—O—) of the acrylate ester is not bonded to a carbon atom bonded to the oxygen atom within the ring. In other words, when m$_3$ represents 0, it is preferable that two or more carbon atoms exist between the terminal oxygen atom and the oxygen atom within the ring (excluding the case where there is only one carbon atom (namely, the case of an acetal linkage)).

Specific examples of structural units represented by formula (a1-5) are shown below.

In each of the following formulas, R$^\alpha$ represents a hydrogen atom, a methyl group, or a trifluoromethyl group.

[Chemical Formula 65]

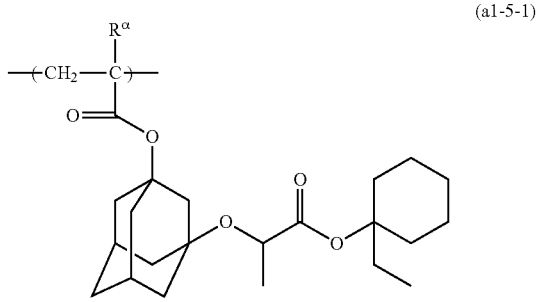

(a1-5-1)

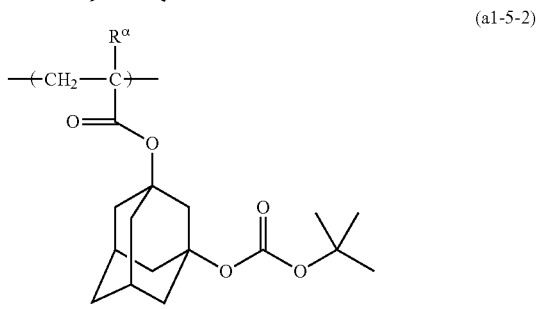

(a1-5-2)

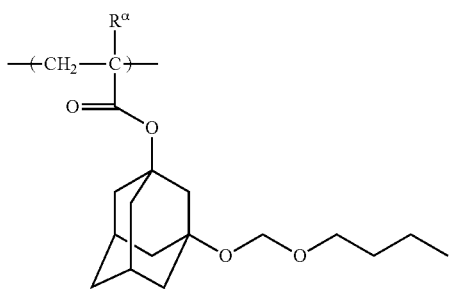
(a1-5-3)

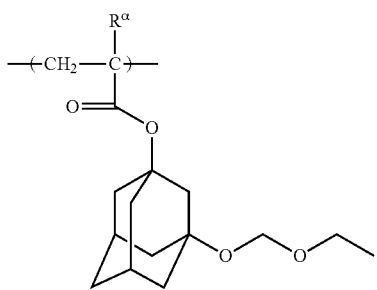
(a1-5-4)

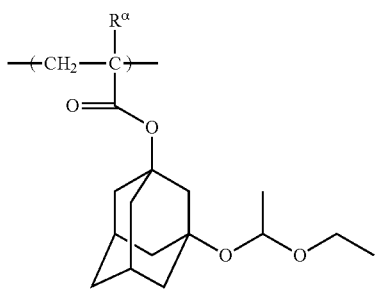
(a1-5-5)

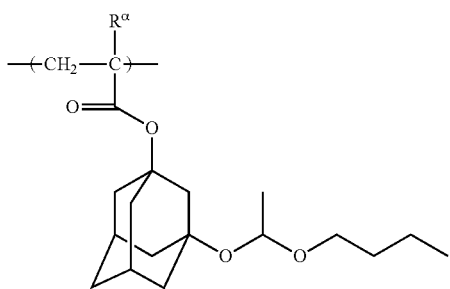
(a1-5-6)

{Structural Unit (a12)}

The structural unit (a12) is a structural unit derived from a hydroxystyrene in which the hydrogen atom bonded to the carbon atom on the α-position may be substituted with a substituent, in which the hydrogen atoms bonded to the benzene ring may be substituted with a substituent other than a hydroxyl group, and in which the hydrogen atom of the hydroxyl group is substituted with an acid-dissociable group or a substituent containing an acid-dissociable group.

Examples of the acid-dissociable group that substitutes the hydrogen atom of the hydroxyl group include the same acid-dissociable groups as those described above, and of these, a tertiary alkyl ester-type acid-dissociable group or an acetal-type acid-dissociable group is preferable, and an acetal-type acid-dissociable group is more preferable.

Examples of the substituent containing an acid-dissociable group include groups composed of an acid-dissociable group and a divalent linking group. Examples of this divalent linking group include the same divalent linking groups as those mentioned above for $Q^1$ in formula (a5-0-1), and a group in which the terminal structure on the acid-dissociable group-side of the group is a carbonyloxy group is particularly desirable. In such a case, the acid-dissociable group is preferably bonded to the oxygen atom (—O—) of the carbonyloxy group.

As the substituent containing an acid-dissociable group, groups represented by a formula $R^{11'}$—O—C(=O)— and groups represented by a formula $R^{11'}$—O—C(=O)—$R^{12'}$— are preferred. In these formulas, $R^{11'}$ represents an acid-dissociable group, and $R^{12'}$ represents a linear or branched alkylene group.

The acid-dissociable group for $R^{11'}$ is preferably a tertiary alkyl ester-type acid-dissociable group or an acetal-type acid-dissociable group, and is more preferably a tertiary alkyl ester-type acid-dissociable group. Preferred examples of the tertiary alkyl ester-type acid-dissociable group include the aforementioned aliphatic branched acid-dissociable groups represented by the formula —C($R^{71}$)($R^{72}$)($R^{73}$), groups represented by the above formulas (1-1) to (1-9), and groups represented by the above formulas (2-1) to (2-6).

Further, in those cases where the component (A) includes the structural unit (a6), the acid-dissociable group for $R^{11'}$ is preferably a tertiary alkyl ester-type acid-dissociable group or an acetal-type acid-dissociable group, and is more preferably an acetal-type acid-dissociable group.

Examples of the alkylene group for $R^{12'}$ include a methylene group, ethylene group, trimethylene group, tetramethylene group and 1,1-dimethylethylene group. A linear alkylene group is preferred as $R^{12'}$.

Specific examples of the structural unit (a12) include groups represented by the above general formula (U-3) in which the value of px for the group —(OX$^c$)$_{px}$ bonded to the benzene ring is an integer of 1 to 3 (and preferably 1), and at least one X$^c$ group is an acid-dissociable group or a substituent containing an acid-dissociable group. When px is 2 or 3, the plurality of X$^c$ groups may be the same or different. For example, one X$^c$ group may be an acid-dissociable group or a substituent containing an acid-dissociable group, and the other one or two X$^c$ groups may be hydrogen atoms.

Specific examples of the structural unit (a12) are shown below. In each of the following formulas, $R^\alpha$ represents a hydrogen atom, a methyl group, or a trifluoromethyl group.

[Chemical Formula 66]

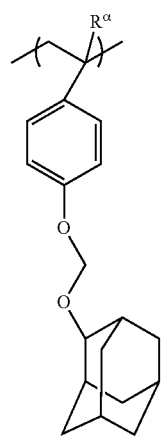
(a12-1-1)

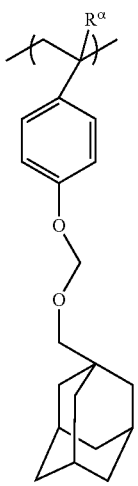
(a12-1-2)

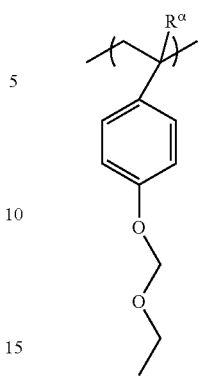
(a12-1-5)

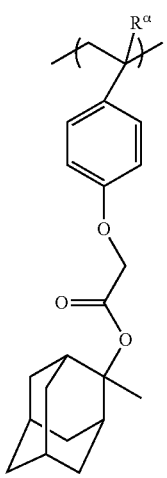
(a12-1-3)

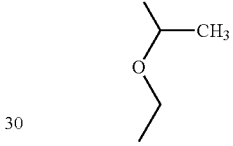
(a12-1-6)

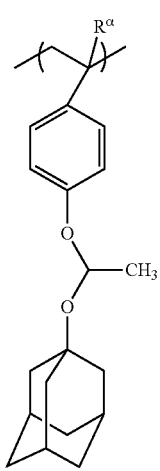
(a12-1-4)

The structural unit (a12) is preferably at least one structural unit selected from the group consisting of structural units represented by chemical formulas (a12-1-1) to (a12-1-6), and is more preferably a structural unit represented by formula (a12-1-1), (a12-1-3) or (a12-1-5).

{Structural Unit (a13)}

The structural unit (a13) is a structural unit derived from a vinyl(hydroxynaphthalene) in which the hydrogen atom bonded to the carbon atom on the α-position may be substituted with a substituent, in which the hydrogen atoms bonded to the naphthalene ring may be substituted with a substituent other than a hydroxyl group, and in which the hydrogen atom of the hydroxyl group is substituted with an acid-dissociable group or a substituent containing an acid-dissociable group.

In the structural unit (a13), examples of the acid-dissociable group or substituent containing an acid-dissociable group that substitutes the hydrogen atom of the hydroxyl group include the same groups and substituents as those mentioned above within the description of the structural unit (a12).

Specific examples of the structural unit (a13) include groups represented by the above general formula (U-4) in which the value of x for the group —$(OX^d)_x$ bonded to the benzene ring is an integer of 1 to 3, and at least one $X^d$ group is an acid-dissociable group or a substituent containing an acid-dissociable group. When x is 2 or 3, the plurality of $X^d$ groups may be the same or different. For example, one $X^d$ group may be an acid-dissociable group or a substituent containing an acid-dissociable group, and the other one or two $X^d$ groups may be hydrogen atoms.

The component (A1-1) may have a single type of the structural unit (a1), or a combination of two or more types.

The amount of the structural unit (a1) within the component (A1-1), based on the combined total of all the structural units that constitute the component (A1-1), is preferably within a range from 15 to 70 mol %, more preferably from 15 to 60 mol %, and still more preferably from 20 to 55 mol %. When the amount of the structural unit (a1) is at least as large as the lower limit of the above range, a pattern can be formed easily using a resist composition prepared from the component (A1-1), and the lithography properties such as the sensitivity, the resolution and the pattern shape also improve. On the other hand, when the amount of the structural unit (a1)) is not more than the upper limit of the above range, a good balance can be achieved with the other structural units.

(Structural Unit (a2))

The component (A1-1) preferably also includes, in addition to the structural units (a5) and (a1), or in addition to the structural units (a5) and (a6), or in addition to the structural units (a5), (a6) and (a1), a structural unit (a2) containing an —$SO_2$-containing cyclic group or a lactone-containing cyclic group.

When the component (A1-1) is used in forming a resist film, the —$SO_2$-containing cyclic group or lactone-containing cyclic group of the structural unit (a2) is effective in improving the adhesion of the resist film to the substrate. Further, because the structural unit (a2) also improves the affinity of the component (A1-1) with developing solutions containing water, such as alkali developing solutions, the structural unit (a2) is particularly effective in an alkali developing process.

In those cases where one of the structural units (a5), (a6) or (a1) includes an —$SO_2$-containing cyclic group or a lactone-containing cyclic group within the unit structure, although such a structural unit may also be classified as a structural unit (a2), in this description, this type of structural unit is classified as the structural unit (a5), (a6) or (a1), and not as the structural unit (a2).

Here, an "—$SO_2$-containing cyclic group" refers to a cyclic group having a ring containing —$SO_2$— within the ring structure, and refers specifically to a cyclic group in which the sulfur atom (S) within —$SO_2$— forms a part of the ring structure of the cyclic group. In the —$SO_2$-containing cyclic group, the ring containing —$SO_2$— within the ring structure is counted as the first ring. A cyclic group in which the only ring structure is the ring that contains —$SO_2$— in the ring structure is referred to as a monocyclic group, and a group containing other ring structures is described as a polycyclic group regardless of the structure of the other rings. The —$SO_2$-containing cyclic group may be either a monocyclic group or a polycyclic group.

The —$SO_2$-containing cyclic group is preferably a cyclic group containing —O—$SO_2$— within the ring structure, namely a cyclic group containing a sultone ring in which the —O—S— within the —O—$SO_2$— forms a part of the ring structure of the cyclic group.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be either an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which part of the carbon atoms that constitute the ring structure have been substituted with either —$SO_2$— or —O—$SO_2$—. More specific examples include groups in which at least one hydrogen atom has been removed from an aliphatic hydrocarbon ring in which a —$CH_2$— group that constitutes part of the ring structure has been substituted with an —$SO_2$— group, and groups in which at least one hydrogen atom has been removed from an aliphatic hydrocarbon ring in which a —$CH_2$—$CH_2$— group that constitutes part of the ring structure has been substituted with an —O—$SO_2$— group.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (=O), —COOR", —OC(=O)R", hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group substituent have each been substituted with an aforementioned halogen atom. A fluorinated alkyl group is preferred as the halogenated alkyl group, and a perfluoroalkyl group is particularly desirable.

In the aforementioned —COOR" group and —OC(=O)R" group, R" represents a hydrogen atom, or a linear, branched or cyclic alkyl group of 1 to 15 carbon atoms.

When R" represents a linear or branched alkyl group, the alkyl group preferably contains 1 to 10 carbon atoms, and more preferably 1 to 5 carbon atoms, and is most preferably a methyl group or an ethyl group.

When R" is a cyclic alkyl group (cycloalkyl group), the cycloalkyl group preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples include groups in which at least one hydrogen atom within an aforementioned alkyl group for the substituent has been substituted with a hydroxyl group.

More specific examples of the —$SO_2$-containing cyclic group include groups represented by general formulas (3-1) to (3-4) shown below.

[Chemical Formula 67]

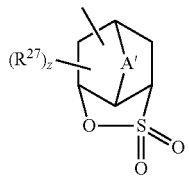
(3-1)

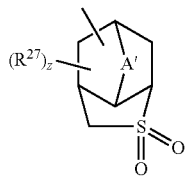
(3-2)

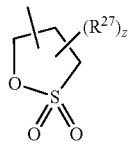
(3-3)

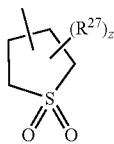
(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In the above general formulas (3-1) to (3-4), A' represents an oxygen atom (—O—), a sulfur atom (—S—), or an alkylene group of 1 to 5 carbon atoms which may contain an oxygen atom or a sulfur atom.

The alkylene group of 1 to 5 carbon atoms for A' is preferably a linear or branched alkylene group, and specific examples include a methylene group, ethylene group, n-propylene group and isopropylene group.

Examples of alkylene groups which contain an oxygen atom or a sulfur atom include the aforementioned alkylene groups in which —O— or —S— is either bonded to the terminal of the alkylene group or interposed between carbon atoms of the alkylene group. Specific examples of such alkylene groups include —O—$CH_2$—, —$CH_2$—O—$CH_2$—, —S—$CH_2$— and —$CH_2$—S—$CH_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^{27}$ groups may be the same or different.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above as the substituent for the —$SO_2$-containing cyclic group.

Specific examples of the cyclic groups represented by general formulas (3-1) to (3-4) are shown below. In the formulas shown below, "Ac" represents an acetyl group.

[Chemical Formula 68]

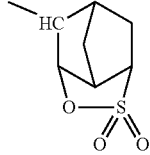
(3-1-1)

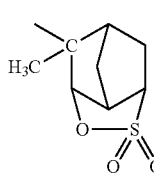
(3-1-2)

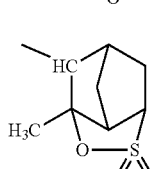
(3-1-3)

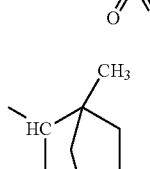
(3-1-4)

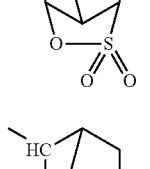
(3-1-5)

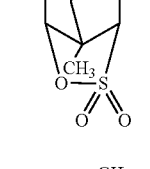
(3-1-6)

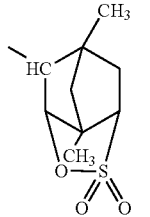

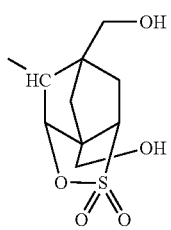 (3-1-7)
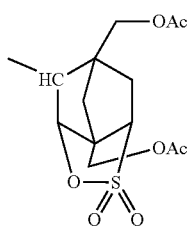 (3-1-8)
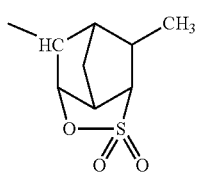 (3-1-9)
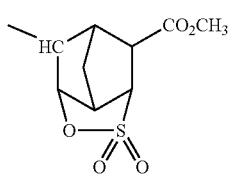 (3-1-10)
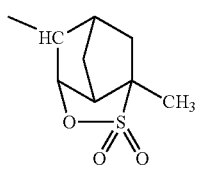 (3-1-11)
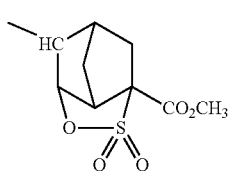 (3-1-12)
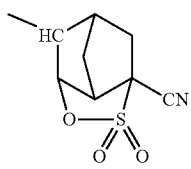 (3-1-13)
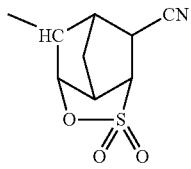 (3-1-14)
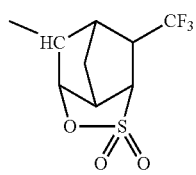 (3-1-15)
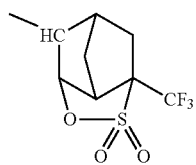 (3-1-16)
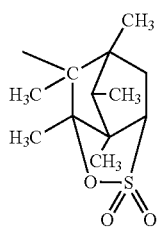 (3-1-17)
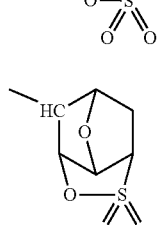 (3-1-18)
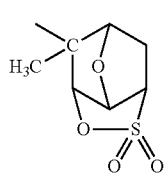 (3-1-19)
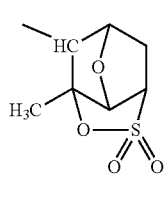 (3-1-20)
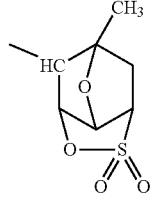 (3-1-21)
[Chemical Formula 69]
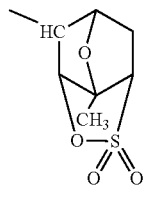 (3-1-22)

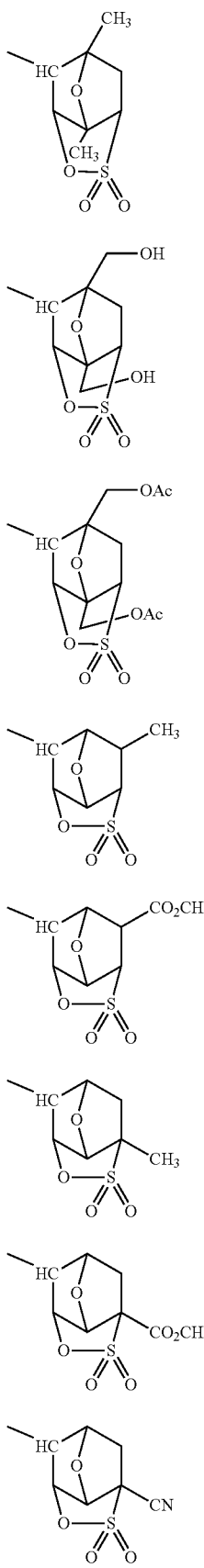
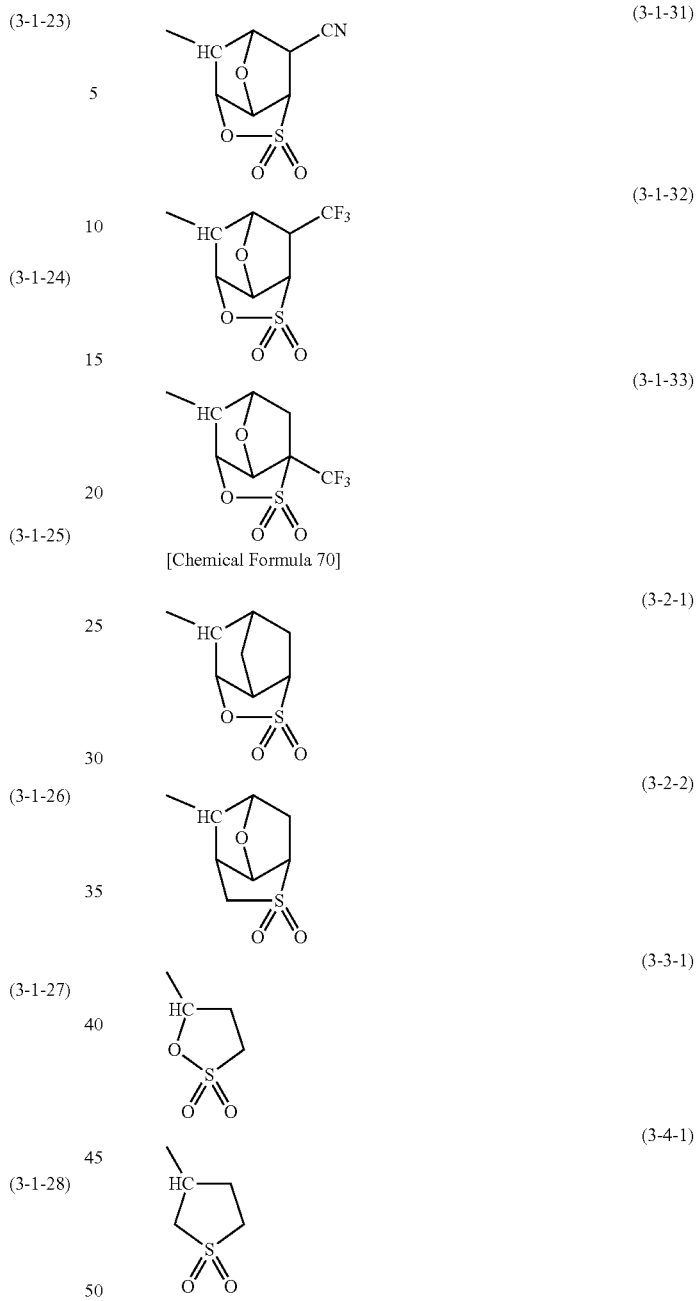

Of the groups shown above, the —SO₂-containing cyclic group is preferably a group represented by the above general formula (3-1), (3-3) or (3-4), more preferably at least one group selected from the group consisting of groups represented by the above chemical formulas (3-1-1), (3-1-18), (3-3-1) and (3-4-1), and most preferably a group represented by the chemical formula (3-1-1).

The term "lactone-containing cyclic group" refers to a cyclic group including a ring (lactone ring) containing —O—C(=O)— within the ring structure. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be monocyclic or polycyclic.

There are no particular limitations on the lactone-containing cyclic group in the structural unit (a2), and any arbitrary structural unit may be used. Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Provided the structural unit (a2) contains an —$SO_2$-containing cyclic group or a lactone-containing cyclic group, there are no particular limitations on the other portions of the structural unit, but the structural unit (a2) is preferably at least one structural unit selected from the group consisting of a structural unit (a2$^S$) derived from an acrylate ester in which the hydrogen atom bonded to the carbon atom on the α-position may be substituted with a substituent and containing an —$SO_2$-containing cyclic group, and a structural unit (a2$^L$) derived from an acrylate ester in which the hydrogen atom bonded to the carbon atom on the α-position may be substituted with a substituent and containing a lactone-containing cyclic group.

Structural Unit (a2$^S$):

Specific examples of the structural unit a2$^S$) include structural units represented by general formula (a2-0) shown below.

[Chemical Formula 71]

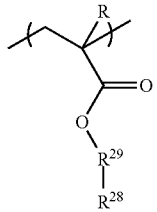

(a2-0)

In the formula, R represents a hydrogen atom, an alkyl group of 1 to 5 carbon atoms or a halogenated alkyl group of 1 to 5 carbon atoms, $R^{28}$ represents an —$SO_2$-containing cyclic group, and $R^{29}$ represents a single bond or a divalent linking group.

In formula (a2-0), R is the same as defined above.

$R^{28}$ is the same as the —$SO_2$-containing cyclic group described above.

$R^{29}$ may be either a single bond or a divalent linking group. A divalent linking group is preferable in terms of achieving superior effects for the present invention.

There are no particular limitations on the divalent linking group for $R^{29}$, and examples include the same groups as those mentioned above for the divalent linking group for $Q^1$ in formula (a5-0-1). Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above for the aliphatic hydrocarbon group for $Y^2$ in formula (a1-0-2).

The divalent linking group containing an ester linkage is preferably a group represented by general formula: —$R^{30}$—C(=O)—O— (wherein $R^{30}$ represents a divalent linking group). In other words, the structural unit (a2$^S$) is preferably a structural unit represented by general formula (a2-0-1) shown below.

[Chemical Formula 72]

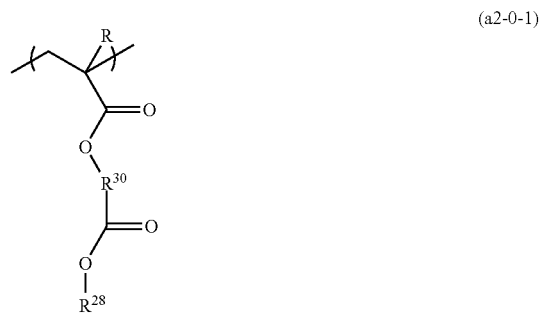

(a2-0-1)

In the formula, R and $R^{28}$ are each the same as defined above, and $R^{30}$ represents a divalent linking group.

There are no particular limitations on $R^{30}$, and examples include the same groups as the divalent linking groups described above for $Q^1$ in formula (a5-0-1).

The divalent linking group for $R^{30}$ is preferably a linear or branched alkylene group, an aliphatic hydrocarbon group that includes a ring within the structure, or a divalent linking group containing a hetero atom, and is more preferably a linear or branched alkylene group, or a divalent linking group containing an oxygen atom as a hetero atom.

As the linear alkylene group, a methylene group or ethylene group is preferable, and a methylene group is particularly desirable.

As the branched alkylene group, an alkylmethylene group or alkylethylene group is preferable, and —CH($CH_3$)—, —C($CH_3$)$_2$— and —C($CH_3$)$_2CH_2$— are particularly desirable.

As the divalent linking group containing an oxygen atom, divalent linking groups containing an ether linkage or an ester linkage are preferred, and groups represented by the aforementioned formulas —$Y^{21}$—O—$Y^{22}$—, —[$Y^{21}$—C(=O)—O]$_m$—$Y^{22}$— or —$Y^{21}$—O—C(=O)—$Y^{22}$— are more preferred. Each of $Y^{21}$ and $Y^{22}$ independently represents a divalent hydrocarbon group which may have a substituent, and m' represents an integer of 0 to 3. Among these groups, a group represented by —$Y^{21}$—O—C(=O)—$Y^{22}$— is preferable, and a group represented by —($CH_2$)$_c$—O—C(=O)—($CH_2$)$_d$— is particularly desirable. c represents an integer of 1 to 5, and is preferably 1 or 2. d represents an integer of 1 to 5, and is preferably 1 or 2.

As the structural unit (a2$^S$), a structural unit represented by general formula (a2-0-11) or (a2-0-12) shown below is preferred, and a structural unit represented by formula (a2-0-12) is particularly desirable.

[Chemical Formula 73]

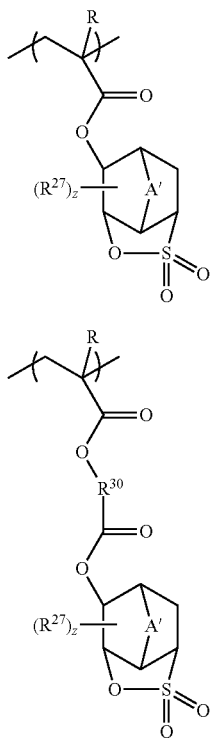

(a2-0-11)

(a2-0-12)

In the formulas, R, A', $R^{27}$, z and $R^{30}$ are the same as defined above.

In formula (a2-0-11), A' is preferably a methylene group, an oxygen atom (—O—) or a sulfur atom (—S—).

$R^{30}$ is preferably a linear or branched alkylene group, or a divalent linking group containing an oxygen atom. Examples of the linear or branched alkylene group and the divalent linking group containing an oxygen atom for $R^{30}$ include the same linear or branched alkylene groups and divalent linking groups containing an oxygen described above.

As the structural unit represented by formula (a2-0-12), a structural unit represented by general formula (a2-0-12a) or (a2-0-12b) shown below is particularly desirable.

[Chemical Formula 74]

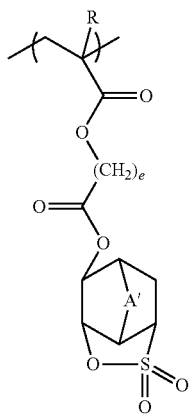

(a2-0-12a)

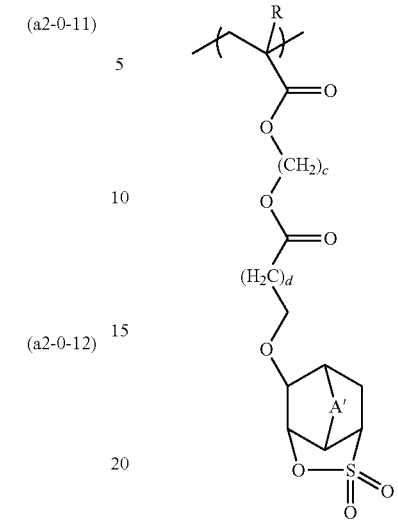

(a2-0-12b)

In the formulas, R and A' are each the same as defined above, and each of c to e independently represents an integer of 1 to 3.

Structural Unit ($a2^L$):

Examples of the structural unit ($a2^L$) include structural units of the above general formula (a2-0) in which $R^{28}$ has been substituted with a lactone-containing cyclic group, and more specific examples include structural units represented by general formulas (a2-1) to (a2-5) shown below.

[Chemical Formula 75]

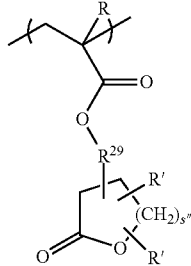

(a2-1)

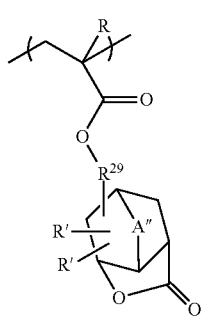

(a2-2)

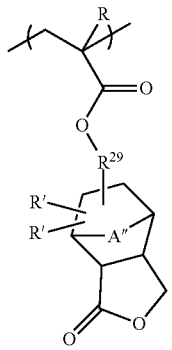
(a2-3)

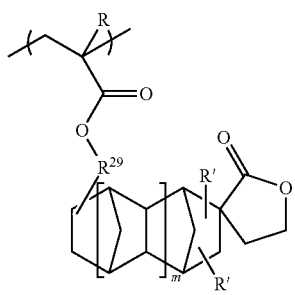
(a2-4)

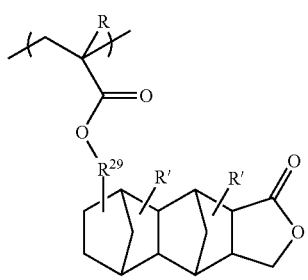
(a2-5)

In the formulas, R represents a hydrogen atom, an alkyl group of 1 to 5 carbon atoms or a halogenated alkyl group of 1 to 5 carbon atoms, each R' independently represents a hydrogen atom, alkyl group, alkoxy group, halogenated alkyl group, hydroxyl group, —COOR", —OC(=O)R", hydroxyalkyl group or cyano group, wherein R" represents a hydrogen atom or an alkyl group, $R^{29}$ represents a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents 0 or 1.

In general formulas (a2-1) to (a2-5), R is the same as defined above.

Examples of the alkyl group, alkoxy group, halogenated alkyl group, —COOR" group, —OC(=O)R" group and hydroxyalkyl group for R' include the same alkyl groups, alkoxy groups, halogenated alkyl groups, —COOR" groups, —OC(=O)R" groups and hydroxyalkyl groups as those mentioned above for the substituent of the —$SO_2$-containing cyclic group.

In terms of factors such as ease of industrial availability, R' is preferably a hydrogen atom.

The alkyl group for R" may be a linear, branched or cyclic alkyl group.

When R" is a linear or branched alkyl group, the alkyl group preferably contains 1 to 10 carbon atoms, and more preferably 1 to 5 carbon atoms.

When R" is a cyclic alkyl group (cycloalkyl group), the cycloalkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of A" include the same groups as those described above for A' in general formula (3-1). A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or dimethylmethylene group is preferable, and a methylene group is the most desirable.

$R^{29}$ is the same as defined above for $R^{29}$ in general formula (a2-0).

In formula (a2-1), s" is preferably 1 or 2.

Specific examples of structural units represented by general formulas (a2-1) to (a2-5) are shown below. In each of the following formulas, $R^\alpha$ represents a hydrogen atom, a methyl group or a trifluoromethyl group.

[Chemical Formula 76]

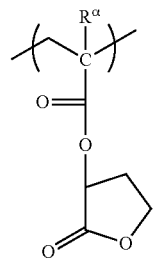
(a2-1-1)

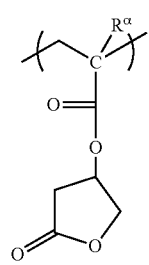
(a2-1-2)

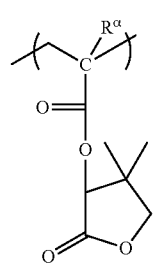
(a2-1-3)

-continued
(a2-1-4)
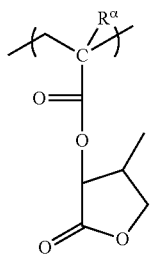
(a-1-5)
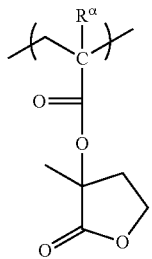
(a2-1-6)
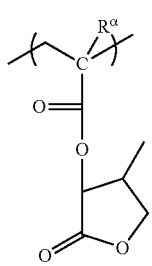
(a2-1-7)
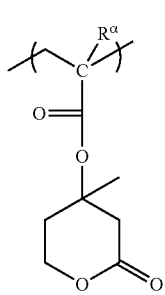
(a2-1-8)
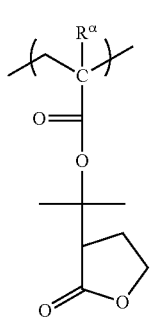
-continued
(a2-1-9)
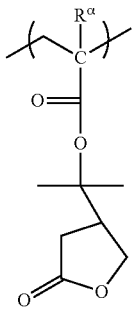
(a2-1-10)
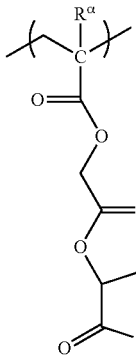
(a2-1-11)
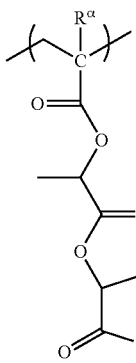
(a2-1-12)
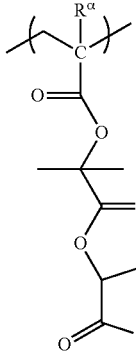

(a2-1-13)
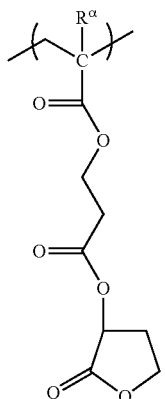
[Chemical Formula 77]
(a2-2-1)
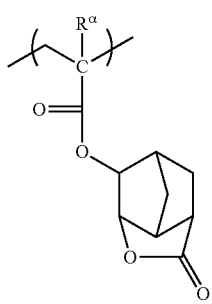
(a2-2-2)
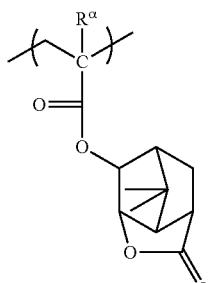
(a2-2-3)
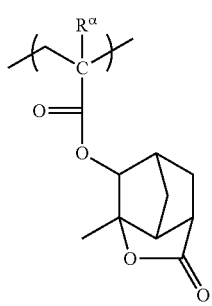
(a2-2-4)
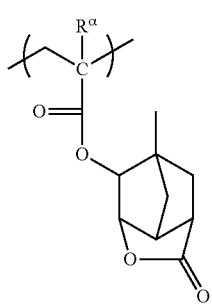
(a2-2-5)
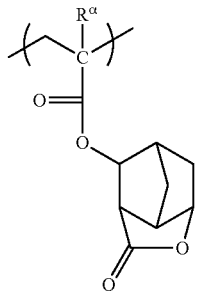
(a2-2-6)
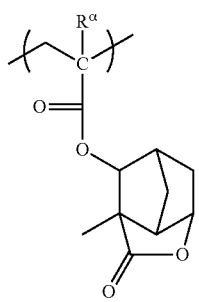
(a2-2-7)
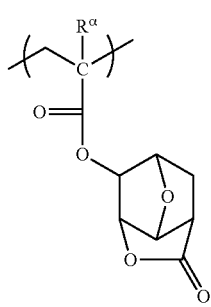
(a2-2-8)
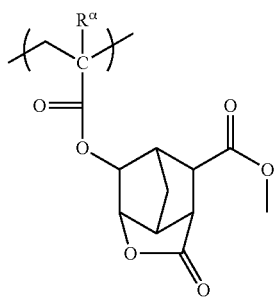
(a2-2-9)
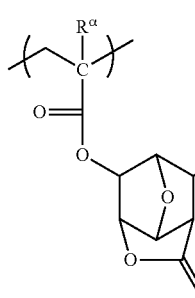

(a2-2-10)
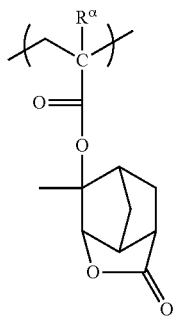
(a2-2-11)
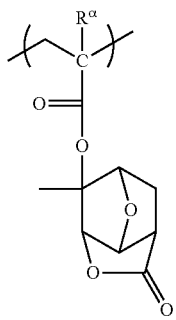
(a2-2-12)
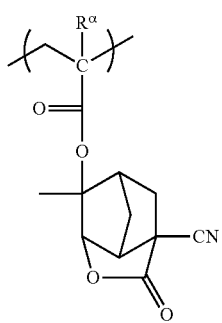
(a2-2-13)
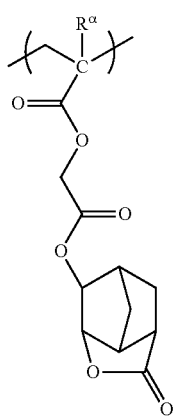
(a2-2-14)
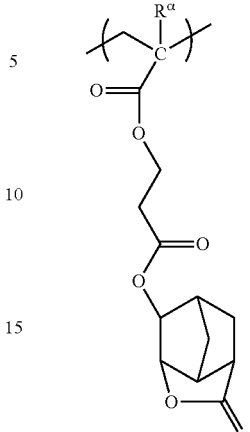
(a2-2-15)
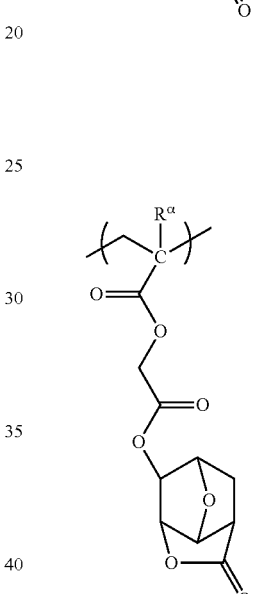
(a2-2-16)
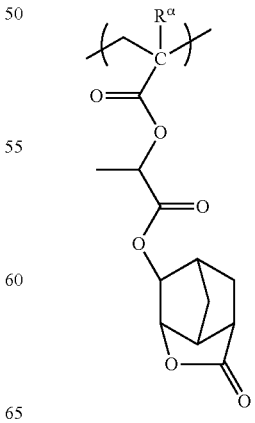

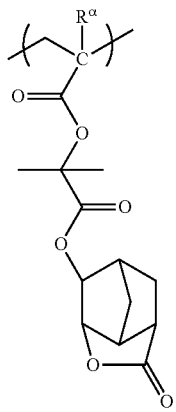
(a2-2-17)
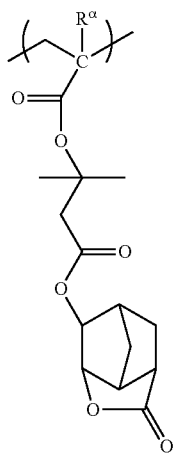
(a2-2-18)
[Chemical Formula 78]
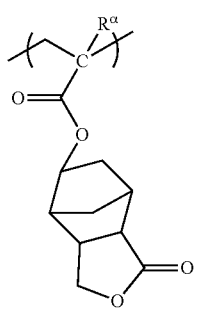
(a2-3-1)
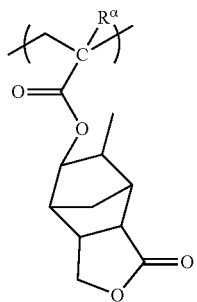
(a2-3-2)
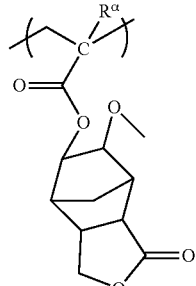
(a2-3-3)
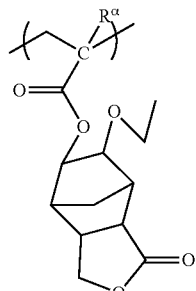
(a2-3-4)
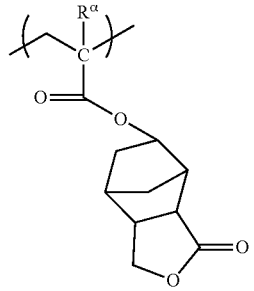
(a2-3-5)
[Chemical Formula 79]
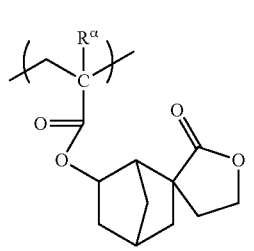
(a2-4-1)
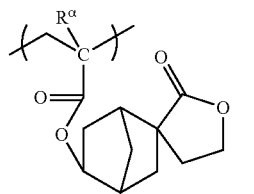
(a2-4-2)
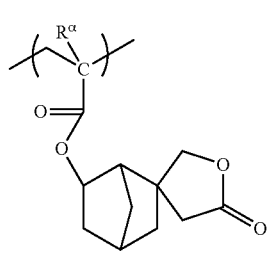
(a2-4-3)

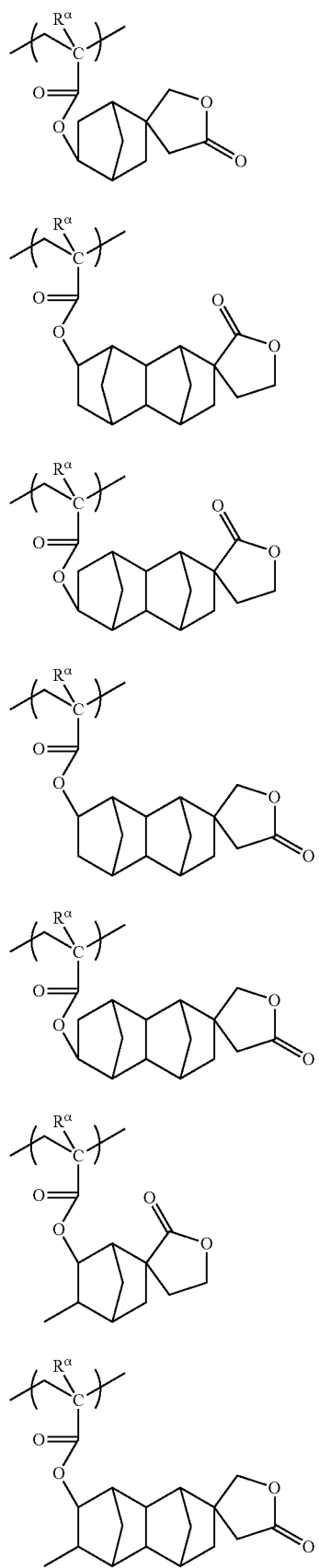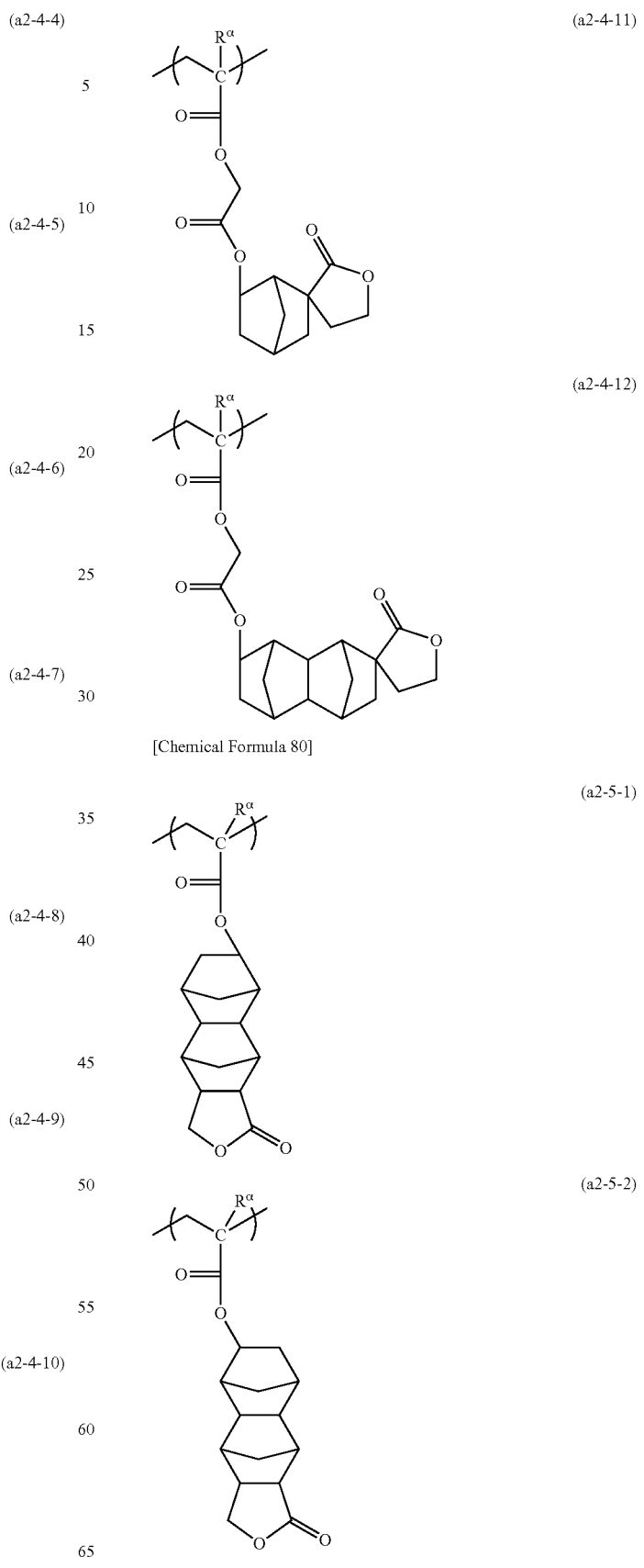

(a2-5-3)
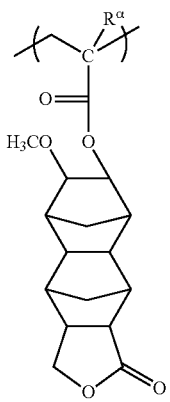

(a2-5-4)
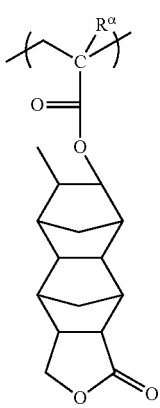

(a2-5-5)

(a2-5-6)
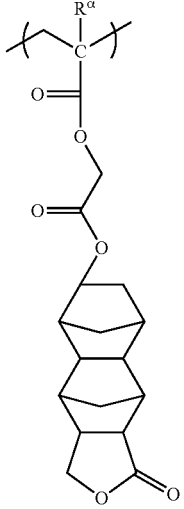

The structural unit (a2$^L$) is preferably at least one structural unit selected from the group consisting of structural units represented by general formulas (a2-1) to (a2-5), is more preferably at least one structural unit selected from the group consisting of structural units represented by general formulas (a2-1) to (a2-3), and is still more preferably at least one structural unit selected from the group consisting of structural units represented by general formulas (a2-1) and (a2-3).

Among these structural units, the structural unit (a2$^L$) is most preferably at least one structural unit selected from the group consisting of structural units represented by the above formulas (a2-1-), (a2-1-2), (a2-2-1), (a2-2-7), (a2-2-12), (a2-2-13), (a2-2-15), (a2-3-1) and (a2-3-5).

Further, structural units represented by general formulas (a2-6) and (a2-7) shown below are also preferred as the structural unit (a2$^L$).

[Chemical Formula 81]

(a2-6)
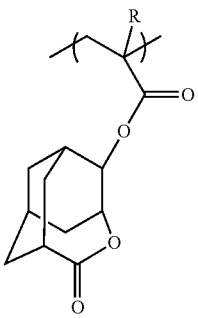

(a2-7)
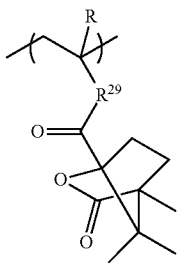

In the formulas, R and $R^{29}$ are the same as defined above.

The structural unit (a2) within the component (A1-1) may be a single type of structural unit, or a combination of two or more types. For example, as the structural unit (a2), the structural unit ($a2^S$) may be used alone, the structural unit ($a2^L$) may be used alone, or a combination of these structural units may be used. Further, as the structural unit ($a2^S$) or the structural unit ($a2^L$), either a single type of structural unit may be used alone, or two or more types may be used in combination.

The amount of the structural unit (a2) within the component (A1-1), based on the combined total of all the structural units that constitute the component (A1-1), is preferably within a range from 1 to 80 mol %, more preferably from 10 to 70 mol %, still more preferably from 10 to 65 mol %, and most preferably from 10 to 60 mol %. When the amount of the structural unit (a2) is at least as large as the lower limit of the above range, the effects achieved by including the structural unit (a2) can be satisfactorily achieved. On the other hand, when the amount of the structural unit (a2) is not more than the upper limit of the above range, a good balance can be achieved with the other structural units, and various lithography properties such as DOF and CDU, and the pattern shape can be improved.

(Structural Unit (a3))

The component (A1-1) may also include, in addition to the structural units (a5) and (a1), or in addition to the structural units (a5), (a1) and (a2), or in addition to the structural units (a5) and (a6), or in addition to the structural units (a5), (a6) and (a1), or in addition to the structural units (a5), (a6) and (a2), or in addition to the structural units (a5), (a6), (a1) and (a2), a structural unit (a3) containing a polar group. By including the structural unit (a3) in the component (A1-1), the polarity of the component (A1-1) following exposure can be further increased. Increasing the polarity of the component (A1-1) contributes to improvements in the resolution and the like, particularly in those cases where an alkali developing process is used.

Structural units containing a polar group which correspond with one of the aforementioned structural units (a5), (a6), (a1) or (a2) are not classified as a structural unit (a3).

Examples of the polar group include —OH, —COOH, —CN, —$SO_2NH_2$ and —$CONH_2$. Structural units containing —COOH include (α-substituted) acrylic acid structural units.

The structural unit (a3) is preferably a structural unit containing a hydrocarbon group in which part of the hydrogen atoms have been substituted with the polar group. The hydrocarbon group may be either an aliphatic hydrocarbon group or an aromatic hydrocarbon group. The hydrocarbon group is preferably an aliphatic hydrocarbon group.

Examples of the aliphatic hydrocarbon group for this hydrocarbon group include linear or branched hydrocarbon groups (and preferably alkylene groups) of 1 to 10 carbon atoms, and aliphatic cyclic groups (monocyclic groups or polycyclic groups).

The linear or branched hydrocarbon group (and preferably alkylene group) of 1 to 10 carbon atoms may or may not have a substituent. Examples of the substituent include a fluorine atom.

As the aliphatic cyclic group (monocyclic group or polycyclic group), any of the multitude of groups proposed for resins used in resist compositions designed for use, for example, with an ArF excimer laser can be selected as appropriate. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples include groups in which two or more hydrogen atoms have been removed from a monocycloalkane, and groups in which two or more hydrogen atoms have been removed from a polycycloalkane such as a bicycloalkane, tricycloalkane or tetracycloalkane. Specific examples of such groups include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane. The aliphatic cyclic group may or may not have a substituent. Examples of the substituent include an alkyl group of 1 to 5 carbon atoms, a fluorine atom, and a fluorinated alkyl group of 1 to 5 carbon atoms.

The aromatic hydrocarbon group for the above hydrocarbon group is a hydrocarbon group containing at least one aromatic ring.

There are no particular limitations on the aromatic ring, provided it is a cyclic conjugated system having 4n+2 (wherein n represents 0 or a natural number) π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the above divalent hydrocarbon group include groups in which two hydrogen atoms have been removed from an aromatic hydrocarbon ring or an aromatic heterocyclic ring (namely, arylene groups or heteroarylene groups), groups in which two hydrogen atoms have been removed from an aromatic compound having two or more aromatic rings (such as biphenyl or fluorene), and groups in which one further hydrogen atom has been removed from the aromatic ring of a group in which one of the hydrogen atoms of an aforementioned aromatic ring has been substituted with an alkylene group (for example, an arylalkyl group such as a benzyl group, phenethyl group, 1-naphthylmethyl group, 2-naphthylmethyl group, 1-naphthylethyl group or 2-naphthylethyl group, or a heteroarylalkyl group). The alkylene group that substitutes the hydrogen atom of the aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group may have a substituent. For example, a hydrogen atom bonded to the aromatic ring within the aromatic hydrocarbon group may be substituted with a substituent. Examples of this substituent include an alkyl group, alkoxy group, halogen atom, halogenated alkyl group, hydroxyl group and oxygen atom (=O).

The alkyl group as the substituent is preferably an alkyl group of 1 to 5 carbon atoms, and a methyl group, ethyl group, propyl group, n-butyl group or tert-butyl group is the most desirable.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent include groups in which part or all of the hydrogen atoms in an aforementioned alkyl group have each been substituted with an aforementioned halogen atom.

The structural unit (a3) is preferably a structural unit represented by general formula (a3-1) shown below.

[Chemical Formula 82]

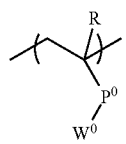

(a3-1)

In the formula, R represents a hydrogen atom, an alkyl group of 1 to 5 carbon atoms or a halogenated alkyl group of 1 to 5 carbon atoms, and $P^0$ represents —C(=O)—O—, —C(=O)—NR$^0$— (wherein R$^0$ represents a hydrogen atom or an alkyl group of 1 to 5 carbon atoms) or a single bond. $W^0$ represents a hydrocarbon group having at least one group selected from the group consisting of —OH, —COOH, —CN, —SO$_2$NH$_2$ and —CONH$_2$ as a substituent, or a group represented by —COOH or —CONHCO—R$^{a3}$ (wherein R$^{a3}$ represents a hydrocarbon group), wherein the hydrocarbon group may have an oxygen atom or a sulfur atom in an arbitrary position, and may be substituted with a halogen atom.

In formula (a3-1), the alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which part or all of the hydrogen atoms of an aforementioned alkyl group for R have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a3-1), $P^0$ represents —C(=O)—O—, —C(=O)—NR$^0$— (wherein R$^0$ represents a hydrogen atom or an alkyl group of 1 to 5 carbon atoms) or a single bond. The alkyl group for R$^0$ is the same as defined above for the alkyl group for R.

In formula (a3-1), $W^0$ represents a hydrocarbon group having at least one group selected from the group consisting of —OH, —COOH, —CN, —SO$_2$NH$_2$ and —CONH$_2$ as a substituent, or a group represented by —COOH or —CONHCO—R$^{a3}$ (wherein R$^{a3}$ represents a hydrocarbon group), wherein the hydrocarbon group may have an oxygen atom or a sulfur atom in an arbitrary position, and may be substituted with a halogen atom.

The expression "hydrocarbon having a substituent" describes a group in which at least part of the hydrogen atoms bonded to the hydrocarbon group have been substituted with a substituent.

The hydrocarbon group for $W^0$ or R$^{a3}$ may be an aliphatic hydrocarbon group or an aromatic hydrocarbon group.

Preferred examples of the aliphatic hydrocarbon group for $W^0$ or R$^{a3}$ include a linear or branched hydrocarbon group (and preferably an alkylene group) of 1 to 10 carbon atoms, and an aliphatic cyclic group (monocyclic group or polycyclic group), and these groups are as described above.

The aromatic hydrocarbon group for $W^0$ or R$^{a3}$ is a hydrocarbon group having at least one aromatic ring, and is the same as described above. However, when $W^0$ represents an aromatic ring, aromatic rings having an —OH bonded thereto are excluded.

In formula (a3-1), $W^0$ may have an oxygen atom or a sulfur atom in an arbitrary position. This expression that the hydrocarbon group "may have an oxygen atom or a sulfur atom in an arbitrary position" means that either a portion of the carbon atoms that constitute the hydrocarbon group or the hydrocarbon group having a substituent (including the carbon atoms in the substituent portion) may be substituted with an oxygen atom or a sulfur atom, or that one or more hydrogen atoms bonded to the hydrocarbon group may be substituted with an oxygen atom or a sulfur atom.

Further, in the hydrocarbon group for $W^0$, a hydrogen atom bonded to the hydrocarbon group may be substituted with a halogen atom. Examples of the halogen atom include a fluorine atom, chlorine atom, bromine atom and iodine atom, and a fluorine atom is particularly desirable.

Examples of $W^0$ groups having an oxygen atom (O) in an arbitrary position are shown below.

[Chemical Formula 83]

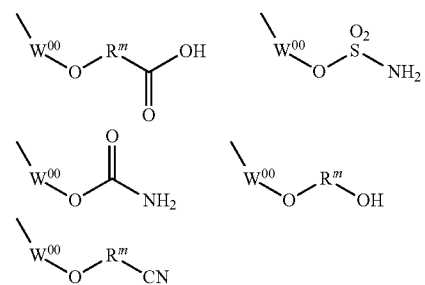

In the formulas, $W^{00}$ represents a hydrocarbon group, and R$^m$ represents an alkylene group of 1 to 5 carbon atoms.

In the above formulas, $W^{00}$ represents a hydrocarbon group, and examples include the same groups as those mentioned above for $W^0$ in formula (a3-1). $W^{00}$ is preferably an aliphatic hydrocarbon group, and more preferably an aliphatic cyclic group (monocyclic group or polycyclic group).

R$^m$ is preferably a linear or branched group, is more preferably an alkylene group of 1 to 3 carbon atoms, and is most preferably a methylene group or an ethylene group.

Among the various structural units (a3), specific examples of preferred structural units include structural units derived from an (α-substituted) acrylate ester, and structural units represented by any of general formulas (a3-11) to (a3-13) shown below. An example of a structural unit derived from an (α-substituted) acrylate ester is a structural unit of the above formula (a3-1) in which $P^0$ represents a single bond and $W^0$ represents —COOH.

[Chemical Formula 84]

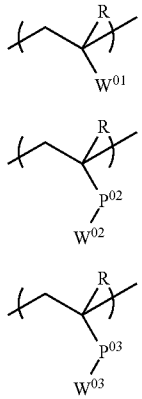

(a3-11)

(a3-12)

(a3-13)

In the formulas, R represents a hydrogen atom, an alkyl group of 1 to 5 carbon atoms or a halogenated alkyl group of 1 to 5 carbon atoms, $W^{01}$ represents an aromatic hydrocarbon group having at least one group selected from the group consisting of —OH, —COOH, —CN, —SO$_2$NH$_2$ and —CONH$_2$ as a substituent, each of $P^{02}$ and $P^{03}$ represents —C(=O)—O—, —C(=O)—NR$^O$— (wherein R$^O$ represents a hydrogen atom or an alkyl group of 1 to 5 carbon atoms) or a single bond, $W^{02}$ represents a cyclic hydrocarbon group having at least one group selected from the group consisting of —OH, —COOH, —CN, —SO$_2$NH$_2$ and —CONH$_2$ as a substituent, or —CONHCO—R$^{a32}$ (wherein R$^{a32}$ represents a cyclic hydrocarbon group) and may have an oxygen atom or a sulfur atom in an arbitrary position, and $W^{03}$ represents a chain-like hydrocarbon group having at least one group selected from the group consisting of —OH, —COOH, —CN, —SO$_2$NH$_2$ and —CONH$_2$ as a substituent, or —CONHCO—R$^{a33}$ (wherein R$^{a33}$ represents a chain-like hydrocarbon group).

[Structural Unit Represented by General Formula (a3-11)]

In the above formula (a3-11), R is the same as defined above for R in formula (a3-1).

The aromatic hydrocarbon group for $W^{01}$ is the same as the aromatic hydrocarbon group described above for $W^0$ in formula (a3-1). However, when $W^{01}$ is an aromatic ring, structural units in which —OH is bonded to the aromatic ring are not included within the definition of structural units represented by formula (a3-11).

Specific examples of preferred structural units represented by general formula (a3-11) are shown below. In the following formula, R$^\alpha$ represents a hydrogen atom, a methyl group, or a trifluoromethyl group.

[Chemical Formula 85]

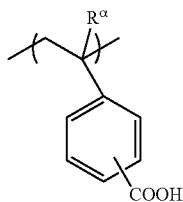

(a3-11-4)

[Structural Unit Represented by General Formula (a3-12)]

In the above formula (a3-12), R is the same as defined above for R in formula (a3-1).

$P^{02}$ represents —C(=O)—O— or —C(=O)—NR$^O$— (wherein R$^O$ represents a hydrogen atom or an alkyl group of 1 to 5 carbon atoms), and is preferably —C(=O)—O—. The alkyl group for R$^O$ is the same as defined above for the alkyl group for R.

Examples of the cyclic hydrocarbon group for $W^{02}$ or R$^{a32}$ include the same groups as those mentioned above for the aliphatic cyclic group (monocyclic group or polycyclic group) and the aromatic hydrocarbon group within the description for $W^0$ in the aforementioned formula (a3-1). However, when $W^{02}$ is an aromatic ring, structural units in which —OH is bonded to the aromatic ring are not included within the definition of structural units represented by formula (a3-12).

$W^{02}$ or R$^{a32}$ may have an oxygen atom or a sulfur atom in an arbitrary position, and this is the same as described above for $W^0$ in formula (a3-1).

Specific examples of preferred structural units represented by general formula (a3-12) are shown below. In each of the following formulas, R$^e$ represents a hydrogen atom, a methyl group, or a trifluoromethyl group.

[Chemical Formula 86]

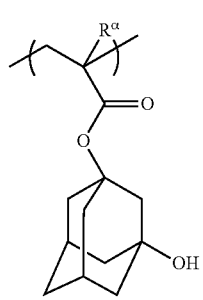

(a3-12-1)

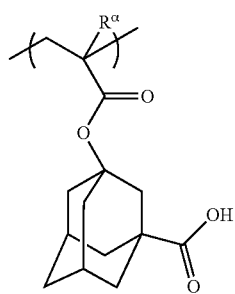

(a3-12-2)

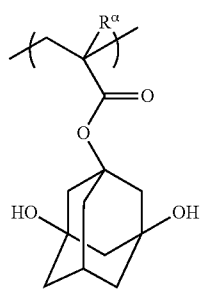

(a3-12-3)

-continued
(a3-12-6)
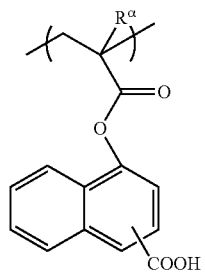
(a3-12-8)
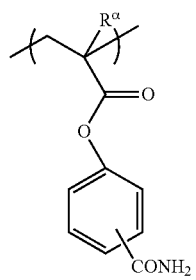
(a3-12-9)
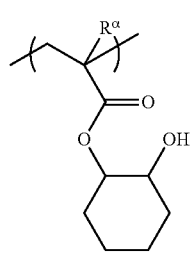
(a3-12-10)
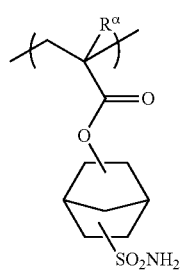
(a3-12-11)
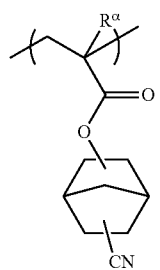
(a3-12-12)
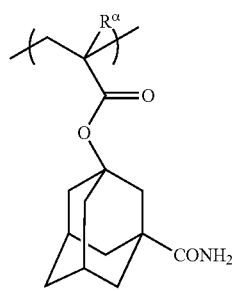
-continued
[Chemical Formula 87]
(a3-12-13)
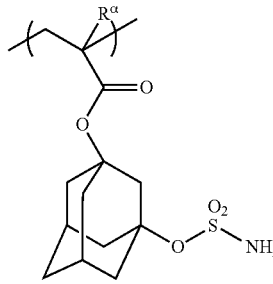
(a3-12-14)
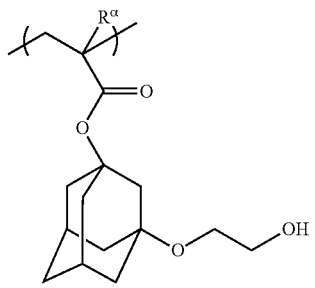
(a3-12-15)
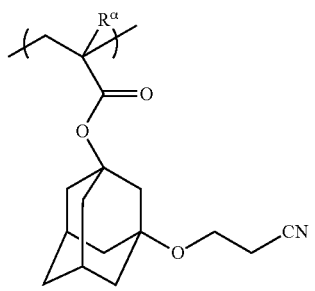
(a3-12-16)
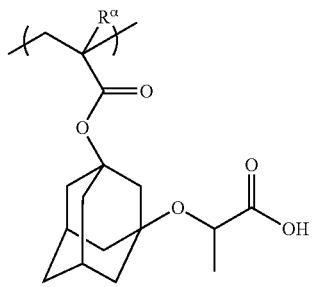
(a3-12-17)
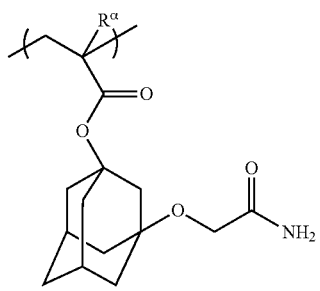

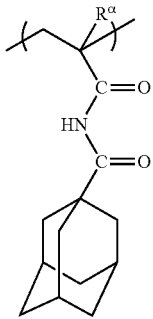

(a3-12-18)

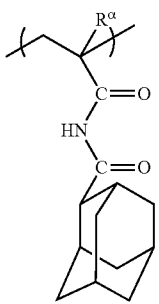

(a3-12-19)

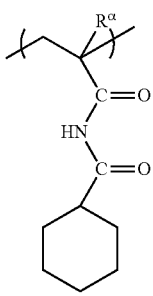

(a3-12-20)

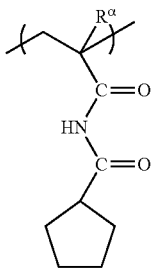

(a3-12-21)

[Structural Unit Represented by General Formula (a3-13)]

In the above formula (a3-13), R is the same as defined above for R in formula (a3-1).

$P^{03}$ represents —C(=O)—O— or —C(=O)—NR⁰— (wherein R⁰ represents a hydrogen atom or an alkyl group of 1 to 5 carbon atoms), and is preferably —C(=O)—O—. The alkyl group for R⁰ is the same as defined above for the alkyl group for R.

The chain-like hydrocarbon group for $W^{03}$ or $R^{a33}$ preferably contains 1 to 10 carbon atoms, more preferably 1 to 5 carbon atoms, and still more preferably 1 to 3 carbon atoms.

The chain-like hydrocarbon group for $W^{03}$ or $R^{a33}$ may also have a substituent (a) besides the —OH, —COOH, —CN, —SO₂NH₂ and/or —CONH₂ substituent. Examples of this substituent (a) include an alkyl group of 1 to 5 carbon atoms, an aliphatic cyclic group (monocyclic group or polycyclic group), a fluorine atom, and a fluorinated alkyl group of 1 to 5 carbon atoms. The aliphatic cyclic group (monocyclic group or polycyclic group) for the substituent (a) preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which two or more hydrogen atoms have been removed from a monocycloalkane, and groups in which one or more hydrogen atoms have been removed from a polycycloalkane such as a bicycloalkane, tricycloalkane or tetracycloalkane. Specific examples of such groups include groups in which two or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Further, the chain-like hydrocarbon group for $W^{03}$ may have a plurality of substituents (a), as shown below for a structural unit represented by general formula (a3-13-a), and this plurality of substituents (a) may be bonded to each other to form a ring.

[Chemical Formula 88]

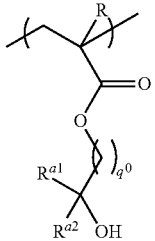

(a3-13-a)

In the formula, R represents a hydrogen atom, an alkyl group of 1 to 5 carbon atoms or a halogenated alkyl group of 1 to 5 carbon atoms, and each of $R^{a1}$ and $R^{a2}$ independently represents an alkyl group of 1 to 5 carbon atoms, an aliphatic cyclic group (monocyclic group or polycyclic group), a fluorine atom or a fluorinated alkyl group of 1 to 5 carbon atoms. Further, $R^{a1}$ and $R^{a2}$ may be bonded to each other to form a ring. $q^0$ represents an integer of 1 to 4.

In formula (a3-13-a), R is the same as defined above for R in formula (a3-1).

The aliphatic cyclic group (monocyclic group or polycyclic group) for $R^{a1}$ and $R^{a2}$ is the same as the aliphatic cyclic group (monocyclic group or polycyclic group) described above for the substituent (a).

Further, $R^{a1}$ and $R^{a2}$ may be bonded to each other to form a ring. In this case, a cyclic group is formed from $R^{a1}$, $R^{a2}$, and the carbon atom to which both $R^{a1}$ and $R^{a2}$ are bonded. The thus formed cyclic group may be a monocyclic group or a polycyclic group, and specific examples include groups in which one or more hydrogen atoms have been removed from the types of monocycloalkanes and polycycloalkanes mentioned above within the description of the aliphatic cyclic group (monocyclic group or polycyclic group) for the aforementioned substituent (a).

$q^0$ is preferably 1 or 2, and is more preferably 1.

Specific examples of preferred structural units represented by general formula (a3-13) are shown below. In each of the following formulas, $R^\alpha$ represents a hydrogen atom, a methyl group, or a trifluoromethyl group.

[Chemical Formula 89]

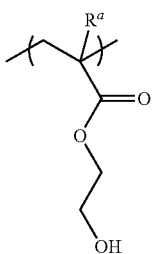
(a3-13-1)

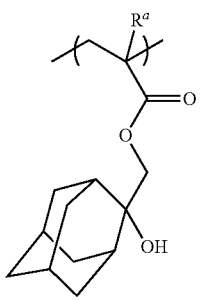
(a3-13-2)

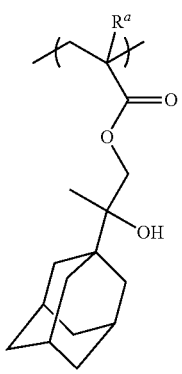
(a3-13-3)

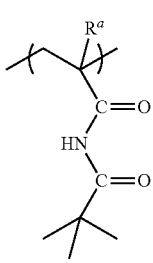
(a3-13-4)

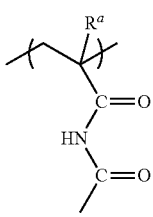
(a3-13-5)

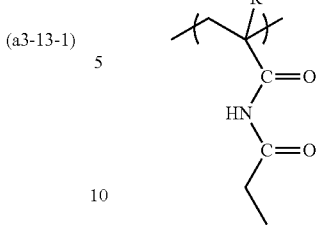
(a3-13-6)

The structural unit (a3) in the component (A1-1) may be a single type of structural unit, or a combination of two or more types.

The amount of the structural unit (a3) within the component (A1-1), based on the combined total of all the structural units that constitute the component (A1-1), is preferably within a range from 0 to 85 mol %, and more preferably from 0 to 80 mol %. When the amount of the structural unit (a3) is at least as large as the lower limit of the above range, the effects achieved be including the structural unit (a3) (improved resolution, lithography properties and pattern shape) can be satisfactorily achieved. On the other hand, when the amount of the structural unit (a3) is not more than the upper limit of the above range, a good balance can be achieved with the other structural units.

(Structural Unit (a4))

The component (A1-1) may also include, where required, a structural unit (a4) containing a non-acid-dissociable cyclic group. By including the structural unit (a4) in the component (A1-1), the dry etching resistance of the formed resist pattern can be improved. Further, the hydrophobicity of the component (A1-1) is enhanced. This improvement in hydrophobicity contributes to improvements in the resolution and the resist pattern shape and the like, particularly in those cases where organic solvent developing is used.

The "non-acid-dissociable cyclic group" in the structural unit (a4) is a cyclic group that does not dissociate, but is rather retained within the structural unit, even when acid is generated from the structural unit (a5) or an optional acid generator component (B) described below upon exposure, and this acid acts upon the structural unit.

Examples of the structural unit (a4) include structural units in which the acid-dissociable group in the aforementioned structural unit (a1) has been substituted with a non-acid-dissociable group. Among such structural units, a structural unit (a41) which is derived from an acrylate ester in which the hydrogen atom bonded to the carbon atom on the α-position may be substituted with a substituent and contains a non-acid-dissociable aliphatic cyclic group, a structural unit (a42) which is derived from a styrene in which the hydrogen atom bonded to the carbon atom on the α-position may be substituted with a substituent, and a structural unit (a43) which is derived from a vinylnaphthalene in which the hydrogen atom bonded to the carbon atom on the α-position may be substituted with a substituent are preferable.

Examples of the non-acid-dissociable aliphatic cyclic group in the structural unit (a41) include monovalent aliphatic cyclic groups in which a substituent (an atom other than a hydrogen atom or a group) is not bonded to the carbon atom bonded to the atom adjacent to the aliphatic cyclic group (such as the —O— in —C(=O)—O—), and groups in which one hydrogen atom of a primary or secondary alkyl group has been substituted with a monovalent aliphatic cyclic group.

There are no particular limitations on the monovalent aliphatic cyclic group, provided the group is non-acid-dissociable, and any of the multitude of conventional aliphatic cyclic groups used within the resin component of resist compositions designed for ArF excimer lasers or KrF excimer lasers (and preferably ArF excimer lasers) can be used. The aliphatic cyclic group may be saturated or unsaturated, nut is preferably saturated.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the aliphatic cyclic group exclusive of substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

The aliphatic cyclic group may be either monocyclic or polycyclic. As the monocyclic aliphatic cyclic group, a group in which one or more hydrogen atoms have been removed from a monocycloalkane is preferred. The monocycloalkane preferably contains 3 to 6 carbon atoms, and specific examples include cyclobutane, cyclopentane and cyclohexane. As the polycyclic aliphatic cyclic group, a group in which one or more hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane. Further, part of the carbon atoms that constitute the ring structure of these aliphatic cyclic groups may be replaced with an ether group (—O—).

In terms of enhancing the effects described above, the aliphatic cyclic group is preferably a polycyclic group. Two-ring to four-ring structures are preferable, and at least one group selected from among a tricyclodecyl group, adamantyl group, tetracyclododecyl group, isobornyl group and norbornyl group is preferred in terms of ease of industrial availability.

Specific examples of the monovalent aliphatic cyclic group for the non-acid-dissociable aliphatic cyclic group include monovalent aliphatic cyclic groups in which a substituent (an atom other than a hydrogen atom or a group) is not bonded to the carbon atom bonded to the atom adjacent to the aliphatic cyclic group (such as the —O— in —C(=O)—O—). Specific examples include groups in which $R^{14}$ within a group represented by formula (1-1) to (1-9) mentioned within the description of the aforementioned acid-dissociable group has been substituted with a hydrogen atom, and groups in which a hydrogen atom has been removed from the tertiary carbon atom of a cycloalkane in which the tertiary carbon atom is formed only by carbon atoms that constitute the ring structure.

Examples of groups in which one hydrogen atom of a primary or secondary alkyl group has been substituted with a monovalent aliphatic cyclic group include groups in which at least one of $R^{15}$ and $R^{16}$ within formula (2-1) to (2-6) mentioned within the description of the aforementioned acid-dissociable group has been substituted with a hydrogen atom.

Examples of the structural unit (a41) include structural units in which the acid-dissociable group in the structural unit (a11) has been substituted with a non-acid-dissociable aliphatic cyclic group. Of these, structural units in which $X^1$ in the aforementioned general formula (a1-0-1) has been substituted with a non-acid-dissociable aliphatic polycyclic group, namely structural units represented by general formula (a-4-1-1) shown below, are preferred, and structural units represented by general formulas (a-4-1-11) to (a-4-1-15) shown below are particularly desirable.

[Chemical Formula 90]

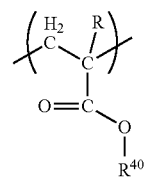

(a4-1-1)

In the formula, R is the same as defined above, and $R^{40}$ represents a non-acid-dissociable aliphatic polycyclic group.

[Chemical Formula 91]

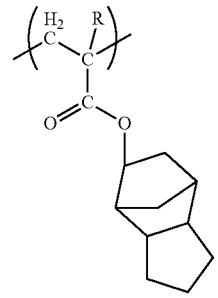

(a4-1-11)

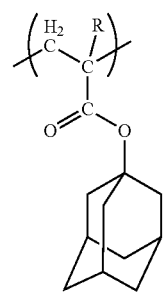

(a4-1-12)

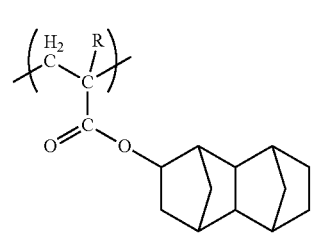

(a4-1-13)

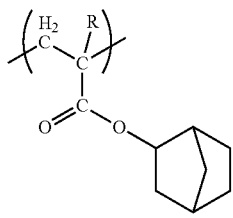
(a4-1-14)

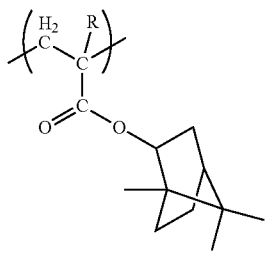
(a4-1-15)

Specific examples of the structural unit (a42) include structural units in which the value of px is zero in the group —$(OX^c)_{px}$ bonded to the benzene ring in the aforementioned general formula (U-3).

Specific examples of the structural unit (a43) include structural units in which the value of x is zero in the group —$(OX^d)_x$ bonded to the benzene ring in the aforementioned general formula (U-4).

The structural unit (a4) in the component (A1-1) may be a single type of structural unit, or a combination of two or more types.

In those cases where the component (A1-1) includes the structural unit (a4), the amount of the structural unit (a4) within the component (A1-1), based on the combined total of all the structural units that constitute the component (A1-1), is preferably within a range from 1 to 30 mol %, more preferably from 1 to 20 mol %, and still more preferably from 5 to 20 mol %.

When the amount of the structural unit (a4) is at least as large as the lower limit of the above range, the effects achieved be including the structural unit (a4) can be satisfactorily achieved. On the other hand, when the amount of the structural unit (a4) is not more than the upper limit of the above range, a good balance can be achieved with the other structural units.

The component (A1-1) may also one or more other structural units besides the structural units (a1) to (a6) described above, provided these other structural units do not impair the effects of the present invention.

There are no particular limitations on these other structural units, provided they cannot be classified as one of the above structural units (a1) to (a6), and any of the multitude of conventional structural units used within resist resins designed for use with ArF excimer lasers, KrF excimer lasers, EB or EUV or the like can be used.

In the resist composition of the present aspect, the component (A1) is preferably the component (A1-1).

In the resist composition of the present aspect, the component (A1-1) is preferably a copolymer that contains the structural unit (a1) in addition to the structural unit (a5). Among such copolymers, a copolymer having the structural units (a5), (a1) and (a2) is particularly preferred.

Examples of copolymers that contain the structural unit (a1) in addition to the structural unit (a5) include copolymers consisting solely of the structural units (a5) and (a1), copolymers consisting of the structural units (a5), (a1) and (a2), copolymers consisting of the structural units (a5), (a1) and (a3), copolymers consisting of the structural units (a5), (a1), (a2) and (a3), copolymers consisting of the structural units (a5), (a1), (a2) and (a4), and copolymers consisting of the structural units (a5), (a1), (a2), (a3) and (a4).

Further, in the resist composition of the present aspect, the component (A1-1) preferably includes the structural unit (a6) in addition to the structural unit (a5).

When the component (A1-1) includes the structural unit (a6), the component (A1-1) preferably also includes the structural unit (a1) in addition to the structural units (a5) and (a6).

Specific examples of such components (A1-1) include copolymers (A1-1-1) (hereafter also referred to as "resin (A1-1-1)") having the structural unit (a5), the structural unit (a6) and the structural unit (a1); and components having a mixed resin composition containing a copolymer (A1-1-2) (hereafter also referred to as "resin (A1-1-2)") having the structural unit (a5) and the structural unit (a1), and a copolymer (A1-1-3) (hereafter also referred to as "resin (A1-1-3)") having the structural unit (a6) but not having the structural unit (a5).

The resin (A1-1-1) is preferably a copolymer consisting of the structural unit (a5), the structural unit (a6) and the structural unit (a1), or a copolymer consisting of the structural unit (a5), the structural unit (a6), the structural unit (a1)) and the structural unit (a2). This structural unit (a2) is most preferably the structural unit ($a2^S$).

The resin (A1-1-2) is preferably a copolymer consisting of the structural unit (a5), the structural unit (a1) and the structural unit (a2), or a copolymer consisting of the structural unit (a5), the structural unit (a1), the structural unit (a2) and the structural unit (a3). This structural unit (a2) is most preferably the structural unit ($a2^S$).

The resin (A1-1-3) is preferably a polymer (homopolymer) consisting solely of the structural unit (a6), a copolymer consisting of the structural unit (a6) and the structural unit (a1), or a copolymer consisting of the structural unit (a6), the structural unit (a3) and the structural unit (a1).

Further, as the resin (A1-1-3), a polymeric compound (A1-1-3S) having a core portion formed from a divalent or higher hydrocarbon group or heterocyclic ring, and arm portions which are bonded to the core portion and are represented by general formula (1) shown below can also be used.

(Core Portion)

The core portion is formed from a divalent or higher hydrocarbon group or heterocyclic ring.

The hydrocarbon group for the core portion may be an aliphatic hydrocarbon group, an aromatic hydrocarbon group, or may be only a carbon atom.

The aliphatic hydrocarbon group may be a chain-like group, a cyclic group, or a combination thereof. Further the aliphatic hydrocarbon group may be either saturated or unsaturated.

Examples of the aromatic hydrocarbon group include hydrocarbon groups having an aromatic hydrocarbon ring, including groups composed of only an aromatic hydrocarbon ring, and combinations of an aromatic hydrocarbon ring and an aliphatic hydrocarbon group.

The number of carbon atoms in the hydrocarbon group of the core portion is preferably from 1 to 20 carbon atoms.

Specific examples of the hydrocarbon group of the core portion include groups having the structures represented by the formulas shown below.

[Chemical Formula 92]

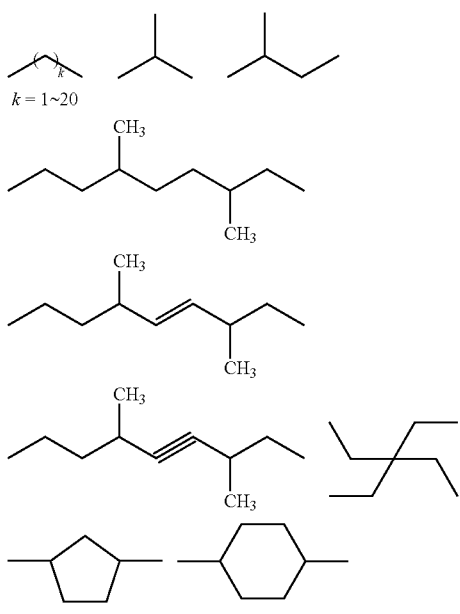

[Chemical Formula 93]

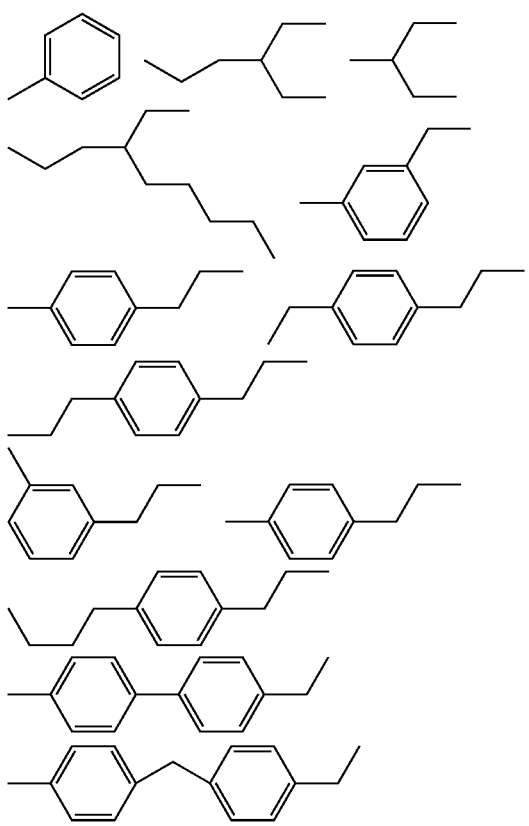

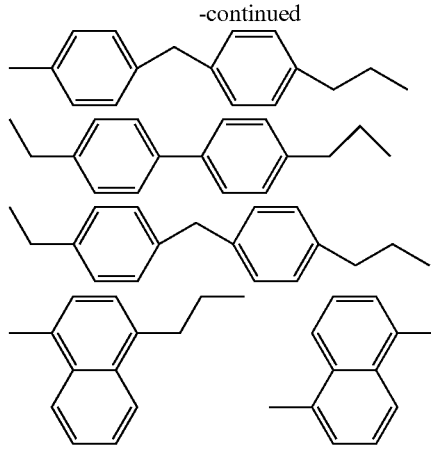

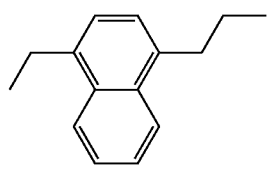

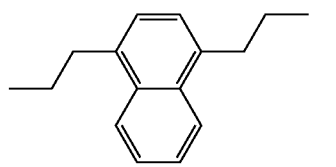

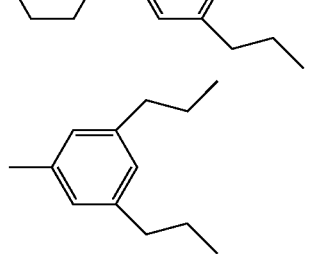

The heterocyclic ring for the core portion may be an aliphatic heterocyclic ring containing a hetero atom within the ring structure, or an aromatic heterocyclic ring containing a hetero atom within the ring structure, but is preferably an aromatic heterocyclic ring containing a hetero atom within the ring structure. The heterocyclic ring may be either monocyclic or polycyclic.

The term "hetero atom" describes an atom other than a carbon atom, and examples include a nitrogen atom, a sulfur atom and an oxygen atom.

The number of carbon atoms in the heterocyclic ring of the core portion is preferably from 1 to 20 carbon atoms.

Specific examples of the heterocyclic ring for the core portion include groups having the structures represented by the formulas shown below. In these formulas, the bonding position may be any of the carbon atoms.

[Chemical Formula 94]

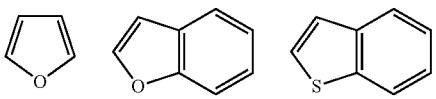

The polymeric compound (A1-1-3S) may have a single core portion or two or more core portions, and preferably has two or more core portions.

When the polymeric compound (A1-1-3S) has a plurality of core portions, the plurality of core portions may be the same or different, but are preferably the same, as this yields particularly superior effects for the present invention.

When the polymeric compound (A1-1-3S) has a plurality of core portions, the plurality of core portions are preferably linked via a "linking portion".

[Linking Portion]

The linking portion is preferably an atom or a divalent linking group.

Examples of the atom for the linking portion include a carbon atom, an oxygen atom and a nitrogen atom, and a carbon atom or an oxygen atom is preferable.

Examples of the divalent linking group for the linking portion include the same divalent linking groups as those mentioned above for $Q^1$ in formula (a5-0-1). The divalent linking group is preferably an alkylene group, a divalent aliphatic cyclic group or a divalent linking group containing a hetero atom, more preferably an alkylene group of 1 to 10 carbon atoms, still more preferably an alkylene group of 1 to 6 carbon atoms, and most preferably an alkylene group of 1 to 4 carbon atoms. Specific examples of these alkylene groups include the same groups as the linear alkylene groups and branched alkylene groups mentioned above for $Q^1$.

Further, the divalent linking group for the linking portion may be a divalent polymer. The average polymerization degree of such a polymer between two cores is preferably not more than 50, and more preferably 20 or less.

(Arm Portion)

The aforementioned arm portions are bonded to the core portion, and are represented by general formula (1) shown below.

[Chemical Formula 95]

$$-(X^P)-Y^P \qquad (1)$$

In the formula, $X^P$ represents a divalent linking group having an acid-dissociable group, and $Y^P$ represents a polymer chain.

In formula (1), $Y^P$ represents a polymer chain (hereafter also referred to as "polymer chain $Y^P$").

The polymer chain $Y^P$ may be the same or different for the plurality of arm portions within the polymeric compound (A1-1-3S), but is preferably the same, as this yields particularly favorable effects for the present invention.

The polymer chain $Y^P$ preferably has a structural unit derived from a hydroxystyrene derivative.

Further, the polymer chain $Y^P$ preferably has a structural unit in which at least part of the hydroxyl group hydrogen atoms of the structural unit derived from a hydroxystyrene derivative have been protected with a substituent (preferably the structural unit (a12)), or a structural unit in which the hydrogen atom of the —C(=O)OH group in a structural unit derived from a vinylbenzoic acid has been protected with a substituent.

The polymer chain $Y^P$ may also have a structural unit derived from styrene, and may also have other structural units (such as the aforementioned structural units (a11), (a13), (a2), (a3) and (a4)).

Such a polymer chain $Y^P$ preferably has the two types of structural units represented by the general formula shown below.

[Chemical Formula 96]

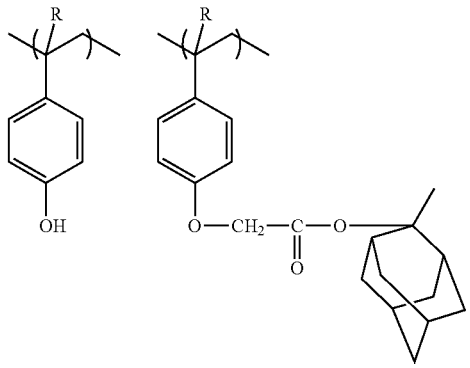

In the formula, R is the same as defined above, and the plurality of R groups may be the same or different.

The average number of structural units (average number of monomers) constituting an arm portion of the polymeric compound (A1-1-3S) is preferably from 2 to 50 units, and more preferably from 3 to 30 units.

When this average number of structural units is not more than the upper limit of the above range, the polymeric compound exhibits satisfactory solubility in a resist solvent when used as a resist. On the other hand, when the average number of structural units is at least as large as the lower limit of the above range, the dry etching resistance and the cross-sectional shape of the resist pattern are improved.

In the above formula (1), $X^P$ represents a divalent linking group having an acid-dissociable group.

Examples of the acid-dissociable group in $X^P$ include groups in which one or more hydrogen atoms have been removed from a tertiary alkyl group-containing group, and groups in which one or more hydrogen atoms have been removed from an alkoxyalkyl group.

Examples of the groups in which one or more hydrogen atoms have been removed from a tertiary alkyl group-containing group include groups in which one or more hydrogen atoms have been removed from the "tertiary alkyl group-containing acid-dissociable group" mentioned above within the description relating to the aforementioned formula (a1-5), and groups in which one or more hydrogen atoms have been removed from a tertiary alkyl ester-type acid-dissociable group mentioned above within the description relating to the aforementioned structural unit (a1).

Examples of the groups in which one or more hydrogen atoms have been removed from an alkoxyalkyl group include groups in which one or more hydrogen atoms have been removed from an acetal-type acid-dissociable group mentioned above within the description relating to the aforementioned structural unit (a1).

Examples of the divalent linking group having an acid-dissociable group for $X^P$ include combinations of the type of acid-dissociable group described above, and a linking group the same as the divalent linking group of the aforementioned linking portion that links a plurality of core portions.

When a mixed resin composition of the resin (A1-1-2) and the resin (A1-1-3) is used, the mixing ratio (weight ratio) preferably satisfies resin (A1-1-2):resin (A1-1-3)=90:10 to 10:90, more preferably 80:20 to 20:80, and still more preferably 70:30 to 50:50.

In this mixed resin composition, when the proportion of the resin (A1-1-2) is at least as large as the lower limit of the above range, the lithography properties and the resist pattern shape are improved, and when the proportion of the resin (A1-1-2) is not more than the upper limit of the above range, the sensitivity is improved.

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight-average molecular weight is not more than the upper limit of the above range, the component (A1) exhibits satisfactory solubility in a resist solvent when used as a resist. On the other hand, when the weight-average molecular weight is at least as large as the lower limit of the above range, the dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn represents the number-average molecular weight.

A single component (A) may be used alone, or a combination of two or more types of the component (A) may be used.

In the component (A), the amount of the component (A1), based on the total weight of the component (A), is preferably at least 25% by weight, more preferably 50% by weight or more, still more preferably 75% by weight or more, and may be even 100% by weight. When this amount is at least 25% by weight, the pattern shape and the critical resolution and the like of the resist pattern formed by EUV exposure or EB exposure are improved.

The component (A) may also include another base component (hereafter referred to as "component (A2)") which generates acid upon exposure and exhibits changed solubility in a developing solution under the action of acid, besides the component (A1), provided the inclusion of the component (A2) does not impair the effects of the present invention. There are no particular limitations on the component (A2), and conventionally proposed materials can be used.

There are no particular limitations on the amount of the component (A) within the resist composition of the present aspect, and the amount may be adjusted in accordance with factors such as the thickness of the resist film that is to be formed.

<Monomer that Yields the Structural Unit (a5)>

In the resist composition of the present aspect, the amount of the monomer that yields the structural unit (a5) is not more than 100 ppm (by weight) relative to the polymer (A1). Further, in the resist composition of the present aspect, when the component (A) includes the structural unit (a6), the amount of the monomer that yields the structural unit (a5) is not more than 100 ppm (by weight) relative to the polymer having the structural unit (a5).

By controlling the amount of the monomer that yields the structural unit (a5) in this manner, a resist pattern having favorable lithography properties and pattern shape can be formed by EUV lithography or EB lithography.

When the component (A) includes the structural unit (a6), the expression "polymer having the structural unit (a5)" includes, among the resin component (A1) having the structural unit (a5) and the structural unit (a6), copolymers having the structural unit (a5) and the structural unit (a6), and polymers having the structural unit (a5) but not having the structural unit (a6).

The expression "monomer that yields the structural unit (a5)" includes monomers that yield the structural unit (a5) directly and monomers that yield the structural unit (a5) indirectly, and specifically, includes monomers having a group represented by the above formula (a5-0-1) and monomers having a group represented by formula (a5-0-2), as well as monomers having the cation of a group represented by formula (a5-0-1) and monomers having the anion of a group represented by formula (a5-0-2).

The amount of the monomer that yields the structural unit (a5) within the resist composition can be controlled, for example, when synthesizing the component (A1), by polymerizing the monomers that yield each of the structural units that constitute the component (A1) by a conventional radical polymerization or the like using a radical polymerization initiator, and then washing the obtained polymer using water or an organic solvent.

In one example of a method of controlling the amount of the monomer that yields the structural unit (a5), in the case of a component (A1) containing a structural unit (a5) having a group represented by formula (a5-0-1), the monomer that yields the structural unit (a5) is polymerized with monomers that yield the other structural units that constitute the component (A1), and the resulting polymer is then washed with an organic solvent.

Examples of preferred organic solvents for performing the washing include methanol, isopropanol, methyl ethyl ketone, heptane and diisopropyl ether, and these solvents may be used individually or in mixtures.

Another example of a method of controlling the amount of the monomer that yields the structural unit (a5), in the case of a component (A1) containing a structural unit (a5) having a group represented by formula (a5-0-2), is a method (I) in which a precursor polymer is synthesized by polymerizing the monomer that yields the structural unit (a5) with monomers that yield the other structural units that constitute the component (A1), and following washing of this precursor polymer with water, the precursor polymer is subjected to a salt exchange with a predetermined organic cation to synthesize the component (A1). This method (I) enables the amount of the monomer that yields the structural unit (a5) to be controlled with ease. The method (1) is described below in further detail, with the description divided into descriptions of the step of synthesizing the precursor polymer, the step of washing the precursor polymer with water, and the step of subjecting the water-washed precursor polymer to a salt exchange with an organic cation.

Step of Synthesizing Precursor Polymer:

In one example of this step, the monomer that yields the structural unit (a5) is dissolved, together with the monomers that yield the structural unit (a6) and the other structural unit(s), in a polymerization solvent, a radical polymerization initiator is added to the resulting solution, and a polymerization (such as a conventional radical polymerization) is then performed to produce the precursor polymer.

During the above polymerization, a chain transfer agent such as $HS-CH_2-CH_2-CH_2-C(CF_3)_2-OH$ may also be used to introduce a $-C(CF_3)_2-OH$ group at the terminals of the precursor polymer. This type of copolymer having an introduced hydroxyalkyl group in which part of the hydrogen atoms of the alkyl group have been substituted with fluorine atoms is effective in reducing developing defects and line edge roughness (LER: unevenness in the side walls of a line pattern).

As the monomers that yield each of the structural units that constitute the component (A1), commercially available monomers may be used, or monomers that have been synthesized using conventional methods may be used.

Examples of the polymerization initiator include azobisisobutyronitrile (AIBN) and dimethyl azobisisobutyrate.

The polymerization solvent may be any solvent capable of dissolving the raw material monomers, and specific examples include ethyl lactate, γ-butyrolactone, methyl ethyl ketone, propylene glycol monomethyl ether acetate, tetrahydrofuran, and mixed solvents of these solvents.

The amounts used of the monomer that yields the structural unit (a5) and the monomers that yield the other structural units may be selected appropriately so as to achieve the desired copolymer composition ratio (the ratio between the structural units that constitute the polymeric compound).

The reaction temperature is preferably within a range from 50 to 100° C., and more preferably from 65 to 85° C.

The reaction time differs depending on the reactivity of the monomers and the reaction temperature and the like, but typically, is preferably within a range from 60 to 480 minutes, and more preferably from 240 to 420 minutes.

Following polymerization of the monomers, the polymerization reaction solution is added dropwise to a large volume of water or an organic solvent (such as isopropanol, heptane or methanol), thereby precipitating the polymer, which can then be collected by filtration or the like to obtain the precursor polymer.

The cation of the monomer that yields the structural unit (a5) may be any cation capable of undergoing salt exchange with an organic cation, and examples include ammonium ions, H$^+$, metal cations, phosphonium ions, and other inorganic cations.

Examples of the ammonium ion include an ammonium ion (NH$_4^+$), quaternary ammonium ions, and primary to tertiary ammonium ions.

Examples of the quaternary ammonium ion include cations represented by general formula (a5-ca1) shown below.

[Chemical Formula 97]

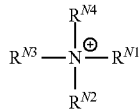

(a5-ca1)

In the above formula, each of $R^{N1}$ to $R^{N4}$ independently represents an alkyl group of 1 to 20 carbon atoms or an aryl group, which may be substituted with an aryl group, carboxyl group, hydroxyl group, alkoxy group of 1 to 5 carbon atoms, or alkylcarbonyloxy group of 1 to 5 carbon atoms.

The alkyl group of 1 to 20 carbon atoms for $R^{N1}$ to $R^{N4}$ in the formula (a5-ca1) may be a chain-like group or a cyclic group, but is preferably a linear alkyl group.

The aryl group for $R^{N1}$ to $R^{N4}$ preferably contains 6 to 18 carbon atoms and more preferably 6 to 10 carbon atoms, and a phenyl group is particularly desirable.

When the alkyl group or aryl group for $R^{N1}$ to $R^{N4}$ has an aryl group as a substituent, the aryl group substituent preferably contains 6 to 18 carbon atoms and more preferably 6 to 10 carbon atoms, and is preferably a phenyl group.

When the alkyl group or aryl group for $R^{N1}$ to $R^{N4}$ has an alkoxy group of 1 to 5 carbon atoms as a substituent, the alkoxy group is preferably a methoxy group, ethoxy group, n-propoxy group, iso-propoxy group, n-butoxy group or tert-butoxy group.

When the alkyl group or aryl group for $R^{N1}$ to $R^{N4}$ has an alkylcarbonyloxy group of 1 to 5 carbon atoms as a substituent, examples of the alkylcarbonyloxy group include a methylcarbonyloxy group, ethylcarbonyloxy group and butylcarbonyloxy group.

Further, the quaternary ammonium ion may be a cation that contains two or more (and preferably two) nitrogen atoms (N$^+$).

Specific examples of the quaternary ammonium ion include a tetramethylammonium ion, tetraethylammonium ion (Et$_4$N$^+$), trimethylethylammonium ion (Me$_3$EtN$^+$), tetra-n-propylammonium ion (n-Pr$_4$N$^+$), tetra-i-propylammonium ion (i-Pr$_4$N$^+$), tetra-n-butylammonium ion (n-Bu$_4$N$^+$), and quaternary ammonium ions represented by the chemical formulas shown below.

[Chemcial Formula 98]

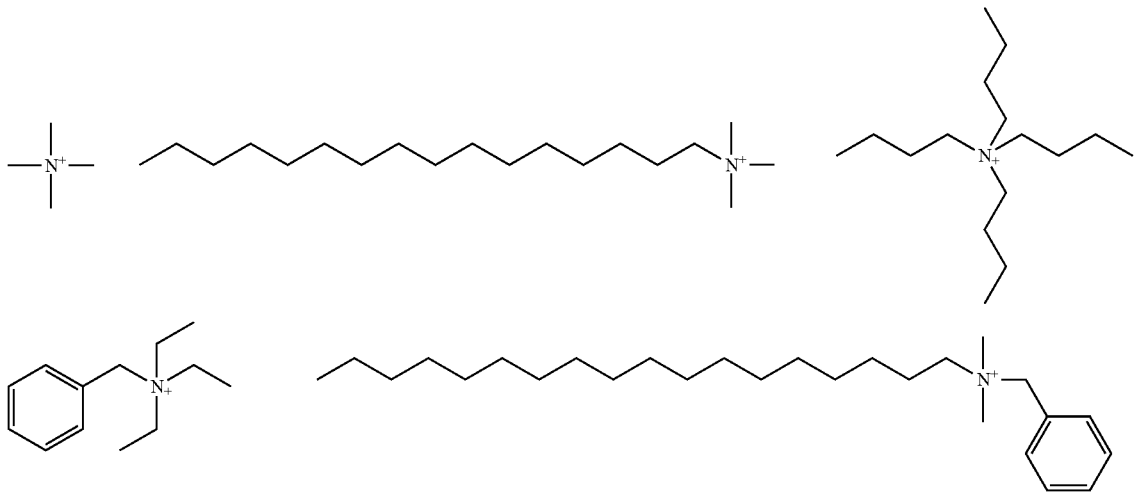

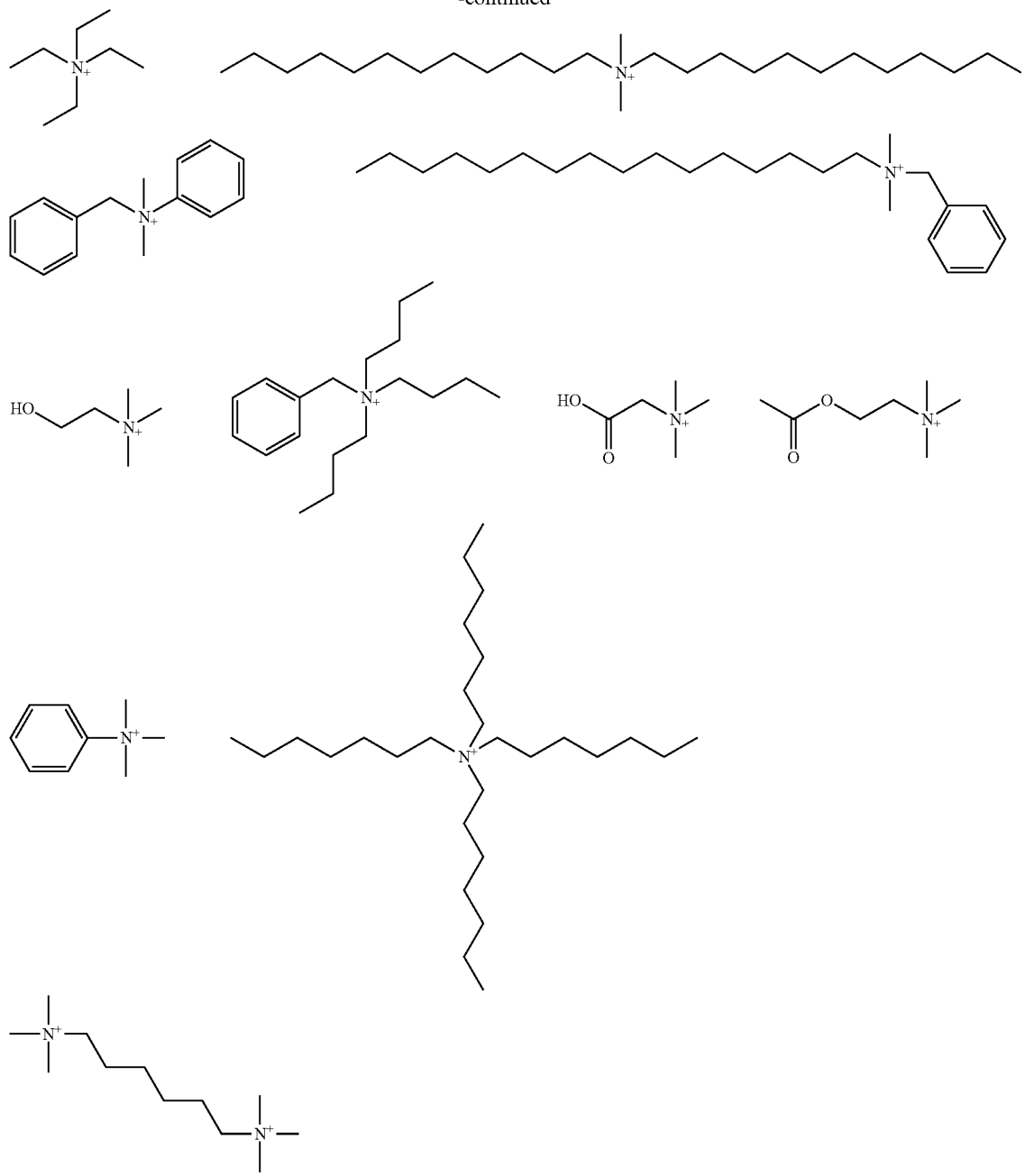

Specific examples of the primary to tertiary ammonium ions include a methylammonium ion, dimethylammonium ion, trimethylammonium ion, ethylammonium ion, diethylammonium ion, triethylammonium ion, n-propylammonium ion, di-n-propylammonium ion, tri-n-propylammonium ion, i-propylammonium ion, di-i-propylammonium ion, tri-i-propylammonium ion, n-butylammonium ion, di-n-butylammonium ion, tri-n-butylammonium ion, sec-butylammonium ion, di-sec-butylammonium ion, tri-sec-butylammonium ion, tert-butylammonium ion, di-tert-butylammonium ion, tri-tert-butylammonium ion, diisopropylethylammonium ion, phenylammonium ion, diphenylammonium ion, and triphenylammonium ion ($Ph_3NH^+$).

Further examples of ammonium ions include ions represented by the chemical formulas shown below.

[Chemical Formula 99]

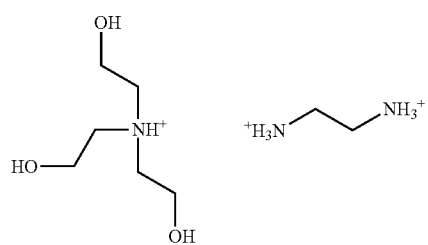

-continued

[chemical structures of various amines and ammonium cations]

Examples of the metal cation include alkali metal ions such as a sodium ion, potassium ion and lithium ion, alkaline earth metal ions such as a magnesium ion and calcium ion, as well as an iron ion and aluminum ion.

Among the above possibilities, the cation is preferably an ion of high polarity. Among such ions, in terms of enhancing the water solubility of the monomer and improving the removal efficiency of the unreacted monomer, an ammonium ion is preferable, a tertiary ammonium ion or quaternary ammonium ion is more preferable, and a quaternary ammonium ion is still more preferable. Among quaternary ammonium ions, a quaternary ammonium ion represented by the above formula (a5-ca1) is preferable, and a tetramethylammonium ion is particularly desirable.

Step of Washing the Precursor Polymer with Water:

By performing water washing in this step, the amount of the monomer that yields the structural unit (a5) can be controlled to an amount within the resist composition of not more than 100 ppm (by weight) relative to the component (A1). Further, when the component (A) also contains the structural unit (a6), performing the water washing in this step controls the amount of the monomer that yields the structural unit (a5) to an amount that is not more than 100 ppm (by weight) relative to the polymer having the structural unit (a5) within the resist composition.

Examples of the method used for washing the precursor polymer with water include methods (a) to (c) described below.

Method (a): a method in which a solution prepared by dissolving the obtained precursor polymer in an organic solvent (such as dichloromethane or chloroform) and water are subjected to a liquid-liquid extraction.

Method (b): a method in which the obtained precursor polymer is dispersed in water.

Method (c): a method in which a solution prepared by dissolving the obtained precursor polymer in an organic solvent (such as dichloromethane or chloroform) is added dropwise to water.

Among the above methods (a) to (c), method (a) is preferred, as it yields superior removal efficiency of unreacted monomers from the polymerization reaction.

Following washing of the precursor polymer with water, and where required subsequent filtration or the like, the washed precursor polymer is preferably subjected to a method (d) described below.

Method (d): a method in which the obtained precursor polymer is washed with an organic solvent. Examples of the organic solvent used include methanol, isopropanol, methyl ethyl ketone, heptane and diisopropyl ether, and these solvents may be used individually or in mixtures.

Further, the method (d) may also be used instead of the above methods (a) to (c), or used prior to performing the methods (a) to (c).

The number of repetitions of the water and organic solvent washing, and the washing time may be set as appropriate so that the amount of the monomer that yields the structural unit (a5) is not more than 100 ppm (by weight) relative to the component (A1) within the resist composition. Further, when the component (A) also contains the structural unit (a6), the number of repetitions of the water and organic solvent washing, and the washing time may be set as appropriate so that the amount of the monomer that yields the structural unit (a5) is not more than 100 ppm (by weight) relative to the polymer having the structural unit (a5) within the resist composition.

Step of Subjecting the Water-Washed Precursor Polymer to a Salt Exchange with an Organic Cation:

This salt exchange can be performed by dissolving the precursor polymer and a compound having an organic cation (a salt exchange compound) in a solvent such as water, dichloromethane, acetonitrile, methanol, chloroform or methylene chloride, and then stirring the solution.

The reaction temperature is preferably within a range from approximately 20 to 40° C., and more preferably from approximately 23 to 30° C. The reaction time varies depending on the reactivity between the precursor polymer and the salt exchange compound, and the reaction temperature and the like, but is typically not less than 10 minutes and not more than 24 hours, and is more preferably within a range from 0.5 to 6 hours.

The amount used of the salt exchange compound in the salt exchange reaction is typically within a range from approximately 1 to 3 mols per 1 mol of the precursor polymer.

The salt exchange compound is preferably a compound in which the cation is an organic cation ($M^{m+}$) and the anion is a non-nucleophilic ion.

Examples of the non-nucleophilic ion include halide ions such as a bromide ion and chloride ion, ions that can become acids of lower acidity than the precursor polymer, and $BF_4^-$, $AsF_6^-$, $SbF_6^-$, $PF_6^-$ and $ClO_4^-$. Specific examples of the ions that can become acids of lower acidity than the precursor polymer include sulfonate ions such as a p-toluenesulfonate ion, methanesulfonate ion and benzenesulfonate ion.

Following completion of the salt exchange reaction between the precursor polymer and the salt exchange compound, the polymer (A1) (the final target product) within the reaction solution may be isolated and purified.

The isolation and purification may be performed using conventional methods, and for example, one or more techniques such as concentration, solvent extraction, distillation, crystallization, recrystallization and chromatography may be used.

By using the method of producing the component (A1) described above, the component (A1) can be produced in such a manner that the amount of the monomer that yields the structural unit (a5) (including the compound in which the cation of the monomer has undergone salt exchange with the aforementioned organic cation ($M^{m+}$), and the compound having the quaternary ammonium ion) is not more than 100 ppm (by weight) relative to the polymer (A1). Further, when the component (A) also contains the structural unit (a6), the number of repetitions of the water and organic solvent washing, and the washing time are set as appropriate so that the amount of the monomer that yields the structural unit (a5) is not more than 100 ppm (by weight) relative to the polymer having the structural unit (a5) within the resist composition.

The above method (1) involves washing the precursor polymer with water, and is therefore not only simple, but enables unreacted components such as residual monomers to be removed with good efficiency. Moreover, because salt exchange is performed with the desired organic cation following preparation of the precursor polymer, there is considerable degree of freedom in terms of the cations that can be introduced.

<Other Optional Components>
[Acid Generator Component (B)]

The resist composition of the present aspect may also include, as an optional component, an acid generator component (B) (hereafter referred to as "component (B)") which generates acid upon exposure, but does not correspond with the above definition of the component (A), provided inclusion of the component (B) does not impair the effects of the present invention.

There are no particular limitations on the component (B), and any of the conventional materials that have already been proposed as acid generators for use in chemically amplified resists can be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

Examples of onium salt acid generators that may be used include compounds represented by general formula (b-1) or (b-2) shown below.

[Chemical Formula 100]

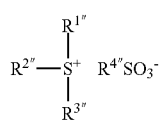

(b-1)

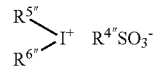

(b-2)

In the formulas, each of $R^{1\prime\prime}$ to $R^{3\prime\prime}$ independently represents an aryl group, alkyl group or alkenyl group which may have a substituent, and two of $R^{1\prime\prime}$ to $R^{3\prime\prime}$ may be bonded to each other to form a ring in combination with the sulfur atom in the formula. Each of $R^{5\prime\prime}$ and $R^{6\prime\prime}$ independently represents an aryl group, alkyl group or alkenyl group which may have a substituent, and $R^{4\prime\prime}$ represents an alkyl group, halogenated alkyl group, aryl group or alkenyl group which may have a substituent.

In formula (b-1), each of $R^{1\prime\prime}$ to $R^{3\prime\prime}$ independently represents an aryl group which may have a substituent, an alkyl group which may have a substituent, or an alkenyl group which may have a substituent. Further, two of $R^{1\prime\prime}$ to $R^{3\prime\prime}$ may be bonded to each other to form a ring in combination with the sulfur atom in the formula.

$R^{1\prime\prime}$ to $R^{3\prime\prime}$ are the same as defined above for the aryl group which may have a substituent, the alkyl group which may have a substituent, and the alkenyl group which may have a substituent for $R^{11\prime\prime}$ to $R^{13\prime\prime}$ in formula (m1-1).

Examples of preferred forms of the cation in the compound represented by formula (b-1) include the cations shown below.

[Chemical Formula 101]

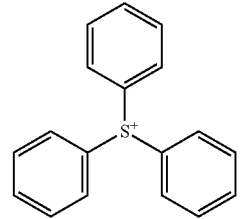

(b-1-1)

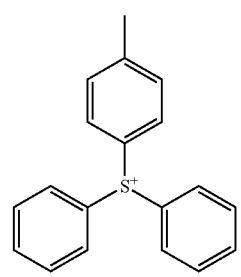

(b-1-2)

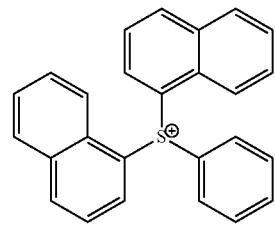

(b-1-3)

(b-1-4)
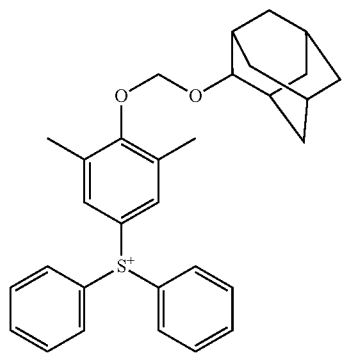
(b-1-5)
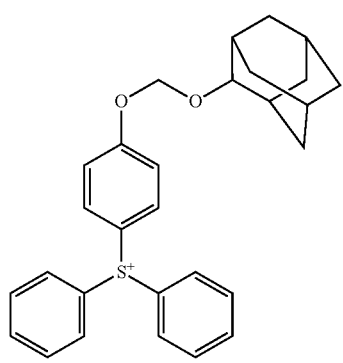
(b-1-6)
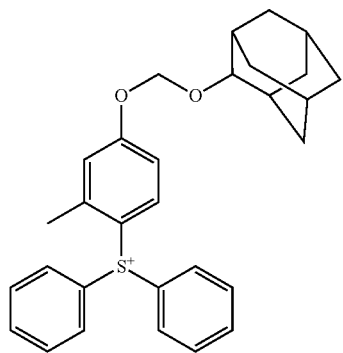
(b-1-7)
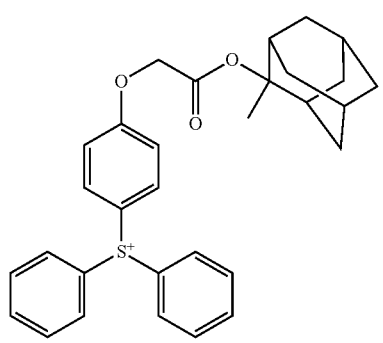
(b-1-8)
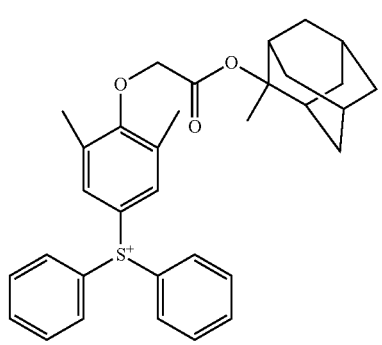
(b-1-9)
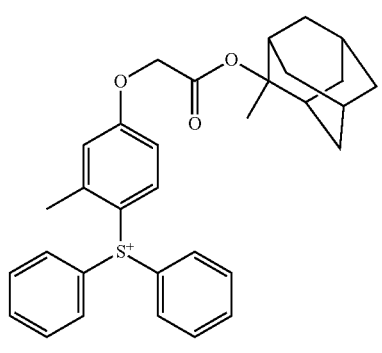
[Chemical Formula 102]
(b-1-10)
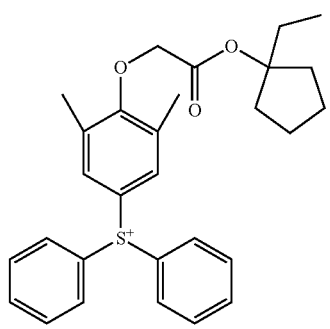
(b-1-11)
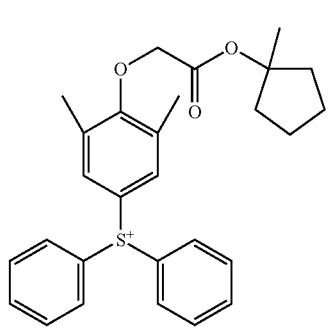

-continued
(b-1-12)
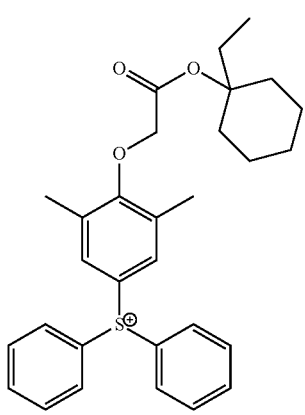
(b-1-16)
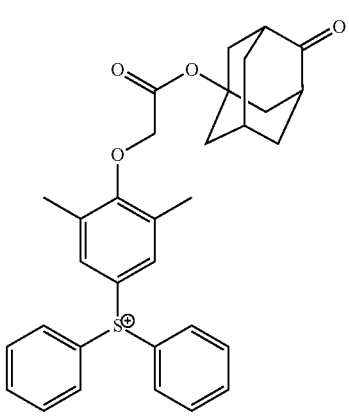
[Chemical Formula 103]
(b-1-13)
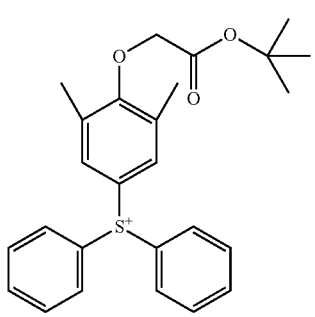
(b-1-17)
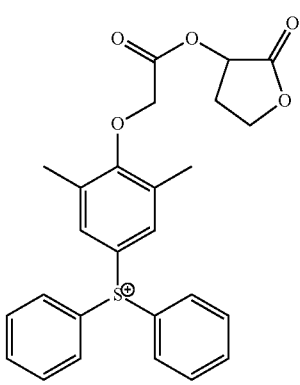
(b-1-14)
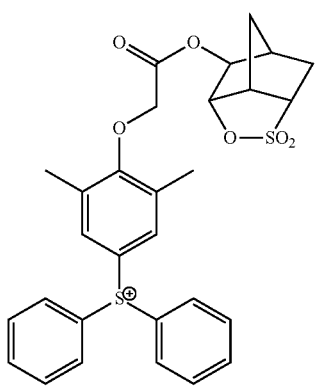
(b-1-18)
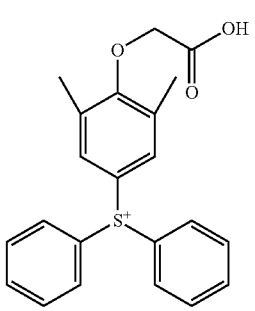
(b-1-15)
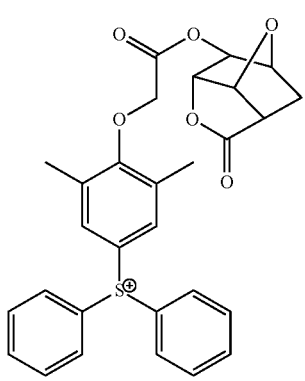
(b-1-19)
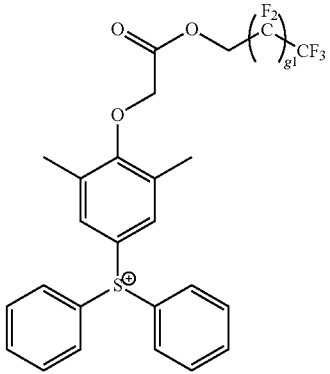

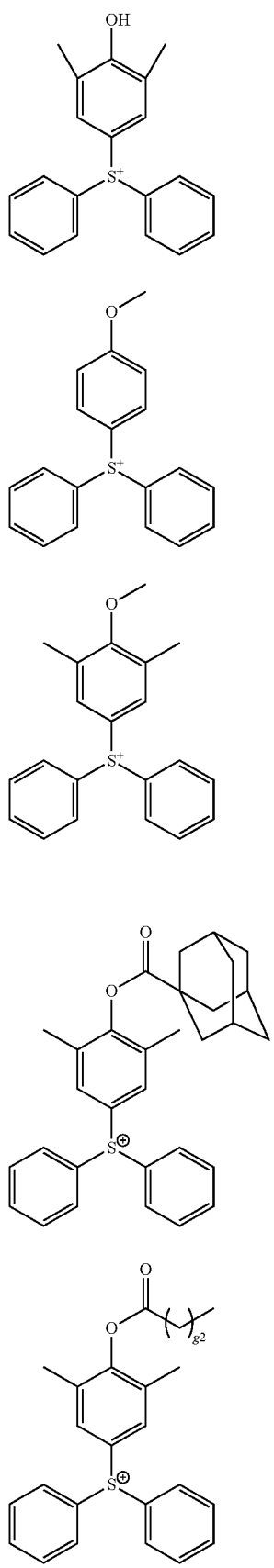
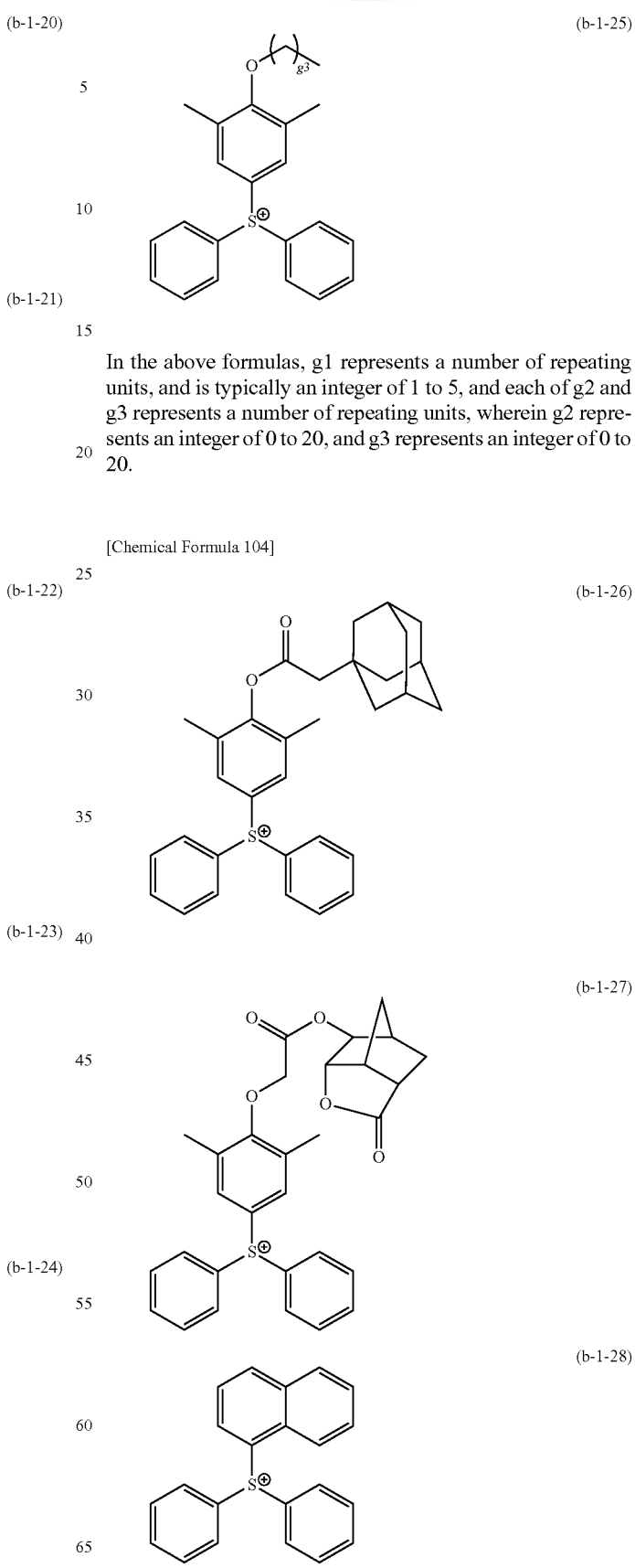
In the above formulas, g1 represents a number of repeating units, and is typically an integer of 1 to 5, and each of g2 and g3 represents a number of repeating units, wherein g2 represents an integer of 0 to 20, and g3 represents an integer of 0 to 20.
[Chemical Formula 104]

-continued (b-1-29)
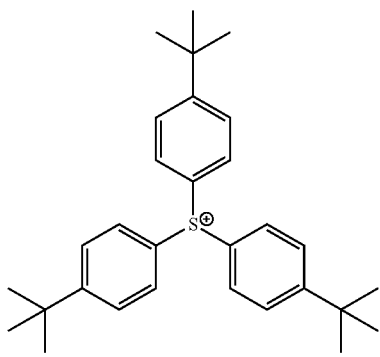

(b-1-30)
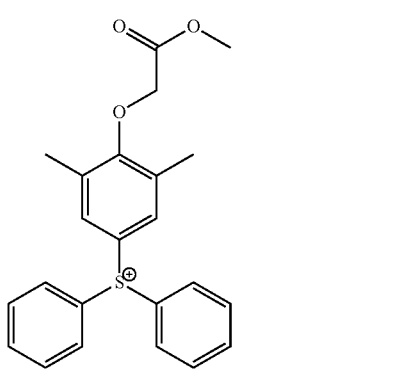

(b-1-31)
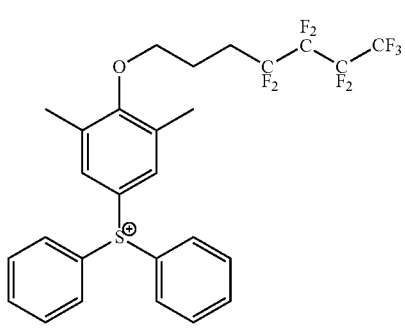

(b-1-32)
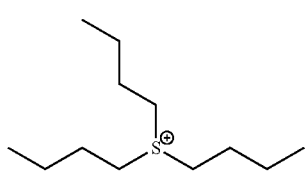

(b-1-33)
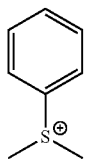

In formula (b-2), each of $R^{5'''}$ and $R^{6'''}$ independently represents an aryl group which may have a substituent, an alkyl group which may have a substituent, or an alkenyl group which may have a substituent.

$R^{5'''}$ and $R^{6'''}$ are the same as defined above for the aryl group which may have a substituent, the alkyl group which may have a substituent, and the alkenyl group which may have a substituent for $R^{15'''}$ and $R^{16'''}$ in formula (m2-1).

Examples of preferred forms of the cation in the compound represented by formula (b-2) include a diphenyliodonium ion and a bis(4-tert-butylphenyl)iodonium ion.

In formulas (b-1) and (b-2), $R^{4'''}SO_3^-$ is the same as $R^{4'''}SO_3^-$ mentioned within the description of $V^-$ in general formula (a5-0-1) described above in connection with the structural unit (a5).

Further, onium salt acid generators in which the anion in the above general formula (b-1) or (b-2) has been replaced with an anion represented by the above general formula (b-3) or (b-4) (but in which the cation is the same as the cation shown in formula (b-1) or (b-2)) can also be used as the onium salt acid generator.

Furthermore, sulfonium salts having a cation represented by general formula (b-5) or (b-6) shown below as the cation may also be used as the onium salt acid generator.

[Chemical Formula 105]

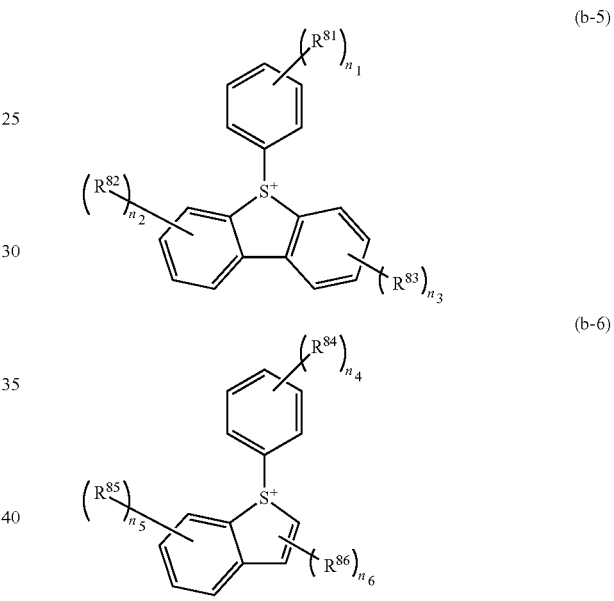

In the formulas, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably a group in which one or more of the hydrogen atoms within an aforementioned alkyl group have each been substituted with a hydroxyl group, and specific examples include a hydroxymethyl group, hydroxyethyl group and hydroxypropyl group.

When the subscripts $n_1$ to $n_6$ appended to $R^{81}$ to $R^{86}$ represent an integer of 2 or more, the corresponding plurality of $R^{81}$ to $R^{86}$ groups may be the same or different.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferable examples of the cation represented by the above formula (b-5) or (b-6) are shown below.

[Chemical Formula 106]

(b-5-1)

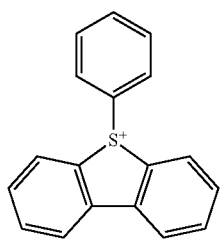

(b-5-2)

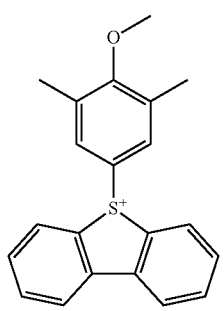

(b-5-3)

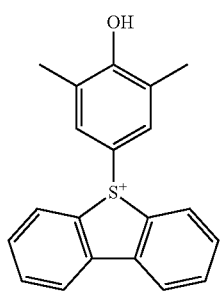

(b-5-4)

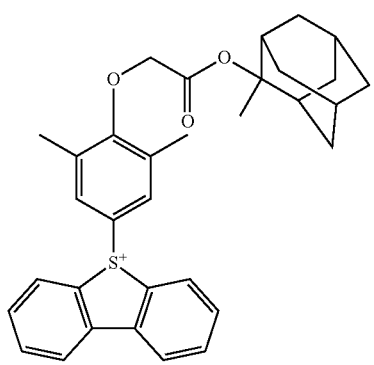

(b-5-5)

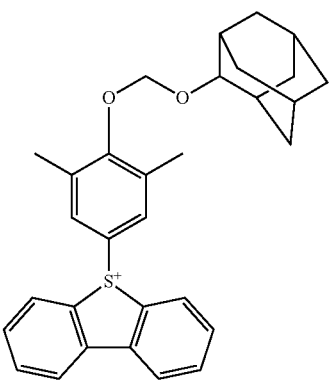

(b-5-6)

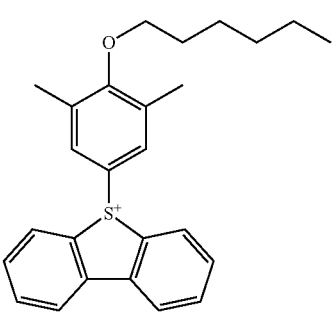

(b-6-1)

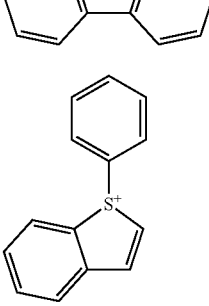

(b-6-2)

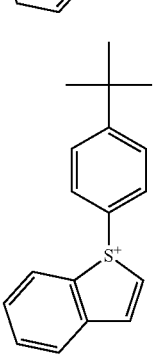

Moreover, sulfonium salts having a cation represented by one of the above formulas (m1-2), (m1-3) or (m1-4) within the cation portion can also be used.

The are no particular limitations on the anion of these sulfonium salts having a cation represented by one of the above formulas (b-5), (b-6), (m1-2) or (m1-3) within the cation portion, and the same anions as those used in conventional onium salt acid generators can be used. Examples of these anions include fluorinated alkylsulfonate ions such as the anion ($R^{4"}SO_3^-$) of the onium salt acid generators represented by the above formulas (b-1) and (b-2), anions represented by the above general formulas (b-3) and (b-4), and anions represented by any of the above formulas (b1) to (b9).

However, in the present invention, the cation of the onium salt acid generator preferably has only one aromatic ring or has no aromatic rings, in a similar manner to that described for $M^{m+}$ within the above general formula (a5-0-2). Examples of cations having only one aromatic ring or having no aromatic rings include the same cations as those described above for $M^{m+}$ in general formula (a5-0-2).

In the present description, an oxime sulfonate acid generator is a compound having at least one group represented by general formula (B-1) shown below, and has a feature of generating acid upon irradiation. Such oxime sulfonate acid generators are widely used for chemically amplified resist compositions, and can be selected as appropriate.

[Chemical Formula 107]

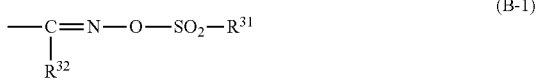

(B-1)

In formula (B-1), each of $R^{31}$ and $R^{32}$ independently represents an organic group.

The organic group for $R^{31}$ and $R^{32}$ refers to a group containing a carbon atom, and may also include atoms other than carbon atoms (such as a hydrogen atom, oxygen atom, nitrogen atom, sulfur atom and halogen atom (such as a fluorine atom and a chlorine atom) and the like).

The organic group for $R^{31}$ is preferably a linear, branched or cyclic alkyl group, or an aryl group. The alkyl group or the aryl group may have a substituent. The substituent is not particularly limited, and examples include a fluorine atom and a linear, branched, or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The term "partially halogenated alkyl group" refers to an alkyl group in which part of the hydrogen atoms are substituted with halogen atoms, and the term "completely halogenated alkyl group" refers to an alkyl group in which all of the hydrogen atoms are substituted with halogen atoms. Examples of the halogen atom include a fluorine atom, chlorine atom, bromine atom and iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The term "partially halogenated aryl group" refers to an aryl group in which part of the hydrogen atoms are substituted with halogen atoms, and the term "completely halogenated aryl group" refers to an aryl group in which all of hydrogen atoms are substituted with halogen atoms.

$R^{31}$ is preferably an alkyl group of 1 to 4 carbon atoms which has no substituent or a fluorinated alkyl group of 1 to 4 carbon atoms.

The organic group for $R^{32}$ is preferably a linear, branched or cyclic alkyl group, an aryl group, or a cyano group.

Examples of the alkyl group and the aryl group for $R^{32}$ include the same alkyl groups and aryl groups as those described above for $R^{31}$.

$R^{32}$ is preferably a cyano group, an alkyl group of 1 to 8 carbon atoms having no substituent or a fluorinated alkyl group of 1 to 8 carbon atoms.

Preferred examples of the oxime sulfonate acid generator include compounds represented by general formula (B-2) or (B-3) shown below.

[Chemical Formula 108]

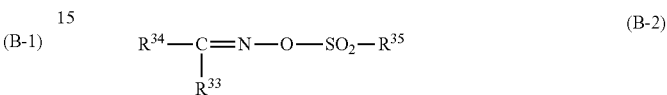

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group and phenanthryl group, and heteroaryl groups in which part of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group for the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

[Chemical Formula 109]

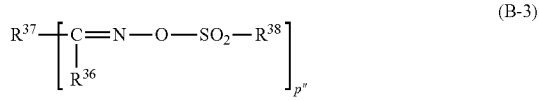

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-3), examples of the alkyl group having no substituent or the halogenated alkyl group for $R^{36}$ include the same groups as those described above for the alkyl group having no substituent or the halogenated alkyl group for $R^{33}$.

Examples of the divalent or trivalent aromatic hydrocarbon group for $R^{37}$ include groups in which one or two hydrogen atoms have been removed from the aryl group described above for $R^{34}$.

Examples of the alkyl group having no substituent and the halogenated alkyl group for $R^{38}$ include the same groups as those described above for the alkyl group having no substituent or the halogenated alkyl group for $R^{35}$.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexyl sulfonyl oxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described on pages 65 to 86) may also be used favorably.

Furthermore, the following compounds may also be used as preferred examples.

[Chemical Formula 110]

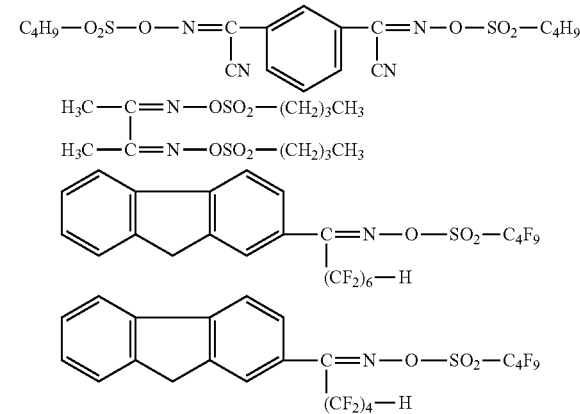

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or a combination of two or more types of the acid generators may be used.

In those cases where the resist composition of the present aspect includes the component (B), the amount of the component (B) is preferably within a range from 0 to 60 parts by weight, more preferably from 0 to 40 parts by weight, and still more preferably from 0 to 10 parts by weight, relative to 100 parts by weight of the component (A). When the amount of the component (B) is not more than 40 parts by weight, a uniform solution can be obtained when each of the components of the resist composition is dissolved in an organic solvent, and the storage stability of the composition tends to improve.

In particular, by ensuring that the amount of the component (B) is not more than 10 parts by weight, a good balance can be achieved between suppressing any deterioration in the lithography properties caused by OoB light, and improving the sensitivity.

[Component (D)]

The resist composition of the present aspect may also include a basic compound (D) (hereafter also referred to as "component (D)") as an optional component. In the present invention, the component (D) functions as an acid diffusion control agent, namely a quencher which traps the acid generated from the aforementioned component (A) and the component (B) and the like upon exposure. In the present invention, the expression "basic compound" describes a compound that is relatively basic compared with the component (A) or the component (B).

The component (D) in the present invention may be a basic compound (D1) (hereafter referred to as "component (D1)") composed of a cation and an anion, or a basic compound (D2) (hereafter referred to as "component (D2)") that does not correspond with the above definition of the component (D1).

Component (D1)

The component (DI) is preferably at least one compound selected from the group consisting of compounds (d1-1) represented by general formula (d1-1) shown below (hereafter referred to as "component (d1-1)"), compounds (d1-2) represented by general formula (d1-2) shown below (hereafter referred to as "component (d1-2)"), and compounds (d1-3) represented by general formula (d1-3) shown below (hereafter referred to as "component (d1-3)").

[Chemical Formula 111]

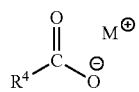  (d1-1)

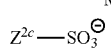  (d1-2)

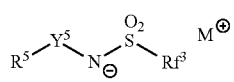  (d1-3)

In the formulas, $R^4$ represents a hydrocarbon group which may have a substituent, $Z^2$ represents a hydrocarbon group of 1 to 30 carbon atoms which may have a substituent (but in which the carbon atom adjacent to S is not substituted with a fluorine atom), $R^5$ represents an organic group, $Y^5$ represents a linear, branched or cyclic alkylene group or an arylene group, $Rf^3$ represents a hydrocarbon group containing a fluorine atom, and each $M^+$ independently represents a sulfonium or iodonium cation.

Component (d1-1):

Anion

In formula (d1-1), $R^4$ represents a hydrocarbon group which may have a substituent.

The hydrocarbon group which may have a substituent for $R^4$ may be an aliphatic hydrocarbon group or an aromatic hydrocarbon group, and examples include the same groups as those described above for $X^3$ in the formula: $X^3$-Q'-, which was mentioned as a possible substituent for $R^{4''}$ in general formula $R^{4''}SO_3^-$ within the above description relating to the structural unit (a5).

Of the various possibilities, the hydrocarbon group which may have a substituent for $R^4$ is preferably an aromatic hydrocarbon group which may have a substituent or an aliphatic cyclic group which may have a substituent, and is more preferably a phenyl group or naphthyl group which may have a substituent, or a group in which one or more hydrogen atoms have been removed from a polycycloalkane such as adamantane, norbornane, isobornane, tricyclodecane or tetracyclododecane.

Furthermore, as the hydrocarbon group which may have a substituent for $R^4$, linear or branched alkyl groups and fluorinated alkyl groups are also desirable.

The linear or branched alkyl group for $R^4$ preferably contains 1 to 10 carbon atoms, and specific examples include linear alkyl groups such as a methyl group, ethyl group, propyl group, butyl group, pentyl group, hexyl group, heptyl group, octyl group, nonyl group and decyl group, and branched alkyl groups such as a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The fluorinated alkyl group for $R^4$ may be a chain-like group or a cyclic group, but is preferably a linear or branched group.

The fluorinated alkyl group preferably contains 1 to 11 carbon atoms, more preferably 1 to 8 carbon atoms, and still more preferably 1 to 4 carbon atoms. Specific examples include groups in which part or all of the hydrogen atoms of a linear alkyl group such as a methyl group, ethyl group, propyl group, butyl group, pentyl group, hexyl group, heptyl group, octyl group, nonyl group or decyl group have each been substituted with a fluorine atom, and groups in which part or all of the hydrogen atoms of a branched alkyl group such as a 1-methylethyl group, 1-methylpropyl group, 2-methylpropyl group, 1-methylbutyl group, 2-methylbutyl group or 3-methylbutyl group have each been substituted with a fluorine atom.

Further, the fluorinated alkyl group for $R^4$ may also include other atoms besides the fluorine atom(s). Examples of these other atoms besides the fluorine atom(s) include an oxygen atom, carbon atom, hydrogen atom, sulfur atom and nitrogen atom.

Among the various possibilities, the fluorinated alkyl group for $R^4$ is preferably a group in which part or all of the hydrogen atoms of a linear alkyl group have each been substituted with a fluorine atom, and is more preferably a group in which all of the hydrogen atoms of a linear alkyl group have been substituted with fluorine atoms (namely, a perfluoroalkyl group).

Specific examples of preferred anions for the component (d1-1) are shown below.

[Chemical Formula 112]

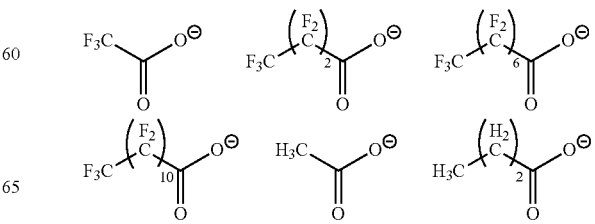

-continued

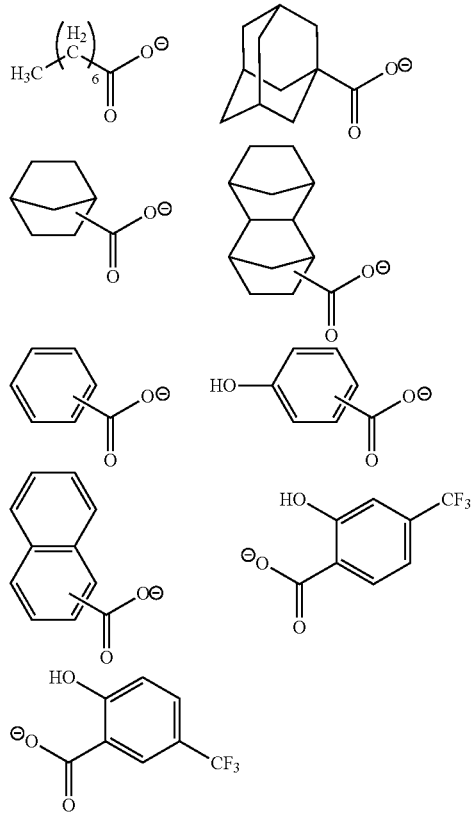

Cation

In formula (d1-1), M⁺ represents an organic cation.

There are no particular limitations on the organic cation for M⁺, and examples include the same cations as those mentioned above for the compound represented by formula (b-1) or (b-2).

A single type of the component (d1-1) may be used alone, or a combination of two or more types may be used.

Component (d1-2)

Anion

In formula (d1-2), $Z^{2c}$ represents a hydrocarbon group of 1 to 30 carbon atoms which may have a substituent.

The hydrocarbon group of 1 to 30 carbon atoms which may have a substituent for $Z^{2c}$ may be an aliphatic hydrocarbon group or an aromatic hydrocarbon group, and examples include the same groups as those mentioned above for $R^4$ in formula (d1-1).

Of the various possibilities, the hydrocarbon group which may have a substituent for $Z^{2c}$ is preferably an aliphatic cyclic group which may have a substituent, and is more preferably a group (which may have a substituent) in which one or more hydrogen atoms have been removed from adamantane, norbornane, isobornane, tricyclodecane, tetracyclododecane or camphor or the like.

The hydrocarbon group for $Z^{2c}$ may have a substituent, and examples of the substituent include the same substituents as those mentioned above for $X^3$ in the formula: $X^3$-Q'-. However, in $Z^{2c}$, the carbon atom adjacent to the S atom in $SO_3^-$ must not be substituted with a fluorine atom. By ensuring that $SO_3^-$ is not adjacent to a fluorine atom, the anion of the component (d1-2) becomes an appropriate weakly acidic anion, and the quenching action of the component (D) improves.

Specific examples of preferred anions for the component (d1-2) are shown below.

[Chemical Formula 113]

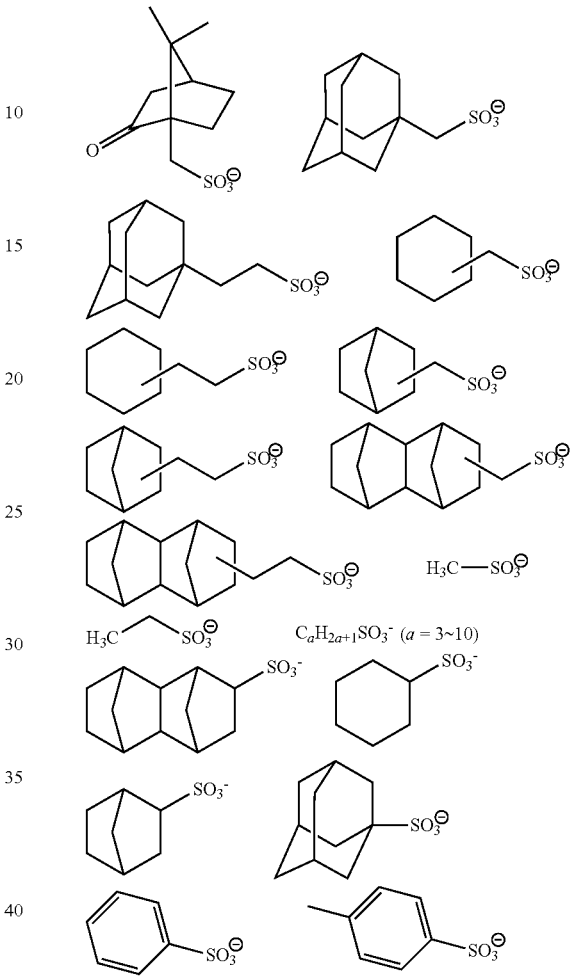

Cation

In formula (d1-2), M⁺ is the same as defined above for M⁺ in formula (d1-1)

A single type of the component (d1-2) may be used alone, or a combination of two or more types may be used.

Component (d1-3)

Anion

In formula (d1-3), $R^5$ represents an organic group.

There are no particular limitations on the organic group for $R^5$, and examples include an alkyl group, alkoxy group, —O—C(=O)—C($R^{C2}$)=CH₂ (wherein $R^{C2}$ represents a hydrogen atom, an alkyl group of 1 to 5 carbon atoms or a halogenated alkyl group of 1 to 5 carbon atoms) and —O—C(=O)—$R^{C3}$ (wherein $R^{C3}$ represents a hydrocarbon group).

The alkyl group for $R^5$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. A portion of the hydrogen atoms within the alkyl group for $R^2$ may each be substituted with a hydroxyl group or a cyano group or the like.

The alkoxy group for $R^5$ is preferably an alkoxy group of 1 to 5 carbon atoms, and specific examples of such alkoxy groups of 1 to 5 carbon atoms include a methoxy group, ethoxy group, n-propoxy group, iso-propoxy group, n-butoxy group and tert-butoxy group. Among these, a methoxy group or an ethoxy group is the most desirable.

When $R^5$ is —O—C(=O)—C($R^{C2}$)=CH$_2$, $R^{C2}$ represents a hydrogen atom, an alkyl group of 1 to 5 carbon atoms or a halogenated alkyl group of 1 to 5 carbon atoms.

The alkyl group of 1 to 5 carbon atoms for $R^{C2}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for $R^{C2}$ is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

$R^{C2}$ is preferably a hydrogen atom, an alkyl group of 1 to 3 carbon atoms or a fluorinated alkyl group of 1 to 3 carbon atoms, and in terms of industrial availability, a hydrogen atom or a methyl group is the most desirable.

When $R^5$ is —O—C(=O)—$R^{C3}$, $R^{C3}$ represents a hydrocarbon group.

The hydrocarbon group for $R^{C3}$ may be either an aromatic hydrocarbon group or an aliphatic hydrocarbon group. Specific examples of the hydrocarbon group for $R^{C3}$ include the same hydrocarbon groups as those described above for $R^4$ in formula (d1-1).

Among these, as the hydrocarbon group for $R^{C3}$, an alicyclic group in which one or more hydrogen atoms have been removed from a cycloalkane such as cyclopentane, cyclohexane, adamantane, norbornane, isobornane, tricyclodecane or tetracyclododecane, or an aromatic group such as a phenyl group or a naphthyl group is preferable. When $R^{C3}$ is an alicyclic group, the resist composition can be satisfactorily dissolved in an organic solvent, thereby improving the lithography properties. Alternatively, when $R^{C3}$ is an aromatic group, the resist composition exhibits excellent photoabsorption efficiency in a lithography process using EUV or the like as the exposure source, resulting in improvements in the sensitivity and the lithography properties.

Among the above possibilities, $R^5$ is preferably a group represented by —O—C(=O)—C($R^{C2'}$)=CH$_2$ (wherein $R^{C2'}$ represents a hydrogen atom or a methyl group) or —O—C(=O)—$R^{C3'}$ (wherein $R^{C3'}$ represents an aliphatic cyclic group).

In formula (d1-3), $Y^5$ represents a linear, branched or cyclic alkylene group or an arylene group.

Examples of the linear, branched or cyclic alkylene group or the arylene group for $Y^5$ include the same groups as the "linear or branched aliphatic hydrocarbon group", "cyclic aliphatic hydrocarbon group" and "aromatic hydrocarbon group" mentioned above within the description of the divalent linking group for $Y^2$ in the aforementioned formula (a1-0-2).

Among these groups, $Y^5$ is preferably an alkylene group, more preferably a linear or branched alkylene group, and most preferably a methylene group or an ethylene group.

In formula (d1-3), $Rf^3$ represents a hydrocarbon group containing a fluorine atom.

The hydrocarbon group containing a fluorine atom for $Rf^3$ is preferably a fluorinated alkyl group, and the same groups as those described above for the fluorinated alkyl group for $R^4$ are particularly desirable.

Specific examples of preferred anions for the component (d1-3) are shown below.

[Chemical Formula 114]

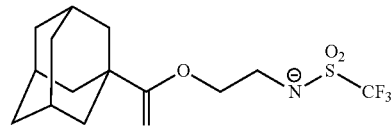

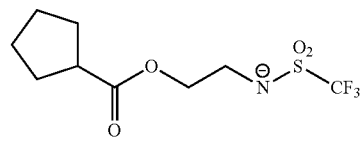

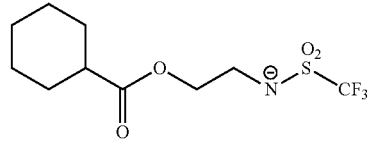

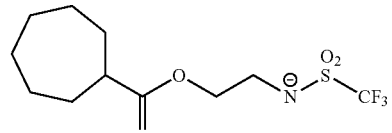

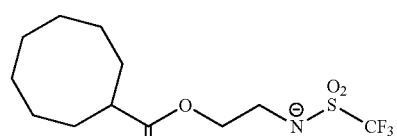

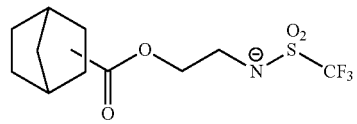

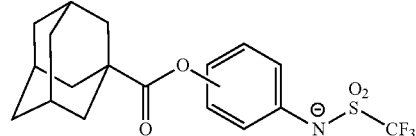

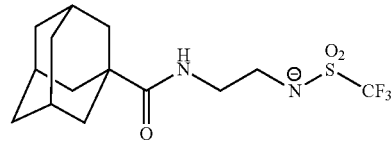

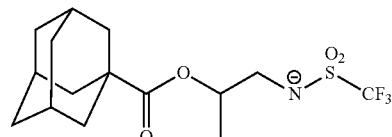

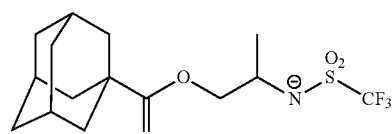

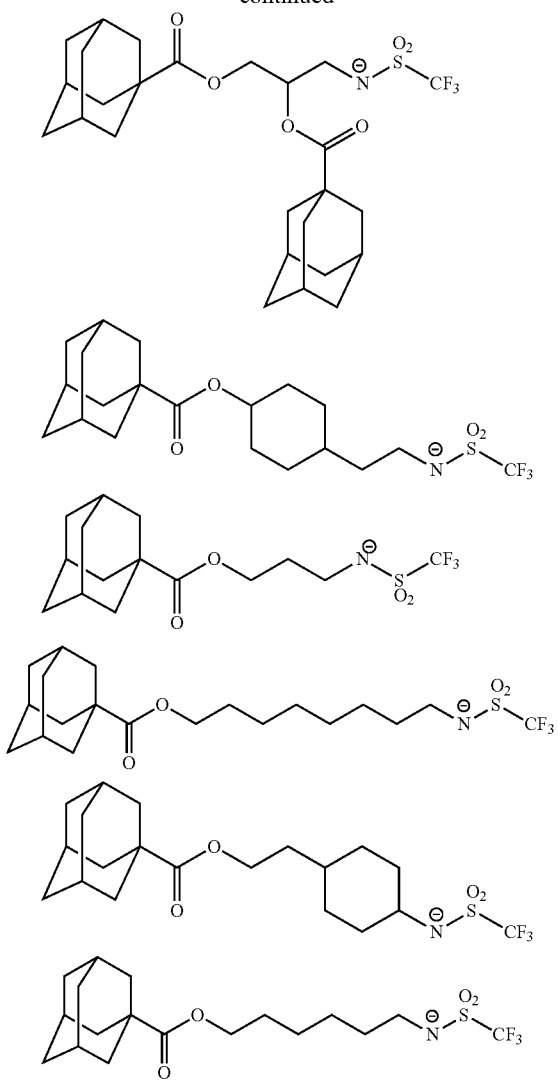

[Chemical Formula 115]

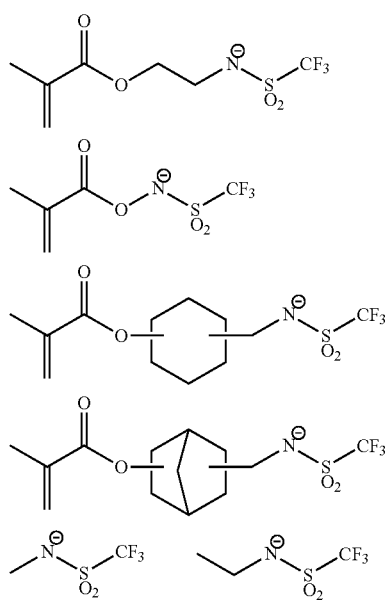

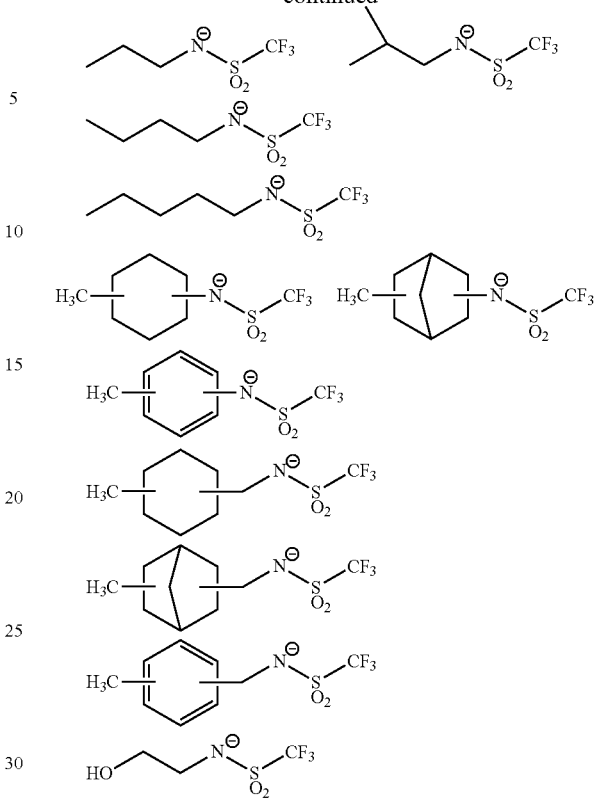

Cation

In formula (d1-3), $M^+$ is the same as defined above for $M^+$ in formula (d1-1).

A single type of the component (d1-3) may be used alone, or a combination of two or more types may be used.

The component (D1) may contain only one of the above components (d1-1) to (d1-3), or may contain a combination of two or more of the components. The component (D1) preferably includes the component (d1-2).

The amount of the component (D1), relative to 100 parts by weight of the component (A), is preferably within a range from 0.5 to 10.0 parts by weight, more preferably from 0.5 to 8.0 parts by weight, still more preferably from 1.0 to 8.0 parts by weight, and most preferably from 2.5 to 5.5 parts by weight. When this amount of the component (D1) is at least as large as the lower limit of the above range, excellent lithography properties and excellent resist pattern shape can be obtained. On the other hand, when the amount is not more than the upper limit of the above range, sensitivity can be maintained at a satisfactory level, and throughput can be improved.

(Methods of Producing Components (d1-1) to (d1-3))

There are no particular limitations on the methods used for producing the components (d1-1) and (d1-2), and conventional methods can be used.

Further, there are also no particular limitations on the production method for the component (d1-3). For example, in the case where $R^5$ in the formula (d1-3) is a group having an oxygen atom at the terminal bonded to $Y^5$, a compound (i-1) represented by general formula (i-1) shown below can be reacted with a compound (i-2) represented by general formula (i-2) shown below to obtain a compound (i-3) represented by general formula (i-3) shown below, and this compound (i-3) can then be reacted with a compound $Z^-M^+$ (i-4)

having the desired cation M⁺, thereby producing a compound (d1-3) represented by general formula (d1-3).

[Chemical Formula 116]

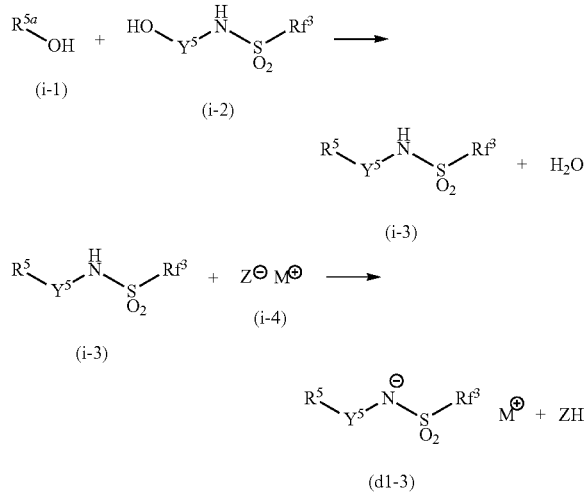

In the above formulas, $R^5$, $Y^5$, $Rf^3$ and $M^+$ are the same as defined above for $R^5$, $Y^5$, $Rf^3$ and $M^+$ respectively in general formula (d1-3), $R^{5a}$ represents a group in which the terminal oxygen atom has been removed from $R^5$, and $Z^-$ represents a counter anion.

First, the compound (i-1) is reacted with the compound (i-2) to obtain the compound (i-3).

In formula (i-1), $R^{5a}$ represents a group in which the terminal oxygen atom has been removed from $R^5$. In formula (i-2), $Y^5$ and $Rf^3$ are the same as defined above.

Commercially available compounds may be used as the compound (i-1) and the compound (i-2), or the compounds may be synthesized.

The method for reacting the compound (i-1) with the compound (i-2) to obtain the compound (i-3) is not particularly limited, and can be performed, for example, by reacting the compound (i-1) with the compound (i-2) in an organic solvent in the presence of an appropriate acid catalyst, and then washing the reaction mixture and recovering the reaction product.

There are no particular limitations on the acid catalyst used in the above reaction, and examples include toluenesulfonic acid and the like. The amount used of the acid catalyst is preferably from approximately 0.05 to 5 mol per 1 mol of the compound (i-2).

As the organic solvent used in the above reaction, any organic solvent which is capable of dissolving the raw materials, namely the compound (i-1) and the compound (i-2), can be used, and specific examples include toluene and the like. The amount of the organic solvent is preferably from 0.5 to 100 parts by weight, and more preferably from 0.5 to 20 parts by weight, relative to 1 part by weight of the compound (i-1). As the solvent, one type of solvent may be used alone, or a combination of two or more types of solvents may be used.

In general, the amount of the compound (i-2) used in the above reaction is preferably from approximately 0.5 to 5 mol, and more preferably from 0.8 to 4 mol, relative to 1 mol of the compound (i-1).

The reaction time for the above reaction varies depending on the reactivity between the compound (i-1) and the compound (i-2), and the reaction temperature and the like, but in most cases, is preferably from 1 to 80 hours, and more preferably from 3 to 60 hours.

The reaction temperature of the above reaction is preferably from 20° C. to 200° C., and more preferably from approximately 20° C. to 150° C.

Next, the obtained compound (i-3) is reacted with the compound (i-4), thereby obtaining the compound (d1-3).

In formula (i-4), M⁺ is the same as defined above, and $Z^-$ represents a counter anion.

The method used for reacting the compound (i-3) with the compound (i-4) to obtain the compound (d1-3) is not particularly limited, and can be performed, for example, by dissolving the compound (i-3) in an appropriate organic solvent and water in the presence of an appropriate alkali metal hydroxide, and then adding the compound (i-4) and stirring to effect a reaction.

There are no particular limitations on the alkali metal hydroxide used in the above reaction, and examples include sodium hydroxide and potassium hydroxide and the like. The amount used of the alkali metal hydroxide is preferably from approximately 0.3 to 3 mols, per 1 mol of the compound (i-3).

Examples of the organic solvent used in the above reaction include dichloromethane, chloroform, ethyl acetate and the like. The amount of the organic solvent is preferably from 0.5 to 100 parts by weight, and more preferably from 0.5 to 20 parts by weight, relative to the weight of the compound (i-3). As the solvent, one type of solvent may be used alone, or a combination of two or more types of solvents may be used.

In general, the amount of the compound (i-4) used in the above reaction is preferably from approximately 0.5 to 5 mol, and more preferably from approximately 0.8 to 4 mol, relative to 1 mol of the compound (i-3).

The reaction time for the above reaction varies depending on the reactivity between the compound (i-3) and the compound (i-4), and the reaction temperature and the like, but in most cases, is preferably from 1 to 80 hours, and more preferably from 3 to 60 hours.

The reaction temperature of the above reaction is preferably from 20° C. to 200° C., and more preferably from approximately 20° C. to 150° C.

Following completion of the reaction, the compound (d1-3) contained in the reaction mixture may be isolated and purified. Conventional methods may be used to isolate and purify the product, including concentration, solvent extraction, distillation, crystallization, recrystallization and chromatography, which may be used individually or in combinations of two or more different methods.

The structure of the compound (d1-3) obtained in the manner described above can be confirmed by general organic analysis methods such as ¹H-nuclear magnetic resonance (NMR) spectrometry, ¹³C-NMR spectrometry, ¹⁹F-NMR spectrometry, infrared absorption (IR) spectrometry, mass spectrometry (MS), elemental analysis and X-ray crystal diffraction methods.

Component (D2)

There are no particular limitations on the component (D2), and a conventional compound can be used, provided it is a compound which is relatively basic compared with the component (A) and the component (B) so as to function as an acid diffusion inhibitor, namely a quencher that traps the acid generated from the components (A) and (B) upon exposure, and provided it does not fall under the definition of the component (D1). Examples of these conventional compounds include amines such as aliphatic amines and aromatic amines, and of these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), cyclic amines, and other aliphatic amines.

The alkyl group for the above alkylamines may be linear, branched or cyclic.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Specific examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Examples of the alkyl group in the hydroxyalkyl group within the aforementioned alkyl alcohol amines include the same groups as those mentioned above for the alkyl group within the alkylamines.

Specific examples of the alkylamines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Among the above compounds, trialkylamines of 5 to 10 carbon atoms are preferred, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate.

Examples of the aromatic amines include aniline, pyridine, 4-dimethylaminopyridine, pyrrole, indole, pyrazole, imidazole, and derivatives of these compounds, as well as diphenylamine, triphenylamine, tribenzylamine, 2,6-diisopropylaniline and N-tert-butoxycarbonylpyrrolidine.

As the component (D2), one type of compound may be used alone, or a combination of two or more types of compounds may be used.

The component (D2) is typically used in an amount of 0.01 to 5.0 parts by weight, relative to 100 parts by weight of the component (A). By ensuring that the amount of the component (D2) is within the above range, the shape of the resist pattern and the post exposure stability of the latent image formed by the pattern-wise exposure of the resist layer are improved.

As the component (D), one type of compound may be used alone, or a combination of two or more types of compounds may be used.

In those cases where the resist composition of the present aspect includes the component (D), the amount of the component (D) (namely, the combined amount of the component (D1) and the component (D2)) is preferably from 0.1 to 15 parts by weight, more preferably from 0.3 to 12 parts by weight, and still more preferably from 0.5 to 12 parts by weight, relative to 100 parts by weight of the component (A). When the amount of the component (D) is at least as large as the lower limit of the above range, lithography properties such as the roughness can be improved. Further, a more favorable resist pattern shape can be obtained. On the other hand, when the amount of the component (D) is not more than the upper limit of the above range, sensitivity can be maintained at a satisfactory level, and throughput can be improved.

[Component (E)]

Furthermore, in order to prevent any deterioration in sensitivity, and improve the resist pattern shape and the post exposure stability of the latent image formed by the pattern-wise exposure of the resist layer, the resist composition of the present aspect may contain, as an optional component, at least one compound (E) (hereafter referred to as "component (E)") selected from the group consisting of organic carboxylic acids, and phosphorus oxo acids and derivatives thereof.

Examples of suitable organic carboxylic acids include acetic acid, malonic acid, citric acid, malic acid, succinic acid, benzoic acid, and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonate esters such as dimethyl phosphonate, di-n-butyl phosphonate, phenyl phosphonate, diphenyl phosphonate and dibenzyl phosphonate.

Examples of phosphinic acid derivatives include phosphinate esters and phenylphosphinic acid.

As the component (E), one type of compound may be used alone, or a combination of two or more types of compounds may be used.

In those cases where the resist composition of the present aspect includes the component (E), the component (E) is typically used in an amount within a range from 0.01 to 5.0 parts by weight, relative to 100 parts by weight of the component (A).

If desired, other miscible additives can also be added to the resist composition of the present aspect. Examples of such miscible additives include additive resins for improving the performance of the resist film, surfactants for improving the applicability, dissolution inhibitors, plasticizers, stabilizers, colorants, halation prevention agents, and dyes, which may be added in appropriate amounts.

[Component (S)]

The resist composition of the present aspect can be produced by dissolving the materials for the resist composition in an organic solvent (hereafter frequently referred to as "component (S)").

The component (S) may be any organic solvent which can dissolve the respective components to give a uniform solution, and one or more types of organic solvent may be selected appropriately from those solvents that have been conventionally known as solvents for chemically amplified resists.

Examples of the component (S) include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives, including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents can be used individually, or as a mixed solvent containing two or more solvents.

Among these solvents, γ-butyrolactone, propylene glycol monomethyl ether acetate (PGMEA), propylene glycol monomethyl ether (PGME), and ethyl lactate (EL) are preferred.

Further, among the mixed solvents, a mixed solvent obtained by mixing PGMEA with a polar solvent is preferable. The mixing ratio (weight ratio) of the mixed solvent may be determined as appropriate, taking into consideration the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as the polar solvents, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone is also preferable, which is obtained by mixing the γ-butyrolactone with PGMEA, EL or the aforementioned mixed solvent of PGMEA and a polar solvent. The mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

The resist composition according to the first aspect of the present invention described above exhibits excellent lithography properties such as resolution and exposure latitude when a resist pattern is formed by EUV exposure or EB exposure. Moreover, a resist pattern having a favorable shape can be formed, with minimal roughness and a high degree of rectangularity for the cross-sectional shape (namely, superior verticalness of the pattern side walls).

It is thought that these effects are achieved in a synergistic manner by including the component (A1) having an introduced acid-generating region as the base resin, thereby improving the uniformity of the distribution of the acid-generating region within the resist film, and enhancing the sensitivity when resist pattern formation is conducted by EUV exposure or EB exposure; and by including the component (A1) having the structural unit (a5), which has an acid-generating region having not more than one aromatic ring that exhibits absorption of light in the DUV region (and particularly wavelengths of 150 to 300 nm), and limiting the amount of the monomer that yields this structural unit (a5) to not more than 100 ppm (by weight), thereby suppressing the absorption of light in the DUV region in the unexposed portions, or suppressing the effects of electron diffusion (scattering) at the surface of the resist film during EB exposure, and thus inhibiting the generation of acid due to photosensitization in the unexposed portions.

In addition, when the component (A1) includes the structural unit (a6), it is thought that using this type of component (A1) having a combination of the structural unit (a5) containing an acid-generating region and the structural unit (a6) containing a phenolic hydroxyl group yields an improvement in the sensitivity.

<<Method of Forming Resist Pattern>>

A method of forming a resist pattern according to the present invention includes using the resist composition for EUV or EB according to the first aspect to form a resist film on a substrate, conducting exposure of the resist film with EUV or EB, and developing the resist film to form a resist pattern.

The method of forming a resist pattern according to the present invention can be performed, for example, as follows.

First, the resist composition according to the aforementioned first aspect of the present invention is applied onto a substrate using a spinner or the like, and a bake treatment (post applied bake (PAB)) is conducted under temperature conditions of 80 to 150° C. for 40 to 120 seconds, and preferably 60 to 90 seconds, to form a resist film.

Next, the resist film is selectively exposed with EUV or EB, for example by using an exposure apparatus such as an EB lithography apparatus or an EUV exposure apparatus to perform exposure through a mask having a predetermined pattern formed therein (namely, a mask pattern), or by patterning via direct irradiation with an electron beam without using a mask pattern, and the resist film is then subjected to a bake treatment (post exposure bake (PEB)) under temperature conditions of 80 to 150° C. for 40 to 120 seconds, and preferably 60 to 90 seconds.

Subsequently, the resulting resist film is subjected to a developing treatment. In the case of an alkali developing process, the alkali developing treatment is performed using a 0.1 to 10% by weight aqueous solution of tetramethylammonium hydroxide (TMAH). In the case of a solvent developing process, the developing treatment is performed using an organic solvent. Any conventional organic solvent capable of dissolving the component (A) (the component (A) prior to exposure) can be used as this organic solvent. Specific examples of solvents that can be used include polar solvents such as ketone-based solvents, ester-based solvents, alcohol-based solvents, amide-based solvents and ether-based solvents, and hydrocarbon-based solvents.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing the aforementioned organic solvent.

Drying is then conducted. If desired, a bake treatment (post bake) may be conducted following the developing treatment.

A resist pattern can be obtained in this manner. The resist composition of the present invention can be used particularly favorably for forming a positive-type resist pattern using an alkali developing process.

The substrate is not specifically limited, and a conventionally known substrate can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface may also be used. As the inorganic film, an inorganic antireflection film (inorganic BARC) can be used. As the organic film, an organic antireflection film (organic BARC) or an organic film such as the lower organic film in a multilayer resist method can be used.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in a solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon-based solvents. Among these, ester-based solvents are preferred. As the ester-based solvent, butyl acetate is particularly desirable.

Conventional additives may be added to the organic developing solution as required. Examples of these additives include surfactants. There are no particular limitations on the surfactants, and ionic or nonionic fluorine-based and/or silicon-based surfactants can be used.

In those cases where a surfactant is added, the amount added of the surfactant, relative to the total weight of the organic developing solution, is typically within a range from 0.001 to 5% by weight, preferably from 0.005 to 2% by weight, and more preferably from 0.01 to 0.5% by weight.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following the developing treatment in a solvent developing process include those organic solvents among the solvents described above for the organic solvent of the organic developing solution which exhibit poor dissolution of the resist pattern. In general, at least one type of solvent selected from among hydrocarbon-based solvents, ketone-based solvents, ester-based solvents, alcohol-based solvents, amide-based solvents and ether-based solvents is used. Among these, at least one solvent selected from among hydrocarbon-based solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

EXAMPLES

A more detailed description of the present invention is presented below based on a series of examples, although the present invention is in no way limited by these examples.

In the examples, unless defined otherwise, a compound represented by a chemical formula (1) is designated as "compound (I)", and a similar labeling system applies for compounds represented by other chemical formulas.

Component (A) Synthesis Examples

Synthesis Example A1

Synthesis of Copolymer (11A)

Step of Synthesizing Precursor Polymer:
In a separable flask fitted with a thermometer, a reflux condenser and a nitrogen inlet tube, 14.00 g (82.28 mmol) of a compound (21A), 41.84 g (159.48 mmol) of a compound (11A) and 7.70 g (25.38 mmol) of a compound (51A) were dissolved in 80.53 g of a mixed solvent (EL/GBL=80/20 (weight ratio)). As a polymerization initiator, 18.70 mmol of dimethyl azobisisobutyrate (V-601, manufactured by Wako Pure Chemical Industries, Ltd.) was then added to the resulting solution and dissolved.

This solution was then added dropwise, over 4 hours and under a nitrogen atmosphere, to 44.29 g of a mixed solvent (EL/GBL=80/20 (weight ratio)) that had been heated to 80° C. Following completion of the dropwise addition, the reaction solution was stirred under heat for one hour, and the reaction solution was then cooled to room temperature.

Subsequently, the obtained polymerization reaction solution was added dropwise to a large volume of isopropanol to precipitate the polymer, and the precipitated white powder (precursor polymer) was collected by filtration.

Step of Washing the Precursor Polymer with Water:
The obtained precursor polymer was dissolved in dichloromethane, and washed with water (liquid-liquid extraction). Subsequently, the solution was once again added dropwise to a large volume of isopropanol to precipitate the polymer, and the precipitated white powder was collected by filtration.

The thus obtained white powder was then dried, yielding 31.77 g of a copolymer (11A-0).

[Chemical Formula 117]

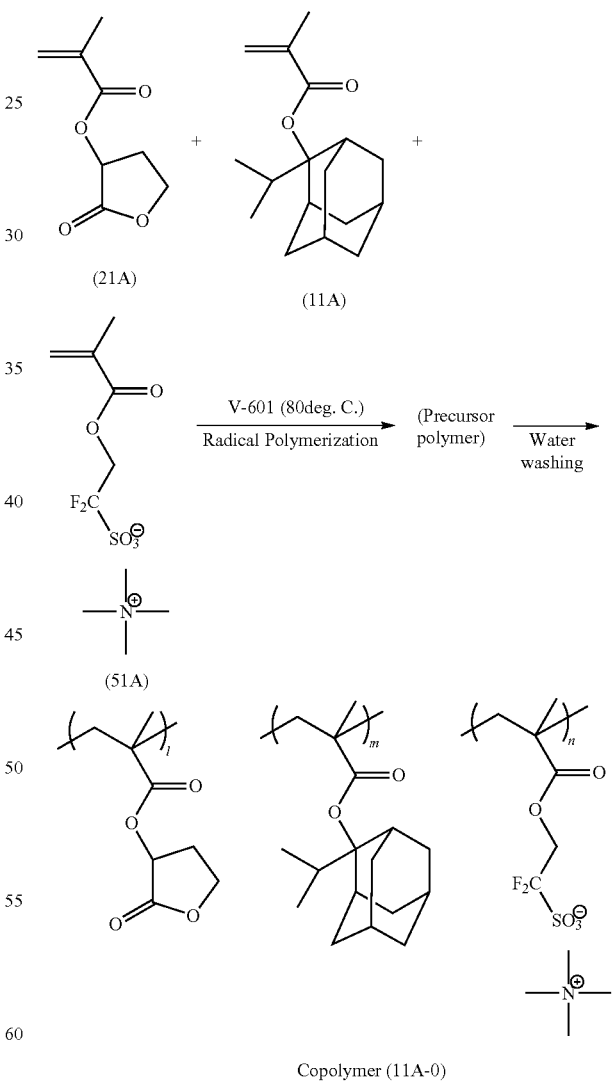

Copolymer (11A-0)

Step of Subjecting the Water-Washed Precursor Polymer to Salt Exchange with an Organic Cation:
The obtained 31.77 g of the copolymer (11A-0) was placed in a round-bottom flask, and following dissolution in 127.08 g of dichloromethane, 7.86 g of a salt exchange compound (c3A) and 127.08 g of water were added to the flask and stiffed for 30 minutes (salt exchange). The organic layer was then extracted.

Subsequently, the extracted organic layer was washed with water, and the solvent was removed by distillation, yielding 30.99 g of the target copolymer (11A).

The amount of residual monomer (the amount of the monomer that yields the structural unit (a5)) within each of the copolymers was adjusted appropriately by altering the mixing time for the two layers (namely, the number of times the dropping funnel was shaken) during the liquid-liquid extraction performed during the step of washing the precursor polymer with water.

[Chemical Formula 118]

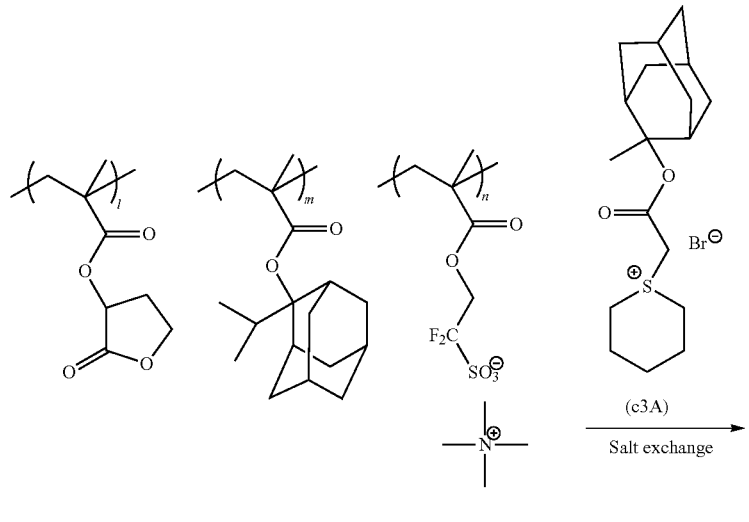

Copolymer (11A-0)

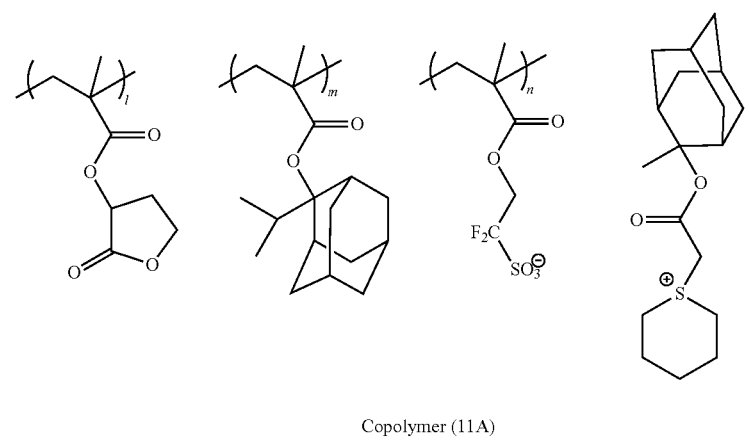

Copolymer (11A)

Synthesis Examples A2 to A27

Synthesis of Copolymers (1A) to (10A), (12A) to (20A), and (22A) to (28A)

With the exceptions of using compounds represented by chemical formulas shown below in the prescribed molar ratio as the monomers in the aforementioned step of synthesizing a precursor polymer described in the aforementioned [Synthesis of Copolymer (11A)], and using compounds represented by chemical formulas (c1A) to (c8A) shown below as the salt exchange compound, copolymers (1A) to (10A), (12A) to (20A), and (22A) to (28A) were obtained using the same method as the aforementioned [Synthesis of Copolymer (11A)].

Synthesis Example A28

Synthesis of Copolymer (21A)

In a separable flask fitted with a thermometer, a reflux condenser and a nitrogen inlet tube, 14.00 g (82.28 mmol) of the compound (21A), 41.84 g (159.48 mmol) of the compound (11A) and 16.21 g (25.38 mmol) of a compound (56A) were dissolved in 91.47 g of a mixed solvent (EL/GBL=80/20 (weight ratio)). As a polymerization initiator, 18.70 mmol of dimethyl azobisisobutyrate (V-601, manufactured by Wako Pure Chemical Industries, Ltd.) was then added to the resulting solution and dissolved.

This solution was then added dropwise, over 4 hours and under a nitrogen atmosphere, to 50.22 g of a mixed solvent (EL/GBL=80/20 (weight ratio)) that had been heated to 80°

C. Following completion of the dropwise addition, the reaction solution was stirred under heat for one hour, and the reaction solution was then cooled to room temperature.

Subsequently, the obtained polymerization reaction solution was added dropwise to a large volume of isopropanol to precipitate the polymer, the precipitated white powder was collected by filtration, and was then washed with methanol and dried, yielding the target copolymer (21A).

[Chemical Formula 119]

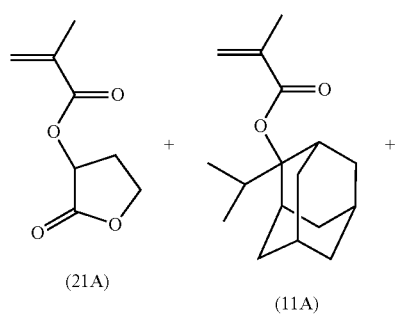

(21A)  (11A)

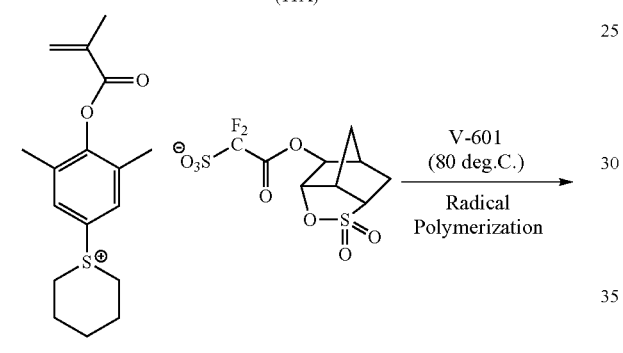

(56A)

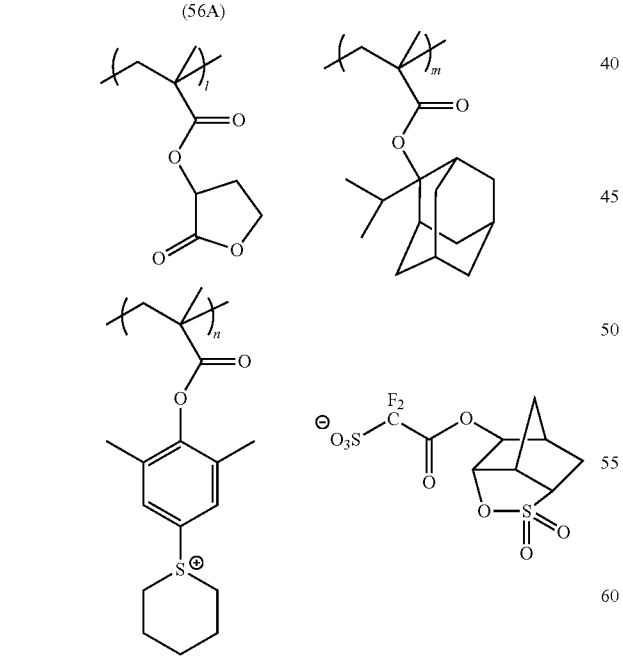

Copolymer (21A)

[Chemical Formula 120]

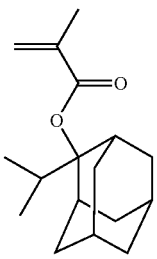

(11A)

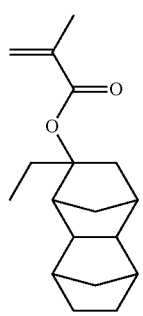

(12A)

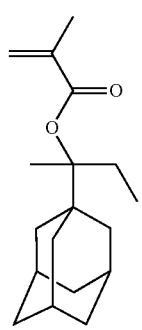

(13A)

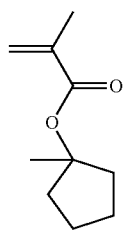

(14A)

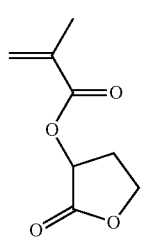

(21A)

-continued
(22A)
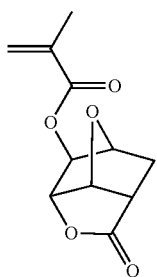
(23A)
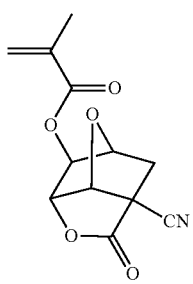
(24A)
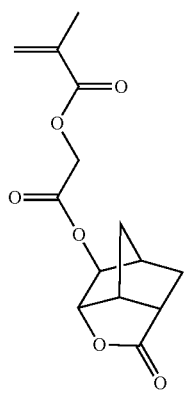
(25A)
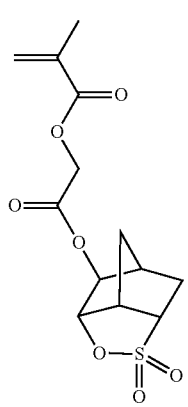
-continued
(31A)
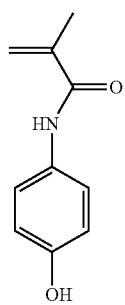
(32A)
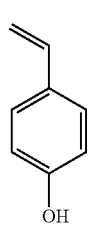
(33A)
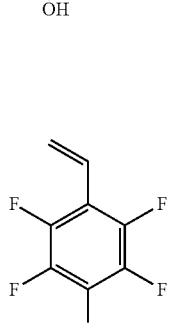
(34A)
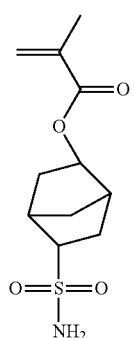
(41A)
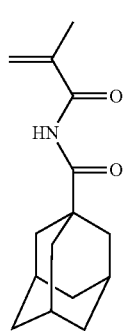

[Chemical Formula 121]
(51A)
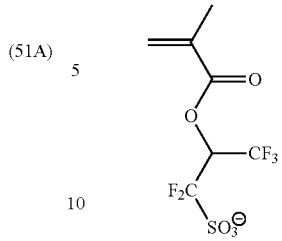
(52A)
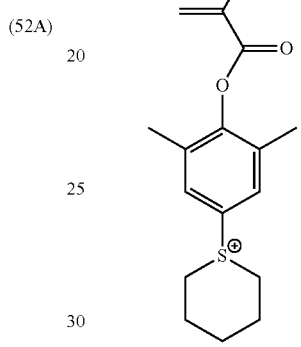
(53A)
(54A)
(55A)
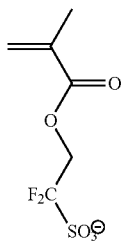
(56A)
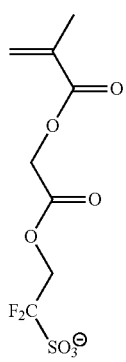
[Chemical Formula 122]
(c1A)
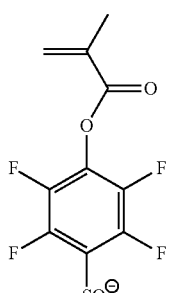
(c2A)
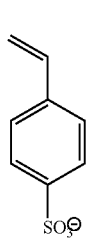
(c3A)

-continued

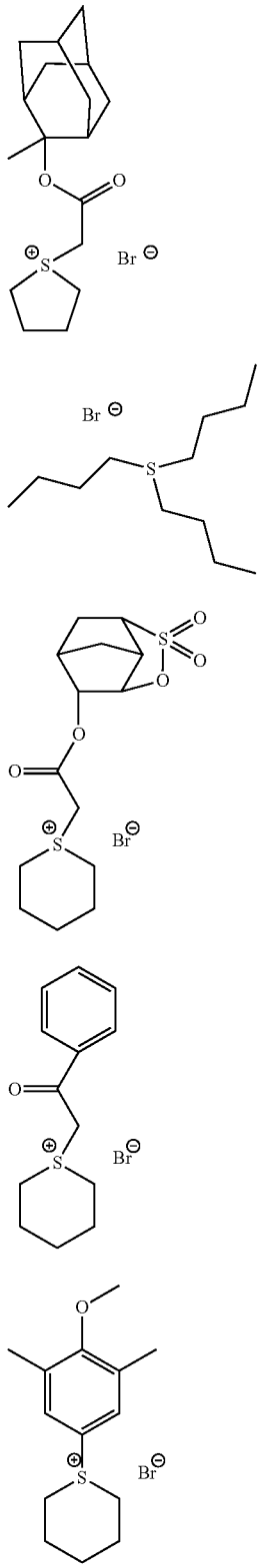

(c4A)

(c5A)

(c6A)

(c7A)

(c8A)

The monomers and the salt exchange compounds used in the synthesis of each of the copolymers, and the washing solvent used for removal of the unreacted monomers during the synthesis are shown in Table 1.

TABLE 1

| | Materials used in production of copolymer | | |
|---|---|---|---|
| | Monomers used | Salt exchange compound | Washing solvent |
| Copolymer (1A) | (21A)/(11A)/(51A) | (c1A) | water |
| Copolymer (2A) | (21A)/(11A)/(51A) | (c1A) | water |
| Copolymer (3A) | (21A)/(11A)/(51A) | (c2A) | water |
| Copolymer (4A) | (21A)/(11A)/(51A) | (c2A) | water |
| Copolymer (5A) | (21A)/(11A)/(51A) | (c3A) | water |
| Copolymer (6A) | (21A)/(11A)/(51A) | (c7A) | water |
| Copolymer (7A) | (21A)/(11A)/(51A) | (c4A) | water |
| Copolymer (8A) | (21A)/(11A)/(53A) | (c3A) | water |
| Copolymer (9A) | (21A)/(11A)/(51A) | (c5A) | water |
| Copolymer (10A) | (23A)/(13A)/(32A)/(53A) | (c8A) | water |
| Copolymer (11A) | (21A)/(11A)/(51A) | (c3A) | water |
| Copolymer (12A) | (21A)/(11A)/(51A) | (c4A) | water |
| Copolymer (13A) | (21A)/(11A)/(51A) | (c5A) | water |
| Copolymer (14A) | (21A)/(11A)/(51A) | (c6A) | water |
| Copolymer (15A) | (21A)/(11A)/(51A) | (c7A) | water |
| Copolymer (16A) | (21A)/(11A)/(51A) | (c8A) | water |
| Copolymer (17A) | (21A)/(11A)/(52A) | (c3A) | water |
| Copolymer (18A) | (21A)/(11A)/(53A) | (c3A) | water |
| Copolymer (19A) | (21A)/(11A)/(54A) | (c3A) | water |
| Copolymer (20A) | (21A)/(11A)/(55A) | (c3A) | water |
| Copolymer (21A) | (21A)/(11A)/(56A) | — | methanol |
| Copolymer (22A) | (22A)/(12A)/(31A)/(55A) | (c6A) | water |
| Copolymer (23A) | (23A)/(13A)/(32A)/(53A) | (c8A) | water |
| Copolymer (24A) | (24A)/(14A)/(33A)/(51A) | (c7A) | water |
| Copolymer (25A) | (25A)/(11A)/(51A) | (c3A) | water |
| Copolymer (26A) | (22A)/(12A)/(31A)/(51A) | (c3A) | water |
| Copolymer (27A) | (21A)/(25A)/(14A)/(41A)/(51A) | (c6A) | water |
| Copolymer (28A) | (25A)/(11A)/(34A)/(52A) | (c3A) | water |

Synthesis Example B1

Synthesis of Copolymer (A)-1B

Step of Synthesizing Precursor Polymer:

In a separable flask fitted with a thermometer, a reflux condenser and a nitrogen inlet tube, 36.74 g (146.76 mmol) of a compound (11B), 16.71 g (93.78 mmol) of a compound (63B) and 7.75 g (25.55 mmol) of a compound (51B) were dissolved in 79.53 g of a mixed solvent of ethyl lactate (EL) and γ-butyrolactone (GBL). As a polymerization initiator, 30.82 mmol of dimethyl azobisisobutyrate (V-601, manufactured by Wako Pure Chemical Industries, Ltd.) was then added to the resulting solution and dissolved.

This solution was then added dropwise, over 4 hours and under a nitrogen atmosphere, to 42.28 g of EL/GBL that had been heated to 80° C. Following completion of the dropwise addition, the reaction solution was stirred under heat for one hour, and the reaction solution was then cooled to room temperature.

Subsequently, the obtained polymerization reaction solution was added dropwise to a large volume of isopropanol to precipitate the polymer, and the precipitated white powder (precursor polymer) was collected by filtration.

Step of Washing the Precursor Polymer with Water:

The obtained precursor polymer was dissolved in dichloromethane, and washed with water (liquid-liquid extraction). Subsequently, the solution was once again added dropwise to a large volume of isopropanol to precipitate the polymer, and the precipitated white powder was collected by filtration.

The thus obtained white powder was then dried, yielding 30.77 g of a copolymer (1B-0).

[Chemical Formula 123]

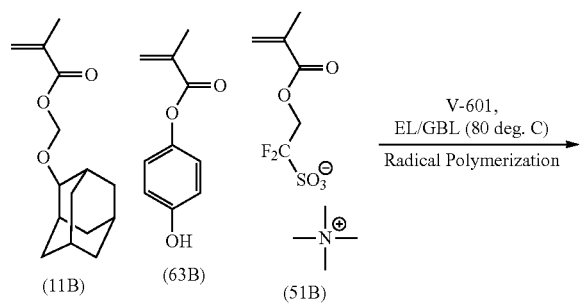

[Chemical Formula 124]

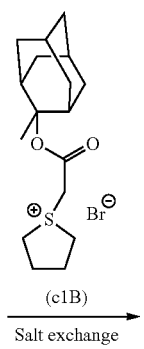

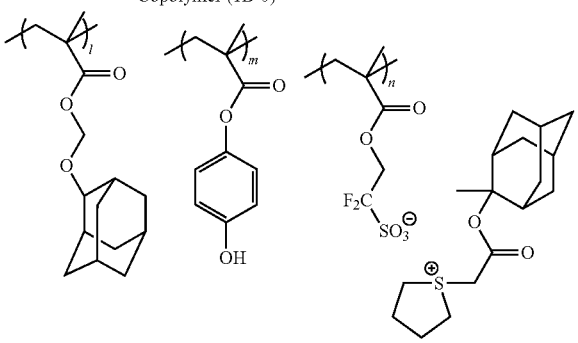

Copolymer (1B-0)

Step of Subjecting the Water-Washed Precursor Polymer to Salt Exchange with an Organic Cation:

The obtained 30.77 g of the copolymer (1B-0) was placed in a round-bottom flask, and following dissolution in 127.08 g of dichloromethane, 7.86 g of a salt exchange compound (c1B) and 127.08 g of water were added to the flask and stirred for 30 minutes (salt exchange). The organic layer was then extracted.

Subsequently, the extracted organic layer was washed with water, and the solvent was removed by distillation, yielding 32.19 g of the target copolymer (A)-1B.

Synthesis Examples B2 to B14

Synthesis of Copolymers (A)-2B to (A)-11B, (A)-37B, (A)-41B and (A)-42B

With the exceptions of using compounds represented by chemical formulas shown below in the prescribed molar ratio as the monomers in the aforementioned step of synthesizing a precursor polymer described in the aforementioned [Synthesis Example B1: Synthesis of Copolymer (A)-1B], and using compounds represented by chemical formulas (c1B) to (c5B) shown below as the salt exchange compound, copolymers (A)-2B to (A)-11B, (A)-37B, (A)-41B and (A)-42B were obtained using the same method as the aforementioned [Synthesis Example B1: Synthesis of Copolymer (A)-1B].

Synthesis Examples B15 and B16

Synthesis of Copolymers (A)-44B and (A)-45B

With the exception of not performing the aforementioned "step of washing the precursor polymer with water", the copolymers (A)-44B and (A)-45B were obtained using the same method as the aforementioned [Synthesis Example B1: Synthesis of Copolymer (A)-1B], namely by performing the aforementioned "step of synthesizing a precursor polymer" and the aforementioned "step of subjecting the precursor polymer to salt exchange with an organic cation" to obtain the target copolymer.

[Chemical Formula 125]

(11B)
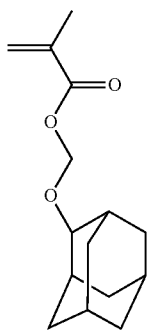

(13B)
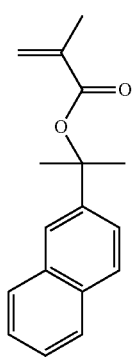

(31B)
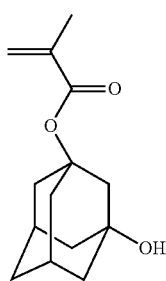

(53B)
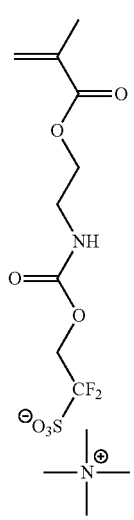

(62B)
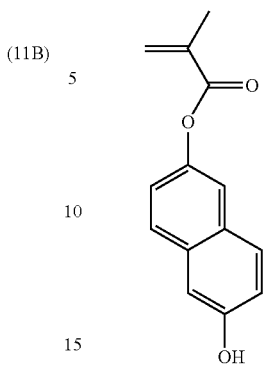

(63B)
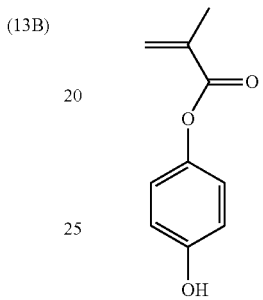

[Chemical Formula 126]

(c3B)
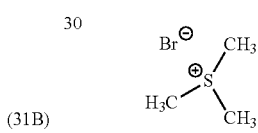

(c4B)
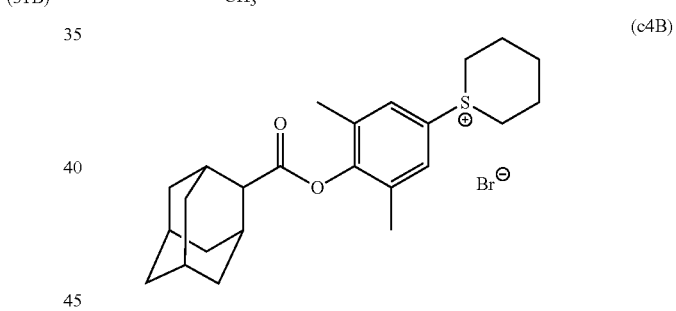

Compound (12B): a compound represented by chemical formula (11A) above.
Compound (21B): a compound represented by chemical formula (25A) above.
Compound (51B): a compound represented by chemical formula (51A) above.
Compound (52B): a compound represented by chemical formula (52A) above.
Compound (61B): a compound represented by chemical formula (32A) above.
Compound (c1B): a compound represented by chemical formula (c4A) above.
Compound (c2B): a compound represented by chemical formula (c5A) above.
Compound (c5B): a compound represented by chemical formula (c1A) above.

The monomers and the salt exchange compounds used in the synthesis of each of the copolymers, and the washing solvent used for removal of the unreacted monomers during the synthesis are shown in Table 2.

TABLE 2

| | Materials used in production of copolymer | | |
|---|---|---|---|
| | Monomers used | Salt exchange compound | Washing solvent |
| Copolymer (A)-1B | (63B)/(11B)/(51B) | (c1B) | water |
| Copolymer (A)-2B | (21B)/(12B)/(62B)/(51B) | (c1B) | water |
| Copolymer (A)-3B | (21B)/(13B)/(61B)/(51B) | (c1B) | water |
| Copolymer (A)-4B | (21B)/(12B)/(51B) | (c1B) | water |
| Copolymer (A)-5B | (21B)/(12B)/(52B) | (c1B) | water |
| Copolymer (A)-6B | (21B)/(12B)/(53B) | (c1B) | water |
| Copolymer (A)-7B | (21B)/(12B)/(51B) | (c2B) | water |
| Copolymer (A)-8B | (21B)/(12B)/(51B) | (c3B) | water |
| Copolymer (A)-9B | (21B)/(12B)/(31B)/(51B) | (c1B) | water |
| Copolymer (A)-10B | (21B)/(12B)/(53B) | (c1B) | water |
| Copolymer (A)-11B | (21B)/(12B)/(51B) | (c4B) | water |
| Copolymer (A)-37B | (63B)/(11B)/(51B) | (c5B) | water |
| Copolymer (A)-41B | (21B)/(12B)/(51B) | (c5B) | water |
| Copolymer (A)-42B | (21B)/(12B)/(62B)/(51B) | (c5B) | water |
| Copolymer (A)-44B | (21B)/(12B)/(51B) | (c1B) | no washing |
| Copolymer (A)-45B | (63B)/(11B)/(51B) | (c5B) | no washing |

<Preparation of Resist Compositions>

Examples A1 to A18, Comparative Examples A1 to A10

The components shown in Tables 3 and 4 were mixed together and dissolved to prepare resist compositions.

In Tables 3 and 4, the value for "Amount of monomer that yields structural unit (a5) (ppm)" indicates the amount (by weight) of the monomer that yields the structural unit (a5) relative to the weight of the copolymer of the component (A).

TABLE 3

| | Component (A) | Amount of monomer that yields structural unit (a5) (ppm) | Component (D) | Component (S) | |
|---|---|---|---|---|---|
| Comparative Example A1 | (A)-1A [100] | 160 | (B)-1A [2.1] | (S)-1 [100] | (S)-2 [5000] |
| Comparative Example A2 | (A)-2A [100] | <100 | (B)-1A [2.1] | (S)-1 [100] | (S)-2 [5000] |
| Comparative Example A3 | (A)-3A [100] | 140 | (B)-1A [2.1] | (S)-1 [100] | (S)-2 [5000] |
| Comparative Example A4 | (A)-4A [100] | <100 | (B)-1A [2.1] | (S)-1 [100] | (S)-2 [5000] |
| Comparative Example A5 | (A)-5A [100] | 220 | (B)-1A [2.1] | (S)-1 [100] | (S)-2 [5000] |
| Comparative Example A6 | (A)-6A [100] | 180 | (B)-1A [2.1] | (S)-1 [100] | (S)-2 [5000] |
| Comparative Example A7 | (A)-7A [100] | 120 | (B)-1A [2.1] | (S)-1 [100] | (S)-2 [5000] |
| Comparative Example A8 | (A)-8A [100] | 130 | (B)-1A [2.1] | (S)-1 [100] | (S)-2 [5000] |
| Comparative Example A9 | (A)-9A [100] | 120 | (B)-1A [2.1] | (S)-1 [100] | (S)-2 [5000] |
| Comparative Example A10 | (A)-10A [100] | 120 | (B)-1A [2.1] | (S)-1 [100] | (S)-2 [5000] |
| Example A1 | (A)-11A [100] | <100 | (B)-1A [2.1] | (S)-1 [100] | (S)-2 [5000] |
| Example A2 | (A)-12A [100] | <100 | (B)-1A [2.1] | (S)-1 [100] | (S)-2 [5000] |
| Example A3 | (A)-13A [100] | <100 | (B)-1A [2.1] | (S)-1 [100] | (S)-2 [5000] |
| Example A4 | (A)-14A [100] | <100 | (B)-1A [2.1] | (S)-1 [100] | (S)-2 [5000] |
| Example A5 | (A)-15A [100] | <100 | (B)-1A [2.1] | (S)-1 [100] | (S)-2 [5000] |
| Example A6 | (A)-16A [100] | <100 | (B)-1A [2.1] | (S)-1 [100] | (S)-2 [5000] |
| Example A7 | (A)-17A [100] | <100 | (B)-1A [2.1] | (S)-1 [100] | (S)-2 [5000] |
| Example A8 | (A)-18A [100] | <100 | (B)-1A [2.1] | (S)-1 [100] | (S)-2 [5000] |
| Example A9 | (A)-19A [100] | <100 | (B)-1A [2.1] | (S)-1 [100] | (S)-2 [5000] |
| Example A10 | (A)-20A [100] | <100 | (B)-1A [2.1] | (S)-1 [100] | (S)-2 [5000] |
| Example A11 | (A)-21A [100] | <100 | (B)-1A [2.1] | (S)-1 [100] | (S)-2 [5000] |

TABLE 4

| | Component (A) | Amount of monomer that yields structural unit (a5) (ppm) | Component (D) | Component (S) | |
|---|---|---|---|---|---|
| Example A12 | (A)-22A [100] | <100 | (B)-1A [2.1] | (S)-1 [100] | (S)-2 [5000] |
| Example A13 | (A)-23A [100] | <100 | (B)-1A [2.1] | (S)-1 [100] | (S)-2 [5000] |
| Example A14 | (A)-24A [100] | <100 | (B)-1A [2.1] | (S)-1 [100] | (S)-2 [5000] |
| Example A15 | (A)-25A [100] | <100 | (B)-1A [2.1] | (S)-1 [100] | (S)-2 [5000] |
| Example A16 | (A)-26A [100] | <100 | (B)-1A [2.1] | (S)-1 [100] | (S)-2 [5000] |
| Example A17 | (A)-27A [100] | <100 | (B)-1A [2.1] | (S)-1 [100] | (S)-2 [5000] |
| Example A18 | (A)-28A [100] | <100 | (B)-1A [2.1] | (S)-1 [100] | (S)-2 [5000] |

In Tables 3 and 4, the reference characters have the following meanings. Further, the numerical values in brackets [ ] indicate the amount (in parts by weight) of the component added.

(A)-1A to (A)-28A: the copolymers (1A) to (28A) represented by chemical formulas (A)-1A to (A)-28A shown below.

(B)-1A: a compound represented by chemical formula (D)-2 shown below.

(S)-1: γ-butyrolactone (S)-2: a mixed solvent of PGMEA/PGME/cyclohexanone=1500/1000/2500 (weight ratio).

For each component (A), the copolymer composition ratio of the copolymer (the ratio (molar ratio) of the respective structural units within the chemical formula), the weight-average molecular weight (Mw), and the molecular weight dispersity (Mw/Mn) are listed below together with the chemical formula.

The weight-average molecular weight (Mw) and the molecular weight dispersity (Mw/Mn) for each copolymer represent polystyrene-equivalent values determined by GPC measurements. The copolymer composition ratio (the ratio (molar ratio) of the respective structural units within the structural formula) for each copolymer was determined by carbon-13 nuclear magnetic resonance spectroscopy (600 MHz $^{13}$C-NMR). Tetramethylsilane (TMS) was used as the internal standard for the $^{13}$C-NMR.

[Chemical Formula 127]
(A)-1A, (A)-2A
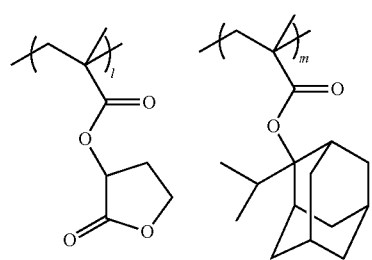
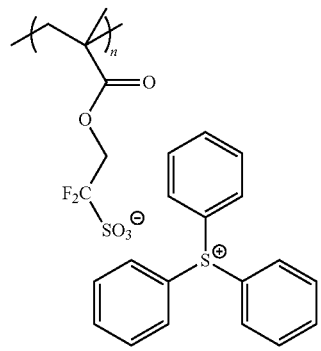
(A)-3A, (A)-4A
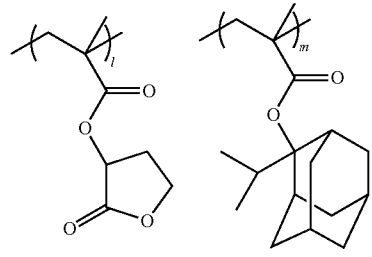
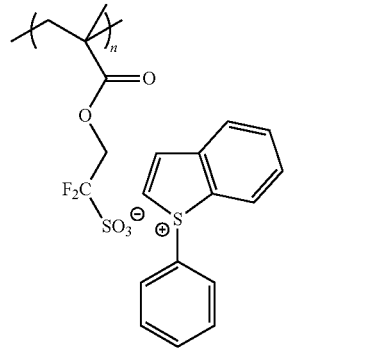
(A)-1A: l/m/n = 45/41/14, Mw: 13,100, Mw/Mn: 1.70
(A)-2A: l/m/n = 45/41/14, Mw: 13,100, Mw/Mn: 1.70
(A)-3A: l/m/n = 45/41/14, Mw: 13,000, Mw/Mn: 1.68
(A)-4A: l/m/n = 45/41/14, Mw: 13,000, Mw/Mn: 1.68
[Chemical Formula 128]
(A)-5A, (A)-11A
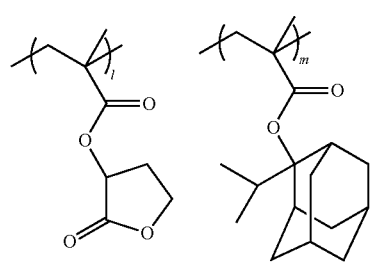
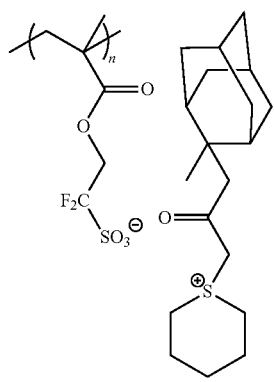
(A)-7A, (A)-12A
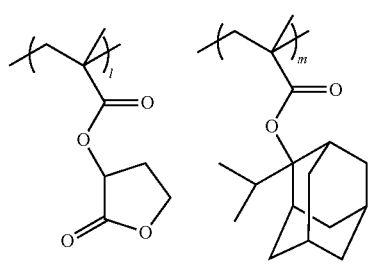
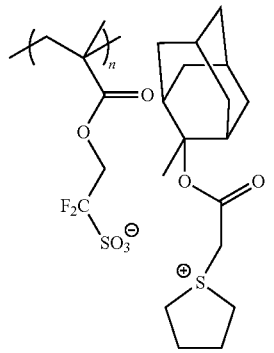
(A)-5A: l/m/n = 45/41/14, Mw: 12,900, Mw/Mn: 1.68
(A)-11A: l/m/n = 45/41/14, Mw: 12,900, Mw/Mn: 1.68
(A)-7A: l/m/n = 45/41/14, Mw: 12,900, Mw/Mn: 1.69
(A)-12A: l/m/n = 45/41/14, Mw: 12,900, Mw/Mn: 1.69
[Chemical Formula 129]
(A)-9A, (A)-13A
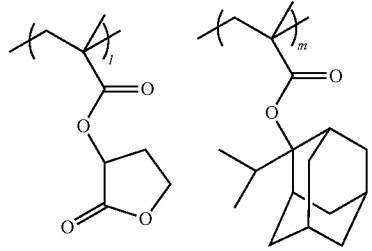

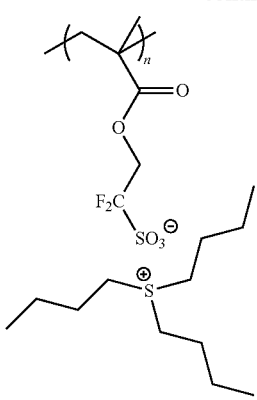
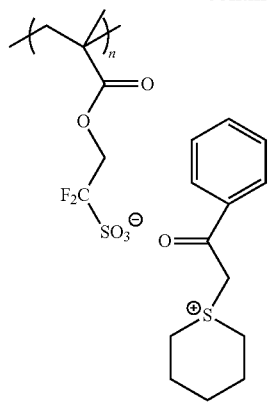
(A)-14A
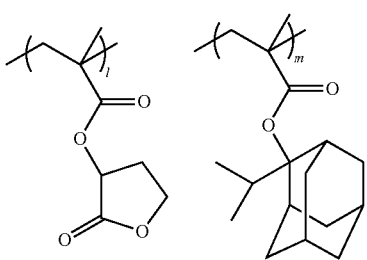
(A)-16A
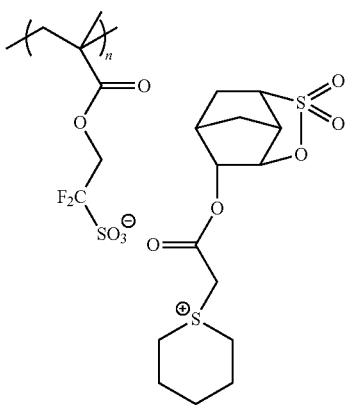
(A)-9A: l/m/n = 44/42/14, Mw: 12,100, Mw/Mn: 1.80
(A)-13A: l/m/n = 44/42/14, Mw: 12,100, Mw/Mn: 1.80
(A)-14A: l/m/n = 45/41/14, Mw: 13,400, Mw/Mn: 1.65
[Chemical Formula 130]
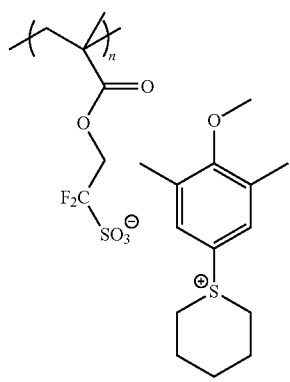
(A)-6A: l/m/n = 45/41/14, Mw: 12,900, Mw/Mn: 1.67
(A)-15A: l/m/n = 45/41/14, Mw: 12,900, Mw/Mn: 1.67
(A)-16A: l/m/n = 45/41/14, Mw: 13,000, Mw/Mn: 1.70
[Chemical Formula 131]
(A)-6A, (A)-15A
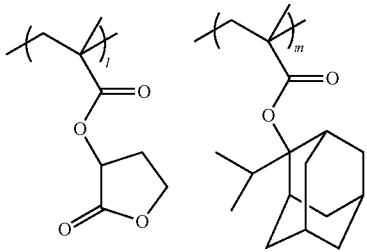
(A)-17A
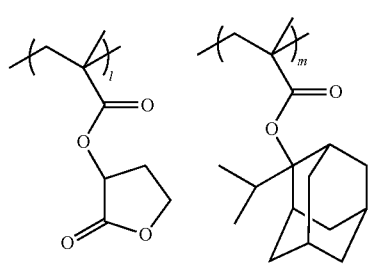

-continued
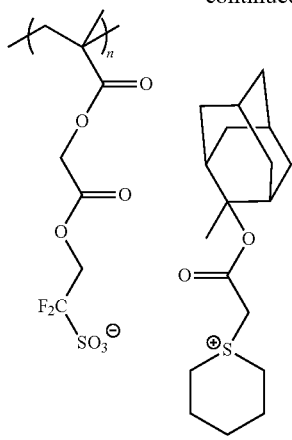
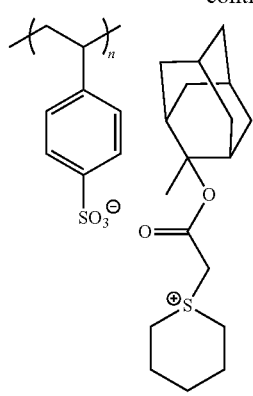
(A)-20A
(A)-8A, (A)-18A
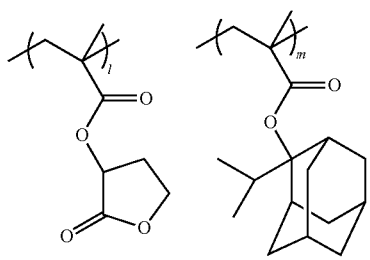
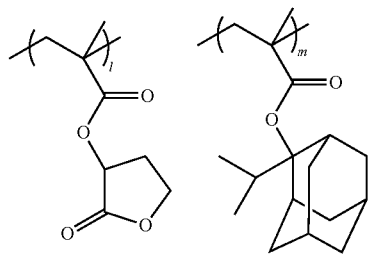
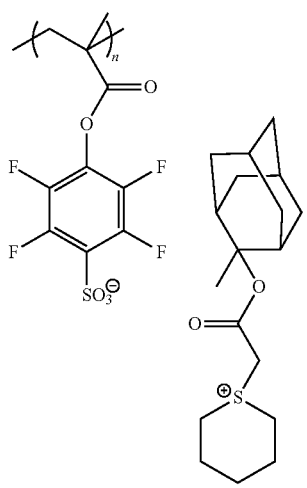
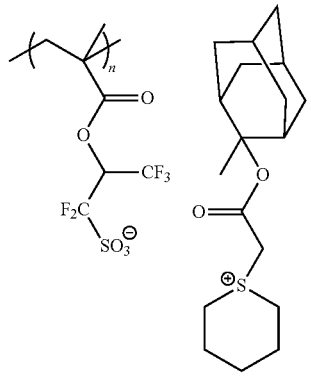
(A)-17A: l/m/n = 44/42/14, Mw: 12,100, Mw/Mn: 1.60
(A)-8A: l/m/n = 45/42/13, Mw: 11,900, Mw/Mn: 1.80
(A)-18A: l/m/n = 45/42/13, Mw: 11,900, Mw/Mn: 1.80
(A)-19A: l/m/n = 45/42/13, Mw: 11,900, Mw/Mn: 1.80
(A)-20A: l/m/n = 45/42/13, Mw: 11,900, Mw/Mn: 1.80
[Chemical Formula 132]
[Chemical Formula 133]
(A)-19A
(A)-21A
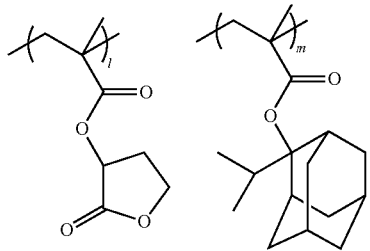
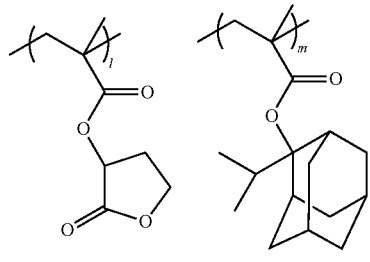

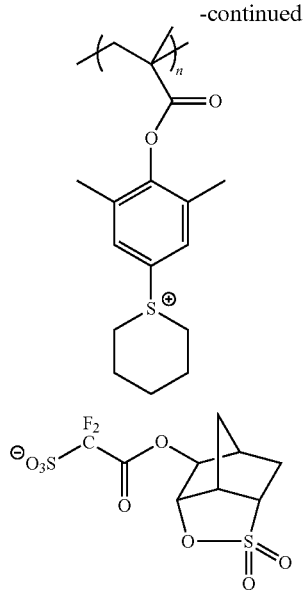
(A)-22A
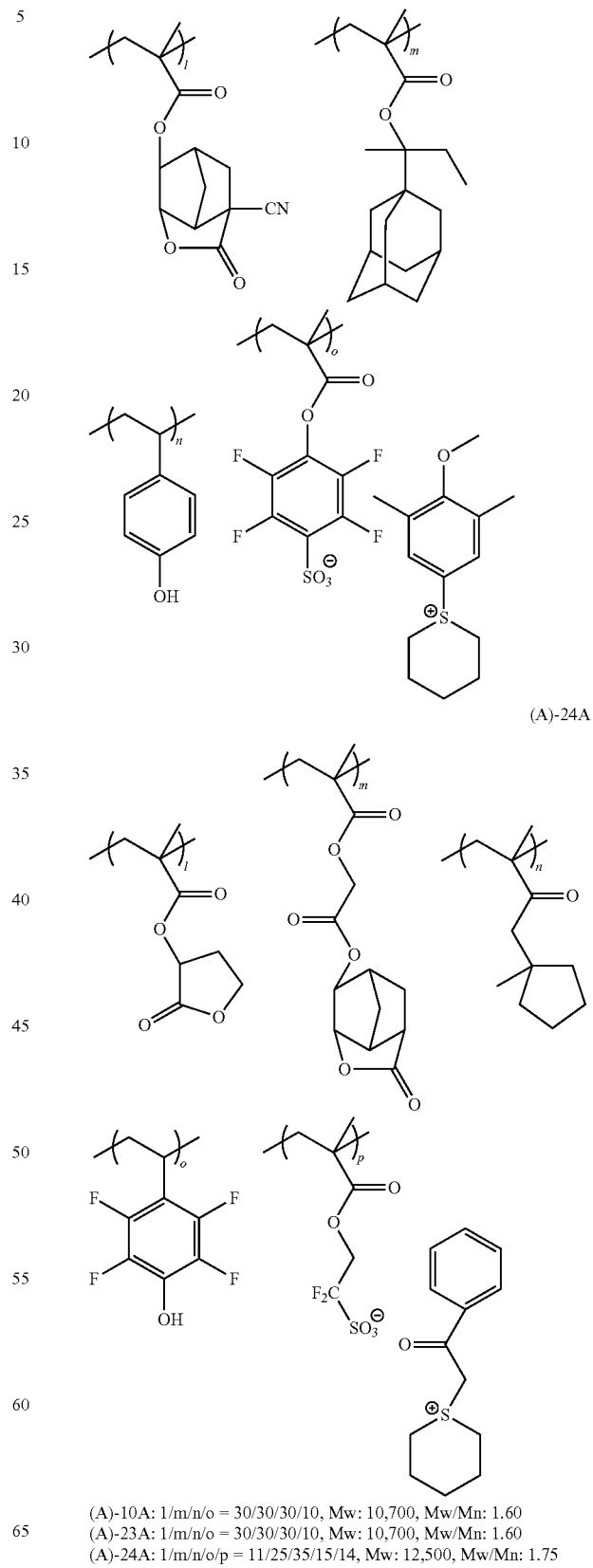
(A)-21A: l/m/n = 44/42/14, Mw: 12,500, Mw/Mn: 1.72
(A)-22A: l/m/n/o = 30/30/30/10, Mw: 10,700, Mw/Mn: 1.60
(A)-10A: l/m/n/o = 30/30/30/10, Mw: 10,700, Mw/Mn: 1.60
(A)-23A: l/m/n/o = 30/30/30/10, Mw: 10,700, Mw/Mn: 1.60
(A)-24A: l/m/n/o/p = 11/25/35/15/14, Mw: 12,500, Mw/Mn: 1.75

[Chemical Formula 135]
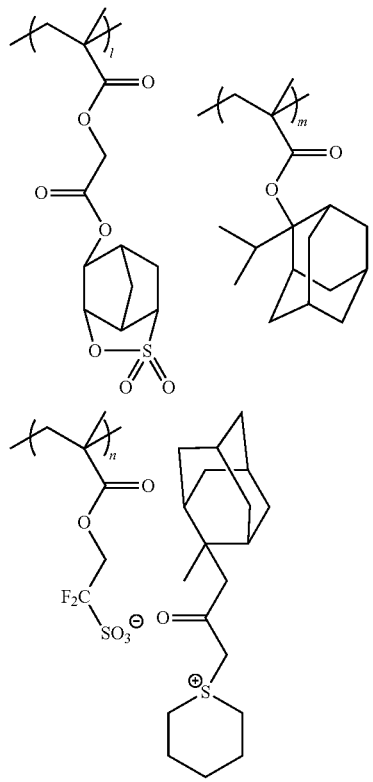
(A)-25A
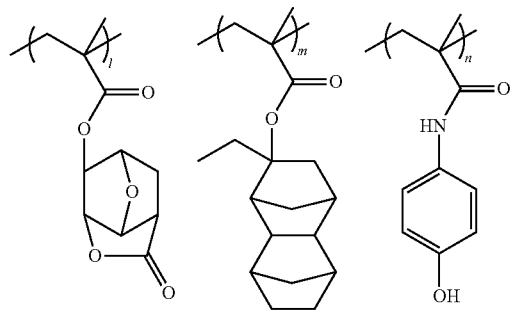
(A)-26A
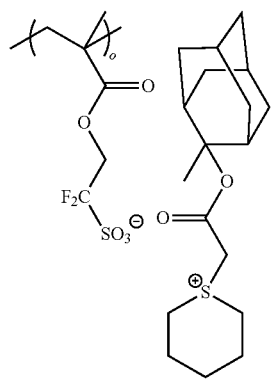
(A)-25A: l/m/n = 46/40/14 Mw: 12,600, Mw/Mn: 1.67
(A)-26A: l/m/n/o = 30/30/30/10, Mw: 10,400, Mw/Mn: 1.60
[Chemical Formula 136]
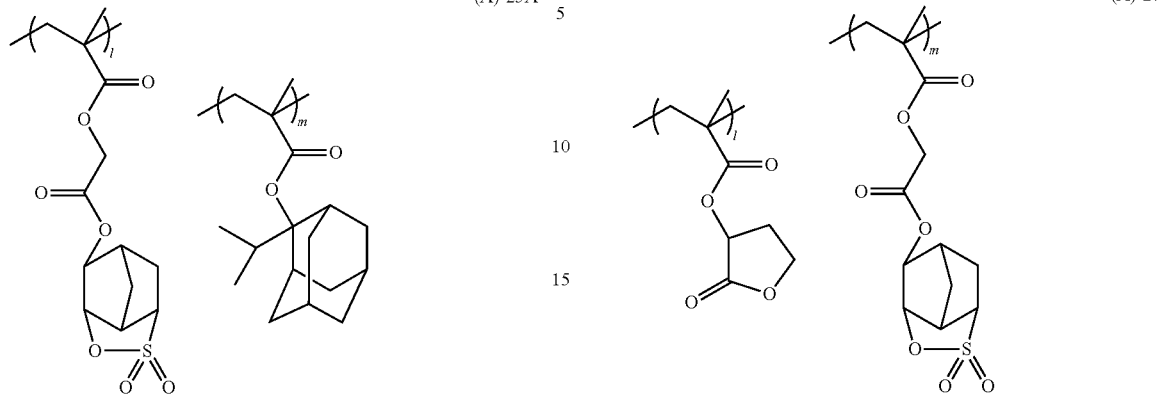
(A)-27
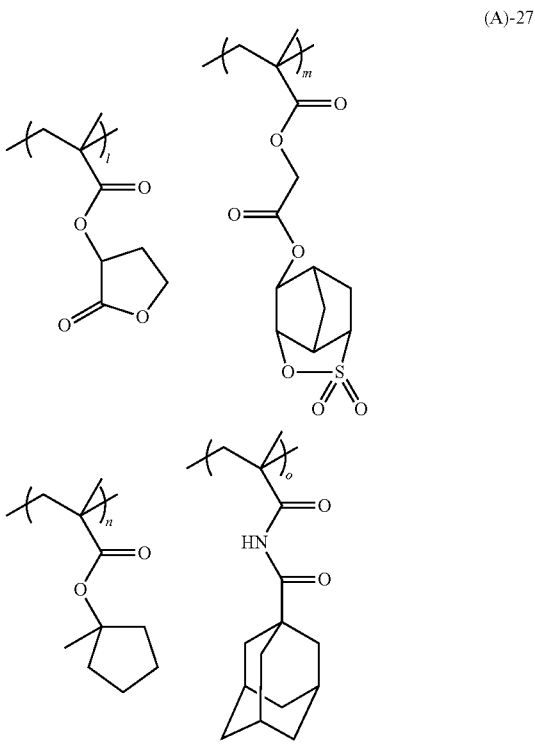
[Chemical Formula 137]
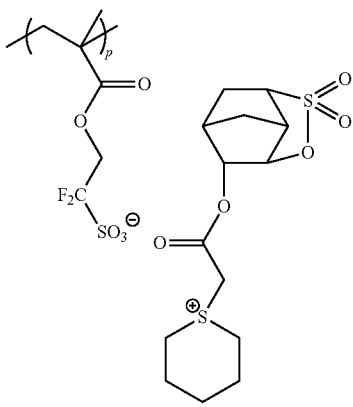
(A)-28A
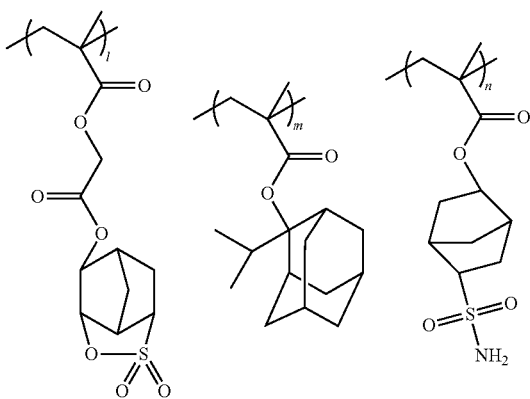

-continued

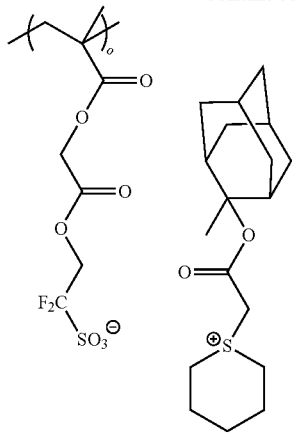

(A)-27A: l/m/n/o/p = 14/26/35/12/13, Mw: 12,000, Mw/Mn: 1.61
(A)-28A: l/m/n/o = 34/34/38/14, Mw: 13,000, Mw/Mn: 1.77

Examples B1 to B61

Comparative Examples B1 to B9

The components shown in Tables 5 to 8 were mixed together and dissolved to prepare resist compositions.

In Tables 5 to 8, the value for "Amount of monomer that yields structural unit (a5) (ppm)" indicates the amount (by weight) of the monomer that yields the structural unit (a5) relative to the weight of the copolymer having the structural unit (a5).

For copolymers (A)-37B, (A)-41B, (A)-42B and (A)-45B, the value indicates the amount (by weight) of the monomer that yields a structural unit capable of generating acid upon exposure (the structural unit shown at the right side of the chemical formula) relative to the weight of the copolymer represented by the chemical formula shown below.

TABLE 5

|  | Component (A) |  | Amount of monomer that yields structural unit (a5) (ppm) | Component (D) | Component (E) | Component (S) | |
|---|---|---|---|---|---|---|---|
| Example B1 | (A)-1B [100] | — | (A)-1B: <100 | — | — | (S)-1 [200] | (S)-2 [5000] |
| Example B2 | (A)-2B [100] | — | (A)-2B: <100 | — | — | (S)-1 [200] | (S)-2 [5000] |
| Example B3 | (A)-3B [100] | — | (A)-3B: <100 | — | — | (S)-1 [200] | (S)-2 [5000] |
| Example B4 | (A)-4B [50] | (A)-21B [50] | (A)-4B: <100 | (D)-1 [1.5] | (E)-1 [0.6] | (S)-1 [200] | (S)-2 [5000] |
| Example B5 | (A)-4B [70] | (A)-21B [30] | (A)-4B: <100 | (D)-1 [1.5] | (E)-1 [0.6] | (S)-1 [200] | (S)-2 [5000] |
| Example B6 | (A)-4B [50] | (A)-22B [50] | (A)-4B: <100 | (D)-1 [1.5] | (E)-1 [0.6] | (S)-1 [200] | (S)-2 [5000] |
| Example B7 | (A)-4B [70] | (A)-22B [30] | (A)-4B: <100 | (D)-1 [1.5] | (E)-1 [0.6] | (S)-1 [200] | (S)-2 [5000] |
| Example B8 | (A)-4B [50] | (A)-23B [50] | (A)-4B: <100 | (D)-1 [1.5] | (E)-1 [0.6] | (S)-1 [200] | (S)-2 [5000] |
| Example B9 | (A)-4B [70] | (A)-23B [30] | (A)-4B: <100 | (D)-1 [1.5] | (E)-1 [0.6] | (S)-1 [200] | (S)-2 [5000] |
| Example B10 | (A)-4B [50] | (A)-24B [50] | (A)-4B: <100 | (D)-1 [1.5] | (E)-1 [0.6] | (S)-1 [200] | (S)-2 [5000] |
| Example B11 | (A)-4B [70] | (A)-24B [30] | (A)-4B: <100 | (D)-1 [1.5] | (E)-1 [0.6] | (S)-1 [200] | (S)-2 [5000] |
| Example B12 | (A)-4B [50] | (A)-25B [50] | (A)-4B: <100 | (D)-1 [1.5] | (E)-1 [0.6] | (S)-1 [200] | (S)-2 [5000] |
| Example B13 | (A)-4B [70] | (A)-25B [30] | (A)-4B: <100 | (D)-1 [1.5] | (E)-1 [0.6] | (S)-1 [200] | (S)-2 [5000] |
| Example B14 | (A)-4B [50] | (A)-26B [50] | (A)-4B: <100 | (D)-1 [1.5] | (E)-1 [0.6] | (S)-1 [200] | (S)-2 [5000] |
| Example B15 | (A)-4B [70] | (A)-26B [30] | (A)-4B: <100 | (D)-1 [1.5] | (E)-1 [0.6] | (S)-1 [200] | (S)-2 [5000] |
| Example B16 | (A)-4B [50] | (A)-27B [50] | (A)-4B: <100 | (D)-1 [1.5] | (E)-1 [0.6] | (S)-1 [200] | (S)-2 [5000] |
| Example B17 | (A)-4B [70] | (A)-27B [30] | (A)-4B: <100 | (D)-1 [1.5] | (E)-1 [0.6] | (S)-1 [200] | (S)-2 [5000] |
| Example B18 | (A)-4B [50] | (A)-28B [50] | (A)-4B: <100 | (D)-1 [1.5] | (E)-1 [0.6] | (S)-1 [200] | (S)-2 [5000] |
| Example B19 | (A)-4B [70] | (A)-28B [30] | (A)-4B: <100 | (D)-1 [1.5] | (E)-1 [0.6] | (S)-1 [200] | (S)-2 [5000] |
| Example B20 | (A)-4B [50] | (A)-29B [50] | (A)-4B: <100 | (D)-1 [1.5] | (E)-1 [0.6] | (S)-1 [200] | (S)-2 [5000] |
| Example B21 | (A)-4B [70] | (A)-29B [30] | (A)-4B: <100 | (D)-1 [1.5] | (E)-1 [0.6] | (S)-1 [200] | (S)-2 [5000] |

TABLE 6

| | Component (A) | | Amount of monomer that yields structural unit (a5) (ppm) | Component (D) | Component (E) | Component (S) | |
|---|---|---|---|---|---|---|---|
| Example B22 | (A)-4B [50] | (A)-30B [50] | (A)-4B: <100 | (D)-1 [1.5] | (E)-1 [0.6] | (S)-1 [200] | (S)-2 [5000] |
| Example B23 | (A)-4B [70] | (A)-30B [30] | (A)-4B: <100 | (D)-1 [1.5] | (E)-1 [0.6] | (S)-1 [200] | (S)-2 [5000] |
| Example B24 | (A)-4B [50] | (A)-31B [50] | (A)-4B: <100 | (D)-1 [1.5] | (E)-1 [0.6] | (S)-1 [200] | (S)-2 [5000] |
| Example B25 | (A)-4B [70] | (A)-31B [30] | (A)-4B: <100 | (D)-1 [1.5] | (E)-1 [0.6] | (S)-1 [200] | (S)-2 [5000] |
| Example B26 | (A)-4B [50] | (A)-23B [50] | (A)-4B: <100 | (D)-1 [1.5] | (E)-1 [0.6] | (S)-1 [200] | (S)-2 [5000] |
| Example B27 | (A)-4B [70] | (A)-23B [30] | (A)-4B: <100 | (D)-1 [1.5] | (E)-1 [0.6] | (S)-1 [200] | (S)-2 [5000] |
| Example B28 | (A)-4B [50] | (A)-32B [50] | (A)-4B: <100 | (D)-1 [1.5] | (E)-1 [0.6] | (S)-1 [200] | (S)-2 [5000] |
| Example B29 | (A)-4B [70] | (A)-32B [30] | (A)-4B: <100 | (D)-1 [1.5] | (E)-1 [0.6] | (S)-1 [200] | (S)-2 [5000] |
| Example B30 | (A)-4B [50] | (A)-33B [50] | (A)-4B: <100 | (D)-1 [1.5] | (E)-1 [0.6] | (S)-1 [200] | (S)-2 [5000] |
| Example B31 | (A)-4B [70] | (A)-33B [30] | (A)-4B: <100 | (D)-1 [1.5] | (E)-1 [0.6] | (S)-1 [200] | (S)-2 [5000] |
| Example B32 | (A)-4B [50] | (A)-34B [50] | (A)-4B: <100 | (D)-1 [1.5] | (E)-1 [0.6] | (S)-1 [200] | (S)-2 [5000] |
| Example B33 | (A)-4B [70] | (A)-34B [30] | (A)-4B: <100 | (D)-1 [1.5] | (E)-1 [0.6] | (S)-1 [200] | (S)-2 [5000] |
| Example B34 | (A)-4B [50] | (A)-35B [50] | (A)-4B: <100 | (D)-1 [1.5] | (E)-1 [0.6] | (S)-1 [200] | (S)-2 [5000] |
| Example B35 | (A)-4B [70] | (A)-35B [30] | (A)-4B: <100 | (D)-1 [1.5] | (E)-1 [0.6] | (S)-1 [200] | (S)-2 [5000] |
| Example B36 | (A)-5B [50] | (A)-22B [50] | (A)-5B: <100 | (D)-1 [1.5] | (E)-1 [0.6] | (S)-1 [200] | (S)-2 [5000] |
| Example B37 | (A)-5B [70] | (A)-22B [30] | (A)-5B: <100 | (D)-1 [1.5] | (E)-1 [0.6] | (S)-1 [200] | (S)-2 [5000] |
| Example B38 | (A)-6B [50] | (A)-22B [50] | (A)-6B: <100 | (D)-1 [1.5] | (E)-1 [0.6] | (S)-1 [200] | (S)-2 [5000] |
| Example B39 | (A)-6B [70] | (A)-22B [30] | (A)-6B: <100 | (D)-1 [1.5] | (E)-1 [0.6] | (S)-1 [200] | (S)-2 [5000] |
| Example B40 | (A)-7B [50] | (A)-22B [50] | (A)-7B: <100 | (D)-1 [1.5] | (E)-1 [0.6] | (S)-1 [200] | (S)-2 [5000] |
| Example B41 | (A)-7B [70] | (A)-22B [30] | (A)-7B: <100 | (D)-1 [1.5] | (E)-1 [0.6] | (S)-1 [200] | (S)-2 [5000] |

TABLE 7

| | Component (A) | | Amount of monomer that yields structural unit (a5) (ppm) | Component (D) | Component (E) | Component (S) | |
|---|---|---|---|---|---|---|---|
| Example B42 | (A)-8B [50] | (A)-22B [50] | (A)-8B: <100 | (D)-1 [1.5] | (E)-1 [0.6] | (S)-1 [200] | (S)-2 [5000] |
| Example B43 | (A)-8B [70] | (A)-22B [30] | (A)-8B: <100 | (D)-1 [1.5] | (E)-1 [0.6] | (S)-1 [200] | (S)-2 [5000] |
| Example B44 | (A)-9B [50] | (A)-22B [50] | (A)-9B: <100 | (D)-1 [1.5] | (E)-1 [0.6] | (S)-1 [200] | (S)-2 [5000] |
| Example B45 | (A)-9B [70] | (A)-22B [30] | (A)-9B: <100 | (D)-1 [1.5] | (E)-1 [0.6] | (S)-1 [200] | (S)-2 [5000] |
| Example B46 | (A)-4B [50] | (A)-36B [50] | (A)-4B: <100 | (D)-1 [1.5] | (E)-1 [0.6] | (S)-1 [200] | (S)-2 [5000] |
| Example B47 | (A)-4B [70] | (A)-36B [30] | (A)-4B: <100 | (D)-1 [1.5] | (E)-1 [0.6] | (S)-1 [200] | (S)-2 [5000] |
| Example B48 | (A)-4B [50] | (A)-1B [50] | (A)-4B: <100 (A)-1B: <100 | (D)-1 [1.5] | (E)-1 [0.6] | (S)-1 [200] | (S)-2 [5000] |
| Example B49 | (A)-4B [70] | (A)-1B [30] | (A)-4B: <100 (A)-1B: <100 | (D)-1 [1.5] | (E)-1 [0.6] | (S)-1 [200] | (S)-2 [5000] |
| Example B50 | (A)-4B [50] | (A)-2B [50] | (A)-4B: <100 (A)-2B: <100 | (D)-1 [1.5] | (E)-1 [0.6] | (S)-1 [200] | (S)-2 [5000] |
| Example B51 | (A)-4B [70] | (A)-2B [30] | (A)-4B: <100 (A)-2B: <100 | (D)-1 [1.5] | (E)-1 [0.6] | (S)-1 [200] | (S)-2 [5000] |
| Example B52 | (A)-4B [50] | (A)-37B [50] | (A)-4B: <100 (A)-37B: <100 | (D)-1 [1.5] | (E)-1 [0.6] | (S)-1 [200] | (S)-2 [5000] |
| Example B53 | (A)-4B [70] | (A)-37B [30] | (A)-4B: <100 (A)-37B: <100 | (D)-1 [1.5] | (E)-1 [0.6] | (S)-1 [200] | (S)-2 [5000] |

TABLE 7-continued

|  | Component (A) |  | Amount of monomer that yields structural unit (a5) (ppm) | Component (D) | Component (E) | Component (S) | |
|---|---|---|---|---|---|---|---|
| Example B54 | (A)-4B [50] | (A)-26B [50] | (A)-4B: <100 | (D)-2 [2.1] | — | (S)-1 [200] | (S)-2 [5000] |
| Example B55 | (A)-4B [70] | (A)-26B [30] | (A)-4B: <100 | (D)-2 [2.1] | — | (S)-1 [200] | (S)-2 [5000] |
| Example B56 | (A)-4B [50] | (A)-26B [50] | (A)-4B: <100 | (D)-3 [1.77] | — | (S)-1 [200] | (S)-2 [5000] |
| Example B57 | (A)-4B [70] | (A)-26B [30] | (A)-4B: <100 | (D)-3 [1.77] | — | (S)-1 [200] | (S)-2 [5000] |
| Example B58 | (A)-10B [50] | (A)-22B [50] | (A)-10B: <100 | (D)-1 [1.5] | (E)-1 [0.6] | (S)-1 [200] | (S)-2 [5000] |
| Example B59 | (A)-10B [70] | (A)-22B [30] | (A)-10B: <100 | (D)-1 [1.5] | (E)-1 [0.6] | (S)-1 [200] | (S)-2 [5000] |
| Example B60 | (A)-11B [50] | (A)-22B [50] | (A)-11B: <100 | (D)-1 [1.5] | (E)-1 [0.6] | (S)-1 [200] | (S)-2 [5000] |
| Example B61 | (A)-11B [70] | (A)-22B [30] | (A)-11B: <100 | (D)-1 [1.5] | (E)-1 [0.6] | (S)-1 [200] | (S)-2 [5000] |

TABLE 8

|  | Component (A) |  | Amount of monomer that yields structural unit (a5) (ppm) | Component (B) | Component (D) | Component (E) | Component (S) | |
|---|---|---|---|---|---|---|---|---|
| Comparative Example B1 | (A)-41B [100] | — | (A)-41B: <100 | — | (D)-1 [1.5] | (E)-1 [0.6] | (S)-1 [200] | (S)-2 [5000] |
| Comparative Example B2 | (A)-4B [100] | — | (A)-4B: <100 | — | (D)-1 [1.5] | (E)-1 [0.6] | (S)-1 [200] | (S)-2 [5000] |
| Comparative Example B3 | (A)-44B [50] | (A)-22B [50] | (A)-44B: 100< | — | (D)-1 [1.5] | (E)-1 [0.6] | (S)-1 [200] | (S)-2 [5000] |
| Comparative Example B4 | (A)-45B [100] | — | (A)-45B: 100< | — | (D)-1 [1.5] | (E)-1 [0.6] | (S)-1 [200] | (S)-2 [5000] |
| Comparative Example B5 | (A)-42B [100] | — | (A)-42B: <100 | — | (D)-1 [1.5] | (E)-1 [0.6] | (S)-1 [200] | (S)-2 [5000] |
| Comparative Example B6 | (A)-41B [50] | (A)-22B [50] | (A)-41B: <100 | — | (D)-1 [1.5] | (E)-1 [0.6] | (S)-1 [200] | (S)-2 [5000] |
| Comparative Example B7 | (A)-41B [50] | (A)-37B [50] | (A)-41B: <100 (A)-37B: <100 | — | (D)-1 [1.5] | (E)-1 [0.6] | (S)-1 [200] | (S)-2 [5000] |
| Comparative Example B8 | (A)-43B [100] | — | — | (B)-1B [30] | (D)-1 [1.5] | (E)-1 [0.6] | (S)-1 [200] | (S)-2 [5000] |
| Comparative Example B9 | (A)-43B [100] | — | — | (B)-2B [30] | (D)-1 [1.5] | (E)-1 [0.6] | (S)-1 [200] | (S)-2 [5000] |

In Tables 5 to 8, the reference characters have the following meanings. Further, the numerical values in brackets [ ] indicate the amount (in parts by weight) of the component added.

(A)-1B to (A)-11B: the copolymers represented by chemical formulas (A)-1B to (A)-11B shown below.

(A)-21B to (A)-37B: the copolymers represented by chemical formulas (A)-2113 to (A)-37B shown below.

(A)-41B to (A)-45B: the copolymers represented by chemical formulas (A)-41B to (A)-45B shown below.

(A)-1B to (A)-3B correspond with the aforementioned resin (A1-1-1).

(A)-4B to (A)-11B and (A)-44B correspond with the above resin (A1-1-2).

(A)-21B to (A)-37B, (A)-42B and (A)-45B correspond with the aforementioned resin (A1-1-3).

For each component (A), the copolymer composition ratio of the copolymer (the ratio (molar ratio) of the respective structural units within the chemical formula), the weight-average molecular weight (Mw), and the molecular weight dispersity (Mw/Mn) are listed below together with the chemical formula.

The weight-average molecular weight (Mw) and the molecular weight dispersity (Mw/Mn) for each copolymer represent polystyrene-equivalent values determined by GPC measurements. The copolymer composition ratio (the ratio (molar ratio) of the respective structural units within the structural formula) for each copolymer was determined by carbon-13 nuclear magnetic resonance spectroscopy (600 MHz $^{13}$C-NMR). Tetramethylsilane (TMS) was used as the internal standard for the $^{13}$C-NMR.

In the copolymer represented by chemical formula (A)-31B, the "average arm length" was identified on the basis of the $^{13}$C-NMR spectrum, and refers to the average value for the total number of the two types of structural units that form the four arms.

[Chemical Formula 138]
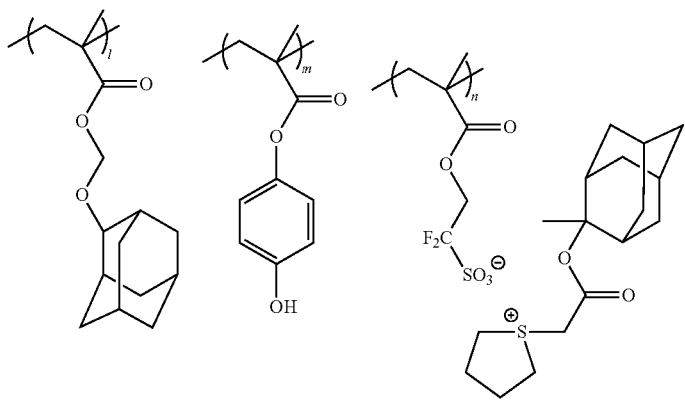
(A)-1B
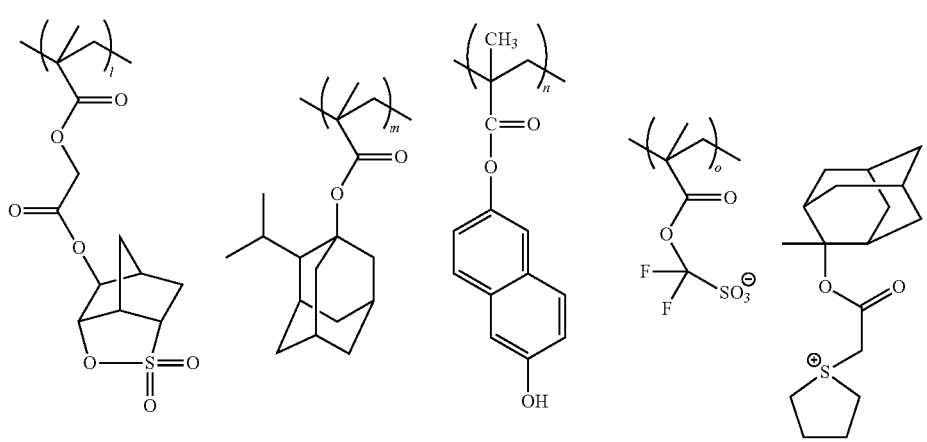
(A)-2B
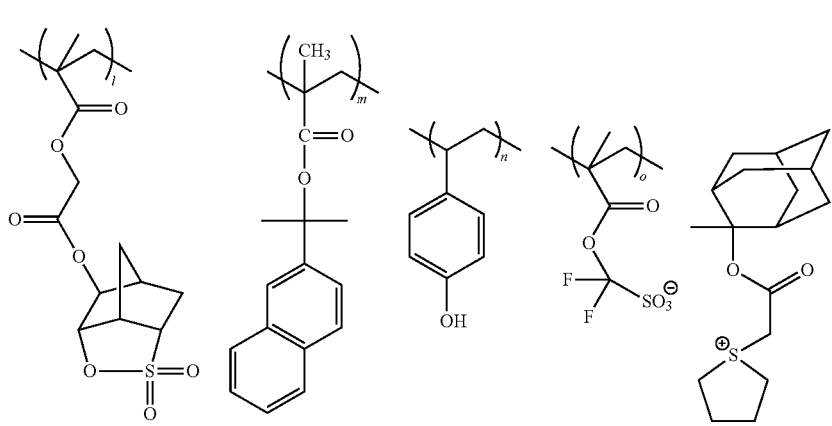
(A)-3B
(A)-1B: l/m/n = 60/30/10, Mw: 4,000, Mw/Mn: 1.65
(A)-2B: l/m/n/o = 36.9/36.1/16.9/10.1, Mw: 4,000, Mw/Mn: 1.64
(A)-3B: l/m/n/o = 10/20/60/10, Mw: 4,000, Mw/Mn: 1.67

-continued
[Chemical Formula 139]
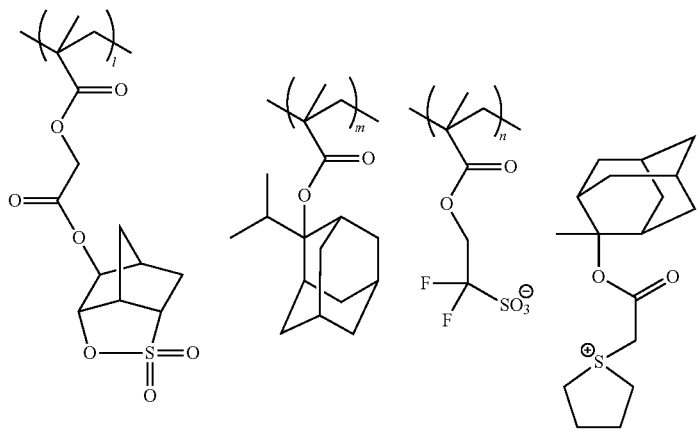
(A)-4B
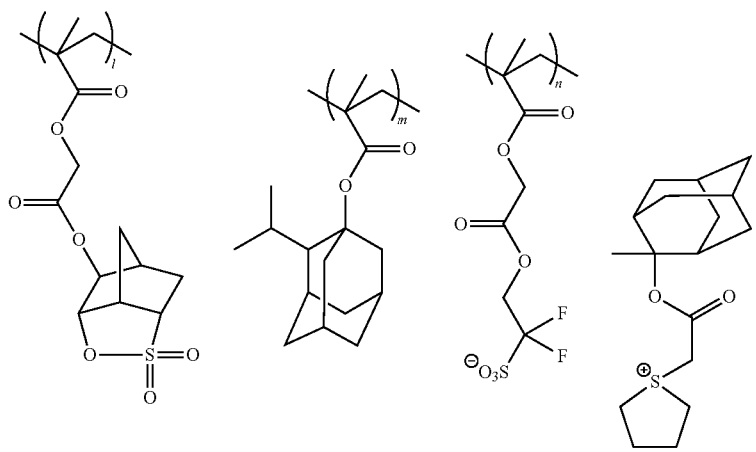
(A)-5B
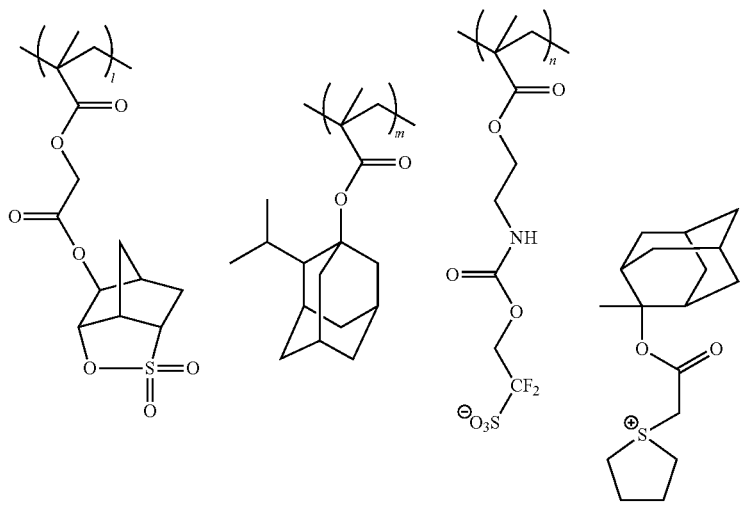
(A)-6B
(A)-4B: l/m/n = 44/44/12, Mw: 7,000, Mw/Mn: 1.33
(A)-5B: l/m/n = 44/44/12, Mw: 7,000, Mw/Mn: 1.24
(A)-6B: l/m/n = 44/44/12, Mw: 7,000, Mw/Mn: 1.32

-continued
[Chemical Formula 140]
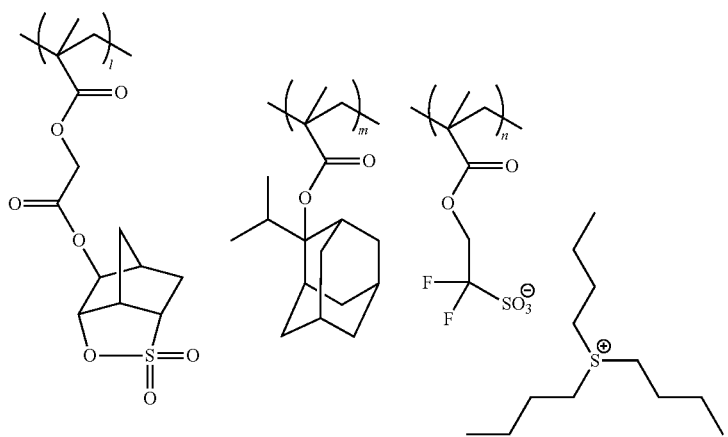
(A)-7B
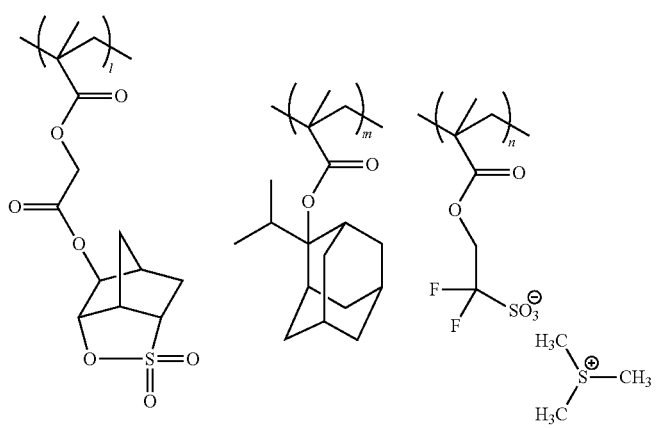
(A)-8B
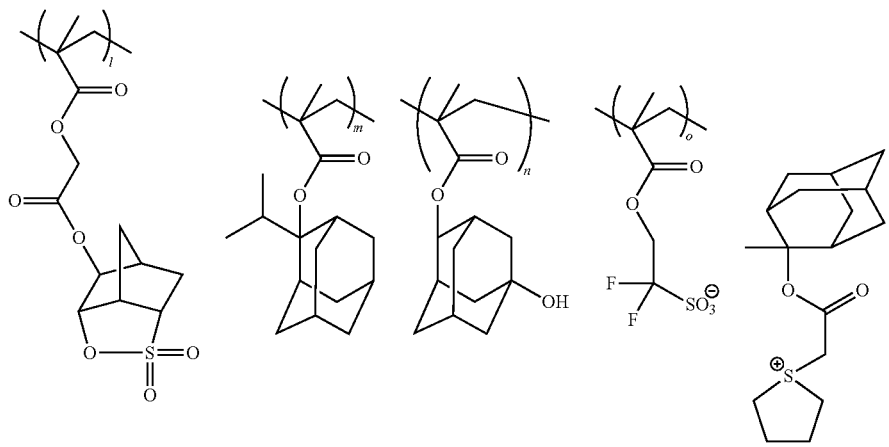
(A)-9B
(A)-7B: l/m/n = 44/44/12, Mw: 4,000, Mw/Mn: 1.61
(A)-8B: l/m/n = 44/44/12, Mw: 7,000, Mw/Mn: 1.58
(A)-9B: l/m/n/o = 35/35/18/12, Mw: 7,000, Mw/Mn: 1.73

[Chemical Formula 141]
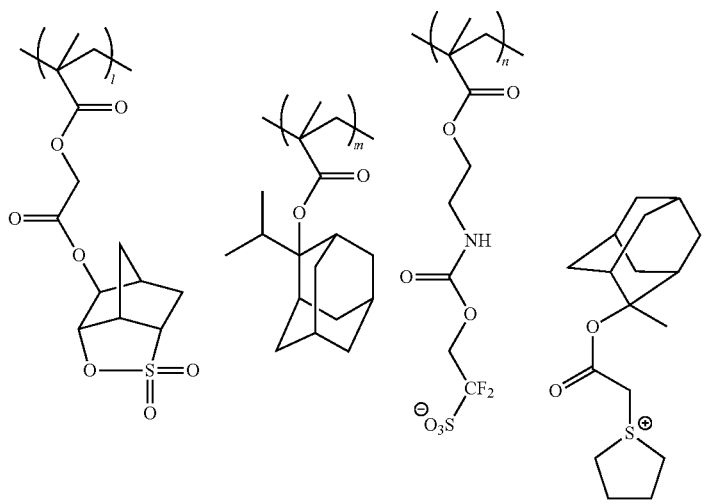
(A)-10B
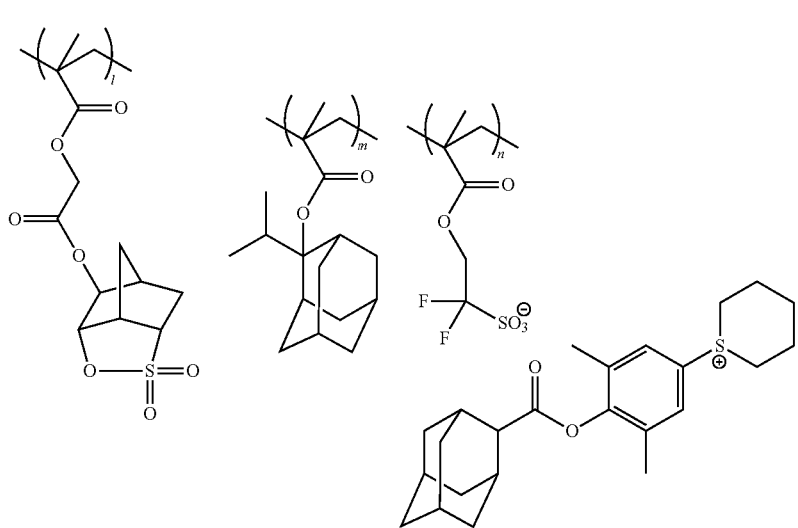
(A)-11B
(A)-10B: l/m/n = 45/45/10, Mw: 4,000, Mw/Mn: 1.45
(A)-11B: l/m/n = 44/44/12, Mw: 4,000, Mw/Mn: 1.61
[Chemical Formula 142]
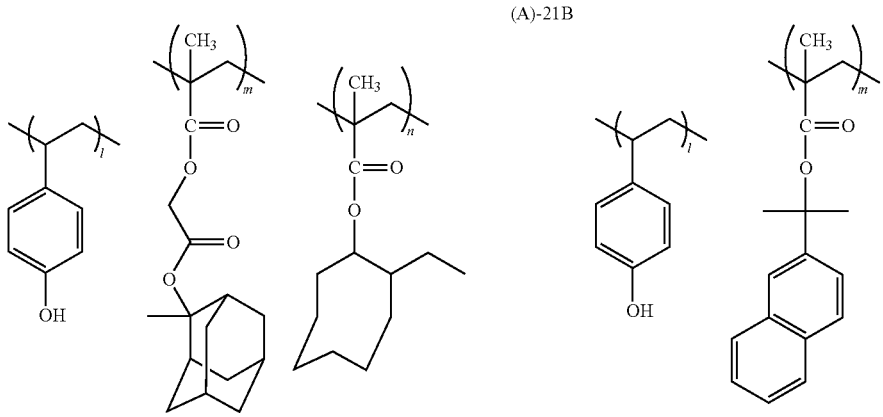
(A)-21B
(A)-22B -continued
(A)-23B 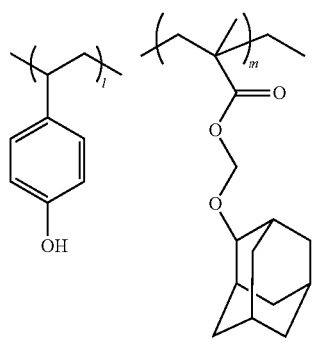 (A)-24B 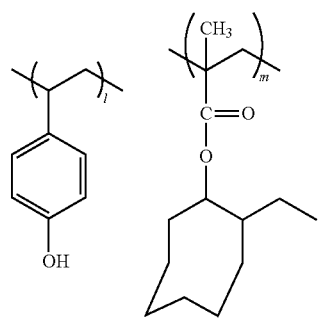
(A)-25B 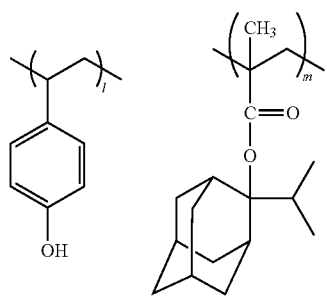 (A)-26B 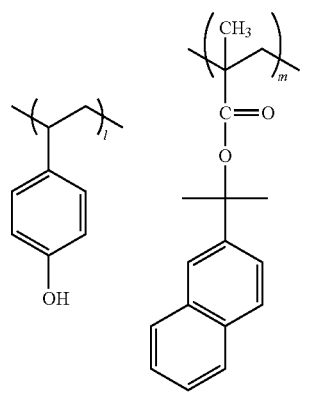
(A)-27B 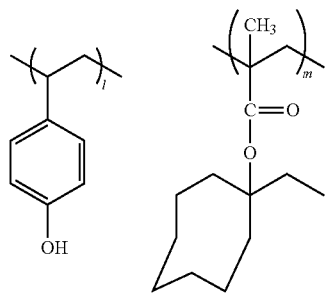 (A)-28B 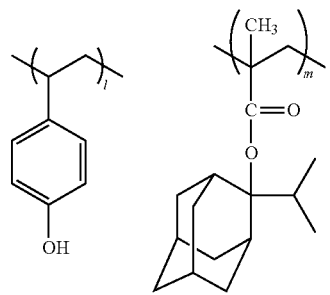
(A)-21B: l/m/n = 64/23/13, Mw: 7,000, Mw/Mn: 1.56
(A)-22B: l/m = 75/25, Mw: 7,000, Mw/Mn: 1.45
(A)-23B: l/m = 75/25, Mw: 7,000, Mw/Mn: 1.35
(A)-24B: l/m = 75/25, Mw: 7,000, Mw/Mn: 1.41
(A)-25B: l/m = 75/25, Mw: 7,000, Mw/Mn: 1.21
(A)-26B: l/m = 60/40, Mw: 7,000, Mw/Mn: 1.33
(A)-27B: l/m = 60/40, Mw: 7,000, Mw/Mn: 1.21
(A)-28B: l/m = 60/40, Mw: 7,000, Mw/Mn: 1.23

[Chemical Formula 143]
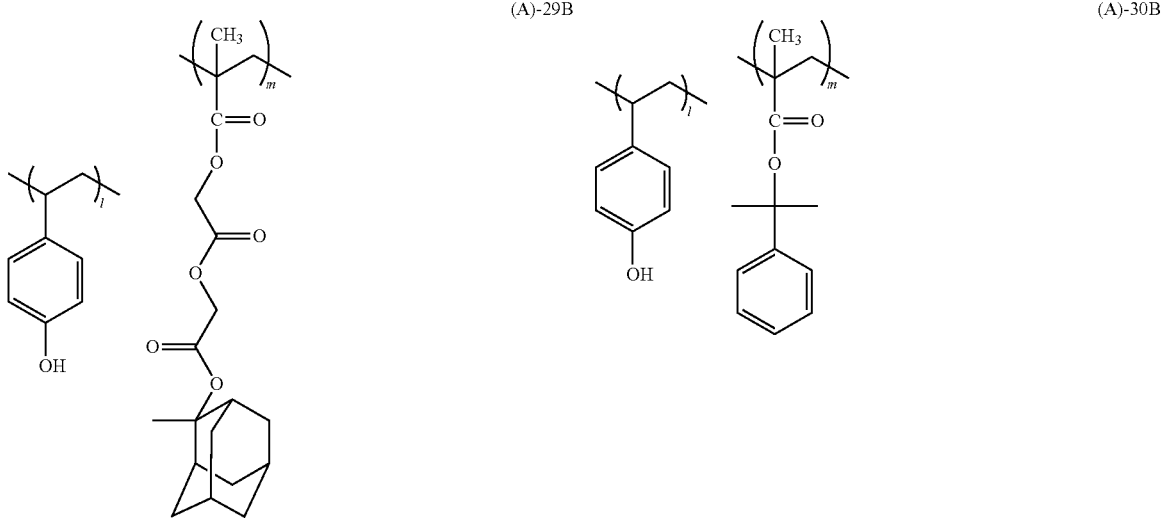
(A)-29B: l/m = 75/25, Mw: 7,000, Mw/Mn: 1.33
(A)-30B: l/m = 70/30, Mw: 7,000, Mw/Mn: 1.35
[Chemical Formula 144]
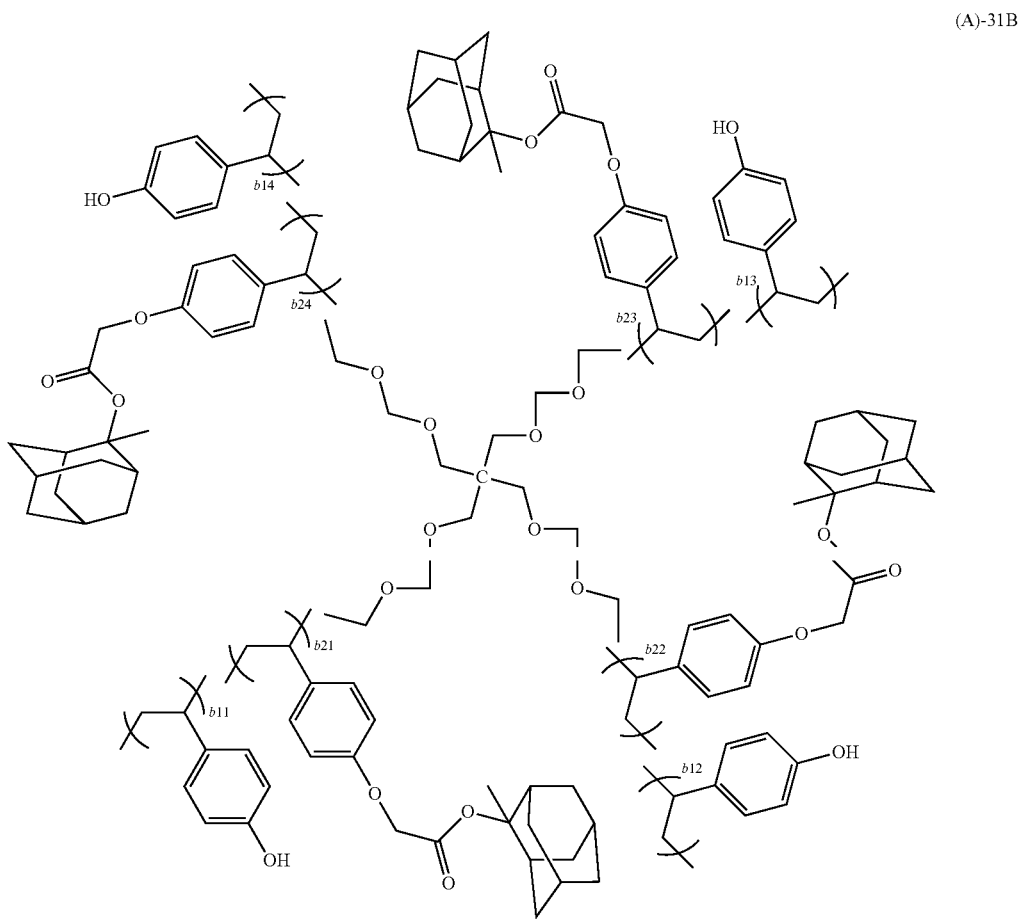
(A)-31B: [(b11 + b12 + b13 + b14)/(b21 + b22 + b23 + b24) = 75/25 (molar ratio), the proportion of (b21 + b22 + b23 + b24) represents the protection ratio], average arm length: 7.0 units, mW: 3,300 Mw/Mn: 1.56

[Chemical Formula 145]
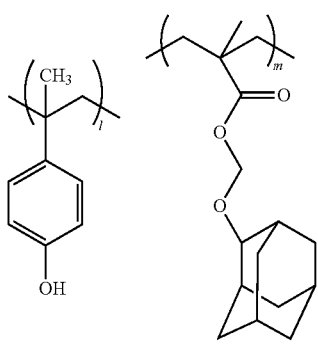
(A)-32B
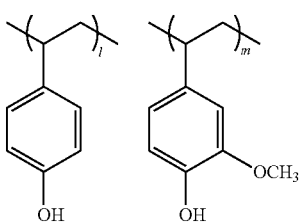
(A)-33B
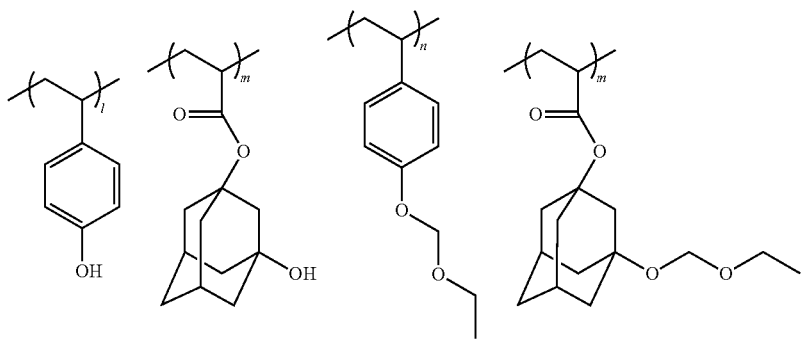
(A)-34B
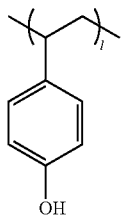
(A)-35B
(A)-32B: l/m = 75/25, Mw: 7,000, Mw/Mn: 1.43
(A)-33B: l/m = 75/25, Mw: 7,000, Mw/Mn: 1.54
(A)-34B: l/m/n/o = 56/17/24/3, Mw: 9,000, Mw/Mn: 1.45
(A)-35B: l = 100, Mw: 8,000, Mw/Mn: 1.51
[Chemical Formula 146]
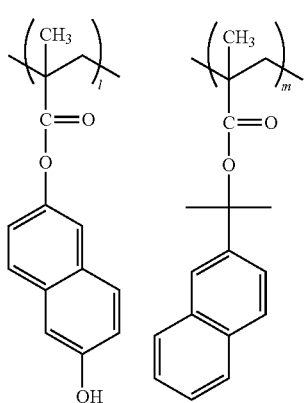
(A)-36B -continued
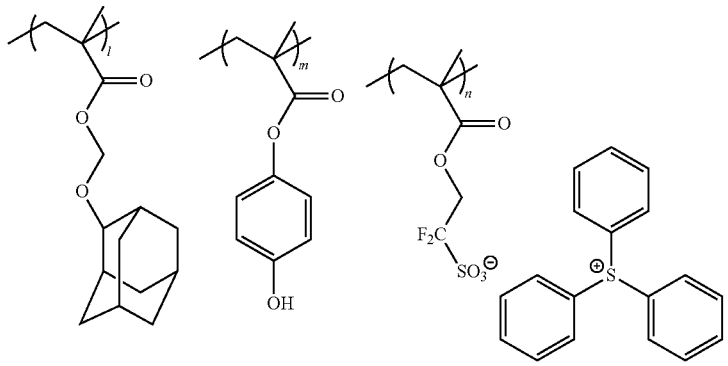
(A)-37B
(A)-36B: l/m = 75/25, Mw: 7,000, Mw/Mn: 1.34
(A)-37B: l/m/n = 60/30/10, Mw: 4,000, Mw/Mn: 1.21
[Chemical Formula 147]
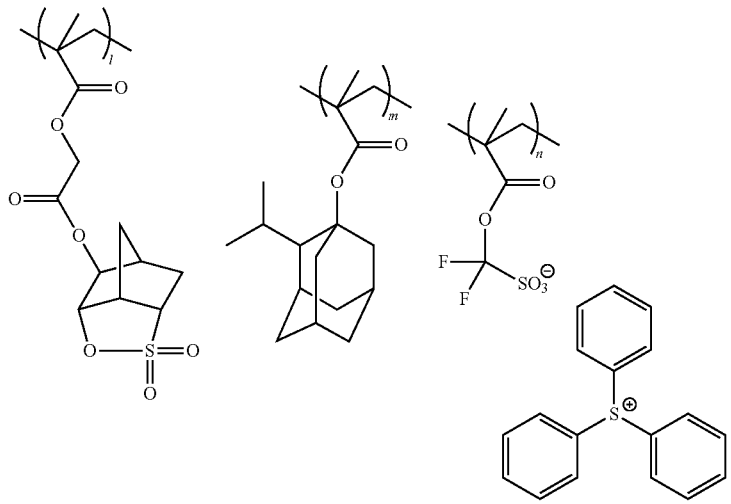
(A)-41B
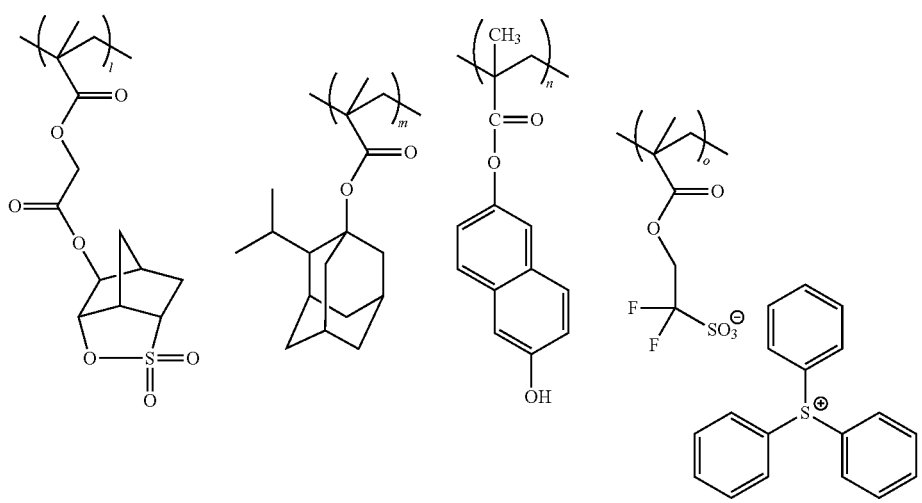
(A)-42B -continued

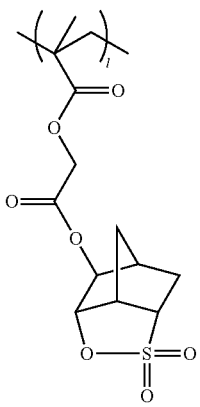 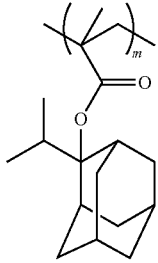 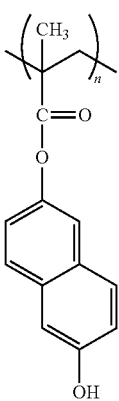

(A)-43B (A)-41B: l/m = 44/44/12, Mw: 7,000, Mw/Mn: 1.42
(A)-42B: l/m/n/o = 35/35/18/12, Mw: 6,000, Mw/Mn: 1.21
(A)-43B: l/m/n = 40/40/20, Mw: 7,000, Mw/Mn: 1.60

[Chemical Formula 148]

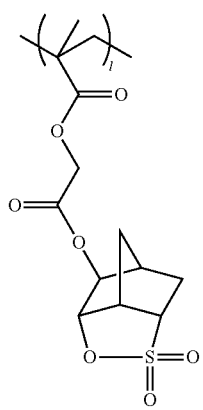 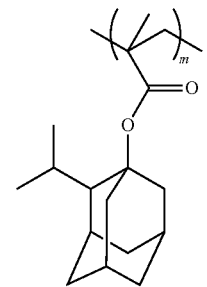 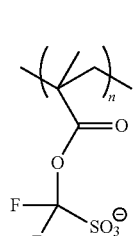 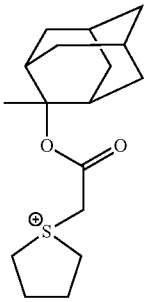

(A)-44B

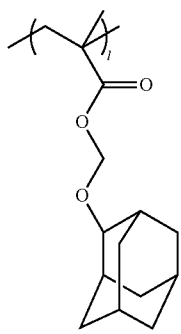 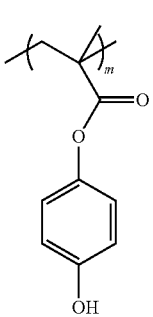 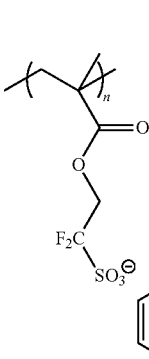 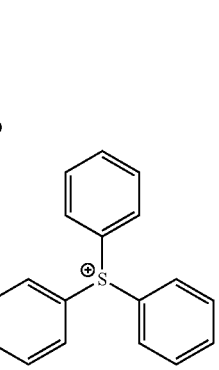

(A)-45B (A)-44B: l/m/n=44/44/12, Mw: 7,000, Mw/Mn: 1.74, during synthesis, removal of the unreacted monomers (water washing of the precursor polymer) was not performed, and the amount of the monomer that yields the structural unit (a5) exceeded 100 ppm.

(A)-45B: l/m/n=60/30/10, Mw: 4,000, Mw/Mn: 1.63, during synthesis, removal of the unreacted monomers (water washing of the precursor polymer) was not performed, and the amount of the monomer that yields the structural unit capable of generating an acid upon exposure exceeded 100 ppm.

(B)-1B: an acid generator composed of a compound represented by chemical formula (B)-1B shown below.

(B)-2B: an acid generator composed of a compound represented by chemical formula (B)-213 shown below.

(D)-1: tri-n-octyl amine (D)-2: a compound represented by chemical formula (D)-2 shown below.

(D)-3: a compound represented by chemical formula (D)-3 shown below.

(E)-1: salicylic acid (S)-1: γ-butyrolactone (S)-2: a mixed solvent of PGMEA/PGME/cyclohexanone=1500/1000/2500 (weight ratio)

[Chemical Formula 149]

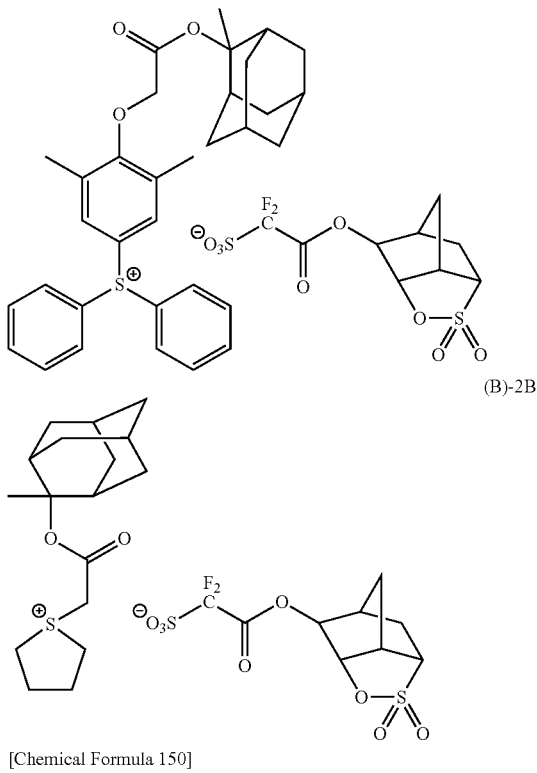

(B)-1B (B)-2B

[Chemical Formula 150]

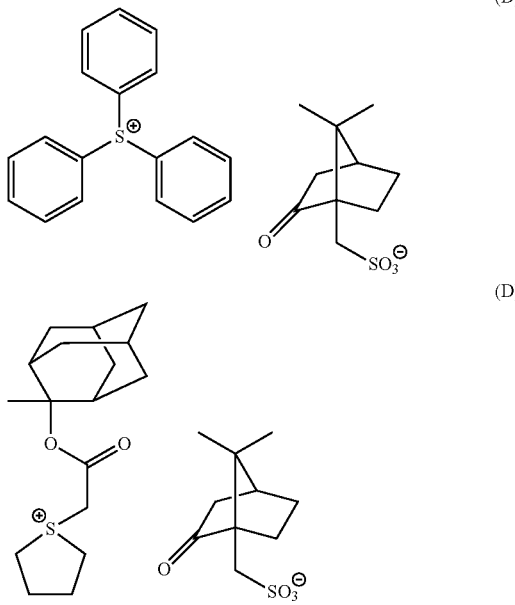

(D)-2

(D)-3

<Measurement of Amount of Monomer that Yields Structural Unit (a5)>

The amount of the monomer that yields the structural unit (a5) was measured using the procedures described below.

Procedure 1: a series of solutions with different concentrations (5 different concentrations) of the monomer that yields the structural unit (a5) were prepared by dissolving the monomer in γ-butyrolactone, and these solution were then measured by HPLC to create a calibration curve and determine a relational expression between the HPLC surface area and the monomer concentration.

Procedure 2: for each of the synthesis examples A1 to A27 and each of the synthesis examples B1 to B14, the synthesis product obtained following completion of the "step of washing the precursor polymer with water" (namely, the copolymer prior to salt exchange) was dissolved in γ-butyrolactone to prepare a solution having a concentration of 1% by weight, for the synthesis example A28, the synthesis product following washing with methanol was dissolved in γ-butyrolactone to prepare a solution having a concentration of 1% by weight, and for the synthesis examples B15 and B16, the synthesis product obtained without performing the "step of washing the precursor polymer with water" was dissolved in γ-butyrolactone to prepare a solution having a concentration of 1% by weight.

Procedure 3: each of the solutions having a concentration of 1% by weight was measured by HPLC, and the relational expression mentioned above was used to calculate the amount of the monomer (ppm, by weight) relative to the solid fraction of the copolymer. These results are indicated in Tables 3 to 8 as the "amount of monomer that yields structural unit (a5) (ppm)".

The monomers that yield the structural unit (a5) (monomers that yield a structural unit capable of generating acid upon exposure) include:

the compounds (51A) to (56A), compounds in which the cations of compounds (51A) to (55A) have been exchanged with the cation of the corresponding salt exchange compound (c1A) to (c8A), the compounds (51B) to (53B), and compounds in which the cations of compounds (51B) to (5313) have been exchanged with the cation of the corresponding salt exchange compound (c1B) to (c5B).

The above HPLC measurements were performed under the measurement conditions listed below.

[HPLC Measurement Conditions]

Developing solvent: acetonitrile/buffer solution (volumetric ratio: 80/20)

Buffer solution: trifluoroacetic acid/ion-exchanged water (0.1% by weight)

Column: Superiorex-ODS

Oven temperature: 30° C.

Measurement wavelength: 210 nm

Flow rate: 1 ml/minute (until 7 minutes elapsed), and then 3 ml/minute (until 20 minutes)

The mixing ratio of the HPLC developing solvent was altered appropriately within a range from acetonitrile/buffer solution=90/10 to 30/70 (volumetric ratio) in accordance with the variety of the monomer being used.

The obtained resist compositions were evaluated in the manner described below.

<Formation of Resist Patterns>

Using a spinner, each of the resist compositions of the above examples was applied uniformly onto an 8-inch silicon substrate that had been treated with hexamethyldisilazane (HMDS) for 36 seconds at 90° C., and a bake treatment (PAB) was then conducted for 60 seconds at the bake temperature shown in Table 9 to 12, thereby forming a resist film (film thickness: 60 nm). This resist film was subjected to direct patterning (exposure) with an electron beam lithography apparatus HL800D (VSB) (manufactured by Hitachi, Ltd.) at an accelerating voltage of 70 kV. Subsequently, a bake treatment (PEB) was conducted for 60 seconds at the bake temperature shown in Table 9 to 12, and an alkali development was then conducted for 60 seconds at 23° C. in a 2.38% by weight aqueous solution of tetramethylammonium hydroxide (TMAH) (product name: NMD-3, manufactured by Tokyo Ohka Kogyo Co., Ltd.).

As a result, a line and space resist pattern (hereafter also referred to as an "LS pattern") having a line width of 100 nm and a pitch of 200 nm was formed in each of the examples.

[Evaluation of Sensitivity]

The optimum exposure Eop ($\mu C/cm^2$) for formation of the LS pattern was determined. The results are shown in Tables 9 to 12.

[Evaluation of Line Width Roughness (LWR)]

For each of the LS patterns having a line width of 100 nm and a pitch of 200 nm formed in the aforementioned <Formation of Resist Patterns>, the value of 3σ was determined as an indicator of LWR.

The value "3σ" indicates the value obtained by measuring the line width of the LS pattern at 400 locations along the lengthwise direction of the line using a scanning electron microscope (accelerating voltage: 800 V, product name: S-9220, manufactured by Hitachi High-Technologies Corporation), determining the standard deviation (σ) from the measurement results, and then calculating the value of 3 times the standard deviation (3s) (units: nm). The smaller this value of 3s, the lower the level of roughness in the line side walls, indicating an LS pattern of more uniform width. The results are indicated as "LWR (nm)" in Table 9.

[Evaluation of Line edge Roughness (LER)]

For each of the LS patterns having a line width of 100 nm and a pitch of 200 nm formed in the aforementioned <Formation of Resist Patterns>, the value of 3σ was determined as an indicator of LER.

The value "3σ" describes the value obtained by measuring the line width of the LS pattern at 400 locations along the lengthwise direction of the line using a measuring SEM (scanning electron microscope, accelerating voltage: 800 V, product name: S-9380, manufactured by Hitachi High-Technologies Corporation), determining the standard deviation (σ) from the measurement results, and then calculating the value of 3 times the standard deviation (3s) (units: nm). The smaller this value of 3s, the lower the level of roughness in the line side walls, indicating an LS pattern of more uniform width. The results are indicated as "LER (nm)" in Tables 10 to 12.

[Evaluation of Exposure Latitude (10% EL)]

In the aforementioned <Formation of Resist Patterns>, the exposure dose at which an LS pattern was formed having a line width within a dimensional variation of ±10% from the target dimension (line width of 100 nm) (namely, within a range from 90 nm to 110 nm) was determined, and the exposure latitude (units: %) was determined using the following formula.

The larger the value of the exposure latitude, the smaller the fluctuation in the pattern size caused by variation in the exposure dose. The results are indicated as "10% EL (%)" in Table 9.

Exposure latitude (%)=(|E1−E2|/Eop)×100

E1: the exposure dose ($\mu C/cm^2$) at which an LS pattern having a line width of 90 nm was formed.

E2: the exposure dose ($\mu C/cm^2$) at which an LS pattern having a line width of 110 nm was formed.

[Evaluation of Resolution]

The critical resolution (nm) at the above Eop value was determined using a scanning electron microscope S-9380 (manufactured by Hitachi High-Technologies Corporation). The results are indicated as "Resolution (nm)" in Tables 9 to 12.

[Evaluation of Resist Pattern Shape]

For each of the LS patterns having a line width of 100 nm and a pitch of 200 nm formed in the aforementioned <Formation of Resist Patterns>, the cross-sectional shape of the pattern was inspected using a scanning electron microscope (product name: SU-8000, manufactured by Hitachi High-Technologies Corporation), and the shape was evaluated against the following evaluation criteria. The results are shown in Tables 9 to 12.

(Evaluation Criteria for Table 9)

A: favorable shape, with excellent rectangularity B: thickness loss was noticeable (Evaluation Criteria for Tables 10 to 12)

A: favorable shape, with excellent rectangularity

B: pattern had a Top-round shape

TABLE 9

| | PAB/PEB (° C./° C.) | Eop ($\mu C/cm^2$) | LWR (nm) | 10% EL (%) | Resolution (nm) | Resist pattern shape |
|---|---|---|---|---|---|---|
| Comparative Example A1 | 130/110 | 50 | 12.0 | 15.0 | 60 | B |
| Comparative Example A2 | 130/110 | 54 | 11.1 | 15.5 | 60 | B |
| Comparative Example A3 | 130/110 | 56 | 13.5 | 14.8 | 80 | B |
| Comparative Example A4 | 130/110 | 58 | 11.9 | 16.0 | 70 | B |
| Comparative Example A5 | 130/110 | 48 | 10.1 | 18.0 | 60 | B |
| Comparative Example A6 | 130/110 | 50 | 10.2 | 19.1 | 60 | B |
| Comparative Example A7 | 130/110 | 44 | 10.0 | 17.8 | 60 | B |
| Comparative Example A8 | 130/110 | 54 | 10.1 | 19.2 | 60 | B |
| Comparative Example A9 | 130/110 | 44 | 11.0 | 18.2 | 60 | B |
| Comparative Example A10 | 130/100 | 46 | 11.8 | 16.2 | 60 | B |
| Example A1 | 130/110 | 52 | 5.9 | 21.8 | 50 | A |
| Example A2 | 130/110 | 46 | 6.5 | 21.8 | 50 | A |
| Example A3 | 130/110 | 46 | 7.5 | 22.3 | 50 | A |
| Example A4 | 130/110 | 52 | 5.8 | 25.9 | 50 | A |
| Example A5 | 130/110 | 50 | 6.8 | 24.3 | 50 | A |
| Example A6 | 130/110 | 48 | 7.4 | 24.1 | 50 | A |
| Example A7 | 130/110 | 44 | 6.1 | 24.6 | 50 | A |
| Example A8 | 130/110 | 56 | 7.5 | 20.5 | 50 | A |
| Example A9 | 130/110 | 58 | 7.2 | 21.5 | 50 | A |
| Example A10 | 130/110 | 46 | 6.5 | 21.9 | 50 | A |
| Example A11 | 130/100 | 42 | 7.1 | 22.0 | 50 | A |
| Example A12 | 130/110 | 52 | 6.6 | 23.0 | 50 | A |
| Example A13 | 130/100 | 50 | 6.0 | 21.2 | 50 | A |
| Example A14 | 130/110 | 48 | 6.0 | 24.1 | 50 | A |
| Example A15 | 130/110 | 50 | 5.9 | 25.0 | 50 | A |
| Example A16 | 130/110 | 50 | 6.1 | 22.5 | 50 | A |
| Example A17 | 130/110 | 52 | 5.9 | 24.0 | 50 | A |
| Example A18 | 130/100 | 48 | 6.3 | 23.0 | 50 | A |

The results in Table 9 confirmed that the resist compositions of Examples A1 to A18 each exhibited more favorable lithography properties, with lower LWR, larger exposure latitude and superior resolution, and also yielded a more favorable shape with superior rectangularity, when compared with the resist compositions of Comparative Examples A1 to A10.

Further, by comparing Examples A1, A5, A2, A8, A3 and A13 with Comparative Examples A5 to A10 respectively (which had the same compositions, and differed only in the amount of the monomer that yielded the structural unit (a5)), it was evident that the resist compositions of the examples, in which the amount of the monomer that yields the structural unit (a5) was restricted to not more than 100 ppm, exhibited more favorable values for the above lithography properties, and produced a more favorable shape with superior rectangularity, than the resist compositions of the comparative examples in which the amount of the monomer exceeded 100 ppm.

TABLE 10

|  | PAB/PEB (° C./° C.) | Eop (μC/cm$^2$) | LER (nm) | Resolution (nm) | Resist pattern shape |
|---|---|---|---|---|---|
| Example B1 | 130/110 | 47 | 6.5 | 50 | A |
| Example B2 | 130/110 | 45 | 7.6 | 50 | A |
| Example B3 | 130/110 | 45 | 6.6 | 50 | A |
| Example B4 | 130/110 | 48 | 7.7 | 50 | A |
| Example B5 | 130/110 | 44 | 7.9 | 50 | A |
| Example B6 | 130/110 | 50 | 7.8 | 50 | A |
| Example B7 | 130/110 | 43 | 7.4 | 50 | A |
| Example B8 | 130/110 | 46 | 7.5 | 50 | A |
| Example B9 | 130/110 | 48 | 7.9 | 50 | A |
| Example B10 | 130/110 | 42 | 7.3 | 50 | A |
| Example B11 | 130/110 | 48 | 7.2 | 50 | A |
| Example B12 | 130/110 | 45 | 7.3 | 50 | A |
| Example B13 | 130/110 | 42 | 7.5 | 50 | A |
| Example B14 | 130/110 | 46 | 7.6 | 50 | A |
| Example B15 | 130/110 | 44 | 7.2 | 50 | A |
| Example B16 | 130/110 | 42 | 7.1 | 50 | A |
| Example B17 | 130/110 | 40 | 7.7 | 50 | A |
| Example B18 | 130/110 | 44 | 7.9 | 50 | A |
| Example B19 | 130/110 | 42 | 6.9 | 50 | A |
| Example B20 | 130/110 | 49 | 7.2 | 50 | A |
| Example B21 | 130/110 | 45 | 7.5 | 50 | A |
| Example B22 | 130/110 | 48 | 7.6 | 50 | A |
| Example B23 | 130/110 | 46 | 7.8 | 50 | A |
| Example B24 | 130/110 | 42 | 7.9 | 50 | A |
| Example B25 | 130/110 | 40 | 7.1 | 50 | A |
| Example B26 | 130/110 | 46 | 8.2 | 50 | A |
| Example B27 | 130/110 | 44 | 8.1 | 50 | A |
| Example B28 | 130/110 | 49 | 7.1 | 50 | A |
| Example B29 | 130/110 | 47 | 6.7 | 50 | A |
| Example B30 | 130/110 | 45 | 6.1 | 50 | A |
| Example B31 | 130/110 | 45 | 6.6 | 50 | A |

TABLE 11

|  | PAB/PEB (° C./° C.) | Eop (μC/cm$^2$) | LER (nm) | Resolution (nm) | Resist pattern shape |
|---|---|---|---|---|---|
| Example B32 | 130/110 | 42 | 6.6 | 50 | A |
| Example B33 | 130/110 | 40 | 6.7 | 50 | A |
| Example B34 | 130/110 | 40 | 7.1 | 50 | A |
| Example B35 | 130/110 | 40 | 7.4 | 50 | A |
| Example B36 | 130/110 | 48 | 6.8 | 50 | A |
| Example B37 | 130/110 | 41 | 7.1 | 50 | A |
| Example B38 | 130/110 | 45 | 7.0 | 50 | A |
| Example B39 | 130/110 | 39 | 6.9 | 50 | A |
| Example B40 | 130/110 | 48 | 7.5 | 50 | A |
| Example B41 | 130/110 | 46 | 7.4 | 50 | A |
| Example B42 | 130/110 | 46 | 7.8 | 50 | A |
| Example B43 | 130/110 | 44 | 7.6 | 50 | A |
| Example B44 | 130/110 | 48 | 7.3 | 50 | A |
| Example B45 | 130/110 | 44 | 7.1 | 50 | A |
| Example B46 | 130/110 | 45 | 7.6 | 50 | A |
| Example B47 | 130/110 | 43 | 7.7 | 50 | A |
| Example B48 | 130/110 | 40 | 7.9 | 50 | A |
| Example B49 | 130/110 | 40 | 7.4 | 50 | A |
| Example B50 | 130/110 | 42 | 7.1 | 50 | A |
| Example B51 | 130/110 | 42 | 7.8 | 50 | A |
| Example B52 | 130/110 | 44 | 7.1 | 50 | A |
| Example B53 | 130/110 | 44 | 7.4 | 50 | A |
| Example B54 | 130/110 | 47 | 6.9 | 50 | A |
| Example B55 | 130/110 | 45 | 6.6 | 50 | A |
| Example B56 | 130/110 | 48 | 6.8 | 50 | A |
| Example B57 | 130/110 | 43 | 6.9 | 50 | A |
| Example B58 | 130/110 | 45 | 6.5 | 50 | A |
| Example B59 | 130/110 | 44 | 6.4 | 50 | A |
| Example B60 | 130/110 | 42 | 7.1 | 50 | A |
| Example B61 | 130/110 | 40 | 7.0 | 50 | A |

TABLE 12

|  | PAB/PEB (° C./° C.) | Eop (μC/cm$^2$) | LER (nm) | Resolution (nm) | Resist pattern shape |
|---|---|---|---|---|---|
| Comparative Example B1 | 140/110 | 51 | 9.1 | 60 | B |
| Comparative Example B2 | 130/110 | 60 | 8.2 | 60 | A |
| Comparative Example B3 | 130/110 | 55 | 10.2 | 70 | B |
| Comparative Example B4 | 130/110 | 54 | 9.8 | 70 | B |
| Comparative Example B5 | 140/120 | 48 | 8.2 | 60 | B |
| Comparative Example B6 | 140/120 | 50 | 8.6 | 60 | B |
| Comparative Example B7 | 140/120 | 51 | 8.9 | 60 | B |
| Comparative Example B8 | 140/120 | 46 | 8.7 | 60 | B |
| Comparative Example B9 | 140/120 | 46 | 9.0 | 60 | B |

The results in Tables 10 to 12 confirmed that the resist compositions of Examples B1 to B61 each exhibited favorable lithography properties, with low LER and superior resolution, yielded a favorable shape with superior rectangularity, and also exhibited excellent sensitivity.

While preferred examples of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition for EUV or EB comprising a base component (A) which generates acid upon exposure and exhibits changed solubility in a developing solution under action of acid, wherein the base component (A) comprises a polymer (A1) having a structural unit (a5) containing a group represented by general formula (a5-0-1) or general formula (a5-0-2) shown below, and an amount of a monomer that derives the structural unit (a5) is not more than 100 ppm by weight relative to the polymer (A1):

(a5-0-1)
(a5-0-2)

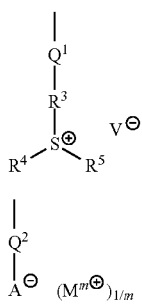

wherein each of $Q^1$ and $Q^2$ independently represents a single bond or a divalent linking group, each of $R^3$, $R^4$ and $R^5$ independently represents an organic group, and $R^4$ and $R^5$ may be bonded to each other to form a ring in combination with a sulfur atom in the formula, provided that a group —$R^3$—$S^+(R^4)(R^5)$ within the formula has a total of only one aromatic ring or has no aromatic rings, V represents a counter anion, $A^-$ represents an organic group containing an anion, and $M^{m+}$ represents an organic cation having a valency of m, wherein m represents an integer of 1 to 3, provided that $M^{m+}$ has only one aromatic ring or has no aromatic rings.

2. The resist composition for EUV or EB according to claim 1, wherein the base component (A) further comprises a structural unit (a6) represented by general formula (a6-1) shown below:

(a6-1)

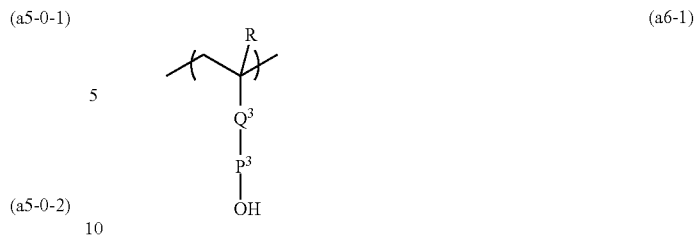

wherein $Q^3$ represents a single bond or a divalent linking group, R represents a hydrogen atom, an alkyl group of 1 to 5 carbon atoms or a halogenated alkyl group of 1 to 5 carbon atoms, and $P^3$ represents an aromatic hydrocarbon group which may have a substituent.

3. The resist composition for EUV or EB according to claim 1, wherein the polymer (A1) has a structural unit (a1) containing an acid-decomposable group that exhibits increased polarity under action of acid.

4. The resist composition for EUV or EB according to claim 1, wherein $M^{m+}$ represents an organic cation having no aromatic rings.

5. A method of forming a resist pattern, the method comprising: using the resist composition for EUV or EB according to claim 1 to form a resist film on a substrate, conducting exposure of the resist film with EUV or EB, and developing the resist film to form a resist pattern.

* * * * *